US008042742B2

(12) United States Patent
Kagaya et al.

(10) Patent No.: US 8,042,742 B2
(45) Date of Patent: Oct. 25, 2011

(54) NONCONTACT IC LABEL AND METHOD AND APPARATUS FOR MANUFACTURING THE SAME

(75) Inventors: Hitoshi Kagaya, Tokyo (JP); Yoshiaki Ide, Tokyo (JP); Takeshi Yamakami, Yokohama (JP); Hiroki Ohno, Tokyo (JP)

(73) Assignee: Toppan Forms Co., Ltd., Tokyo (JP)

( * ) Notice: Subject to any disclaimer, the term of this patent is extended or adjusted under 35 U.S.C. 154(b) by 1224 days.

(21) Appl. No.: 11/576,162

(22) PCT Filed: Oct. 7, 2005

(86) PCT No.: PCT/JP2005/018639
§ 371 (c)(1),
(2), (4) Date: Mar. 28, 2007

(87) PCT Pub. No.: WO2006/041033
PCT Pub. Date: Apr. 20, 2006

(65) Prior Publication Data
US 2008/0042266 A1    Feb. 21, 2008

(30) Foreign Application Priority Data

| Oct. 13, 2004 | (JP) | 2004-299307 |
| Nov. 18, 2004 | (JP) | 2004-335100 |
| Nov. 18, 2004 | (JP) | 2004-335101 |
| Feb. 16, 2005 | (JP) | 2005-038963 |
| Feb. 16, 2005 | (JP) | 2005-038964 |
| Apr. 20, 2005 | (JP) | 2005-121896 |
| Apr. 20, 2005 | (JP) | 2005-121897 |
| Apr. 22, 2005 | (JP) | 2005-124865 |

(51) Int. Cl.
*G06K 19/06* (2006.01)

(52) U.S. Cl. .......................... 235/492; 235/493
(58) Field of Classification Search .................. 235/492, 235/493, 486, 487, 451; 257/724, 423, 664, 257/659
See application file for complete search history.

(56) References Cited

U.S. PATENT DOCUMENTS
5,515,059 A    5/1996    How et al.
(Continued)

FOREIGN PATENT DOCUMENTS
EP    1 484 816 A1    12/2004
(Continued)

OTHER PUBLICATIONS

Nobuyuki, Teraura, "Development and application of Radio Frequency Idetification—the future of Radio Frequency IC tag", (first edition), p. 121, Feb. 28, 2003, CMC Publishing Co., Ltd., (with partial English translation).

(Continued)

*Primary Examiner* — Thien M Le
(74) *Attorney, Agent, or Firm* — Oblon, Spivak, McClelland, Maier & Neustadt, L.L.P.

(57) ABSTRACT

A non-contact IC label comprising an electrically insulating first substrate; an electrically connected antenna coil and IC chip provided on one surface of said substrate; a magnetic layer provided on said one surface of said substrate so as to cover said antenna coil and said IC chip, a first adhesive layer provided on said magnetic layer, an electrically insulating second substrate provided on said first adhesive layer, a second adhesive layer provided on said second substrate, a release paper provided on said second adhesive layer, and an overlay material provided on a third adhesive layer on the other surface of said first substrate.

3 Claims, 45 Drawing Sheets

U.S. PATENT DOCUMENTS

| | | | |
|---|---|---|---|
| 5,912,622 A | 6/1999 | Endo et al. | |
| 6,048,601 A | 4/2000 | Yahagi et al. | |
| 6,146,773 A | 11/2000 | Kaule | |
| 6,186,398 B1 | 2/2001 | Kato et al. | |
| 6,229,444 B1 | 5/2001 | Endo et al. | |
| 6,371,380 B1 | 4/2002 | Tanimura | |
| 6,861,731 B2 * | 3/2005 | Buijsman et al. | 257/664 |
| 6,917,526 B2 * | 7/2005 | Ajioka et al. | 361/816 |
| 7,088,304 B2 | 8/2006 | Endo et al. | |
| 7,161,542 B2 | 1/2007 | Endo et al. | |
| 7,192,628 B2 | 3/2007 | Burrows | |
| 7,315,248 B2 | 1/2008 | Egbert | |
| 7,336,221 B2 * | 2/2008 | Matsuo et al. | 342/175 |
| 7,405,709 B2 * | 7/2008 | Takahashi et al. | 343/788 |
| 7,451,934 B2 * | 11/2008 | Takahashi et al. | 235/492 |
| 2001/0026016 A1 | 10/2001 | Yoshida et al. | |
| 2002/0056758 A1 | 5/2002 | Stenzel et al. | |
| 2003/0117336 A1 | 6/2003 | Droz | |
| 2003/0179151 A1 * | 9/2003 | Senba et al. | 343/895 |
| 2003/0190498 A1 | 10/2003 | Fujieda et al. | |
| 2007/0095913 A1 * | 5/2007 | Takahashi et al. | 235/451 |
| 2007/0252771 A1 * | 11/2007 | Maezawa et al. | 343/841 |
| 2008/0042266 A1 * | 2/2008 | Kagaya et al. | 257/724 |
| 2008/0191028 A1 * | 8/2008 | Kagaya et al. | 235/492 |

FOREIGN PATENT DOCUMENTS

| | | |
|---|---|---|
| JP | 4-27599 | 1/1992 |
| JP | 5-30874 | 4/1993 |
| JP | 6-344692 | 12/1994 |
| JP | 7-306264 | 11/1995 |
| JP | 9-12954 | 1/1997 |
| JP | 10-162260 | 6/1998 |
| JP | 10-261516 | 9/1998 |
| JP | 11-16756 | 1/1999 |
| JP | 11-45317 | 2/1999 |
| JP | 11-216627 A | 8/1999 |
| JP | 11-348110 A | 12/1999 |
| JP | 11-352243 A | 12/1999 |
| JP | 2000-90637 | 3/2000 |
| JP | 2000-113142 | 4/2000 |
| JP | 2000-148947 | 5/2000 |
| JP | 2000-276565 | 10/2000 |
| JP | 2000-311226 | 11/2000 |
| JP | 2000-331135 | 11/2000 |
| JP | 2001-291816 | 10/2001 |
| JP | 2001-312709 | 11/2001 |
| JP | 2002-132153 A | 5/2002 |
| JP | 2002-208876 A | 7/2002 |
| JP | 2002-232321 A | 8/2002 |
| JP | 2002-271127 | 9/2002 |
| JP | 2002-290131 | 10/2002 |
| JP | 2002-298095 | 10/2002 |
| JP | 2002-298116 | 10/2002 |
| JP | 2002-324221 | 11/2002 |
| JP | 2002-325013 | 11/2002 |
| JP | 2003-22912 | 1/2003 |
| JP | 2003-36431 | 2/2003 |
| JP | 2003-068775 | 3/2003 |
| JP | 2003-099747 | 4/2003 |
| JP | 2003-108966 | 4/2003 |
| JP | 2003-519424 A | 6/2003 |
| JP | 2003-317952 | 11/2003 |
| JP | 2003-331243 | 11/2003 |
| JP | 2004-47701 | 2/2004 |
| JP | 2004-54337 | 2/2004 |
| JP | 2004-94522 | 3/2004 |
| JP | 2004-355192 | 12/2004 |
| JP | 2005-11227 | 1/2005 |
| JP | 2005-327939 | 11/2005 |
| WO | WO 01/80173 A1 | 10/2001 |
| WO | WO 02/50951 A1 | 6/2002 |
| WO | WO 03/030300 A1 | 4/2003 |
| WO | WO 2006/041033 | 4/2006 |

OTHER PUBLICATIONS

U.S. Appl. No. 11/720,299, filed May 25, 2007, Kagaya, et al.
Japanese Office Action issued on Feb. 1, 2011 in corresponding Japanese Application No. 2005-121896 (with an English Translation).
Japanese Office Action issued on Feb. 1, 2011 in corresponding Japanese Application No. 2005-121897 (with an English Translation).
Japanese Notice of Allowance issued on Feb. 1, 2011 in corresponding Japanese Application No. 2005-124865 (with an English Translation).
Office Action issued Nov. 30, 2010 in Japan Application No. 2005-124865 (With English Translation).
Office Action issued Nov. 30, 2010 in Japan Application No. 2005-121896 (With English Translation).
Office Action issued Nov. 30, 2010 in Japan Application No. 2005-121897 (With English Translation).
Notice of Allowance dated Jun. 2, 2011, in co-pending U.S. Appl. No. 11/720,299, filed Nov. 15, 2007.

* cited by examiner

US 8,042,742 B2

NONCONTACT IC LABEL AND METHOD AND APPARATUS FOR MANUFACTURING THE SAME

TECHNICAL FIELD

The present invention relates to a non-contact data reception/transmission unit such as a non-contact IC label that can receive information from outside and send information to the outside through the medium of electromagnetic waves, such as information storage media of an RFID (Radio Frequency IDentification) application.

The present invention relates to a semiconductor device and a manufacturing method therefor, and particularly relates to a semiconductor device in which a semiconductor substrate consisting of an IC chip mounted on a base substrate is sealed in resin and its manufacturing method.

The present application claims priority on Japanese Patent Application No. 2004-299307, filed Oct. 13, 2004; Japanese Patent Application No. 2004-335100, filed Nov. 18, 2004; Japanese Patent Application No. 2004-335101, filed Nov. 18, 2004; Japanese Patent Application No. 2005-038963, filed Feb. 16, 2005; Japanese Patent Application No. 2005-038964, filed Feb. 16, 2005; Japanese Patent Application No. 2005-121896, filed Apr. 20, 2005; Japanese Patent Application No. 2005-121897, filed Apr. 20, 2005; and Japanese Patent Application No. 2005-124865, filed Apr. 22, 2005, the contents of which are incorporated herein by reference.

BACKGROUND ART

As an IC label used for RFID, there are conventionally known identification IC labels consisting of an electrically connected antenna coil and an IC chip on which information is stored.

When these IC labels receive electromagnetic waves from a reader/writer, electromotive force is generated in the antenna coil by a resonance action, the IC chip in the IC label is activated by the electromotive force, information in the chip is converted to a signal, and this signal is transmitted from the antenna coil of the IC label.

The signal sent from the IC label is received by the antenna of the reader/writer and sent to a data processing device through a controller, where data processing such as identification is performed.

In order for these IC labels to operate, the electromagnetic waves transmitted from the reader/writer must be sufficiently picked up by antenna coil of the IC label and electromotive force not below the operational electromotive force of the IC chip must be induced. However, when IC labels are attached to the surfaces of metal articles, on the surface of metal articles, the flux becomes parallel to the surface of the metal articles. Because of this, the problem arises of the flux that crosses the antenna coil of the IC label decreasing, causing the induced electromotive force to drop below the actuation electromotive force of the IC chip, so that the IC chip does not operate (for example, refer to nonpatent document 1).

FIG. 4 is a mimetic diagram showing the flow of flux in the case of an IC label placed on the surface of a metal article. Since the flux 142 generated from the reader/writer 141 becomes parallel to the surface of the metal article 143, the flux that passes the antenna coil 145 of the IC label 144 installed on the surface of the metal object article 143 decreases, and since the electromotive force induced by the antenna coil 145 declines, the IC chip 146 stops operating.

In order to enable operation even when installed on a metal article, a method has been proposed to increase the induced electromotive force by winding an antenna coil around a ferrite core, arranging the antenna coil so that its axial center may become parallel to the direction of the flux of the surface of the metal article, and increasing the flux which passes through an antenna coil surface to increase the induced electromotive force (for example, refer to patent document 1).

FIG. 5 is a perspective view of the IC tag according to the embodiment of patent document 1, showing an antenna coil 152 wrapped around the perimeter of a square-shaped ferrite core 156, and at the portion where the antenna coil 152 is not wrapped, an IC chip 153 and a condenser 154 are mounted on the substrate 155 via the substrate 155. If the flat portion of the square-shaped ferrite core 156 (underside of FIG. 5) is attached to the surface of a metal article, flux parallel to the surface of the metal article passes through the ferrite core 156. Since it passes perpendicular to the antenna coil 152, the necessary induced voltage occurs and the IC chip 153 operates.

On the other hand, it has also been proposed that by forming a flat antenna coil and causing flux to pass a magnetic core member provided on the underside of the antenna coil, the flux is made to pass through the flat antenna coil to generate induced electromagnetic force in the magnetic core member, and by providing a conductive member on the underside of the antenna coil, the impact of the article on which the IC label is to be installed on the IC label is inhibited (for example, refer to patent document 2).

FIG. 6 is a sectional drawing showing the embodiment of the invention disclosed in patent document 2. The antenna coil 161 for IC labels consists of a conductor 161a spirally wound within a flat surface, and is equipped with a plate-like or sheet-like magnetic core member 163 glued to one side of the antenna coil 161 and a conductive member 164 on the underside of the magnetic core member 163. The magnetic core member 163 traverses a portion of the antenna coil 161 on the other surface of the substrate on which the antenna coil 161 is provided, being laminated so that one end portion goes outside of the antenna coil 161, and the other end portion comes to the center portion (inside) 162 of the antenna coil 161.

By laminating the magnetic core member 163 in this way, flux enters one end portion of the magnetic core member 163 and leaves from the other end portion, so that the flux that left the other end portion passes through the inside of the antenna coil 161 and induced electromotive force occurs in the antenna coil 161 formed by the conductor 161a.

For this reason, even if the IC label is attached to the surface of an article 165 and the flux direction around the IC label becomes parallel with the surface of the antenna coil 161, the flux passes through the inside of the antenna coil 161. Since sufficient voltage to operate an IC chip is induced by this, the IC chip reliably operates.

Furthermore, in this embodiment, since the conductive member 164 is laminated and bonded so as cover the magnetic core member 163 on the other surface of the substrate on which the antenna coil 161 was formed, the conductive member 164 screens the passage of electromagnetic waves to an article. Therefore, irrespective of whether or not the article 165 is metal, the antenna coil 161 becomes less affected by it, and even if the surface of the article 165 is formed with metal, losses due to eddy currents produced in the metal surface do not develop, and so the RFID tag reliably functions even if attached to the metal article 165.

However, in the method disclosed in patent document 1, enlarging the diameter of the antenna coil 152 in order to increase the flux that passes the antenna coil 152 in order to increase the induced electromotive force gives rise to the problem of increasing the thickness of the IC label.

On the other hand, in the method disclosed in patent document 2, the problem arises of increased thickness of the IC label due to providing a magnetic core member and a conductive member on one surface of the substrate.

In recent years there has been use of RFID media such as non-contact IC tags, non-contact IC labels and non-contact IC cards that enable writing and reading of information in a non-contact state for information control, payments and control of merchandise and the like. These RFID media are quickly becoming popular since they enable writing and reading of information in a non-contact state and, depending on the specifications, can perform writing and reading of information simultaneously to a plurality of RFID media.

FIGS. 17A and 17B are schematic diagrams showing an example of a conventional non-contact IC tag, with FIG. 17A being a plan view showing the internal structure, and FIG. 17B being a sectional drawing along line C-C in FIG. 17A.

The non-contact IC tag 2100 of this example includes an inlet 2110 in which an antenna 2102 is formed on a resin sheet 2101 and an IC chip 2103 is mounted, and a surface sheet 2112 glued to the top of the inlet 2110 with an adhesive 2111.

An antenna 2102 is formed on the resin sheet 2101 in a coiled form, both ends thereof being connected to the IC chip 2103 by the contacts 2104. Moreover, writing and read-out of information in a non-contact state are possible for the IC chip 2103 through the antenna 2102. Moreover, the surface sheet 2112 consists of a resin film and protects the IC chip 2103 by being glued to the side of the inlet 2110 in which the IC chip 2103 is mounted.

When an information writing/reading device (not shown) provided externally is brought near the non-contact IC tag 2100, a current flows into the antenna 2102 by the electromagnetic induction from the information writing/reading device, and this current is supplied from the antenna 2102 to the IC chip 2103 via the contacts 2104. Thereby, in a non-contact state, information is written from the information writing/reading device to the IC chip 2103, and information written on the IC chip 2103 is read by the information writing/reading device.

Here, as with the non-contact IC tag 2100, in the semiconductor substrate in which an IC chip is mounted on a base substrate, the IC chip is protected by gluing a protecting member such as a surface sheet to the surface on which the IC chip is mounted.

Moreover, in a semiconductor substrate on which an IC chip is mounted, technology has been devised in which the surface on which the IC chip is not mounted is covered with a resin, and then the surface of the semiconductor substrate on which the IC chip is mounted is covered with a resin, thereby protecting the IC chip (for example, refer to patent document 3). In this technique, in a semiconductor substrate on which an IC chip is mounted, the surface on which the IC chip is not mounted is first covered with a resin. Then, a metal mold is provided on top of the semiconductor substrate, and by injecting resin into this metal mold, the surface of the semiconductor substrate on which the IC chip is mounted is covered by the resin. Thereby, the semiconductor substrate on which the IC chip is mounted becomes sealed by the resin so that, compared to a protecting member such as a surface sheet being glued to the top of the semiconductor substrate protection of the IC chip can be reinforced.

Moreover, technology has also been conceived to manufacture RFID tags by fixing to a metal mold a substrate on whose base substrate an antenna is wound and an IC chip is mounted and injecting resin into the metal mold, whereby the substrate on whose base substrate the antenna is wound and the IC chip is mounted is sealed (for example, refer to patent document 4). Compared to a protecting member such as a surface sheet being glued to the top of the semiconductor substrate, this technology can reinforce protection of the IC chip.

However, in protecting the IC chip by supplying resin onto a semiconductor substrate on whose base substrate the IC chip is mounted and sealing the semiconductor substrate with the resin as described above, at the juncture when resin is supplied on the semiconductor substrate, the IC chip may be damaged and the connections between the wiring formed on the base substrate and the IC chip may break from the pressure and heat of the resin supply.

In addition, in a semiconductor device whose semiconductor substrate, on whose base substrate an IC chip is mounted, is sealed with resin, the IC chip may be damaged and the connections between the wiring formed on the base substrate and the IC chip may break from pressure being applied to the IC chip due to expansion of the resin from changes in the surrounding environment after manufacture, particularly a rise in the ambient temperature.

In addition, when affixing an IC label on a metal container and the like, since repeated reaffixing is possible any number of times, a method of using ferromagnetic materials (such as a magnet) having spontaneous magnetization characteristics instead of an adhesive has been devised.

However, since the magnetic moment of the ferromagnetic material having spontaneous magnetization characteristics is strong, there is strong magnetic isotropy in this ferromagnetic material. Accordingly, in the IC label in which a magnetic layer consisting of a ferromagnetic material is provided so as to be in contact with the antenna, when picking up flux emitted from the information writing reading device, variations arise in the degree of flux capture, giving rise to the problem of a drop in the reading rate and reading distance.

When the thickness of the IC label increases, there is a problem of the flexibility of the IC label being impaired. When the flexibility of the IC label is impaired, it is difficult to affix the IC label on an article having a curved surface. In addition, when affixing the IC label to an article or separating it from an article, immoderate force is applied to the IC label, giving rise to the possibility of damaging the antenna or the IC chip.

Non-contact data reception/transmission units such as an IC label are used for such purposes as goods tracking.

In particular, if non-contact data reception/transmission units are applied to tracking of goods of many types and machine parts with many components, since the good itself can be identified without viewing, the efficiency of such operations as selection of an item and inventory control can be raised, and so it is extremely effective.

In the case of using a non-contact data reception/transmission unit for tracking of a good, it is directly affixed to the good to be tracked. Therefore, depending on the use of an article, the non-contact data reception/transmission unit may be damaged by an external impact, causing its communication facility to be impaired. Therefore, a non-contact data reception/transmission unit has been proposed with a structure able to withstand external impacts by providing a protective construction such as housing the inlet in a case, or covering it with resin.

As methods of manufacturing the non-contact data reception/transmission unit with such a structure, the following are given (for example, refer to patent document 5).

For example, a method of obtaining a disk-like non-contact data reception/transmission unit has been given in which a raw sheet and a cover sheet of the same material are bonded together with thermocompression bonding or a resin adhesive and the like so as to provide an inlet on the raw sheet and cover the inlet on this raw sheet, after which the layered product including the raw sheet, inlet and cover sheet is stamped into a circle in the laminating direction, with the inlet embedded in resin (hereinafter referred to as "the first method" in order to simplify the explanation).

Also, a method of obtaining a non-contact data reception/transmission unit formed to a predetermined shape with a metal die has been given in which an inlet is inserted in a metal mold for injection molding, after which melted thermoplastic resin is made to flow thereinto or a thermosetting resin is made to flow thereinto and heated, thereby embedding the inlet in the resin (hereinafter referred to as "the second method" in order to simplify the explanation).

Incidentally, in the first method, since a minimum thickness is required to be able to withstand the tension and pressure when the raw sheet is stamped into a disk, there is the problem that it is difficult to make the non-contact data reception/transmission unit smaller in thickness. In addition, since there is no portion that absorbs the thickness of the IC chip in the raw sheet and the cover sheet, there is the problem of increased pressure load on the IC chip. Moreover, since the adhesion of the raw sheet and the cover sheet is poor, as a result of forming by stamping, the joining end faces of both end up being exposed, and so when external pressure is applied, the raw sheet and the cover sheet may peel apart, exposing the inlet.

Furthermore, water and chemicals can easily seep inside from the joining end face of the raw sheet and the cover sheet, so that non-contact data reception/transmission units manufactured by this method have inferior water resistance and chemical resistance.

Moreover, in the second method, excessive pressure is applied to the inlet at the time of injection molding, and so there is the risk of damaging the IC chip or the antenna. Also, when the thickness of the base substrate is made thin in order to make a thin non-contact data reception/transmission unit in this method, at the juncture when resin is made to flow into the metal mold, cracking occurs in the base substrate due to the pressure of the resin, and so it is difficult to be made smaller in thickness.

[Patent Document 1] Japanese Unexamined Patent Application No. 2003-317052
[Patent Document 2] Japanese Unexamined Patent Application No. 2003-108966
[Patent Document 3] Japanese Unexamined Patent Application No. 2003-68775
[Patent Document 4] Japanese Unexamined Patent Application No. 2002-298116
[Patent Document 5] Japanese Unexamined Patent Application No. 2003-331243
[Non-patent Document I] TERAURA, Nobuyuki. "Development and Application of RF Tags: The Future of Wireless IC Chips", 1st ed., CMC Publishing, 28 Feb. 2003, p 121, FIG. 2.

DISCLOSURE OF THE INVENTION

The present invention was achieved in view of the above circumstances, and has as its object to provide a non-contact IC label that restrains an increase in thickness of the IC label and that can be used even when placed on a metal article by having an electromotive force induced that sufficiently exceeds the actuation electromotive force of its IC chip.

In order to solve the aforementioned problems, the present invention provides a non-contact IC label including an electrically insulating first substrate; an electrically connected antenna coil and IC chip provided on one surface of the first substrate; a magnetic layer provided on the one surface of the first substrate so as to cover the antenna coil and the IC chip, a first adhesive layer provided on the magnetic layer, an electrically insulating second substrate provided on the first adhesive layer, a second adhesive layer provided on the second substrate, a release paper provided on the second adhesive layer, and an overlay material provided on a third adhesive layer on the other surface of the first substrate.

According to the aforementioned constitution, on one surface of the first substrate, since flux is picked up by the antenna coil through the magnetic layer by the magnetic layer being formed so as to cover the antenna coil and the IC chip provided on this substrate, the antenna coil can be made to generate sufficient induced electromotive force to operate the IC chip. Moreover, the magnetic layer can be formed to an extent that slightly exceeds the thickness of the antenna coil or the IC chip, so that the combined thickness of the magnetic layer, the antenna coil and the IC chip can be made thinner than a conventional non-contact IC label.

The magnetic layer may consist of an organic in which a magnetic powder or magnetic flakes is/are dispersed. Moreover, the magnetic layer may be formed by a coating method or a printing method.

Thereby gaps formed by the antenna coil or the IC chip can be easily filled efficiently without causing damage to the antenna coil or the IC chip.

Moreover, the present invention provides a method of manufacturing a non-contact IC label including at least: a first supply step of supplying in the lengthwise direction a first continuous sheet including a second adhesive layer; a second substrate, a first adhesive layer and a backing paper stacked in that order on one surface of a long release paper; an adhesive layer exposure step of removing the backing paper from the first continuous sheet prepared in the first supply process to expose the first adhesive layer; an inlet attaching step of successively attaching inlets including an electrically connected antenna coil and IC chip provided on one surface of an electrically insulating first substrate and a magnetic layer provided so as to cover the antenna coil and the IC chip on the exposed surface of the first adhesive layer prepared in the adhesive layer exposure step via the magnetic layer; a second supply step of supplying a second continuous sheet including a backing paper stacked on a surface of a long overlay material via a third adhesive layer in the lengthwise direction thereof; a bonding step of removing the backing paper from the second continuous sheet unrolled in the second supply step and bonding the exposed third adhesive layer with the other surface of the first substrate; and a die-cut step of punching out a region to be the IC label from the laminated body formed in the bonding step.

According to the aforementioned constitution, the process of supplying the second substrate with the attached release paper while removing the backing paper, feeding the IC inlets one at a time, and fitting the IC inlets at the predetermined position on the second substrate can be performed automatically with high accuracy without relying on manual operation. Furthermore, since IC labels can be punched out in-line after supplying the overlay material while removing the backing paper and then bonding the overlay material to the other surface of the first substrate large quantities of IC labels can be manufactured efficiently and with high quality.

The present invention also provides an apparatus for manufacturing a non-contact IC label provided with at least: a first supply means that supplies in the lengthwise direction a first continuous sheet including a second adhesive layer, a second substrate, a first adhesive layer and a backing paper stacked in that order on one surface of a long release paper; an adhesive layer exposing means that removes the backing paper to expose the first adhesive layer; an inlet attaching means that successively attaches inlets including an electrically connected antenna coil and IC chip provided on one surface of an electrically insulating first substrate and a magnetic layer provided so as to cover the antenna coil and the IC chip on the exposed surface of the first adhesive layer via the magnetic layer; a second supply means that supplies a second continuous sheet including a backing paper stacked on a surface of a long overlay material via a third adhesive layer in the lengthwise direction thereof; a bonding means that removes the backing paper of the second continuous sheet and bonds the exposed third adhesive layer with the other surface of the first substrate; and a die-cut means that punches out a region to be the IC label from the laminated body formed in the bonding means.

According to the above constitution, the function of supplying the second substrate with the attached release paper while removing the backing paper, feeding the IC inlets one at a time, attaching the IC inlets at the predetermined position on the second substrate, bonding the overlay material with its backing paper removed to the other surface of the second substrate and then punching out the IC labels in-line can be compactly configured, and so a comparatively inexpensive apparatus is obtained.

The present invention provides a semiconductor device provided with an inlet including a base substrate and an antenna and an IC chip provided on one surface of the base substrate and electrically connected to each other; a magnetic layer disposed so as to cover the antenna and the IC chip constituting the inlet; and a case made of resin provided so as to envelop the inlet with the disposed magnetic layer.

According to the aforementioned constitution, since external impacts can be absorbed by the magnetic layer, vibration of the antenna and the IC chip constituting the inlet due to external impacts can be prevented so that breakage of the antenna and the IC chip can be effectively prevented. Also, since the case made of resin is provided so as to envelop the inlet with the disposed magnetic layer, and the magnetic layer is provided so as to cover the surface of the base substrate on which the antenna and the IC chip are provided, when the semiconductor device of the present invention is bent, a force is applied uniformly to the entire inlet with the disposed magnetic layer, and so the semiconductor device of the present invention is one having flexibility. Furthermore, since the magnetic layer that is provided so as to cover the antenna and the IC chip functions as a magnetic body, flux is picked up by the antenna through the magnetic layer. Therefore, by the electromagnetic induction from the information writing/reading device, the antenna can be made to generate sufficient induced electromotive force to operate the IC chip. Also, since the pressure directly applied to the IC chip by resin supply can be absorbed by the magnetic layer, damage to the IC chip and disconnection of the antenna and the IC chip provided on the base substrate at the contacts can be effectively prevented.

The present invention provides a semiconductor device provided with an inlet including a base substrate and an antenna and an IC chip provided on one surface of the base substrate and electrically connected to each other; a magnetic layer disposed so as to cover the other surface of the base substrate constituting the inlet; and a case made of resin provided so as to envelop the inlet with the disposed magnetic layer.

According to the aforementioned constitution, since external impacts can be absorbed by the magnetic layer, vibration of the antenna and the IC chip constituting the inlet due to external impacts can be prevented so that breakage of the antenna and the IC chip can be effectively prevented. Also, since the case made of resin is provided so as to envelop the inlet with the disposed magnetic layer, the magnetic layer is provided so as to cover the surface of the base substrate opposite the surface on which the antenna and the IC chip are provided, and gaps formed by the antenna and the IC chip are filled by a second resin member, when the semiconductor device of the present invention is bent, a force is applied uniformly to the entire inlet with the disposed magnetic layer, and so the semiconductor device of the present invention is one having flexibility. Furthermore, since the magnetic layer that is provided so as to cover the surface of the base substrate opposite the surface on which the antenna and the IC chip are provided functions as a magnetic body, flux is picked up by the antenna through the magnetic layer. Therefore, by the electromagnetic induction from the information writing/reading device the antenna can be made to generate sufficient induced electromotive force to operate the IC chip.

The magnetic layer may be a composite body consisting of a bonding agent and a magnetic powder or magnetic flakes.

According to the aforementioned constitution, gaps formed by the antenna and the IC chip can be efficiently and easily filled by the composite body that makes up the magnetic layer without damaging the antenna and the IC chip.

The present invention provides a method of manufacturing a semiconductor device having a step of forming an inlet by providing an antenna and an IC chip on a surface of a base substrate and electrically connecting to each other; a step of disposing a magnetic layer so as to cover the antenna and the IC chip constituting the inlet; a step of molding a first resin member which has a recessed portion that fits at least a portion of the inlet with the magnetic layer for covering at least a portion of the magnetic layer within the inlet with the magnetic layer; a step of fitting at least a portion of the magnetic layer of the inlet with the magnetic layer in the recessed portion; and a step of supplying resin on the inlet with the magnetic layer fitted into the first resin member, molding a second resin member from the resin, covering by the second resin member a portion within the inlet with the magnetic layer not covered by the first resin member, molding a case from the first resin member and the second resin member, and enveloping the inlet with the magnetic layer by the case.

According to the aforementioned constitution, after housing the inlet with the magnetic layer so as to house at least a portion of the magnetic layer in the recessed portion provided on the first resin member, resin is supplied to the side of the inlet on which the antenna and the IC chip are not provided so as to cover the portion not covered by the first resin member, the pressure directly applied to the IC chip by the resin supply decreases, and so damage to the IC chip and disconnection of the antenna and the IC chip provided on the base substrate at the contacts can be effectively prevented. In addition, since the pressure directly applied to the IC chip by the resin supply can be absorbed by the magnetic layer, damage to the IC chip and disconnection of the antenna and the IC chip provided on the base substrate at the contacts can be effectively prevented.

The present invention provides a method of manufacturing a semiconductor device having a step of forming an inlet by providing an antenna and IC chip on a surface of a base substrate and electrically connecting to each other; a step of disposing a magnetic layer so as to cover the other surface of the base substrate constituting the inlet; a step of molding a first resin member which has a recessed portion that fits at least a portion of the magnetic layer disposed on the other surface of the inlet for covering at least a portion of the magnetic layer of the inlet with the magnetic layer; a step of fitting at least a portion of the magnetic layer of the inlet with the magnetic layer in the recessed portion; and a step of supplying resin on the inlet with the magnetic layer fitted into the first resin member, molding a second resin member by the resin, covering by the second resin member a portion of the inlet with the magnetic layer not covered by the first resin member, molding a case made of the first resin member and the second resin member, and enveloping the inlet with the magnetic layer by the case.

According to the aforementioned constitution, after housing the inlet with the magnetic layer so as to house at least a portion of the magnetic layer in the recessed portion provided on the first resin member, resin is supplied to the side of the inlet on which the antenna and the IC chip are mounted so as to cover the portion not covered by the first resin member, and the magnetic layer functions as a shock-absorbing material, and the pressure directly applied to the IC chip by the resin supply can be dispersed by the magnetic layer, so that damage to the IC chip and disconnection of the antenna and the IC chip provided on the base substrate at the contacts can be effectively prevented.

The present invention provides a non-contact data reception/transmission unit including an inlet consisting of a base substrate and an antenna and an IC chip provided on one surface of and connected to each other; and a magnetic layer disposed so as to cover the antenna and the IC chip constituting the inlet.

According to the aforementioned constitution, even when the non-contact data reception/transmission unit is in contact with an article including at least metal, by the formation of the magnetic layer so as to cover the antenna and the IC chip constituting the inlet, the antenna can be made to generate sufficient induced electromotive force to operate the IC chip since flux is picked up by the antenna through the magnetic layer. Moreover, the magnetic layer, by being formed so as to cover the antenna and the IC chip, also exhibits the function of a protective layer of the antenna and the IC chip.

The non-contact data reception/transmission unit may be further equipped with a release paper provided on the inlet via the magnetic layer, and an overlay material provided on the other surface of the base substrate constituting the inlet via the adhesive layer.

According to the aforementioned constitution since the inlet with the magnetic layer is surrounded by the release paper and the adhesive layer, adhesion of dust and dirt to the magnetic layer is prevented. And by having the magnetic layer make contact with an article including at least metal by means of the adhesive layer newly exposed by removing the release paper, a non-contact data reception/transmission unit can be affixed to the article. Since the overlay material is provided on the other surface of the base substrate constituting the inlet via the adhesive layer, a pattern can be provided and various information can be printed on the overlay material.

The magnetic layer may be one consisting of a bonding agent and a magnetic powder or magnetic flakes. In this case, the magnetic powder or magnetic flakes which constitute the magnetic layer can form it without scattering. Moreover, each gap formed within the antenna and between the antenna and the IC chip can be filled easily and efficiently without damaging the antenna and the IC chip.

The magnetic layer may further contain an adhesive. In this case, the binding property in the magnetic powder or the magnetic flakes can be improved, enabling attachment to an article. And if a material having flexibility is chosen for the material of the base substrate and the magnetic layer, a configuration also becomes possible that can be attached to an article with a curved surface shape. Furthermore, when a bonding function is sought, an adhesive layer may be newly prepared.

In particular, it is preferable for the bonding function of the adhesive layer surrounding the inlet with a magnetic layer in the non-contact data reception'transmission unit to be duplicated to enable firm bonding to an article.

The magnetic layer may be formed by a coating method or a printing method. In this case, no damage is caused to the antenna or the IC chip, and gaps formed by the antenna or the IC chip can be easily and efficiently filled.

The present invention provides a method of manufacturing a non-contact data reception/transmission unit having at least a step A1 of providing an antenna and an IC chip so as to be connected on one surface of a base substrate; a step A2 of providing a magnetic layer so as to cover the antenna and the IC chip; and a step A3 of drying and hardening the magnetic layer In step A1, since the antenna and the IC chip are provided on one of the surfaces of the base substrate, the magnetic layer may cover only one surface of the base substrate. In step A2, since the higher of the antenna and the IC chip may be covered to be slightly concealed, there is no need to make the magnetic layer thicker than need be. And in step A3, since the magnetic layer becomes firm by drying and hardening of the magnetic layer the required amount of the magnetic layer can be restrained to a minimum and the antenna and the IC chip can be firmly affixed to the base substrate.

The present invention provides a method of manufacturing a non-contact data reception/transmission unit having at least a step B1 of supplying in the lengthwise direction thereof a first continuous sheet including a backing paper stacked on one side of a long release paper; a step B2 of removing the backing paper from the first continuous sheet prepared in the step B1 to expose the release paper; a step B3 of, using an inlet with a magnetic layer in which on an inlet comprising a base substrate and an antenna and IC chip provided on one surface of the base substrate and connected to each other a magnetic layer is provided so as to cover the antenna and the IC chip, successively attaching the inlet to the exposed surface of the release paper prepared in the step B2, so that the magnetic layer contacts to the exposed surface; a step B4 of supplying in the lengthwise direction thereof a second continuous sheet in which a backing paper is stacked on one surface of a long overlay material via an adhesive layer; a step B5 of removing the backing paper from the second continuous sheet unrolled in step B4 and bonding the exposed adhesive layer with the other surface of the base substrate; and a step B6 of punching out a region to be the non-contact data reception/transmission unit from the laminated body formed in the step B5.

According to the aforementioned constitution, the process of supplying the release paper while removing the backing paper, feeding the inlets with magnetic layer one at a time, and fitting the inlets with magnetic layer at the predetermined position on the release paper can be performed automatically with good mass productivity without relying on manual operation. Furthermore, since non-contact data reception/transmission units can be punched out in-line after supplying the overlay material while removing the backing paper and then bonding the overlay material to the other surface of the base substrate, large quantities of non-contact data reception/transmission units can be manufactured efficiently and at low cost.

The present invention provides an apparatus for manufacturing a non-contact data reception/transmission unit having at least a first means that supplies in the lengthwise direction thereof a first continuous sheet in which a backing paper is stacked on one surface of a long release paper; a second means that removes the backing paper to expose the release paper; a third means in which using an inlet with a magnetic layer, in which on an inlet including a base substrate and an antenna and an IC chip provided on one surface of the base substrate and connected to each other, a magnetic layer is provided so as to cover the antenna and the IC chip, the magnetic layer is successively attached to the exposed surface of the release paper prepared in the second means so as to make contact; a fourth means that supplies in the lengthwise direction thereof a second continuous sheet in which a backing paper is stacked on one surface of a long release paper via an adhesive layer; a fifth means that removes the backing paper from the second continuous sheet and bonds the exposed adhesive layer with the other surface of the base substrate; and a sixth means that punches out a region to be the non-contact data reception/transmission unit from the laminated body formed in the fifth means.

According to the aforementioned constitution, since there is provided a function to punch out non-contact data reception/transmission units after supplying the release paper while removing the backing paper, feeding inlets with a magnetic layer one at a time, attaching the IC inlets with a magnetic layer to the predetermined position on the release paper and furthermore bonding an overlay material with its backing paper removed to the other surface of the base substrate an apparatus is obtained excellent in automation and high-volume production.

The present invention provides a non-contact data reception/transmission unit provided with an inlet including a base substrate and an antenna and an IC chip provided on one surface of the base substrate and connected to each other, and a magnetic layer disposed so as to cover the antenna and the IC chip constituting the inlet, the magnetic layer including in the thickness thereof a region α and a region β whose thicknesses do not affect the communication distance and a region γ whose thickness affects the communication distance, with the region γ being positioned between the region α and the region β.

According to the aforementioned constitution, even when the first non-contact data reception/transmission unit is in contact with an article including at least metal, by disposing the magnetic layer so as to cover either one of or both of the antenna and the IC chip constituting the inlet, the antenna can be made to generate sufficient induced electromotive force to operate the IC chip since flux is picked up by the antenna through the magnetic layer. Moreover, the magnetic layer, by being formed so as to cover either one of or both of the antenna and the IC chip, also exhibits the function of a protective layer of the antenna and the IC chip.

The region γ may be a range with the thickness of the coil portion constituting the antenna being the lower limit and the thickness of the IC chip being the upper limit.

In this case, in the region γ, the communication distance of the non-contact data reception/transmission unit can be set to a desired range by varying the thickness of the magnetic layer.

Also, the communication distance in the region γ may be one that increases monotonously with respect to the thickness of the magnetic layer.

In this case, in the region the communication distance of the non-contact data reception/transmission unit can be set to the desired range by varying the thickness of the magnetic layer.

The magnetic layer may be constituted from a filler including at least Sendust magnetic particulates and resin.

According to the aforementioned constitution, flux passes easier through the magnetic layer, and the flux is more easily picked up by the antenna than in the case of using other magnetic particulates.

The present invention provides a non-contact data reception/transmission unit including an inlet consisting of a base substrate and an antenna and an IC chip provided on one surface of the base substrate and connected to each other; a magnetic layer disposed on the other surface of the base substrate; and a ferromagnetic layer provided with a spontaneous magnetization characteristic disposed on the surface of the magnetic layer opposite the surface in contact with the base substrate.

According to the aforementioned constitution, it can be repeatedly attached to metal articles without using adhesive, and even when in contact with a metal article, the antenna can be made to generate sufficient induced electromotive force to operate the IC chip since flux is picked up by the antenna through the magnetic layer.

The present invention provides a non-contact data reception/transmission unit including an inlet consisting of a base substrate and an antenna and an IC chip provided on one surface of the base substrate and connected to each other; a magnetic layer disposed so as to cover the antenna and/or the IC chip constituting the inlet; and a ferromagnetic layer provided with a spontaneous magnetization characteristic disposed on the surface of the magnetic layer opposite the surface in contact with the antenna and/or the IC chip.

According to the aforementioned constitution, it can be repeatedly attached to metal articles without using adhesive, and even when in contact with a metal article, the antenna can be made to generate sufficient induced electromotive force to operate the IC chip since flux is picked up by the antenna through the magnetic layer.

The present invention provides a non-contact data reception/transmission unit including an inlet consisting of a base substrate and an antenna and an IC chip provided on one surface of the base substrate and connected to each other; a magnetic layer disposed on the other surface of the base substrate; a paramagnetic layer that does not magnetize disposed on the surface of the magnetic layer opposite the surface in contact with the base substrate; and a ferromagnetic layer provided with a spontaneous magnetization characteristic disposed on the surface of the paramagnetic layer opposite the surface in contact with the magnetic layer.

According to the aforementioned constitution, it can be repeatedly attached to metal articles without using adhesive, and even when in contact with a metal article, the antenna can be made to generate sufficient induced electromotive force to operate the IC chip since flux is picked up by the antenna through the magnetic layer. In addition, since a paramagnetic layer is disposed between the magnetic layer and the ferromagnetic layer, it can prevent the phenomenon arising of the magnetic layer taking on a spontaneous magnetization characteristic by the ferromagnetic layer over the course of time.

The present invention provides a non-contact data reception/transmission unit including an inlet consisting of a base substrate and an antenna and an IC chip provided on one surface of the base substrate and connected to each other; a magnetic layer disposed so as to cover the antenna and/or the IC chip constituting the inlet; a paramagnetic layer that does not magnetize disposed on the surface of the magnetic layer opposite the surface in contact with the antenna and/or IC chip; and a ferromagnetic layer provided with a spontaneous magnetization characteristic disposed on the surface of the paramagnetic layer opposite the surface in contact with the magnetic layer.

According to the aforementioned constitution, it can be repeatedly attached to metal articles without using adhesive, and even when in contact with a metal article, the antenna can be made to generate sufficient induced electromotive force to operate the IC chip since flux is picked up by the antenna through the magnetic layer. In addition, since a paramagnetic layer is disposed between the magnetic layer and the ferromagnetic layer, it can prevent the phenomenon arising of the magnetic layer taking on a spontaneous magnetization characteristic by the ferromagnetic layer over the course of time.

The present invention provides a non-contact data reception'transmission unit including an inlet consisting of a base substrate and an antenna and an IC chip provided on one surface of the base substrate and connected to each other, with the antenna is in a coiled form via the IC chip, and except for both ends thereof and the vicinity thereof a magnetic layer disposed on the base substrate so as to cover the antenna and the IC chip.

According to the aforementioned constitution, by disposing a magnetic layer on the base substrate so as to cover the antenna and the IC chip except for both ends of the antenna and the vicinity thereof, even with the non-contact data reception/transmission unit is in contact with an article containing at least metal, the antenna can be made to generate sufficient induced electromotive force to operate the IC chip since flux is picked up by the antenna through the magnetic layer. Moreover, the magnetic layer, by being formed so as to cover the antenna and the IC chip, also exhibits the function of a protective layer thereof. In addition, a portion of a conductive portion connecting both ends of the antenna can be provided on the surface of the magnetic layer opposite the surface in contact with the base substrate.

The present invention provides a non-contact data reception/transmission unit including an inlet consisting of a base substrate and an antenna and an IC chip provided on one surface of the base substrate and connected to each other, wherein the antenna is in a coiled form via the IC chip, and, except for both ends thereof and the vicinity thereof and the IC chip and the vicinity thereof, a magnetic layer is disposed on the base substrate so as to cover the antenna and the IC chip.

According to the aforementioned constitution, by disposing a magnetic layer on the base substrate so as to cover the antenna except for both ends thereof and the vicinity thereof, and the IC chip and the vicinity thereof, even when in contact with an article containing at least metal, the antenna can be made to generate sufficient induced electromotive force to operate the IC chip since flux is picked up by the antenna through the magnetic layer. Moreover, the magnetic layer is one having flat shaped magnetic particulates impregnated in resin. By adjusting the mix ratio of the magnetic particulates and the resin, the permeability of the magnetic layer can be raised and the insulation properties can be maintained. Therefore, the magnetic layer, by being formed so as to cover the antenna, also exhibits the function of a protective layer of them. In addition, a portion of the conductive portion connecting both ends of the antenna can be provided on the surface of the magnetic layer opposite the surface in contact with the base substrate. Even if the surface of the magnetic layer opposite the surface in contact with the base substrate or the surface of the base substrate opposite the surface in contact with the magnetic layer serves as the surface that bonds with an article, in the case of flexing the non-contact data reception/transmission unit in order to make contact with an article containing at least metal the side surfaces of the IC chip and the side surfaces of the magnetic layer are hindered from making contact, thereby preventing damage to the IC chip by their contact.

A portion of the conductive portion connecting both ends of the antenna can be provided on the surface of the magnetic layer opposite the surface in contact with the base substrate.

In this case, the magnetic layer is one having flat shaped magnetic particulates impregnated in resin. By adjusting the mix ratio of the magnetic particulates and the resin, the permeability of the magnetic layer can be raised and the insulation properties can be maintained. Thereby, the magnetic layer also serves as an element of an insulating film, and the conductive portion connects both end portions of the antenna, so there is no need to form a conductive portion on the coil portion of the antenna via the insulating film, resulting in fewer elements (layers, films, etc.) constituting the non-contact data reception/transmission unit. Because of this, in the case of flexing the non-contact data reception/transmission unit in order to make contact with an article containing at least metal, the elements easily follow the change in shape, and as a result, such problems as exfoliation between the elements can be prevented. In addition, in the manufacture of the non-contact data reception/transmission unit there is no need to form a conductive portion on the coil portion of the antenna via the insulating film in order to connect both ends of the antenna, so that manufacturing steps can be omitted, thereby cutting manufacturing costs.

A portion of the conductive portion may be provided inside of the magnetic layer.

Since the conductive portion for connecting both ends of the antenna is in this case covered by the magnetic layer, disconnection of the antenna by breakage of the conductive portion can be prevented.

The conductive portion may be made of a polymer ink containing a flexibilizer.

Since the flexibility of the conductive portion is improved in this case, even in the event of flexing the non-contact data reception/transmission unit in order to make contact with an article containing at least metal, impairment of the communication function of the non-contact data reception/transmission unit due to damage to the conductive portion can be prevented.

The present invention provides a non-contact data reception/transmission unit including an inlet consisting of a base substrate and an antenna and an IC chip provided on one surface of the base substrate and connected to each other, wherein except for the IC chip and the vicinity thereof, a magnetic layer is disposed on the base substrate so as to cover the antenna.

According to the aforementioned constitution, by disposing a magnetic layer on the base substrate so as to cover the antenna except for the IC chip and the vicinity thereof, even when the non-contact data reception/transmission unit is in contact with an article containing at least metal, the antenna can be made to generate sufficient induced electromotive force to operate the IC chip since flux is picked up by the antenna through the magnetic layer.

Moreover, since the magnetic layer is one having flat shaped magnetic particulates impregnated in resin, by adjusting the mix ratio of the magnetic particulates and the resin the permeability of the magnetic layer can be raised and the insulation properties can be maintained. Therefore, the magnetic layer, by being formed so as to cover the antenna, also exhibits the function of a protective layer of them. In addition, by disposing a magnetic layer on the base substrate so as to cover the antenna except for the IC chip and the vicinity thereof, even in the case of flexing the non-contact data reception/transmission unit in order to make contact with an article containing at least metal, the magnetic layer can easily follow the change in shape, and as a result, such problems as exfoliation between the elements can be prevented.

Gaps may be provided between the side surface of the IC chip and the side surface of the magnetic layer.

In this case, the IC chip and the magnetic layer are hindered from making contact when the non-contact data reception/transmission unit is flexed in order to make contact with an article containing at least metal, and so damage to the IC chip arising from contact of the two is prevented.

The side surfaces of the magnetic layer positioned opposing the side surfaces of the IC chip may be tapered with the opening diameter gradually increasing from the surface of the magnetic layer in contact with the antenna toward the surface opposite the surface of the magnetic layer in contact with the antenna.

In this case, even if one of the surface of the magnetic layer opposite the surface in contact with the base substrate or the surface of the base substrate opposite the surface in contact with the magnetic layer serves as a surface that bonds to an article, the side surface of the IC chip and the side surface of the magnetic layer are hindered from making contact when the non-contact data reception/transmission unit is flexed in order to make contact with an article containing at least metal, and so damage to the IC chip arising from contact of the two can be prevented.

The present invention provides a non-contact data reception/transmission unit including a case that provides a recessed portion; an inlet that is housed in the recessed portion; and a covering provided so as to cover the inlet in the recessed portion, wherein the inlet is inside the recessed portion from a plane formed by the peripheral edge of the case.

According to this constitution since the inlet is disposed inside the recessed portion from a plane formed by the peripheral edge of the case, the entire periphery of the inlet is covered by the covering within the recessed portion of the case. Therefore, even if the case and the covering are formed with different materials, separation of the case and the covering at their surface boundary, and resulting exposure and damage of the inlet does not occur from the application of an external force to the non-contact data reception/transmission unit. In addition, since there is no exfoliation of the case and the covering at their surface boundary, seepage of water or chemicals into the interior of the non-contact data reception/transmission unit does not occur, thereby imparting excellent water resistance and chemical resistance. In addition, if the case is formed with thermoplastic resin, its durability against external forces and chemical resistance can be sufficiently ensured, and it can be made into a thin structure. Moreover, if the case is formed with thermoplastic resin, not only can it be made into a thin structure while sufficiently ensuring its durability against external forces and chemical resistance, but also it can be formed into a shape with a curved surface.

The present invention provides a manufacturing method for a non-contact data reception/transmission unit including a step of, using a substrate having at least a portion forming a recessed portion, storing an inlet in the recessed portion; and a step of filling resin in the recessed portion so as to cover the inlet.

According to the aforementioned constitution, a non-contact data reception/transmission unit is obtained in which since the entire periphery of the inlet can be covered by the covering within the recessed portion of the case, even if the case and the covering are formed with different materials, separation of the case and the covering at their surface boundary, and resulting exposure and damage of the inlet, does not occur from the application of an external force. Also, since there is no exfoliation of the case and the covering at their surface boundary, seepage of water or chemicals into the interior of the non-contact data reception/transmission unit does not occur, thereby imparting excellent water resistance and chemical resistance. Also, if the case is formed with thermoplastic resin, it can be made into a thin structure while sufficiently ensuring its durability against external forces and chemical resistance. Moreover, if the case is formed with thermoplastic resin, not only can it be made into a thin structure while sufficiently ensuring its durability against external forces and chemical resistance, but also it can be formed into a shape with a curved surface. Furthermore, since there is no need to provide a special purpose device or a molding die and the like for covering the inlet with resin, manufacturing is easy and manufacturing costs can be reduced.

In addition, a step of, using a sheet-shaped substrate made of thermoplastic resin, transforming the substrate so that at least a portion of the substrate forms a recessed portion may be provided.

In this case, in accordance with the shape of the object article and the place where the non-contact data reception/transmission unit is to be attached, a non-contact data reception/transmission unit of a prescribed shape can be manufactured simply by altering the shape of the recessed portion of the sheet-shaped substrate.

Moreover, a step of dividing the substrate at every region where the substrate, the inlet, and the resin are integrated and form a case including the substrate may be provided.

In this case, a non-contact data reception/transmission unit in which a substrate, an inlet, and resin are integrated can be individually obtained.

In the aforementioned manufacturing method, using a thermosetting resin as the resin, the thermosetting resin may be heat treated at a temperature lower than the melting point of the thermoplastic resin.

In this case, since the case consisting of a separated substrate retains the shape formed according to the shape of the article serving as the applied object, and the inlet is covered by a covering consisting of thermosetting resin without sustaining thermal damage, the obtained non-contact data reception/transmission unit has excellent dimensional accuracy, maintains the initial function of the inlet and has an excellent communication facility.

The present invention provides a non-contact data reception/transmission unit including a case that provides a recessed portion; an inlet stored in the recessed portion; and a covering including a magnetic material provided so as to cover the inlet within the recessed portion except for the space positioned between the case and the inlet.

According to the aforementioned constitution, since a covering that includes a magnetic material is provided so as to cover the inlet within the recessed portion except for the space positioned between the case and the inlet, even when in contact with an article including at least metal, the antenna can be made to generate sufficient induced electromotive force to operate the IC chip since flux is picked up by the antenna through the magnetic layer. Moreover, the covering functions as a protective film of the antenna and the IC chip.

The peripheral edge of the outside surface of the covering may be disposed so as to be flush with the peripheral edge of the case.

In this case, since the entire periphery of the inlet is covered by the covering within the recessed portion of the case, separation of the case and the covering at their surface boundary, and resulting exposure and damage of the inlet, does not occur from the application of an external force to the non-contact data reception/transmission unit.

[Effects of the Invention]

As explained above, according to the present invention, by forming a magnetic layer, the antenna coil can be made to generate sufficient induced electromotive force to operate the IC chip even in the case of being placed on a metal article. Moreover, since the magnetic layer can be formed thinly, compared with a conventional non-contact IC label, a non-contact IC label with a thin thickness can be provided.

Since the method of manufacturing the non-contact IC label according to the present invention involves continuously supplying a substrate, automatically fitting IC inlets and punching out manufactured articles in-line large quantities of IC labels can be manufactured efficiently and with high quality.

In addition, a continuous substrate supply function, a function of sending IC inlets forward and attaching them to a substrate, and a function that bonds an overlay material and punches out manufactured articles are compactly organized in the apparatus for manufacturing the non-contact IC label according to the present invention, a comparatively inexpensive apparatus is obtained.

EXPLANATION OF REFERENCE NUMERALS

Figure 1:
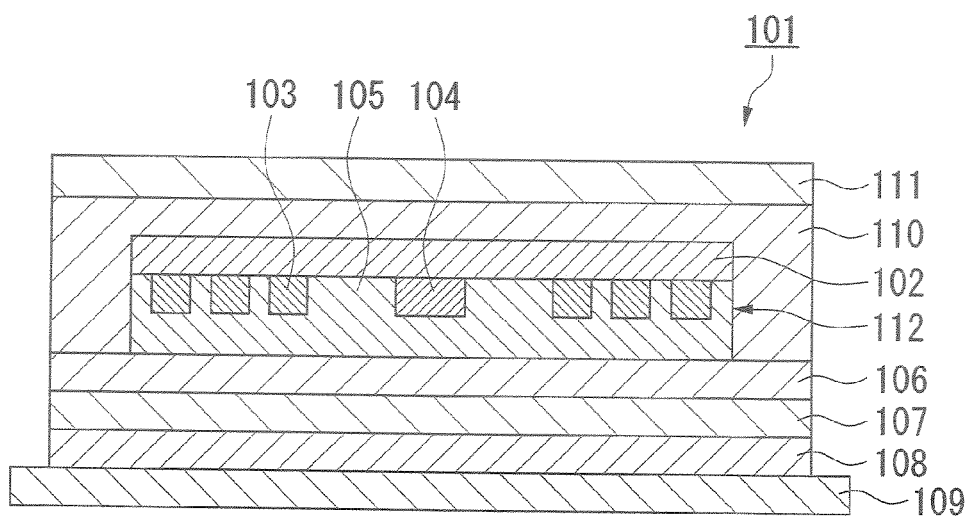
[FIG. 1] A mimetic diagram showing an example of the cross-section of the non-contact IC label according to the first embodiment of the present invention.

101 Non-contact IC label, 102 First substrate, 103 Antenna coil, 104 IC chip, 105 Magnetic layer, 106 First adhesive layer, 107 Second substrate, 108 Second adhesive layer, 109 Release paper, 110 Third adhesive layer, 111 Overlay material, 112 IC inlet, 120 First continuous sheet, 120*a* Backing paper, 120*b* Sheet, 120*d* Timing mark, 121 First supply means, 122 Take-up means, 123 Inlet attaching means, 124 Second continuous sheet, 124*a* Backing paper, 124*b* Sheet, 126 Take-up means, 127 Bonding means, 127*a*, 127*b* Bonding rollers, 128 Die punch-out means, 129 Take-up means, 130 IC. inlet, 131 Stacker, 132 Pull-out means, 132*a* Distal end head, 133 Rail member, 133*a* Guide groove, 133*b* Through-hole, 133*c* Abutting portion, 134 Push-out block, 135 Suction block, 135*a* Sponge, 210, 240 Non-contact IC tag, 211, 241 Base substrate, 212, 242 Antenna, 213, 243 IC chip, 214, 244 Contacts 215, 245 Inlet, 220, 250 Magnetic layer, 221, 251 First resin member, 222, 252 Recessed portion, 223, 253 Second resin member, 225, 255 Case, 231, 261 First metal mold, 232, 262 Second metal mold, 233, 263 Space, 234, 264 Third metal mold, 301, 3100 Non-contact data reception/transmission unit, 302, 3102 Base substrate, 303, 3103 Antenna, 304, 3104 IC chip, 305, 3105 Magnetic layer, 306 Release paper, 307 Adhesive layer, 308 Overlay material, 309, 3109 Inlet, 320 First continuous sheet, 320*a* Backing paper, 320*b* Release paper, 321 First means, 322 Second means, 323 Third means, 324 Second continuous sheet 324*a* Backing paper, 324*b* Sheet, 325 Fourth means, 326, 329 Take-up means, 327 Fifth means, 327*a*, 327*b* Bonding rollers, 328 Sixth means, 330 Inlet, 331 Stacker, 332 Inlet pull-out mechanism, 332*a* Distal end head. 333 Rail member, 333*a* Guide groove, 333*b* Through-hole, 333*c* Abutting portion, 334 Push-out block, 335 Suction block, 335*a* Sponge, 410 Non-contact data reception/transmission unit, 411 Base substrate, 412 Antenna, 413 IC chip, 414 Inlet, 415 Magnetic layer, 510, 540, 550, 560 Non-contact data reception/transmission unit, 511, 541, 551, 561 Base substrate, 512, 542, 552, 562 Antenna, 513, 543, 553, 563 IC chip, 514, 544, 554, 564 Inlet, 515, 545, 555, 565 Magnetic layer, 516, 546, 556, 566 Ferromagnetic layer, 520 Metal article, 530 Information writing/reading device, 557 Intermediate layer, 567 First intermediate layer, 568 Second intermediate layer, 610, 640, 650, 660 Non-contact data reception/transmission unit, 611, 641, 651, 661 Base substrate, 612, 642, 652, 662 Antenna, 613, 643, 653, 663 IC chip, 614, 644, 654, 664 Inlet, 615, 645, 655, 665 Magnetic layer, 616, 646, 656, 666 Paramagnetic layer, 617, 647, 657, 667 Ferromagnetic layer, 620 Metal article, 630 Information writing/reading device, 658 Intermediate layer, 668 First intermediate layer, 669 Second intermediate layer, 710, 720, 730, 740 Non-contact data reception/transmission unit, 711 Base substrate, 712 Antenna, 713 IC chip, 714 Inlet, 715 Magnetic layer, 716 Conductive portion, 721 Adhesive layer, 722 Releasing base, 723 Overlay material, 810, 820, 830 non-contact data reception/transmission unit, 811 Base substrate, 812 Antenna, 813 IC chip, 814 Inlet, 815 Magnetic layer, 816 Conductive portion, 821 Adhesive layer, 822 Release substrate, 823 Overlay material, 910, 930, 940, 950 Non-contact data reception/transmission unit, 911 Base substrate, 912 Antenna, 913 IC chip, 914 Inlet, 915 Magnetic layer, 916, 923, 941, 951 Case, 916*a* Recessed portion, 917 covering, 920 Substrate, 921 Thermosetting resin, 922 Covering, 1010 Non-contact data reception/transmission unit, 1011 Base substrate, 1012 Antenna, 1013 IC chip, 1014 Inlet, 1015 Magnetic layer, 1016 Case, 1016*a* Recessed portion, 1017 Covering, 1020 Substrate, 1020*c* Recessed portion, 1021 Thermosetting resin, 1110, 1130, 1140, 1150 Non-contact data reception/transmission unit, 1111 Base substrate, 1112 Antenna, 1113 IC chip, 1114 Inlet, 1115, 1126, 1141, 1151 Case, 1115*a* Recessed portion, 1116, 1125 Covering, 1117, 1123 First covering, 1118, 1124 Second covering, 1120 Substrate, 1121 Resin, 1122 Magnetic coating

BEST MODE FOR CARRYING OUT THE INVENTION

Hereinbelow, the embodiment of a non-contact IC label of the present invention, a manufacturing method and manufacturing apparatus therefor shall be explained using drawings.

In addition, this embodiment is explained in concrete terms in order to more clearly comprehend the gist of the invention, and unless stated otherwise, shall not serve to limit the present invention.

FIG. 1 is an outline sectional view of the non-contact IC label that is the first embodiment of the present invention. In FIG. 1, an antenna coil 103 and an IC chip 104 are provided on one surface of an electrically insulating first substrate 102, with the antenna coil 103 and the IC chip 104 being electrically connected. On one surface of the first substrate 102, a magnetic layer 105 is provided so as to cover the antenna coil 103 and the IC chip 104, a first adhesive layer 106 is provided on the magnetic layer 105, an electrically insulating second substrate 107 is provided on the first adhesive layer 106, a second adhesive layer 108 is provided on the second substrate 107, and a release paper 109 is provided on the second adhesive layer 108. An overlay material 111 is provided on the other surface of the first substrate 102 via a third adhesive layer 110.

The first substrate 102 in this embodiment may be a publicly known material such as a woven fabric, non-woven fabric, mat, paper or combination thereof made from inorganic fiber such as glass fiber or alumina fiber and organic fiber such as polyester fiber or polyamide fiber; a composite base substrate formed by impregnating any thereof with a resin varnish; a plastic substrate such as a polyamide resin substrate, polyester resin (PET, PEN, etc.) base substrate, polyolefine resin substrate, polyimide resin substrate, ethylene vinyl alcohol copolymer substrate, polyvinyl alcohol resin substrate, polyvinyl chloride resin (PVC etc.) base substrate, polyvinylidence chloride resin substrate, polystyrene resin substrate, polycarbonate (PC) resin substrate, acrylonitrile styrene butadiene copolymerization resin substrate, polyether sulfone resin substrate or any thereof subjected to mat treatment, corona discharge treatment, plasma treatment, ultraviolet irradiation treatment, electron-beam-irradiation treatment, flame plasma treatment and ozone treatment, or surface treatment such as easy adhesion treatment. Among these, an electrically insulating film or sheet consisting of polyethylene terephthalate (PET) or polyimide is suitably used.

The antenna coil 103 can be formed by screen printing a predetermined pattern with a polymer conductive ink or etching a conductive foil on one surface of the first substrate 102.

As examples of the polymer conductive ink used in the present invention, those that have electrically conductive particulates such as silver dust, gold dust, platinum powder, aluminum powder, powder of palladium and rhodium and the like, and carbon powder (carbon black, carbon nanotube, etc.) blended in a resin composition can generally be given. If a thermosetting resin is used as the resin compound, it can obtain a coating film at less than 200° C., for example 100 to 150° C., and the path through which electricity flows on the obtained coating film, while depending on contact with the conductive particulates, has a resistance value on the order of $10^{-5}$ Ω/cm.

Moreover, the polymer conductive ink of the present invention, in addition to a thermosetting-type, may be a publicly known type such as a photo-curing type, osmotic drying type, and solvent volatilization type. In addition, by including a photo-curing resin in the resin composition, the hardening time can be shortened, thereby raising manufacturing efficiency. Specifically, one containing at least 60 percent conductive particulates by mass, being a thermoplastic resin only or a blended resin composition of a thermoplastic resin and a crosslinked resin (particularly a crosslinked resin of polyester and isocyanate and the like), and containing at least 10 percent polyester resin by mass, that is, a solvent volatilization type or a crosslinked/thermoplastic combination type (with the thermoplastic type being at least 50 percent by mass), or one containing at least 50 percent conductive particulates by mass, being a crosslinked resin (a phenol hardening type epoxy resin, or a sulfonium salt hardening type epoxy resin) only or a blended resin composition of a thermoplastic resin and a crosslinked resin, that is, one that is a crosslinked type or a crosslinked/thermoplastic combination type, may be suitably used. In addition, a flexibilizer can be blended with the polymer conductive ink used in the present invention when resistance to bending is further required in the conductive circuits such as the antenna. Specific examples of the flexibilizer used in the present invention are a polyester flexibilizer, acrylic flexibilizer, urethane flexibilizer, polyvinyl acetate flexibilizer, thermoplastic-elastomer flexibilizer, natural-rubber flexibilizer, synthetic-rubber flexibilizer, and a mixture of two or more thereof.

When forming the antenna coil 103 by etching, a copper foil is bonded to the entire surface of one side of an electrically insulating substrate. Then an etch-resistant coating is printed in a desired pattern by a silk screen method onto the copper foil. Since the antenna coil 103 is normally formed in a spiral or rectangular shape, the etch-resistant coating is printed in a spiral or rectangular shape. After drying and hardening the coating for an appropriate time, it is immersed in an etching solution, wherein the copper foil that is not coated with the etch-resistant coating dissolves away, leaving the copper foil coated with the etch-resistant coating on one surface of the substrate, thereby forming the antenna coil 103.

Next, the IC chip 104 is mounted at the predetermined position on the first substrate 102 via an electrically conductive adhesive (not illustrated). By applying a prescribed pressure to the IC chip 104, the IC chip 104 and the first substrate 102 are bonded by the adhesive (not illustrated), with the antenna coil 103 and the IC chip 104 being electrically connected by contacts provided on the underside of the IC chip 104.

The magnetic layer 105 is formed by applying a magnetic coating including a powder or flakes consisting of a magnetic material and drying. Here, as the magnetic powder included in the magnetic coating, carbonile iron powder, atomized powder such as permalloy, and reduced iron powder, etc. can be used. Examples of the flakes of a magnetic material include flakes obtained by refining the magnetic material into a powder with a ball mill or the like and then mechanically flattening the powder, and flakes obtained by running molten metal of an iron-based or cobalt-based amorphous alloy into a water-cooled copper plate.

A magnetic coating is used in which the magnetic powder or magnetic flakes is/are mixed and dispersed with at least an organic solvent and a bonding agent.

As the bonding agent used in this embodiment, a thermoplastic resin, a thermosetting resin, and a reactive resin can be used, with examples of the thermoplastic resin including vinyl chloride, vinyl acetate, a vinyl chloride-vinyl acetate copolymer, a vinyl chloride-vinylidene chloride copolymer, a vinyl chloride-acrylonitrile copolymer, an acrylic acid ester-acrylonitrile copolymer, an acrylic ester-vinyl chloride-vinylidene chloride copolymer, an acrylic ester-vinylidene chloride copolymer, a methacrylate ester-vinylidene chloride copolymer, a methacrylate ester-vinyl chloride copolymer, a methacrylic acid ester-ethylene copolymer, polyvinyl fluoride, a vinylidene chloride-acrylonitrile copolymer, an acrylonitrile-butadiene copolymer, polyamide resin, polyvinyl butyral, a cellulose derivative (cellulose acetate butyrate, a cellulose die acetate, cellulose triacetate, cellulose propionate, cellulose nitrate), a styrene-butadiene copolymer, a polyurethane resin, a polyester resin, an amino resin, and synthetic rubber and the like.

Also, examples of the thermosetting resin or reactive resin include phenol resin, epoxy resin, polyurethane hardening resin, urea resin, melamine resin, alkyd resin, silicone resin, polyamine resin, and urea-formaldehyde resin.

This magnetic coating is applied by a screen printing method to the top surface of the first substrate 102 on which the antenna coil 103 and the IC chip 104 are provided, coating the antenna coil 103 and the IC chip 104 to a degree of being slightly concealed. An IC inlet 112 with the magnetic layer 105 is then formed by drying and hardening the magnetic layer 105 after coating by being left at room temperature or heated at a prescribed temperature and time.

Next, the electrically insulating second substrate 107 is prepared. The same material used for the first substrate 102 may be used for the second substrate 107. After applying an adhesive to both sides of this second substrate 107 (formation of the first adhesive layer 106 and the second adhesive layer 108), the release paper 109 is attached to one surface (the second adhesive layer 108), and the IC inlet 112 is attached to the other surface (the first adhesive layer 106) through the magnetic layer 105.

Then, by attaching the overlay material 111, whose underside is coated with adhesive (third adhesive layer 110), to the other surface of the first substrate 102 (the surface on which the antenna coil 113 and the IC chip 104 are not provided) via the same adhesive (third adhesive layer 110) the non-contact IC label 101 of the present invention is obtained.

Hereinbelow the manufacturing method and manufacturing apparatus of the non-contact IC label of the present invention shall be explained.

Figure 2:
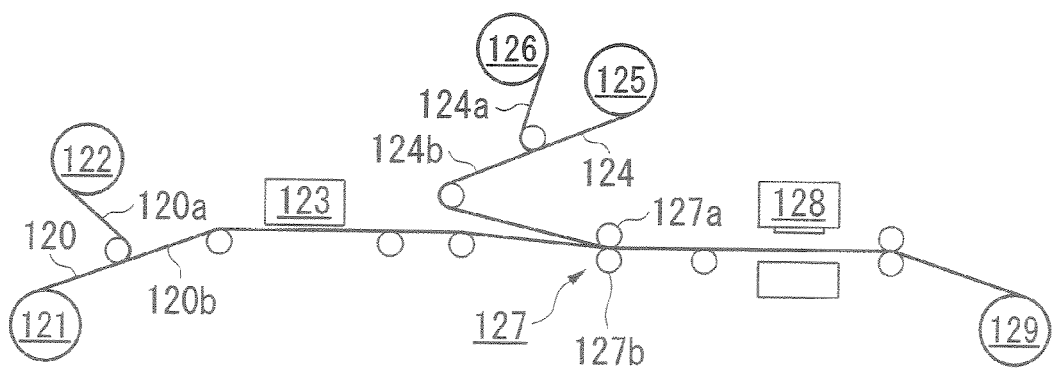
[FIG. 2] A drawing schematically showing the constitution of the apparatus for manufacturing the non-contact IC label concerning the second embodiment of the present invention.

FIG. 2 is a drawing schematically showing the constitution of the apparatus for manufacturing the non-contact IC label 101 according to the second embodiment of the present invention.

The manufacturing apparatus of the present embodiment is provided with a first supply means 121 that supplies a first continuous sheet 120 consisting of a backing paper attached to one surface of the second substrate 107 via the first adhesive layer 106 and the release paper attached to the other surface via the second adhesive layer 108.

After a backing paper 120a on the surface layer of the first continuous sheet 120 supplied from the first supply means 121 is peeled off and taken up by a take-up portion 122, the first continuous sheet 120 is sent to an inlet attaching means 123.

Figure 3:
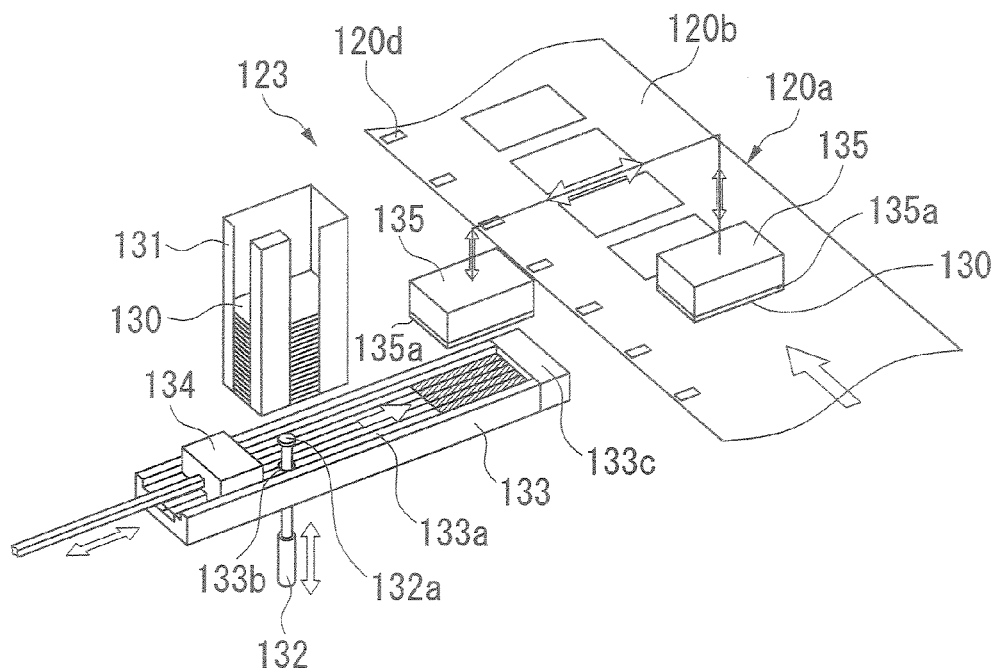
[FIG. 3] An enlarged perspective view showing in detail the constitution of the inlet attaching portion of the apparatus for manufacturing the non-contact IC label according to the present invention.
Figure 4:
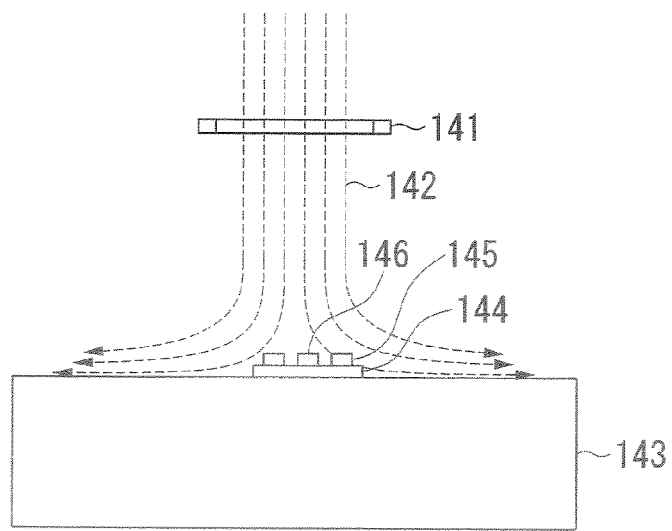
[FIG. 4] A mimetic diagram showing the flow of the flux at the time when an ordinary IC label is placed on the surface of a metal article.
Figure 5:
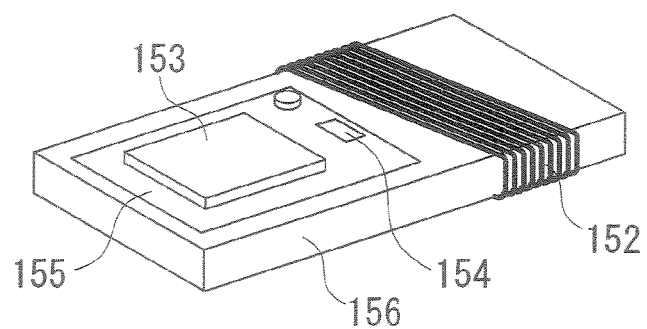
[FIG. 5] A perspective view showing an example of a conventional non-contact IC label.
Figure 6:
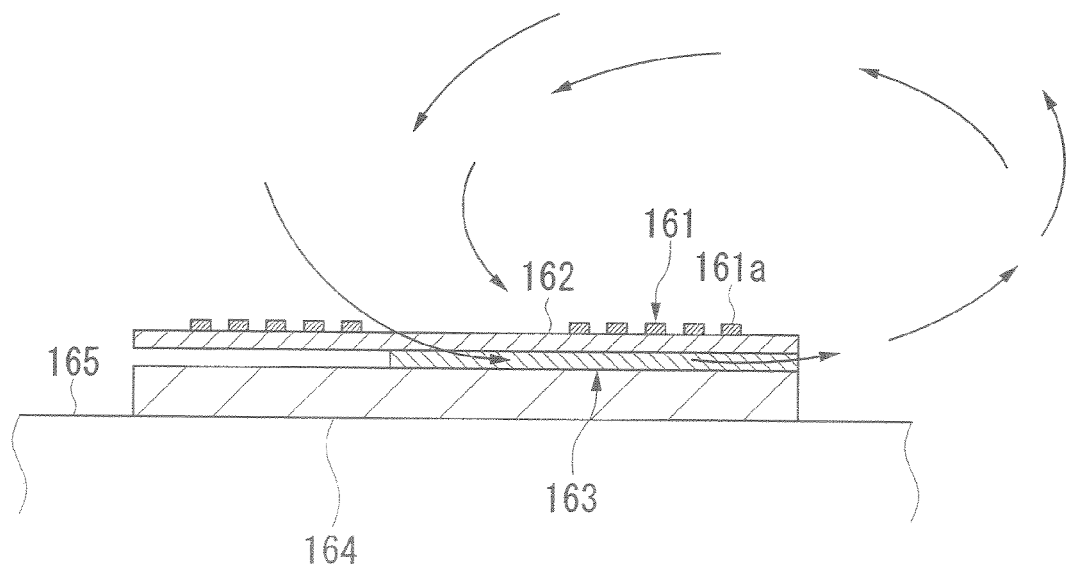
[FIG. 6] A sectional view showing another example of a conventional non-contact IC label.

As shown in FIG. 3, the inlet attaching means 123 is provided with a stacker (holding means) 131 that holds a plurality of IC inlets 130 (corresponding to 112 in FIG. 1) in a vertically stacked state. Under the stacker 131, an inlet pull-out mechanism (pull-out means) 132 is provided for picking out one IC inlet 130 at a time from the plurality of IC inlets 130. The inlet pull-out mechanism 132 is constituted to be able to move reciprocally in the vertical direction, and a distal end head 132a thereof sequentially pulls out (takes out) by suction action the IC inlet 130 located at the bottom of the plurality of IC inlets 130 stacked in the stacker 131.

Here, the lower surface of the IC inlet 130, being the surface that is attached on the first continuous sheet 120b, is formed flat. Therefore, the distal end head 132a of the inlet pullout mechanism 132, suctioning the center portion of the lower surface of the IC inlet 130 with sufficient suction force, can reliably pull out one IC inlet 130 at a time from the stacker 131. Although the IC inlet 130 will bend momentarily at this time, since the IC module and antenna are positioned away from the center portion of the IC inlet 130, they are not damaged by the suction from the distal end head 132a. Moreover, due to the constitution of pulling out one by one from the bottom side of the plurality of IC inlets 130, the IC inlets 130 can be supplied anytime to the stacker 131 during operation.

The IC inlet 130 pulled out from the stacker 131 by the inlet pull-out mechanism 132 is placed in the middle of a guide groove 133a formed in the rail member 133. In addition, the width dimension of the guide groove 133a is set to be slightly greater than the dimension corresponding to the IC inlet 130. And the inlet pull-out mechanism 132 is constituted to be able to approach the stacker 131 through a vertical through-hole 133b formed in the rail member 133. Moreover, the inlet attaching means 123 is provided with a push-out block 134 that is capable of reciprocal movement along the guide groove 133a, with the push-out block 134 being positioned in the middle of the guide groove 133a of the rail member 133.

By movement of the push-out block 134 driven by an air cylinder to the right in the drawing along the guide groove 133a, for example, the IC inlet 130 pulled out from the stacker 131 and placed in the middle of the guide groove 133a is fed until its distal end mostly abuts the abutting portion 133c of the guide groove 133a. Thus, the rail member 133 and the push-out block 134 constitute a transportation means for moving the IC inlet 130 taken out from the plurality of IC inlets 130 to a predetermined location. In addition, the stacker (holding means) 131, the inlet pull-out mechanism (takeout portion) 132, the rail member 133, and the push-out block 134 (transportation device) constitute a feeding means for selectively taking out IC inlets 130 one at a time from the plurality of IC inlets 130 and sequentially feeding them to a predetermined position.

Furthermore, the inlet attaching means 123 is provided with a suction block 135 for suction-holding with a suction action the IC inlet 130 positioned so that its distal end mostly abuts the abutting portion 133c of the guide groove 133a. The suction block 135 has the cubical shape corresponding to the rectangular shape of the IC inlet 130, with a sponge 135a attached to its bottom surface as a shock absorbing material. Moreover, a suction port (not illustrated) for carrying out suction-holding of the IC inlet 130 is provided in the center of the bottom surface of the suction block 135.

The suction block 135 driven by an air cylinder for example is constituted to be movable in the vertical direction and the horizontal direction along the guide groove 133a. In this way, the suction block 135 descends toward the IC inlet 130 positioned so that its distal end mostly abuts the abutting portion 133c of the guide groove 133a, and the IC inlet 130 is suction-held by the bottom surface of the suction block 135. Although the suction force from the suction block 135 acts on the center portion of the IC inlet 130 at this time, due to the shock absorbing action of the sponge 135a, the IC inlet 130 does not sustain damage stemming from the suction force.

After the suction block 135 that suction-holds the IC inlet 130 ascends, it moves in the horizontal direction in the drawing until being above the sheet 120b of the first continuous sheet 120 at this time, the suction block 135 moves transversely along a horizontal guide not illustrated and stops at a predetermined position above the sheet 120b by the operation of, for example, a stopper not illustrated. Then, the suction block 135 descends and presses the suction-held IC inlet 130 onto the surface of the sheet 120b.

In addition, the first continuous sheet 120 is in the condition of the backing paper 120a thereof being peeled off, with the second adhesive layer 106 being exposed on the surface of the sheet 120b. Accordingly, the IC inlet 130 is attached to the surface of the sheet 120b by the suction block 135 pressing the IC inlet 130 onto the surface of the sheet 120b while stopping the suction operation. In this way, the suction block 135 constitutes a moving and pressing means that moves IC inlets 130 fed into the predetermined location, and sequentially presses them onto the surface of the sheet 120b of the first continuous sheet 120.

On the other hand, the first continuous sheet 120 is intermittently conveyed along the lengthwise direction by a sensor (not illustrated) reading timing marks 120d formed on one side of the sheet 120b. In this way, by repeating the above-mentioned inlet attaching action and an intermittent conveyance action, the IC inlets 130 are sequentially attached onto the surface of the sheet 120b at a predetermined pitch and interval.

Although FIG. 3 shows only one inlet attaching mechanism that consists of one feeding means and one moving and pressing means for the sake of clarity of the drawing, a plurality of inlet attaching mechanisms can also be arranged in a row along the flow direction (supply direction) of the continuous sheet 120. In this case, the same number of IC inlets 130 as the number of inlet attaching devices can be simultaneously attached to the surface of the sheet 120b.

Moreover, it is preferable that the spacing of the plurality of inlet attaching mechanisms be constituted to be adjustable along the flow direction of the first continuous sheet 120 so as to be able to adjust the spacing of the plurality of IC inlets 130 attached simultaneously to the surface of the sheet 120b. Furthermore, the plurality of inlet attaching mechanisms can also be constituted so as to be able to correspond to IC inlets 130 of various sizes.

Again referring to FIG. 2, the first continuous sheet 120, on which IC inlets 130 are sequentially attached at an internal by the inlet attaching means 123, is fed to a bonding means 127 constituted by a pair of bonding rollers 127a and 127b. On the other hand, the manufacturing apparatus of this embodiment is provided with a second supply means 125 for supplying, as the second continuous sheet 124, the second continuous sheet 124 consisting for example of a backing paper attached to an overlay material through an adhesive layer. The second continuous sheet 124 has a three-layer structure, in which the backing paper 124a provided on the top side and the overlay material 124b provided on the bottom side are glued together by an adhesive layer.

Here, the overlay material 124b constitutes the cover paper of the IC label 101.

After the backing paper 124a is peeled off the second continuous sheet 124 supplied from the second supply means 125 and taken up by the take-up portion 126, the second continuous sheet 124 is fed to the bonding means 127. In addition, in the state of the backing paper 124a peeled off, the adhesive layer is exposed on the surface of the second continuous sheet 124b (the surface that was in contact with the backing paper 124a). In this way, when the first continuous sheet 120 and the second continuous sheet 124 pass between the pair of bonding rollers 127a and 127b at the bonding means 127, the adhesive layer of the second continuous sheet 124b and the surface of the first continuous sheet 120b on which the IC inlets 130 are attached are overlapped and bonded together.

Here, in order to reduce the load on the IC inlets 130 when passing between the pair of bonding rollers 127a and 127b, that is, in order to reduce the nip pressure which acts on the IC inlets 130, a sponge (not illustrated) that acts as a shock absorbing material is wrapped around at least one of the bonding rollers 127a and 127b. Moreover, at each guide roller provided downstream of the bonding means 127, the roller diameter is set to a comparatively large value (for example, a diameter of approximately 80 mm) in order to reduce the bending stress that acts on the IC inlet 130, which has a characteristic of being comparatively weak to bending deformation.

The composite sheet (120b, 124b) that is laminated and bonded together by the bonding means 127 is fed to a die punch-out means 128. In the die punch-out means 128, die cutting is performed in accordance with the external dimensions of one IC label 101, with the unwanted portion of the die-cut composite sheet (120b and 124b) (the sheet 120b and the sheet 124b of the region outside the IC label 1) being taken up by the take-up means 129.

As described above, in the present embodiment, the inlet attaching means 123 can selectively take out IC inlets 130 one at a time from a plurality of IC inlets 130, feed them sequentially to a prescribed position, transport the fed IC inlets 130 to the prescribed position and sequentially attach them by pressing the surface of the sheet 120b of the first continuous sheet 120. Accordingly, the activity of fitting the IC inlets 130 onto a sheet is performed automatically without relying on manual operation, and so large quantities of IC labels 101 can be manufactured efficiently and with high quality.

FIG. 3 of the present embodiment shows the supply of IC inlets 130 in a cassette system, but of course a system of continuous supply and separating with a cutter and the like may also be adopted. In addition, the magnetic layer may be formed by coating and drying in-line.

Other embodiments of the present invention are explained hereinbelow with reference to the drawings.

Figure 7A:
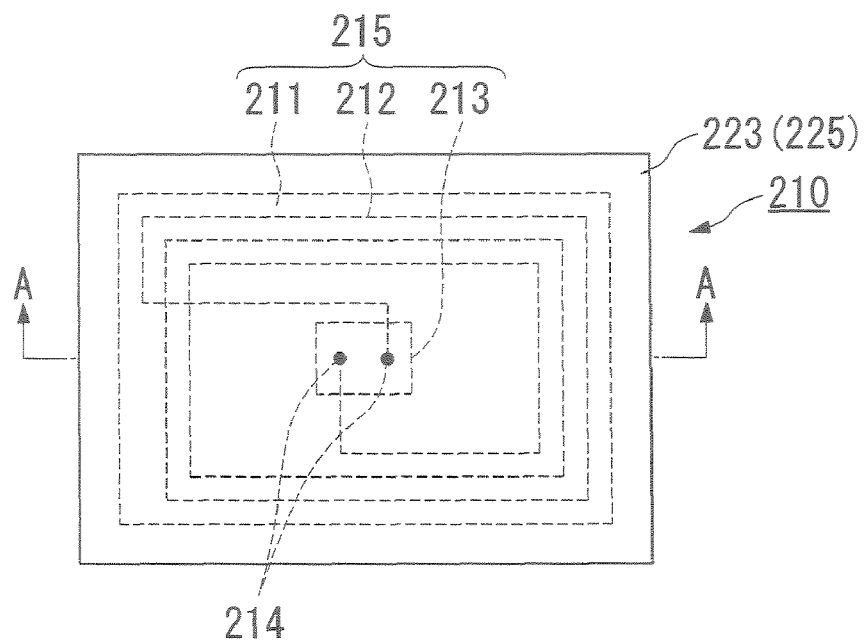
[FIG. 7A] A plan view showing the internal structure of the non-contact IC tag according to the third embodiment of the present invention.
Figure 7B:
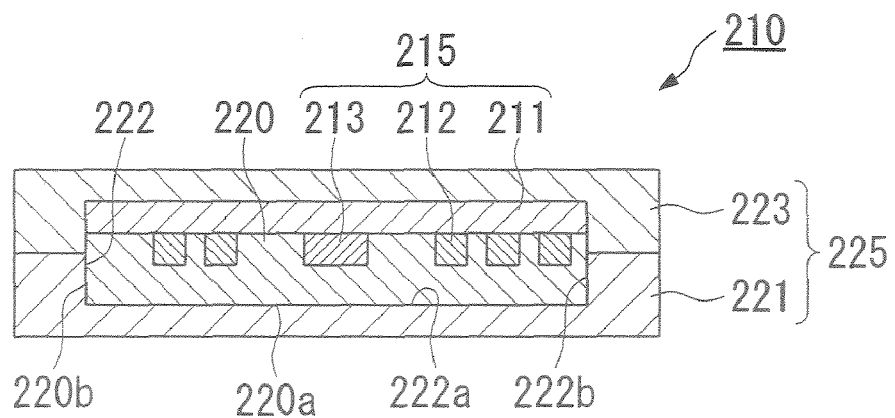
[FIG. 7B] A sectional view along line A-A in FIG. 7A.

FIGS. 7A and 7B are schematic diagrams showing the non-contact IC tag that is the third embodiment according to the present invention, with FIG. 7A being a plan view showing the internal structure and FIG. 7B being a sectional view along line A-A of FIG. 7A.

In FIGS. 7A and 7B, reference numeral 210 denotes a non-contact IC tag, 211 a base substrate, 212 an antenna, 213 an IC chip, 214 contacts 215 an inlet, 220 a magnetic layer, 221 a first resin member 222 a recessed portion, 223 a second resin member, and 225 a case.

This non-contact IC tag 210 is roughly constituted from an inlet 215 including a base substrate 211 and an electrically connected antenna 212 and IC chip 213 provided on one surface thereof; a magnetic layer 220 disposed so as to cover the antenna 212 and the IC chip 213 constituting the inlet 215; and a case 225 including a first resin member 221 and a second resin member 223 provided so as to envelop the inlet 215 with the disposed magnetic layer 220.

In the non-contact IC tag 210, the antenna 212 is formed in a coiled shape on one surface of the base substrate 211, with both ends thereof being electrically connected to the IC chip 213 by the contacts 214.

Moreover, the magnetic layer 220 is disposed so as to cover the antenna 212 and the IC chip 213 provided on one surface of the base substrate 211 as well as the entire area of the one surface of the base substrate 211. The magnetic layer 220 may be provided to an extent that slightly exceeds the thickness of at least the antenna 212 and the IC chip 213.

The first resin member 221 has a recessed portion 222 large enough for accommodating at least a portion of the inlet 215 with the disposed magnetic layer 220, that is, the magnetic layer 220 covering the antenna 212 and the IC chip 213 constituting the inlet 215. At least a portion of the magnetic layer 220 is accommodated in the recessed portion 222 and at least a portion of the magnetic layer 220 is covered by the first resin member 221 so that the surface 220a of the magnetic layer 220 opposite the surface in contact with the base substrate 211 contacts the bottom surface 222a of the recessed portion 222 and at least a portion of the side surfaces 220b of the magnetic layer 220 contact the inner side surfaces 222b of the recessed portion 222. Also, the second resin member 223 is disposed to face the first resin member 221 and be continuous with the first resin member 221, covering the portion of the inlet 215 with the disposed magnetic layer 220 not covered by the first resin member 221. Thereby, the inlet 215 with the disposed magnetic layer 220 has a configuration of being sealed by the case 225 with is made of the first resin member 221 and the second resin member 223.

The surface of the base substrate 211 on which at least the antenna 212 and the IC chip 213 are provided is made of an electrically insulating material. Such a base substrate 211 may be a publicly known material such as a woven fabric, non-woven fabric, mat, paper or combination thereof made from inorganic or organic fiber such as glass fiber, alumina fiber, polyester fiber, and polyamide fiber; a composite base substrate formed by impregnating any thereof with a resin varnish; a plastic substrate such as a polyamide resin substrate, polyester resin (PET, PEN, etc.) base substrate, polyolefine resin substrate, polyimide resin substrate, ethylene vinyl alcohol copolymer substrate, polyvinyl alcohol resin substrate, polyvinyl chloride resin (PVC etc.) base substrate, polyvinylidence chloride resin substrate, polystyrene resin substrate, polycarbonate resin substrate, acrylonitrile styrene butadiene copolymerization resin substrate, polyether sulfone resin substrate or any thereof subjected to mat treatment, corona discharge treatment, plasma treatment, ultraviolet irradiation treatment, electron-beam-irradiation treatment, flame plasma treatment and ozone treatment, or surface treatment such as easy adhesion treatment. Among these, an electrically insulating film or sheet consisting of polyethylene terephthalate (PET) or polyimide is suitably used.

The antenna 212 is a conductive body consisting of a conductive film made of conductive paste, a conductive foil, etc.

As the conductive paste that forms the conductive material forming the antenna 212, those that have electrically conductive particulates such as silver dust, gold dust, platinum powder, aluminum powder, powder of palladium and rhodium and the like, and carbon powder (carbon black, carbon nanotube, etc.) blended in a resin composition can be given. As a resin composition that forms this conductive paste, a heat curing type resin composition, a photo-curing type resin composition, an osmosis drying type resin composition, and a solvent volatilization type resin composition are given.

When using a thermosetting resin as the resin compound, it should obtain a coating film at less than 200° C., for example 100 to 150° C., and the path through which electricity flows on the obtained coating film, while depending on contact with the conductive particulates, should have a resistance value on the order of $10^{-5}$ Ω/cm.

In addition, in the case of using a photo-curing resin composition as the aforementioned resin composition, the hardening time of the conductive past can be shortened, thereby raising efficiency.

As the conductive paste in which the aforementioned electrically conductive particulates are blended in a resin composition, specifically, one containing at least 60 percent conductive particulates by mass, being a thermoplastic resin only or a blended resin composition of a thermoplastic resin and a crosslinked resin (particularly a crosslinked resin of polyester and isocyanate and the like), and containing at least 10 percent polyester resin by mass, that is, a solvent volatilization type or a crosslinked/thermoplastic combination type (containing at least 50 percent thermoplastic resin by mass), or one containing at least 50 percent conductive particulates by mass, being a crosslinked resin (a phenol hardening type epoxy resin, or a sulfonium salt hardening type epoxy resin) only or a blended resin composition of a thermoplastic resin and a crosslinked resin, that is, one that is a crosslinked type or a crosslinked/thermoplastic combination type, may be suitably used.

In addition, a flexibilizer can be blended with the conductive paste when resistance to bending is further required in the non-contact IC tag 210. Examples of the flexibilizer are a polyester flexibilizer, acrylic flexibilizer, urethane flexibilizer, polyvinyl acetate flexibilizer, thermoplastic-elastomer flexibilizer, natural-rubber flexibilizer, and synthetic-rubber flexibilizer. In the semiconductor device of the present invention, these flexibilizers can be used alone or in a combination of two or more.

The conductive foil that forms the conductive material that forms the antenna 212 includes copper foil, silver foil, gold foil, platinum foil, etc.

The IC chip 213 is not particularly limited, and as long as writing and reading of information is possible in a non-contact state via the antenna 212, anything may be used that is applicable to RFID media such as non-contact IC tags and non-contact IC labels or non-contact IC cards.

The magnetic layer 220 is a composite body including a bonding agent, a powder consisting of a magnetic material (henceforth "magnetic powder") or flakes consisting of a magnetic material (henceforth "magnetic flakes").

In this composite body, the magnetic powder or the magnetic flakes is/are dispersed nearly uniformly in the bonding agent, so that the magnetic layer 220 functions uniformly as a magnetic body throughout the entire region thereof. Moreover, since the magnetic layer 220 contains a bonding agent that has elasticity as shown below, it functions also as an elastic body.

Examples of the magnetic powder include carbonile iron powder, atomized powder such as permalloy, and reduced iron powder, etc.

Examples of the magnetic flakes include flakes obtained by refining carbonile iron powder, atomized powder such as permalloy, or reduced iron powder, etc. with a ball mill and the like into a fine powder, and then mechanically flattening the powder, and flakes obtained by running molten metal of an iron-based or cobalt-based amorphous alloy into a water-cooled copper plate.

A material having elasticity is used as the bonding agent, with examples of such a material including thermoplastic resin, thermosetting resin, and reactive resin.

Examples of the aforementioned thermoplastic resin including vinyl chloride, vinyl acetate, a vinyl chloride-vinyl acetate copolymer, a vinyl chloride-vinylidene chloride copolymer, a vinyl chloride-acrylonitrile copolymer, an acrylic acid ester-acrylonitrile copolymer, an acrylic ester-vinyl chloride-vinylidene chloride copolymer, an acrylic ester-vinylidene chloride copolymer, a methacrylate ester-vinylidene chloride copolymer, a methacrylate ester-vinyl chloride copolymer, a methacrylic acid ester-ethylene copolymer, polyvinyl fluoride, a vinylidene chloride-acrylonitrile copolymer, an acrylonitrile-butadiene copolymer, polyamide resin, polyvinyl butyral, a cellulose derivative (cellulose acetate butyrate, a cellulose die acetate, cellulose triacetate, cellulose propionate, cellulose nitrate), a styrene-butadiene copolymer, a polyurethane resin, a polyester resin, an amino resin, or a polymer synthetic rubber material such as styrene rubber, fluorine rubber, silicone rubber, and ethylene-propylene copolymer rubber.

Examples of the aforementioned thermosetting resin or reactive resin include phenol resin, epoxy resin, polyurethane hardening resin, urea resin, melamine resin, alkyd resin, silicone resin, polyamine resin, and urea-formaldehyde resin.

As the material including the first resin member 221 and the second resin member 223, thermoplastic resins such as polyethylene, polypropylene, polyester, polyamide, polystyrol, polyvinyl alcohol, vinylidene chloride, and polyethylene terephthalate can be given.

Although the inlet 215 is illustrated in this embodiment with the antenna 212 formed into a coiled shape on one surface of the base substrate 211, the semiconductor device of the present invention is not limited thereto. In the semiconductor device of the present invention, the antenna constituting the inlet may be formed into a pole shape or loop shape on the base substrate.

Also, in this embodiment, an example was shown of the magnetic layer 220 being disposed to so as to cover the antenna 212 and the IC chip 213 provided on one surface of the base substrate 211 as well as the entire area of the one surface of the base substrate 211, however, the semiconductor device of the present invention is not limited thereto. In the semiconductor device of the present invention, it is acceptable for the magnetic layer to be disposed so as to cover at least the antenna and the IC chip provided on one surface of the base substrate.

Also, in this embodiment, an example was shown of the surface 220a of the magnetic layer 220 opposite the surface in contact with the base substrate 211 and a portion of the side surfaces 220b being covered by the first resin member 221, however, the semiconductor device of the present invention is not limited thereto. In the semiconductor device of the present invention, it is acceptable for the first resin member to cover all of the side surfaces of the magnetic layer, or all of the side surfaces of the magnetic layer and a portion or all of the side surfaces of the base substrate.

In the non-contact IC tag 210 of this embodiment, the magnetic layer 220 is provided so as to cover the antenna 212 and the IC chip 213 constituting the inlet 215 and cover the entire surface of the base substrate 211 on which the antenna 212 and the IC chip 213 are provided. Gaps formed by the antenna 212 and the IC chip 213 are filled by the magnetic layer 220. The magnetic layer 220 is a composite body consisting of the bonding agent and the magnetic powder or magnetic flakes. Since the magnetic layer 220 functions as an elastic body, external shocks can be absorbed by the magnetic layer 220, thereby preventing the antenna 212 and the IC chip 213 from vibrating due to external shocks, so that breakage of the antenna 212 and the IC chip 213 can be effectively prevented.

Moreover, in the non-contact IC tag 210, the case 225 made of resin so as to envelop the inlet 215 with the disposed magnetic layer 220 is provided, the magnetic layer 220 consisting of a soft magnetic material is provided so as to cover the entire surface of the base substrate 211 on which the antenna 212 and the IC chip 213 are provided, and gaps formed by the antenna 212 and the IC chip 213 are filled by the magnetic layer 220, so that when the non-contact IC tag 210 is bent, a force is applied uniformly to the entire inlet 215 with the disposed magnetic layer 220, and so flexibility can be imparted to the non-contact IC tag 210.

Moreover, since the magnetic layer 220 provided so as to cover the antenna 212 and the IC chip 213 functions as a magnetic body in the non-contact IC tag 210, flux is picked up by the antenna 212 through the magnetic layer 220. Therefore, by the electromagnetic induction from the information writing/reading device, the antenna 212 can be made to generate sufficient induced electromotive force to operate the IC chip 213. Moreover, since the magnetic layer 220 may be formed to an extent that slightly exceeds the thickness of the antenna coil 212 or the IC chip 213, the combined thickness of the magnetic layer 220, the antenna coil 212 and the IC chip 213 can be made thin, and therefore made thinner than a conventional non-contact IC tag.

Next, the method of manufacturing the aforementioned non-contact IC tag 210 as the fourth embodiment according to the present invention shall be described, referring to FIGS. 8A through 11B.

Figure 8A:
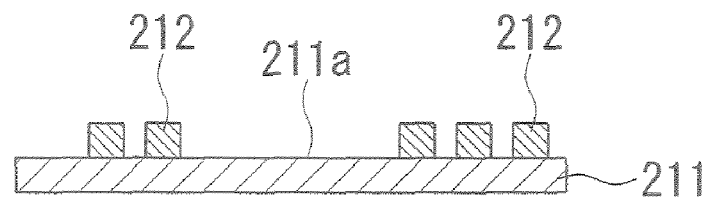
[FIG. 8A] An outline sectional view showing the method of manufacturing the semiconductor device according to the fourth embodiment of the present invention.

In this embodiment, the antenna 212 of a predetermined pattern shown in FIG. 8A is formed by first printing the conductive paste in a predetermined pattern on one surface 211a of the base substrate 211 by screen printing and then drying the conductive paste, or attaching an electrically conductive foil and then performing etching.

In the case of attaching a conductive foil onto the surface 211a of the base substrate 211 and then forming the antenna 212 by etching, first the conductive foil is attached to the entire surface 211a of the base substrate 211. Subsequently, an etch-resistant coating is printed by a silk screen method onto this conductive foil in a predetermined pattern. Since the antenna 212 is normally formed in a coil shape, pole shape or loop shape, the etch-resistant coating is printed in a coil shape, pole shape or loop shape.

After drying and hardening this etch-resistant coating it is immersed in an etching solution, wherein the portion of the conductive foil that is not coated with the etch-resistant coating dissolves away, leaving the portion coated with the etch-resistant coating on the one surface 211a of the base substrate 211, thereby forming the antenna coil 212.

Figure 8B:
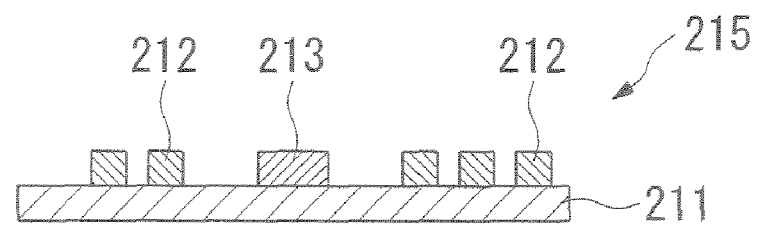
[FIG. 8B] An outline sectional view showing the method of manufacturing the semiconductor device according to the fourth embodiment of the present invention.

Next, the IC chip 213 is mounted at the predetermined position on the surface 211a of the base substrate 211 via an electrically conductive adhesive so that contacts provided in the antenna 212 and contacts provided in the IC chip 213 overlap. By applying a prescribed pressure to the IC chip 213, the IC chip 213 bonds to the base substrate 211. The inlet 215 as shown in FIG. 8B is formed by the electrical connection between the antenna 212 and the IC chip 213 via the contacts provided in the antenna 212 and contacts provided in the IC chip 213.

Figure 8C:
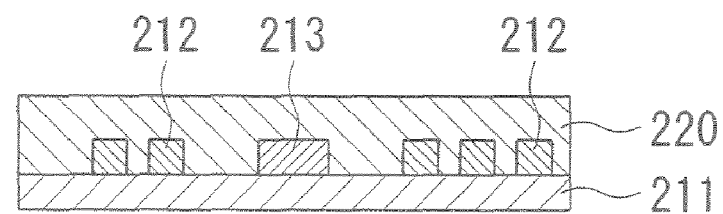
[FIG. 8C] An outline sectional view showing the method of manufacturing the semiconductor device according to the fourth embodiment of the present invention.

Next, a magnetic coating including a magnetic powder or magnetic flakes and a bonding agent is applied by a screen printing method so as to cover the antenna 212 and the IC chip 213 provided on one surface of the base substrate 211 as well as the entire area of the one surface of the base substrate 211. After applying the magnetic coating, it is dried and hardened by being left to stand at room temperature or heating the magnetic coating for a prescribed time at a prescribed temperature. As shown in FIG. 8C, the magnetic layer 220 is thereby formed so as to cover the antenna 212 and the IC chip 213 provided on one surface of the base substrate 211 as well as the entire surface of the base substrate 211.

As the aforementioned magnetic coating, a liquid is used consisting of a magnetic powder or magnetic flakes and a bonding agent distributed in an organic solvent.

Figure 9A:
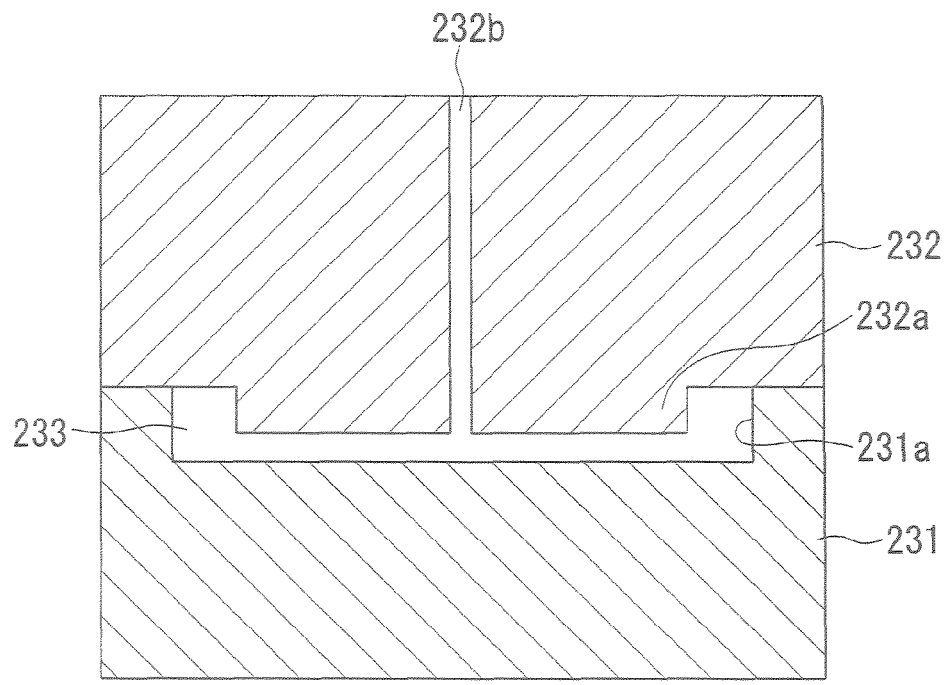
[FIG. 9A] An outline sectional view showing the method of manufacturing the semiconductor device according to the fourth embodiment of the present invention.

Subsequently, as shown in FIG. 9A, a first metal mold 231 provided with a recessed portion 231a and a second metal mold 232 provided with a protruding portion 232a and a resin supply port 232b are mated so that the recessed portion 231a and the protruding portion 232a face each other. A space 233 is thereby formed by the first metal mold 231 and the second metal mold 232.

In addition, the recessed portion 231a provided in the first metal mold 231 has a depth equivalent to the thickness of the first resin member and a shape equivalent to the outer shape of the first resin member.

Moreover, the protruding portion 232a provided on the second metal mold 232 has a height equivalent depth of the recessed portion formed in the first resin member and an outer shape equivalent to the shape of the recessed portion.

Furthermore, the supply port 232b provided in the second metal mold 232 bores through the second metal mold 232 from the surface of the second metal mold 232 opposite the surface on which the protruding portion 232a is provided, that is, the outer surface of the second metal mold 232, to the protruding portion 232a, being provided in a position facing the recessed portion 231a provided in the first metal mold 231.

Figure 9B:
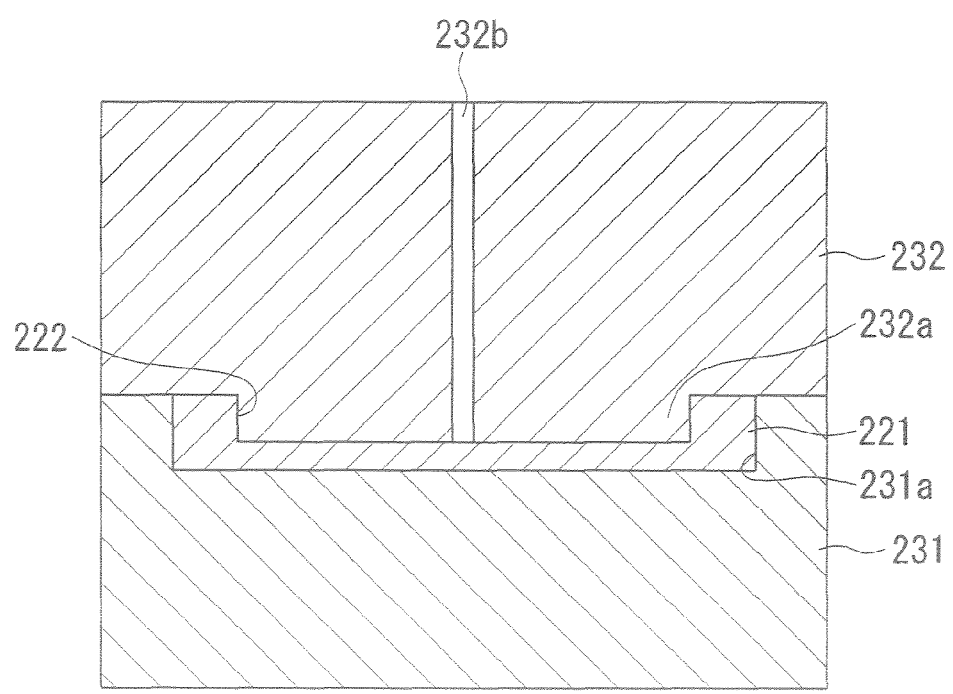
[FIG. 9B] An outline sectional view showing the method of manufacturing the semiconductor device according to the fourth embodiment of the present invention.

Next, in this state, resin for molding the first resin member is supplied from the supply port 232b provided in the second metal mold 232. The space 233 formed by the first metal mold 231 and the second metal mold 232 is filled by the resin, and as shown in FIG. 9B, the first resin member 221 having the recessed portion 222 is thereby molded.

In addition, although the method of supplying resin from the supply port 232b to the space 233 may be an injection method or a pouring method, an injection method is preferable since it can raise production efficiency.

Figure 10A:
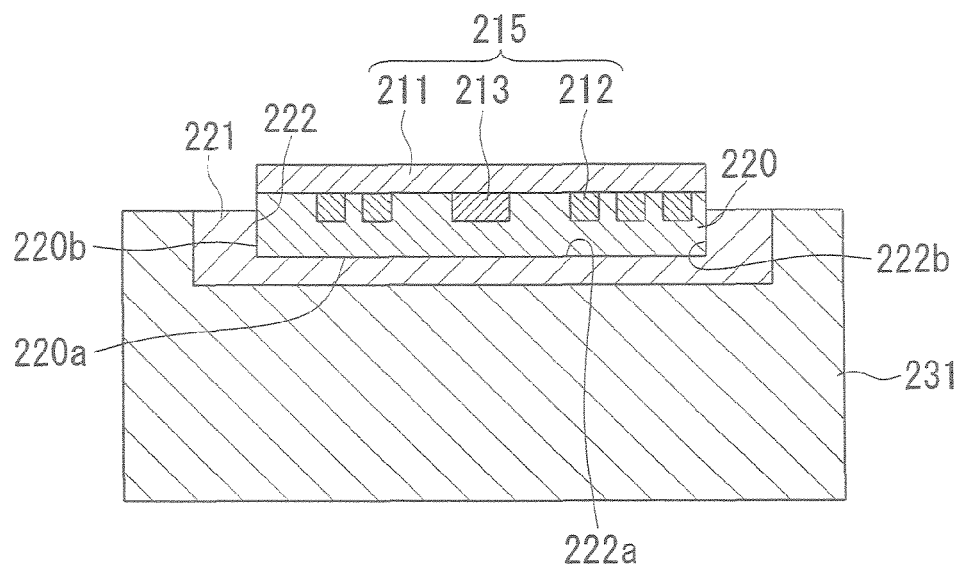
[FIG. 10A] An outline sectional view showing the method of manufacturing the semiconductor device according to the fourth embodiment of the present invention.

Next, after removing the second metal mold 232 from the first metal mold 231, as shown in FIG. 10A, in the recessed portion 222 formed by the protruding portion 232a of the second metal mold 232 in the first resin member 221 molded in the recessed portion 231a of the first metal mold 231, the surface 220a of the magnetic layer 220 opposite the surface in contact with the base substrate 211 contacts a bottom surface 222a of the recessed portion 222, at least a portion of the side surfaces 220b of the magnetic layer 220 contact the inner side surfaces 222b of the recessed portion 222, and the inlet 215 with the disposed the magnetic layer 220 is accommodated so that at least a portion of the magnetic layer 220 is housed.

In this case, the recessed portion 222 formed in the first resin member 221 is formed to have a depth equivalent to the thickness of the magnetic layer 220 disposed on the surface 211a of the inlet 215 and a shape equivalent to the outer shape of the magnetic layer 220. That is, the protruding portion 232a provided on the second metal mold 232 has a height equivalent to the thickness of the magnetic layer 220 and an outer shape of the magnetic layer 220.

Figure 10B:
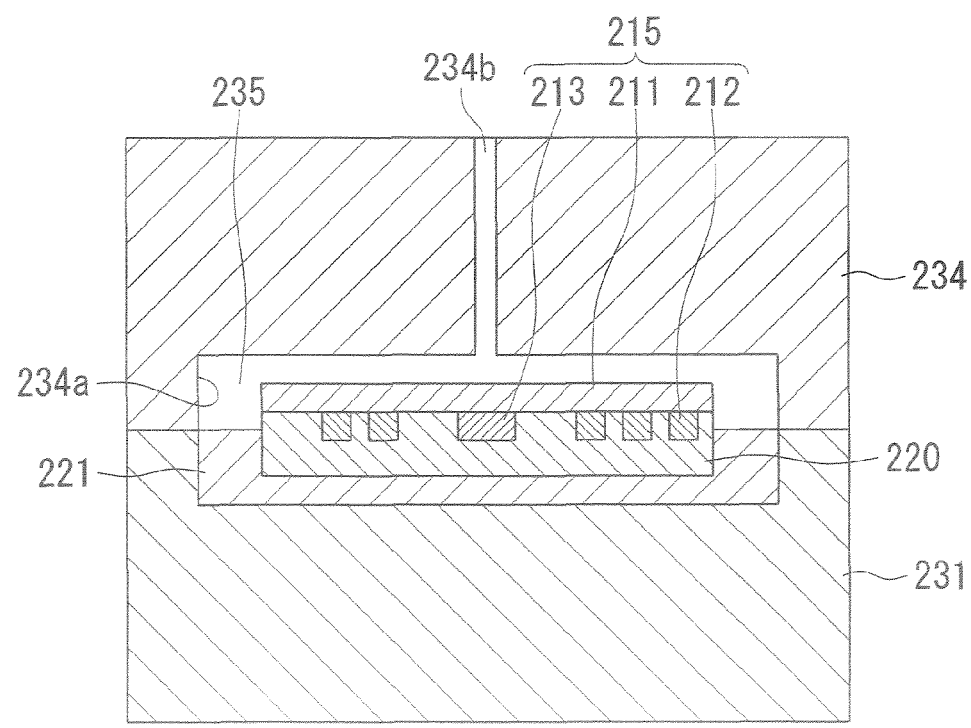
[FIG. 10B] An outline sectional view showing the method of manufacturing the semiconductor device according to the fourth embodiment of the present invention.

Next, as shown in FIG. 10B, in order to mold the second resin member that covers the portion of the inlet 215 with the magnetic layer 220 accommodated in the recessed portion 222 of the first resin member 221 not covered by the first resin member 221, a third metal mold 234 provided with a recessed portion 234a and a resin supply port 234b is mated with the first metal mold 231 so that the inlet 215 with the magnetic layer 220 housed in the recessed portion 222 of the first resin member 221 enters a recessed portion 234a. Thereby a space 235 is formed by the inlet 215, the first resin member 221, and the third metal mold 234.

In addition, the recessed portion 234a provided in the third metal mold 234 has a depth equivalent to the thickness of the second resin member and a shape equivalent to the outer shape of the second resin member. The supply port 234b provided in the third metal mold 234 bores through the third metal mold 234 from the surface of the third metal mold 234 opposite the surface on which the recessed portion 234a is provided, that is, the outer surface of the third metal mold 234, to the recessed portion 234a, being provided in a position facing the recessed portion 231a provided in the first metal mold 231 when the first metal mold 231 and the third metal mold 234 are mated together.

Figure 11A:
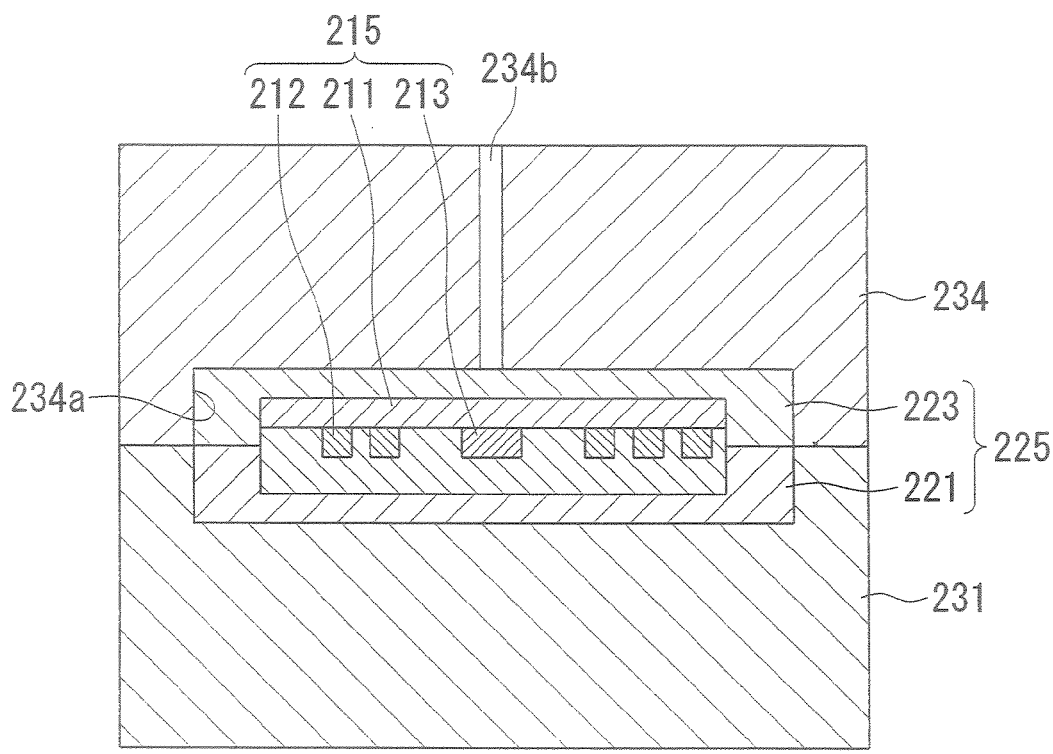
[FIG. 11A] An outline sectional view showing the method of manufacturing the semiconductor device according to the fourth embodiment of the present invention.

Next, in this state, the same resin as the resin for molding the first resin member 221 is supplied from the supply port 234b provided in the third metal mold 234. The space 235 formed by the inlet 215, the first resin member 221 and the third metal mold 234 is filled by the resin, and as shown in FIG. 11A, in addition to molding the second resin member 223, the case 225 is formed by integrating the first resin member 221 and the second resin member 223, with the inlet 215 with the disposed magnetic layer 220 being sealed by the case 225.

In addition, although the method of supplying resin from the supply port 234b to the space 235 may be an injection method or a pouring method, an injection method is preferable since it can raise production efficiency.

Figure 11B:
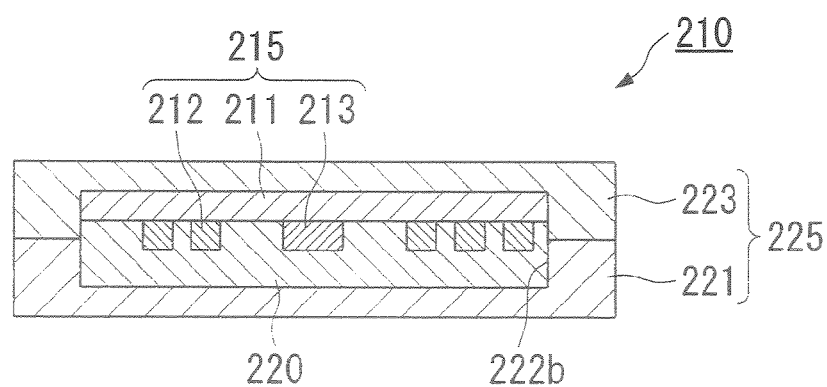
[FIG. 11B] An outline sectional view showing the method of manufacturing the semiconductor device according to the fourth embodiment of the present invention.

The first metal mold 231 and the third metal mold 234 are then subsequently removed to obtain the non-contact IC tag 210 as shown in FIG. 11B.

In this embodiment, after housing the inlet 215 with the disposed magnetic layer 220 so as to accommodate at least a portion of the magnetic layer 220 in the recessed portion 222 provided in the first resin member 221, resin is supplied from the side of the inlet 215 on which the antenna 212 and the IC chip 213 are not mounted so as to cover the portion not covered by the first resin member 221. Therefore, since the pressure directly applied to the IC chip 213 by the resin supply is reduced, damage to the IC chip 213 and disconnection of the antenna 212 and the IC chip 213 provided on the base substrate 211 at the contacts can be effectively prevented. In addition, since the pressure due to supply of the resin can be absorbed by the magnetic layer 220 that is made of an elastic body, damage to the IC chip 213 and disconnection of the antenna 212 and the IC chip 213 provided on the base substrate 211 at the contacts 214 can be effectively prevented.

Figure 12A:
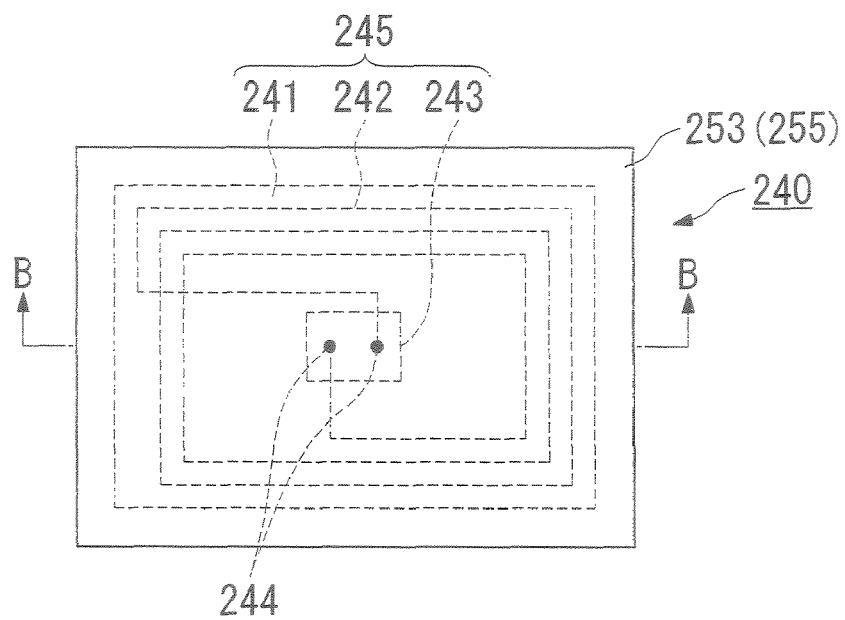
[FIG. 12A] A plan view showing the internal structure of the non-contact IC tag concerning the fifth embodiment of the present invention.
Figure 12B:
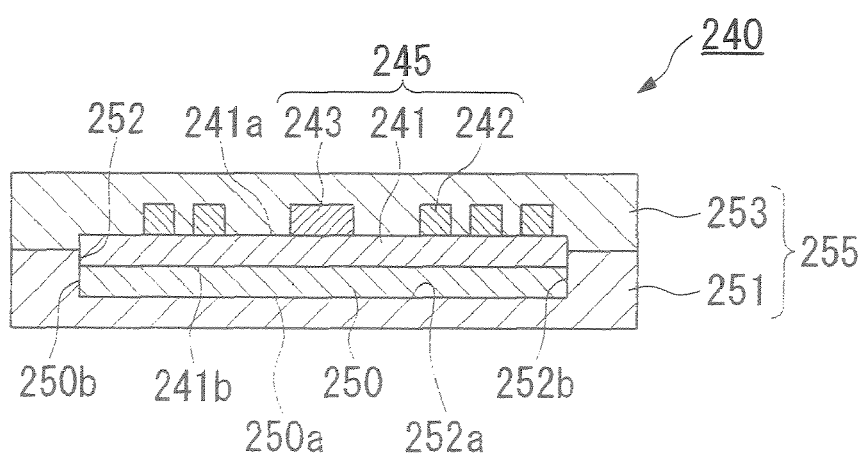
[FIG. 12B] A sectional view along line B-B of FIG. 12A.

FIGS. 12A and 12B are schematic diagrams showing the non-contact IC tag that is the fifth embodiment according to the present invention, with FIG. 12A being a plan view showing an internal structure and FIG. 12B being a sectional view along line B-B in FIG. 12A.

In FIG. 12A and FIG. 12B, 240 denotes a non-contact IC tag, 241a base substrate, 242 an antenna, 243 an IC chip, 244 contacts, 245 an inlet, 250 a magnetic layer, 251a first resin member, 252 a recessed portion, 253 a second resin member, and 255 a case.

The non-contact IC tag 240 is constituted from the inlet 245 including the base substrate 241 and the electrically connected antenna 242 and IC chip 243 provided on one surface 241a thereof; a magnetic layer 250 disposed so as to cover the other surface 241b of the base substrate 241 constituting the inlet 245; and a case 255 including a first resin member 251 provided so as to envelop the inlet 245 with the disposed magnetic layer 250 and the second resin member 253.

In the non-contact IC tag 240, the antenna 242 is formed in a coiled shape on one surface of the base substrate 241, with both ends thereof being electrically connected to the IC chip 243 by the contacts 244.

Moreover, the magnetic layer 250 is disposed to as to cover the entire other surface 241b of the base substrate 241.

The first resin member 251 has a recessed portion 252 large enough to accommodate at least a portion of the inlet 245 with the disposed magnetic layer 250, that is, at least a portion of the magnetic layer 250 covering the other surface 241b of the base substrate 241 constituting the inlet 245. At least a portion of the magnetic layer 250 is accommodated in the recessed portion 252 and at least a portion of the magnetic layer 250 is covered by the first resin member 251 so that the surface 250a of the magnetic layer 250 opposite the surface in contact with the base substrate 241 contacts the bottom surface 252a of the recessed portion 252 and at least a portion of the side surfaces 250b of the magnetic layer 250 contact the inner side surfaces 252b of the recessed portion 252. Also, the second resin member 253 is disposed to face the first resin member 251 and be continuous with the first resin member 251, covering the portion of the inlet 245 with the disposed magnetic layer 250 not covered by the first resin member 251, that is, the antenna 242 and the IC chip 243 provided on the one surface 241a of the base substrate 241 as well as the entire area of the surface 241a of the base substrate 241, filling gaps formed by the antenna 242 and the IC chip 243. Thereby, the inlet 245 with the disposed magnetic layer 250 has a configuration of being sealed by the case 255 made of the first resin member 251 and the second resin member 253.

The base substrate 241 is the same as the aforementioned base substrate 211. The antenna 242 is formed by the same material as the electrically conductive body forming the aforementioned antenna 212. The IC chip 243 is the same as the aforementioned IC chip 213.

The magnetic layer 250 is a composite body including a bonding agent, a magnetic power or magnetic flakes, same as the magnetic layer 220.

In this composite body, the magnetic powder or magnetic flakes is/are dispersed nearly uniformly in the bonding agent, so that the magnetic layer 250 functions uniformly as a magnetic body throughout the entire region thereof. Moreover, since the magnetic layer 250 contains a bonding agent that has elasticity as described above, it functions also as an elastic body.

The same materials as those forming the first resin member 221 and the second resin member 223 are given as materials forming the first resin member 251 and the second resin member 253.

Although the inlet 245 is illustrated in this embodiment with the antenna 242 formed into a coiled shape on one surface 241a of the base substrate 241, the semiconductor device of the present invention is not limited thereto. In the semiconductor device of the present invention, the antenna constituting the inlet may be formed into a pole shape or loop shape on the base substrate.

Also, in this embodiment the example was shown of the magnetic layer 250 being disposed so as to cover the entire area of the other surface 241b of the base substrate 241, however, the semiconductor device of the present invention is not limited thereto. In the semiconductor device of the present invention, the magnetic layer may be disposed on the other surface of the base substrate so as to overlap at least the antenna and the IC chip provided on the one surface of the base substrate.

Also, in this embodiment, an example was shown of the surface 250a of the magnetic layer 250 opposite the surface in contact with the base substrate 241 and a portion of the side surfaces 250b covered by the first resin member 251, but the semiconductor device of the present invention is not limited thereto. In the semiconductor device of the present invention, the first resin member may cover all of the side surfaces of the magnetic layer, or all of the side surfaces of the magnetic layer and a portion or all of the side surfaces of the base substrate.

In the non-contact IC tag 240 of this embodiment, the magnetic layer 250 is provided so as to cover the entire area of the other surface 241b of the base substrate 241 constituting the inlet 245, the magnetic layer 250 is a composite body consisting of the bonding agent and the magnetic powder or magnetic flakes and functions as an elastic body, and gaps formed by the antenna 242 and the IC chip 243 are filled by the magnetic layer 250. Therefore, external shocks can be absorbed by the magnetic layer 250, thereby preventing the antenna 242 and the IC chip 243 from vibrating due to external shocks, so that breakage of the antenna 242 and the IC chip 243 can be effectively prevented.

Moreover, in the non-contact IC tag 240, the case 255 made of resin so as to envelop the inlet 245 with the disposed magnetic layer 250 is provided, the magnetic layer 250 consisting of a soft magnetic material is provided so as to cover the entire area of the other surface 241b of the base substrate 241, and gaps formed by the antenna 242 and the IC chip 243 are filled by the second resin member 253, so that when the non-contact IC tag 240 is bent, a force is applied uniformly to the entire inlet 245 with the disposed magnetic layer 250, and so flexibility can be imparted to the non-contact IC tag 240.

Moreover, since the magnetic layer 250 provided so as to cover the other surface 241b of the base substrate 241 even functions as a magnetic body in the non-contact IC tag 240, flux is picked up by the antenna 242 through the magnetic layer 250. Therefore, by the electromagnetic induction from the information writing/reading device, the antenna 242 can be made to generate sufficient induced electromotive force to operate the IC chip 243. Moreover, since the magnetic layer 250 can adequately function even if provided thinner than the thickness of the base substrate 241, the combined thickness of the magnetic layer 250 and the inlet 245 can be made thin, and therefore made thinner than a conventional non-contact IC tag.

Next, the method of manufacturing the aforementioned non-contact IC tag 240 as the sixth embodiment according to the present invention shall be described, referring to FIGS. 13A through 16B.

Figure 13A:
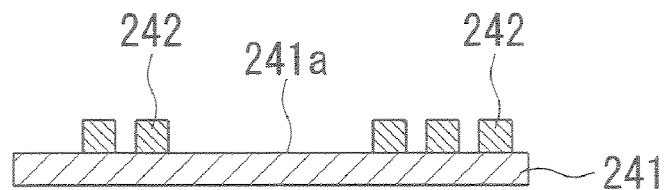
[FIG. 13A] An outline sectional view showing the method of manufacturing the semiconductor device according to the sixth embodiment of the present invention.

In this embodiment, the antenna 242 of a predetermined pattern shown in FIG. 13A is formed by first printing the electrically conductive paste in a predetermined pattern on one surface 241a of the base substrate 241 by screen printing and then drying the conductive paste, or attaching an electrically conductive foil and then performing etching.

Figure 13B:
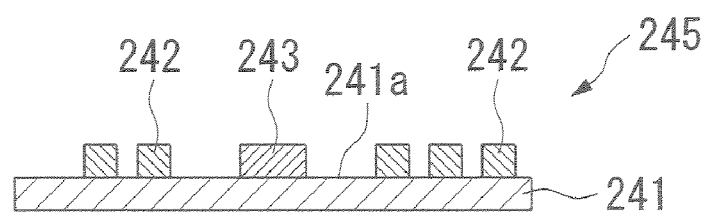
[FIG. 13B] An outline sectional view showing the method of manufacturing the semiconductor device according to the sixth embodiment of the present invention.

Next, the IC chip 243 is mounted at the predetermined position on the surface 241a of the base substrate 241 via an electrically conductive adhesive so that contacts provided in the antenna 242 and contacts provided in the IC chip 243 overlap. By applying a prescribed pressure to the IC chip 243, the IC chip 243 bonds to the base substrate 241. The inlet 245 as shown in FIG. 13B is formed by the electrical connection between the antenna 242 and the IC chip 243 via the contacts provided in the antenna 242 and contacts provided in the IC chip 243.

Figure 13C:
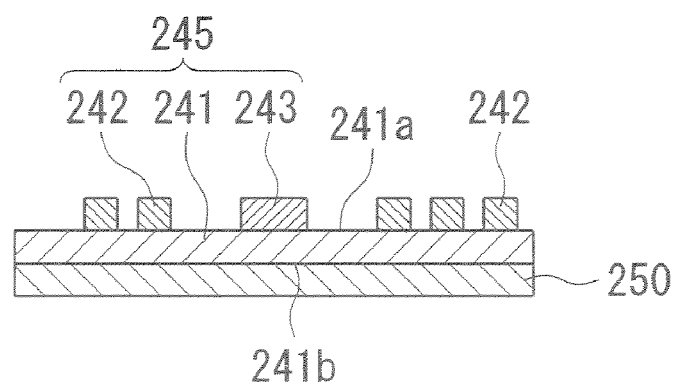
[FIG. 13C] An outline sectional view showing the method of manufacturing the semiconductor device according to the sixth embodiment of the present invention.

Next, a magnetic coating including a magnetic powder or magnetic flakes and a bonding agent is applied by a screen printing method so as to cover the entire area of the other surface 241b of the base substrate 241. After applying the magnetic coating, it is dried and hardened by being left to stand at room temperature or heating the magnetic coating for a prescribed time at a prescribed temperature. As shown in FIG. 13C, the magnetic layer 250 is thereby formed so as to cover the entire area of the other surface 241b of the base substrate 241.

As the aforementioned magnetic coating, a liquid is used consisting of a magnetic powder or magnetic flakes and a bonding agent distributed in an organic solvent.

Figure 14A:
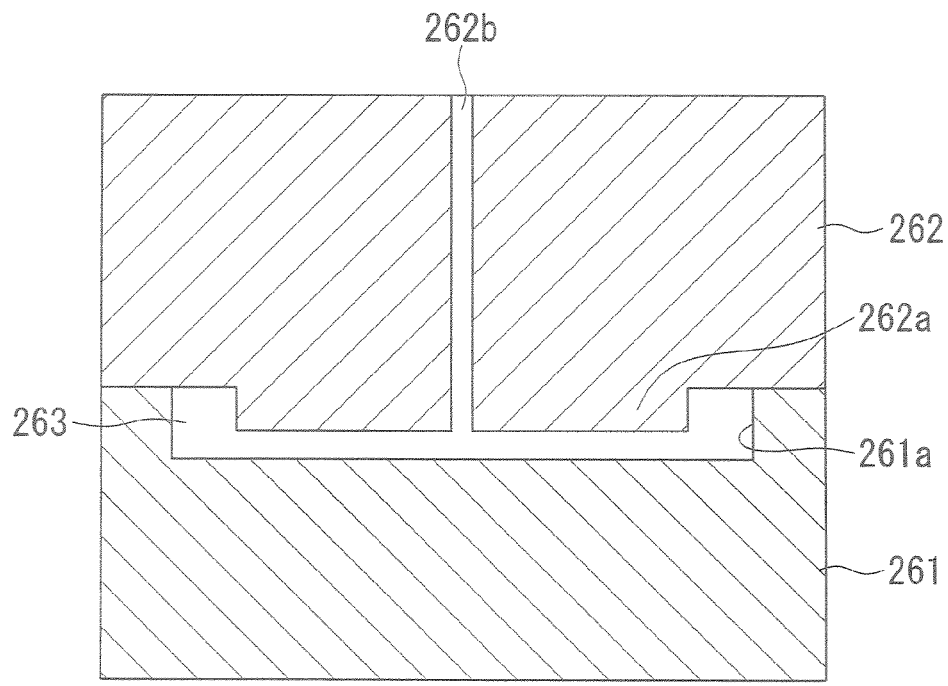
[FIG. 14A] An outline sectional view showing the method of manufacturing the semiconductor device according to the sixth embodiment of the present invention.

Subsequently, as shown in FIG. 14A, a first metal mold 261 provided with a recessed portion 261a and a second metal mold 262 provided with a protruding portion 262a and a resin supply port 262b are mated so that the recessed portion 261a and the protruding portion 262a face each other. A space 263 is thereby formed by the first metal mold 261 and the second metal mold 262.

In addition, the recessed portion 261a provided in the first metal mold 261 has a depth equivalent to the thickness of the first resin member and a shape equivalent to the outer shape of the first resin member.

Moreover, the protruding portion 262a provided on the second metal mold 262 has a height equivalent depth of the recessed portion formed in the first resin member and an outer shape equivalent to the shape of the recessed portion.

Furthermore, the supply port 262b provided in the second metal mold 262 bores through the second metal mold 262 from the surface of the second metal mold 262 opposite the surface on which the protruding portion 262a is provided, that is, the outer surface of the second metal mold 262, to the protruding portion 262a, being provided in a position facing the recessed portion 261a provided in the first metal mold 261.

Figure 14B:
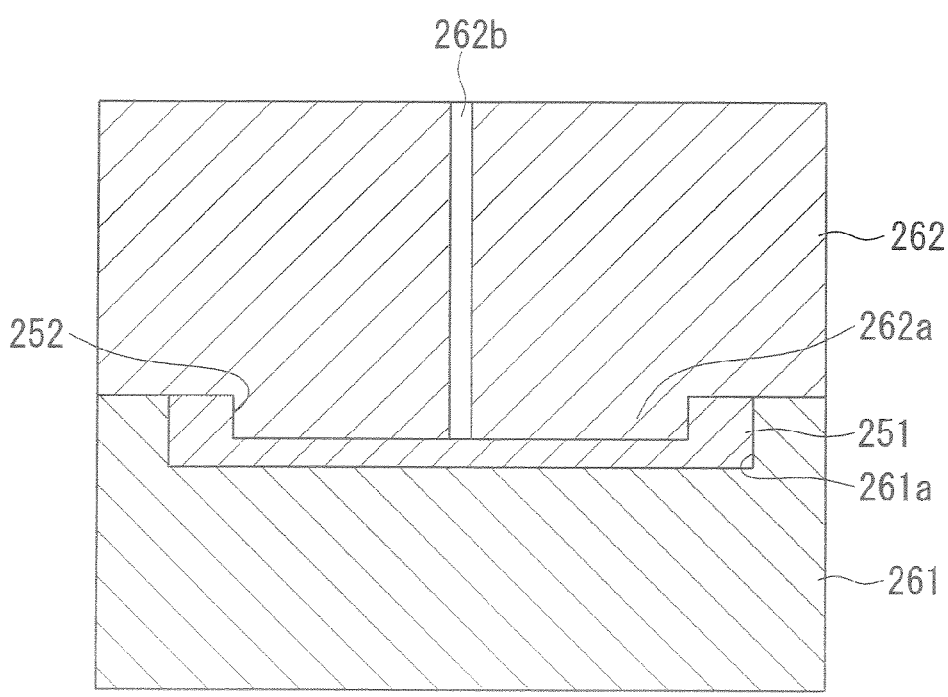
[FIG. 14B] An outline sectional view showing the method of manufacturing the semiconductor device according to the sixth embodiment of the present invention.

Next, in this state, resin for molding the first resin member is supplied from the supply port 262b provided in the second metal mold 262. The space 263 formed by the first metal mold 261 and the second metal mold 262 is filled by the resin, and as shown in FIG. 14B, the first resin member 251 having the recessed portion 252 is thereby molded.

In addition, although the method of supplying resin from the supply port 262b to the space 263 may be an injection method or a pouring method, an injection method is preferable since it can raise production efficiency.

Figure 15A:
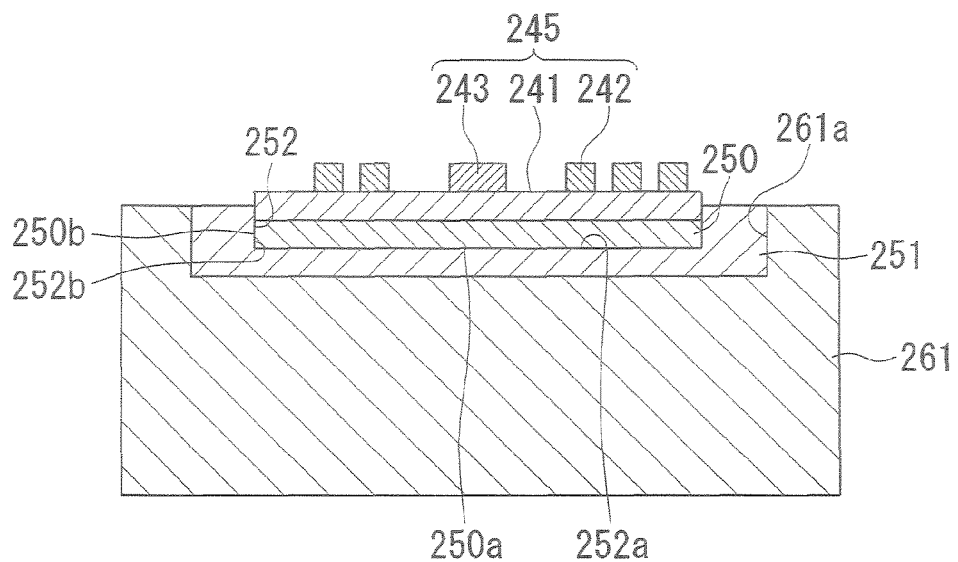
[FIG. 15A] An outline sectional view showing the method of manufacturing the semiconductor device according to the sixth embodiment of the present invention.

Next, after removing the second metal mold 262 from the first metal mold 261, as shown in FIG. 15A, in the recessed portion 252 formed by the protruding portion 262a of the second metal mold 262 in the first resin member 251 molded in the recessed portion 261a of the first metal mold 261, the surface 250a of the magnetic layer 250 opposite the surface in contact with the base substrate 241 contacts a bottom surface 252a of the recessed portion 252, at least a portion of the side surfaces 250b of the magnetic layer 250 contact the inner side surfaces 252b of the recessed portion 252, and the inlet 245 with the disposed the magnetic layer 250 is accommodated so that at least a portion of the magnetic layer 250 is housed.

In this case, the recessed portion 252 formed in the first resin member 251 is formed to have a depth equivalent to the thickness of the magnetic layer 250 disposed on the other surface 241b of the inlet 245 and a shape equivalent to the outer shape of the magnetic layer 250. That is, the protruding portion 262a provided on the second metal mold 262 has a height equivalent to the thickness of the magnetic layer 250 and an outer shape of the magnetic layer 250.

Figure 15B:
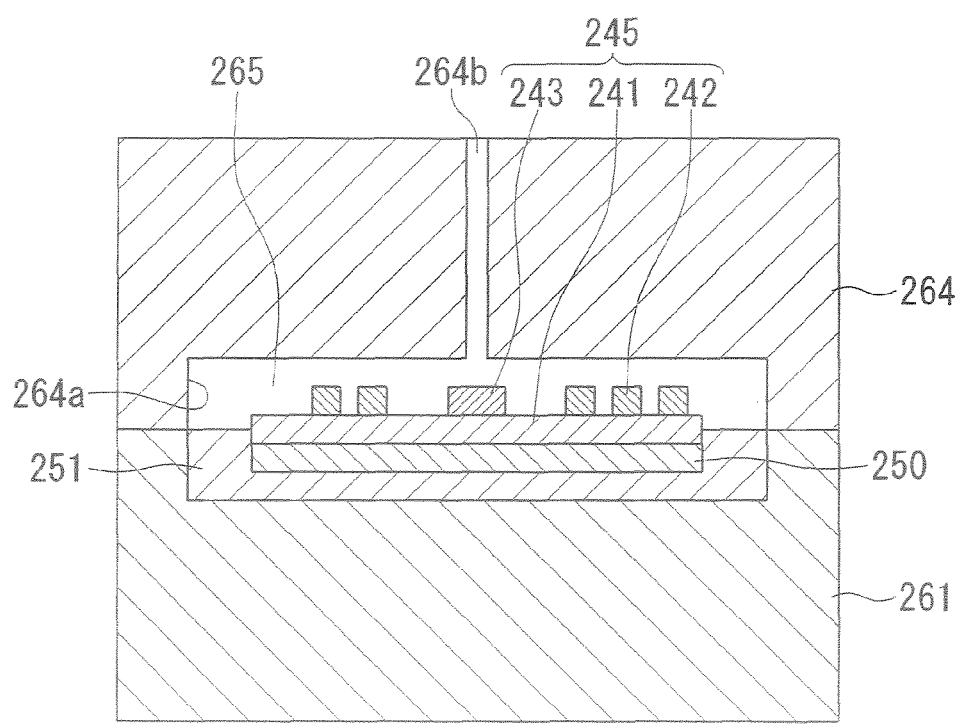
[FIG. 15B] An outline sectional view showing the method of manufacturing the semiconductor device according to the sixth embodiment of the present invention.

Next, as shown in FIG. 15B, in order to mold the second resin member that covers the portion of the inlet 245 with the disposed magnetic layer 250 accommodated in the recessed portion 252 of the first resin member 251 not covered by the first resin member 251, a third metal mold 264 provided with a recessed portion 264a and a resin supply port 264b is mated with the first metal mold 261 so that the inlet 245 with the magnetic layer 250 housed in the recessed portion 252 of the first resin member 251 enters a recessed portion 264a. Thereby a space 265 is formed by the inlet 245, the first resin member 251, and the third metal mold 264.

In addition, the recessed portion 264a provided in the third metal mold 264 has a depth equivalent to the thickness of the second resin member and a shape equivalent to the outer shape of the second resin member. The supply port 264b provided in the third metal mold 264 bores through the third metal mold 264 from the surface of the third metal mold 264 opposite the surface on which the recessed portion 264a is provided, that is, the outer surface of the third metal mold 264, to the recessed portion 264a, being provided in a position facing the recessed portion 261a provided in the first metal mold 261 when the first metal mold 261 and the third metal mold 264 are mated together.

Figure 16A:
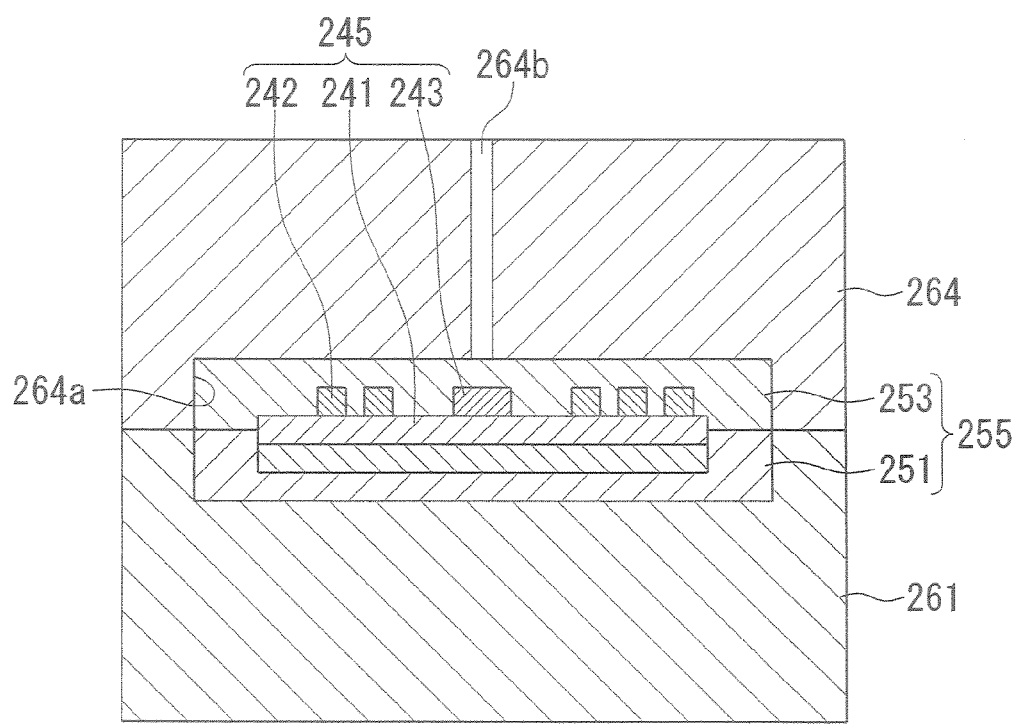
[FIG. 16A] An outline sectional view showing the method of manufacturing the semiconductor device according to the sixth embodiment of the present invention.
Figure 16B:
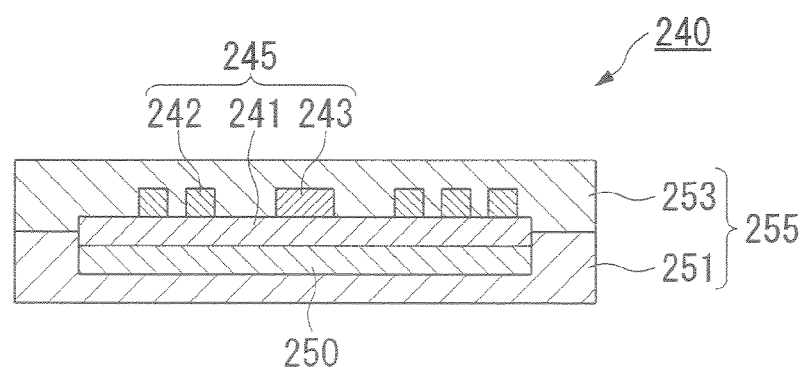
[FIG. 16B] An outline sectional view showing the method of manufacturing the semiconductor device according to the sixth embodiment of the present invention.
Figure 17A:
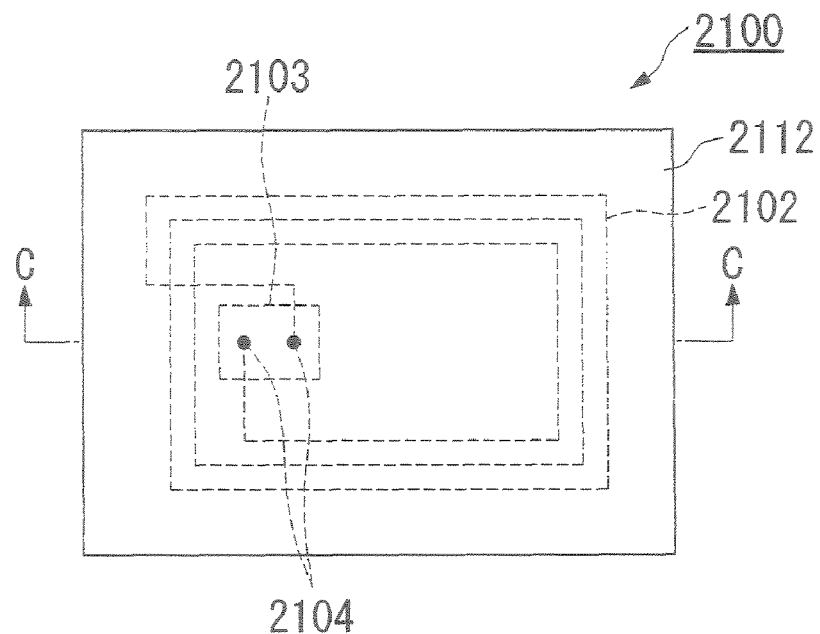
[FIG. 17A] A plan view showing the internal structure of an example of a conventional non-contact IC tag.
Figure 17B:
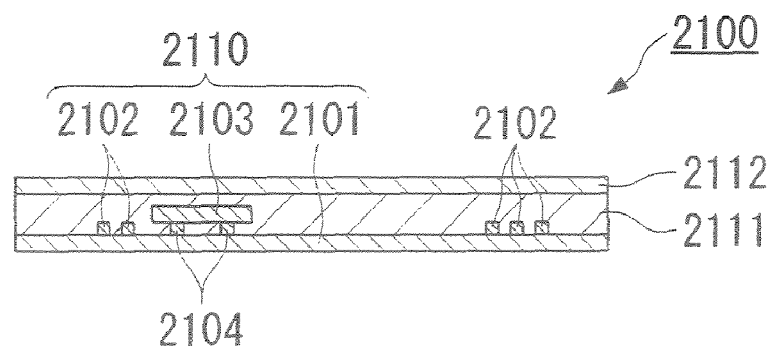
[FIG. 17B] A sectional view along line C-C of FIG. 17A.

Next, in this state, the same resin as the resin for molding the first resin member 251 is supplied from the supply port 264b provided in the third metal mold 264. The space 265 formed by the inlet 245, first metal mold 251 and the third metal mold 264 is filled by the resin, and as shown in FIG. 16A, in addition to molding the second resin member 253, the case 255 is formed by integrating the first resin member 251 and the second resin member 253, with the inlet 245 with the disposed magnetic layer 250 being sealed by the case 255.

In addition, although the method of supplying resin from the supply port 264b to the space 265 may be an injection method or a pouring method, an injection method is preferable since it can raise production efficiency.

The first metal mold 261 and the third metal mold 264 are then subsequently removed to obtain the non-contact IC tag 240 as shown in FIG. 163.

In this embodiment, after housing the inlet 245 with the disposed magnetic layer 250 so as to accommodate at least a portion of the magnetic layer 250 in the recessed portion 252 provided in the first resin member 251, resin is supplied from the side of the inlet 245 on which the antenna 242 and the IC chip 243 are mounted so as to cover the portion not covered by the first resin member 251. However, since the magnetic layer 250 including an elastic body functions as a shock absorbing material and distributes pressure directly applied to the IC chip 243 by the resin supply, damage to the IC chip 243 and disconnection of the antenna 242 and the IC chip 243 provided on the base substrate 241 at the contacts can be effectively prevented.

Hereinbelow, the embodiment of a non-contact data reception/transmission unit, a manufacturing method and a manufacturing apparatus therefor shall be explained using drawings.

This embodiment is explained in concrete terms in order to more clearly comprehend the gist of the invention, and unless stated otherwise, shall not serve to limit the present invention.

Figure 18:
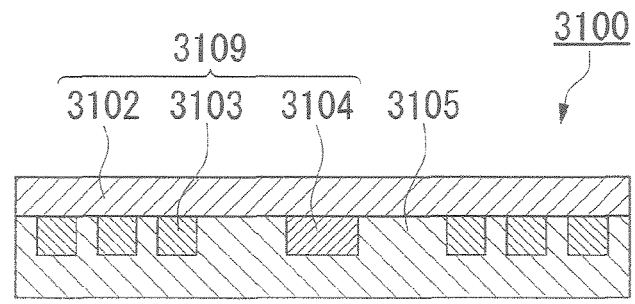
[FIG. 18] A sectional view showing the non-contact data reception/transmission unit according to the seventh embodiment of the present invention.

FIG. 18 is an outline sectional view showing the seventh embodiment of the non-contact data reception/transmission unit according to the present invention.

The non-contact data reception/transmission unit according to the present invention consists of the following constitution.

(1) Providing an inlet 3109 on one surface of a base substrate 3102 means an antenna 3103 and an IC chip 3104 that constitute the inlet 3109 are not provided on both surfaces of the base substrate 3102 but on either one of the surfaces thereof.

(2) Connecting the antenna 3103 and the IC chip 3104, which constitute the inlet 3109, means the end portions of the antenna 3103 being respectively connected to both terminals of the IC chip 3104.

(3) A composite body, including a bonding agent and a magnetic powder or magnetic flakes, forming a magnetic layer 3105 covering the antenna 3103 and the IC chip 3104 constituting the inlet 3109 means covering to a degree that the antenna 3103 and the IC chip 3104 are slightly concealed, and preferably covering so that the external surface (open surface) of the magnetic layer 3105 is flat.

Figure 19:
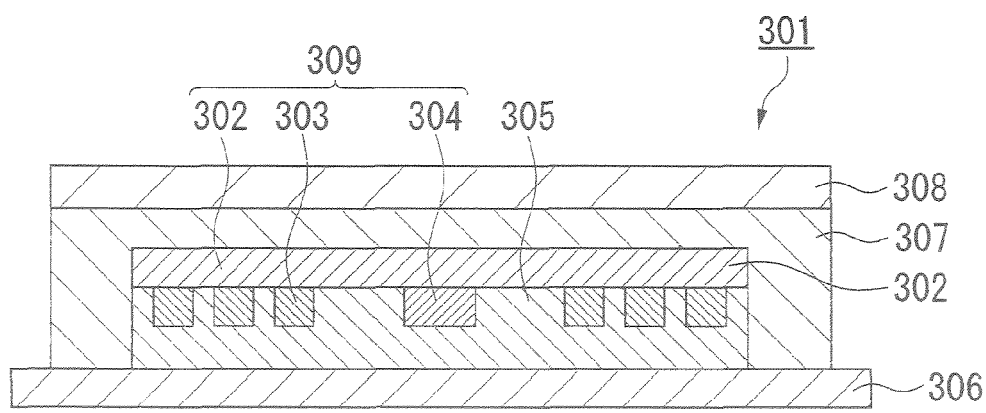
[FIG. 19] A sectional view showing the non-contact data reception/transmission unit according to the eighth embodiment of the present invention.

FIG. 19 is an outline sectional view showing the eighth embodiment of the non-contact data reception/transmission unit according to the present invention.

The non-contact data reception/transmission unit according to the present invention consists of the following constitution.

(1) Providing an inlet 309 on one surface of a base substrate 302 means an antenna 303 and an IC chip 304 that constitute the inlet 309 are not provided on both surfaces of the base substrate 302 but on either one of the surfaces thereof.

(2) Connecting the antenna 303 and the IC chip 304, which constitute the inlet 309, means the end portions of the antenna 303 being respectively connected to both terminals of the IC chip.

(3) A composite body, including a bonding agent and a magnetic powder or magnetic flakes, forming a magnetic layer 305 covering the antenna 303 and the IC chip 304 constituting the inlet 309 means covering to a degree that the antenna 303 and the IC chip 304 are slightly concealed, and preferably covering so that the external surface (open surface) of the magnetic layer 305 is flat.

(4) By a release paper 306 being provided via the magnetic layer 305, the release paper 306 and the magnetic layer 305 may be directly connected, or the release paper 306 may be attached to the magnetic layer 305 via an adhesive layer.

(5) The other surface of the base substrate 302 refers to the surface on the opposite side of the surface on which the antenna 303 and the IC chip 304 are provided.

(6) As for an overlay material 308 provided on the other surface of the base substrate 302 via an adhesive layer 307, the overlay material 308 may be provided with the adhesive layer 307 between the base substrate 302 and the overlay material 308, and the overlay material 308 may be attached to the top side of the base substrate 302 with the adhesive layer 307 be provided so as to cover both side surfaces of the inlet 309 and the top side of the base substrate 302.

At least the surface layer of the base substrate 302, 3102 in these embodiments may be a publicly known material such as a woven fabric, non-woven fabric, mat, paper or combination thereof made from inorganic fiber such as glass fiber or alumina fiber and organic fiber such as polyester fiber or polyamide fiber; a composite base substrate formed by impregnating any thereof with a resin varnish; a plastic substrate such as a polyamide resin substrate, polyester resin (PET, PEN, etc.) substrate, polyolefine resin substrate, polyimide resin substrate, ethylene vinyl alcohol copolymer substrate, polyvinyl alcohol resin substrate, polyvinyl chloride resin (PVC etc.) substrate, polyvinylidence chloride resin substrate, polystyrene resin substrate, polycarbonate resin (PC, etc.) substrate, acrylonitrile styrene butadiene copolymerization resin substrate, polyether sulfone resin substrate or any thereof subjected to mat treatment, corona discharge treatment, plasma treatment, ultraviolet irradiation treatment, electron-beam-irradiation treatment, flame plasma treatment and ozone treatment, or surface treatment such as easy adhesion treatment. Among these, an electrically insulating film or sheet consisting of polyethylene terephthalate (PET) or polyimide is suitably used.

The antenna 303, 3103 can be formed by screen printing a predetermined pattern with a polymer conductive ink or etching a conductive foil on one surface of the base substrate 302, 3102.

As examples of the polymer conductive ink used in the present invention, those that have electrically conductive particulates such as silver dust, gold dust, platinum powder, aluminum powder, powder of palladium and rhodium and the like, and carbon powder (carbon black, carbon nanotube, etc.) blended in a resin composition can generally be given. If a thermosetting resin is used as the resin compound, it can obtain a coating film at less than 200° C., for example 100 to 150° C., and the path through which electricity flows on the obtained coating film, while depending on contact with the conductive particulates, has a resistance value on the order of $10^{-5}$ Ω/cm.

In addition, the polymer conductive ink of the present invention, in addition to a thermosetting-type, may be a publicly known type such as a photo-curing type, osmotic drying type, and solvent volatilization type can also be used. In addition, by including a photo-curing resin in the resin composition, the hardening time can be shortened, thereby raising efficiency. Specifically, one containing at least 60 percent conductive particulates by mass, being a thermoplastic resin only or a blended resin composition of a thermoplastic resin and a crosslinked resin (particularly a crosslinked resin of polyester and isocyanate and the like), and containing at least 10 percent polyester resin by mass, that is, a solvent volatilization type or a crosslinked/thermoplastic combination type (with the thermoplastic type being at least 50 percent by mass), or one containing at least 50 percent conductive particulates by mass, a crosslinked resin (a phenol hardening type epoxy resin, or a sulfonium salt hardening type epoxy resin) only or a blended resin composition of a thermoplastic resin and a crosslinked resin, that is, one that is a crosslinked type or a crosslinked/thermoplastic combination type, may be suitably used. In addition, a flexibilizer can be blended with the polymer conductive ink used in the present invention when resistance to bending is further required in the conductive circuits such as the antenna. Specific examples of the flexibilizer used in the present invention are a polyester flexibilizer, acrylic flexibilizer, urethane flexibilizer, polyvinyl acetate flexibilizer, thermoplastic-elastomer flexibilizer, natural-rubber flexibilizer, synthetic-rubber flexibilizer, and a mixture of two or more thereof.

When forming the antenna 303, 3103 by etching, a copper foil is bonded to the entire surface of one side of the electrically insulating base substrate 302. Then an etch-resistant coating is printed in a desired pattern by a silk screen method onto the copper foil. Since the antenna 303 is normally formed in a spiral or rectangular shape, the etch-resistant coating is printed in a spiral or rectangular shape. After drying and hardening the coating for an appropriate time, it is immersed in an etching solution, wherein the copper foil that is not coated with the etch-resistant coating dissolves away, leaving the copper foil portion coated with the etch-resistant coating on one surface of the base substrate, thereby forming the antenna 303, 3103.

Next, the IC chip 304, 3104 is mounted at the predetermined position on the base substrate 302, 3102 via an electrically conductive adhesive (not illustrated). By applying a prescribed pressure to the IC chip 304, 3104, the IC chip 304, 3104 and the base substrate 302, 3102 are bonded by the adhesive (not illustrated), with the antenna 303, 3103 and the IC chip 304, 3104 being electrically connected by contacts provided on the underside of the IC chip 304, 3104.

By applying a magnetic coating that includes a bonding agent and a magnetic powder or magnetic flakes and then drying, the composite body forming the magnetic layer 305, 3105 is formed with the magnetic powder or magnetic flakes dispersed. If the magnetic coating has a configuration that moreover includes an adhesive, the binding property of the magnetic powder or magnetic flakes can be increased and attachment to an article can be enabled, and so is preferable.

Here, as the magnetic powder included in the magnetic coating, carbonile iron powder, atomized powder such as permalloy, and reduced iron powder, etc. can be used. Examples of the flakes of a magnetic material include flakes obtained by refining the magnetic material into a powder with a ball mill or the like and then mechanically flattening the powder and flakes obtained by running molten metal of an iron-based or cobalt-based amorphous alloy into a water-cooled copper plate.

As the bonding agent used in this embodiment, a thermoplastic resin, a thermosetting resin, and a reactive resin can be used, with examples of the thermoplastic resin including vinyl chloride, vinyl acetate, a vinyl chloride-vinyl acetate copolymer, a vinyl chloride-vinylidene chloride copolymer, a vinyl chloride-acrylonitrile copolymer, an acrylic acid ester-acrylonitrile copolymer, an acrylic ester-vinyl chloride-vinylidene chloride copolymer, an acrylic ester-vinylidene chloride copolymer, a methacrylate ester-vinylidene chloride copolymer, a methacrylate ester-vinyl chloride copolymer, a methacrylic acid ester-ethylene copolymer, polyvinyl fluoride, a vinylidene chloride-acrylonitrile copolymer, an acrylonitrile-butadiene copolymer, polyamide resin, polyvinyl butyral, a cellulose derivative (cellulose acetate butyrate, a cellulose die acetate, cellulose triacetate, cellulose propionate, cellulose nitrate), a styrene-butadiene copolymer, a polyurthane resin, a polyester resin, an amino resin, or a polymer synthetic rubber material such as styrene rubber, fluorine rubber, silicone rubber, and ethylene-propylene copolymer rubber.

Examples of the thermosetting resin or reactive resin include phenol resin epoxy resin, polyurethane hardening resin, urea resin, melamine resin, alkyd resin, silicone resin, polyamine resin, and urea-formaldehyde resin.

This magnetic coating may be applied by a screen printing method to one surface of the base substrate 302, 3102 to a degree that the antenna 303, 3103 and the IC chip 304, 3104 are slightly concealed or amply concealed. The inlet 309, 3109 with the magnetic layer 305, 3105 is then formed by drying and hardening the magnetic layer 305, 310 after coating by being left at room temperature or heated at a prescribed temperature and time.

Next, a release paper with a backing paper is prepared, the backing paper is removed, and the inlet 309 is attached to the one exposed surface of the release paper via the magnetic layer 305.

Then, the non-contact data reception/transmission unit of the present invention is obtained by affixing the overlay material 308, whose underside is provided with the adhesive layer 307, to the other surface of the base substrate 302 (the surface on which the antenna 303 and the IC chip 304 are not provided) via the adhesive layer 307.

Hereinbelow the manufacturing method and manufacturing apparatus for the non-contact data reception/transmission unit that is the ninth embodiment of the present invention shall be explained.

Figure 20:
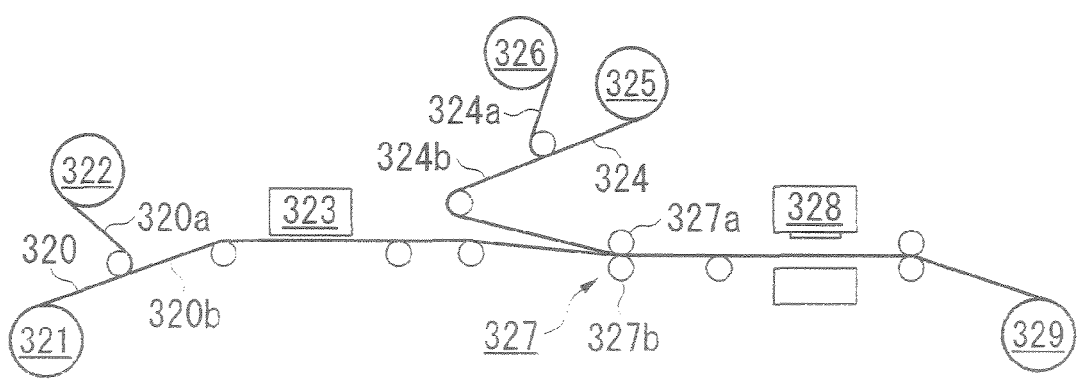
[FIG. 20] A drawing schematically showing the constitution of the apparatus for manufacturing the non-contact data reception/transmission unit according to the ninth embodiment of the present invention.

FIG. 20 is a drawing schematically showing the constitution of the apparatus for manufacturing the non-contact data reception/transmission unit according to the embodiment of the present invention. Hereinbelow, inlet means the inlet with a magnetic layer.

The manufacturing apparatus of this embodiment is equipped with a first means 321 that supplies a first continuous sheet 320 consisting of a backing paper attached to a long release paper.

After a backing paper 320a on the surface layer of the first continuous sheet 320 supplied from the first means 321 is peeled off and taken up by a second means 322, the first continuous sheet 320 is sent to a third means 323 that attaches the inlets.

Below, an example of the third means of FIG. 20 mentioned above is explained in detail based on FIG. 21.

Figure 21:
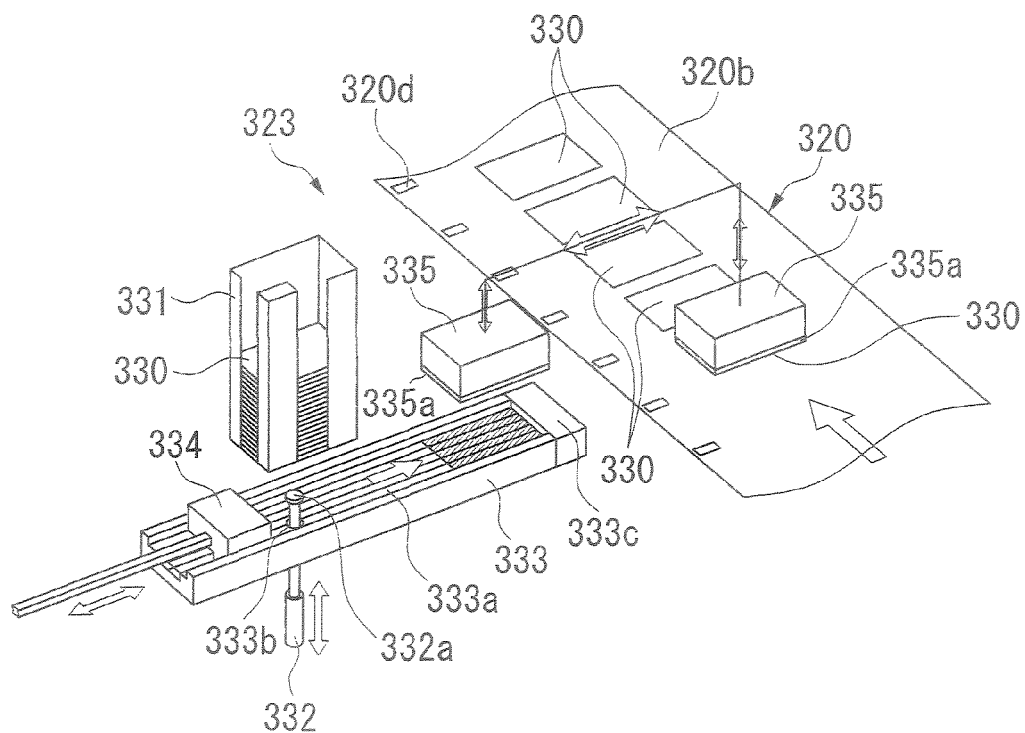
[FIG. 21] An enlarged perspective view showing in detail the constitution of the third means of the apparatus for manufacturing the non-contact data reception/transmission unit according to the ninth embodiment of the present invention.

As an example of the third means of FIG. 20, a constitution that consists of a stacker (holding means) 331, an inlet pull-out mechanism (take-out means) 332, a transportation means, and a moving and pressing means can be given as shown in FIG. 21.

[Holding Means, Take-out Means]

The third means 323 shown in FIG. 21 is equipped with a stacker (holding means) 331 that holds a plurality of inlets 330 (corresponding to 309 in FIG. 19) in a vertically stacked state. Under the stacker 331, an inlet pull-out mechanism 332 is provided for pulling out one inlet 330 at a time from the plurality of inlets 330. The inlet pull-out mechanism 332 is constituted to be able to move reciprocally in the vertical direction, and the distal end head 332a thereof sequentially pulls out (takes out) by suction action the inlet 330 located at the bottom of the plurality of inlets 330 stacked in the stacker 331.

[Take-out Means]

Here, the lower surface of the inlet 330, being the surface that is attached onto the release paper 320b of the first continuous sheet 320, is formed flat. Therefore, the distal end head 332a of the inlet pull-out mechanism 332, drawing the center portion of the lower surface of the inlet 330 with sufficient suction force, can reliably pull out one inlet 330 at a time from the stacker 331. Although the inlet 330 will bend momentarily at this time, since the IC module and antenna are positioned away from the center portion of the inlet 330, they are not damaged by the suction from the distal end head 332a. Moreover, due to the constitution of sequentially pulling out from the bottom side of the plurality of inlets 330, the inlets 330 can be supplied anytime to the stacker 331 during operation.

[Transportation Mechanism]

The inlet 330 pulled out from the stacker 331 by the inlet pull-out mechanism 332 is placed in the middle of a guide groove 333a formed in the rail member 333. In addition, the width dimension of the guide groove 333a is set to be slightly greater than the dimension corresponding to the inlet 330. And the inlet pull-out mechanism 332 is constituted to be able to approach the stacker 331 through a vertical through-hole 333b formed in the rail member 333. Moreover, the third means 323 is provided with a push-out block 334 that is capable of reciprocal movement along the guide groove 333a, with the push-out block 334 being positioned in the middle of the guide groove 333a of the rail member 333.

By movement of the push-out block 334 driven by an air cylinder to the right in the drawing along the guide groove 333a, for example, the inlet 330 pulled out from the stacker 331 and placed in the middle of the guide groove 333a is fed until its distal end mostly abuts the abutting portion 333c of the guide groove 333a. Thus, the rail member 333 and the push-out block 334 constitute a transportation means for moving the inlet 330 taken out from the plurality of inlets 330 to a predetermined location. In addition, the stacker (holding means) 331, the inlet pull-out mechanism (takeout means) 332, the rail member 333, and the push-out block 334 (transportation means) constitute a feeding means for selectively taking out inlets 330 one at a time from the plurality of inlets 330 and sequentially feeding them to a predetermined position.

[Moving and Pressing Means]

Furthermore, the third means 323 is provided with a suction block 335 for suction-holding with a suction action the inlet 330 positioned so that its distal end mostly abuts the abutting portion 333c of the guide groove 333a. The suction block 335 has the cubical shape corresponding to the rectangular shape of the inlet 330, with a sponge 335a attached to its bottom surface as a shock absorbing material. Moreover, a suction port (not illustrated) for carrying out suction-holding of the inlet 330 is provided in the center of the bottom surface of the suction block 335.

The suction block 335 driven by an air cylinder for example is constituted to be movable in the vertical direction and the horizontal direction along the guide groove 333a. In this way the suction block 335 descends toward the inlet 330 positioned so that its distal end mostly abuts the abutting portion 333c of the guide groove 333a, and the inlet 330 is suction-held by the bottom surface of the suction block 335. Although the suction force from the suction block 335 acts on the center portion of the inlet 330 at this time, due to the shock absorbing action of the sponge 335a, the inlet 330 does not sustain damage stemming from the suction force.

After the suction block 335 that suction-holds the inlet 330 ascends, it moves in the horizontal direction in the drawing until being above the release paper 320b of the first continuous sheet 320. At this time, the suction block 335 moves transversely along a horizontal guide not illustrated and stops at a predetermined position above the release paper 320b by the operation of, for example, a stopper not illustrated. Then, the suction block 335 descends and presses the suction-held inlet 330 onto the surface of the release paper 320b.

In addition, the first continuous sheet 320 is in the condition of the backing paper 320a thereof being peeled off, with the release paper 320b being exposed. Accordingly, the inlet 330 is attached to the surface of the sheet 320b by the suction block 335 pressing the inlet 330 onto the surface of the release paper 320b while stopping the suction operation. In this way, the suction block 335 constitutes a moving and pressing means that moves inlets 330 fed into the predetermined location, and sequentially presses them onto the surface of the release paper 320b of the first continuous sheet 320. On the other hand, the first continuous sheet 320 is intermittently conveyed along the lengthwise direction by a sensor (not illustrated) reading timing marks 320d formed on one side of the release paper 320b. In this way, by repeating the above-mentioned inlet attaching action and an intermittent conveyance action, the inlets 330 are sequentially attached onto the surface of the release paper 320b at a predetermined pitch and interval.

Although FIG. 21 shows only one inlet attaching mechanism that consists of one feeding means and one moving and pressing means for the sake of clarity of the drawing, a plurality of inlet attaching mechanisms can also be arranged in a row along the flow direction (supply direction) of the continuous sheet 320. In this case, the same number of inlets 330 as the number of inlet attaching devices can be simultaneously attached to the surface of the release paper 320b.

Moreover, it is preferable that the spacing of the plurality of inlet attaching mechanisms be constituted to be adjustable along the flow direction of the first continuous sheet 320 so as to be able to adjust the spacing of the plurality of inlets 330 attached simultaneously to the surface of the release paper 320b. Furthermore, the plurality of inlet attaching mechanisms can also be constituted so as to be able to correspond to inlets 330 of various sizes.

Again referring to FIG. 20, the first continuous sheet 320, on which inlets 330 are sequentially attached at an interval by the third means 323, is fed to a fifth means 327 constituted by a pair of bonding rollers 327a and 327b. On the other hand, the manufacturing apparatus of this embodiment is provided with a fourth means 325 for supplying, as the second continuous sheet 324, the second continuous sheet 324 consisting for example of a backing paper attached to an overlay material through an adhesive layer. The second continuous sheet 324 has a three-layer structure, in which the backing paper 324a provided on the top side and the overlay material 324b provided on the bottom side are glued together by an adhesive layer. Here, the overlay material 324b constitutes the cover paper of the non-contact data reception/transmission unit 301.

After the backing paper 324a is peeled off the second continuous sheet 324 supplied from the fourth means 325 and taken up by the take-up means 326, the second continuous sheet 324 is fed to the fifth means 327. In addition, in the state of the backing paper 324a peeled off, the adhesive layer is exposed on the surface of the second continuous sheet 324b (the surface that was in contact with the backing paper 324a). In this way, when the release paper 320b and the second continuous sheet 324b pass between the pair of bonding rollers 327a and 327b at the fifth means 327, the adhesive layer of the second continuous sheet 324b and the surface of the release paper 320b on which the inlets 330 are attached are overlapped and bonded together.

Here, in order to reduce the load on the inlet 330 when passing between the pair of bonding rollers 327a and 327b, that is, in order to reduce the nip pressure which acts on the inlet 330, a sponge (not illustrated) that acts as a shock absorbing material is wrapped around at least one of the bonding rollers 327a and 327b. Moreover, at each guide roller provided downstream of the bonding means 327, the roller diameter is set to a comparatively large value (for example, a diameter of approximately 80 mm) in order to reduce the bending stress that acts on the inlet 330, which has a characteristic of being comparatively weak to bending deformation.

The composite sheet (320b, 324b) that is stacked and bonded together by the fifth means 327 is fed to a sixth means 328. In the sixth means 328, die cutting is performed in accordance with the external dimensions of one non-contact data reception/transmission unit, with the unwanted portion of the die-cut composite sheet (320b and 324b) (the release paper 320b and the sheet 324b of the region outside the non-contact data reception/transmission unit) being taken up by the take-up means 329.

As described above, in the present embodiment, the third means 323 can selectively take out the inlets 330 one at a time from a plurality of the inlets 330, feed them sequentially to a prescribed position, transport the fed inlets 330 to the prescribed position and sequentially attach them by pressing to the surface of the release paper 320b of the first continuous sheet 320 since the magnetic layer has adhesiveness. Accordingly, the activity of fitting the inlets 330 onto a sheet is performed automatically without relying on manual operation, and so large quantities of non-contact data reception/transmission units 301 can be manufactured efficiently and with high quality.

FIG. 21 of the present embodiment shows the supply of inlets 330 in a cassette system, but of course a system of continuous supply and separating with a cutter and the like may also be adopted. In addition, the magnetic layer may be formed by coating and drying in-line.

A non-contact data reception/transmission unit embodying the present invention is explained in detail hereinbelow.

Figure 22:
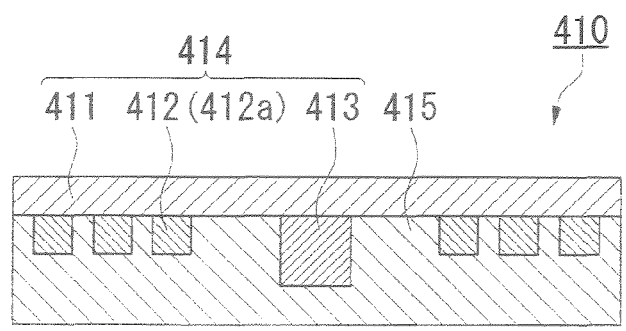
[FIG. 22] An outline sectional view showing the non-contact data reception/transmission unit according to the 10th embodiment of the present invention.

FIG. 22 is an outline sectional view showing the non-contact data reception/transmission unit of the 10th embodiment according to the present invention.

A non-contact data reception/transmission unit 410 of this embodiment is roughly constituted from an inlet 414 including a base substrate 411 and a connected antenna 412 and IC chip 413 provided on one surface thereof; and a magnetic layer 415 disposed so as to cover the antenna 412 and the IC chip 413. The antenna 412 is constituted from a coil portion 412a that forms a circuit and contacts (not shown) for connecting the coil portion 412a to the IC chip 413.

Providing the inlet 414 on one surface of the base substrate 411 in the non-contact data reception/transmission unit 410 means the antenna 412 and the IC chip 413 constituting the inlet 414 are not provided on both surfaces of the base substrate 411, but provided on either one surface. In addition, the antenna 412 is provided in a coil shape at a predetermined interval on one surface of the base substrate 411. Moreover, the thickness of the IC chip 413 is thicker than the thickness of the antenna 412.

The antenna 412 and the IC chip 413, which constitute the inlet 414, being connected in the non-contact data reception/transmission unit 410 means the end portions of the antenna 412 being respectively connected to both terminals of the IC chip 413.

A composite body, including a filler consisting of magnetic particulates and resin, that forms a magnetic layer 415 covering the antenna 412 and the IC chip 413 constituting the inlet 414 means covering to a degree that the antenna 412 and the IC chip 413 are concealed. The magnetic layer 415 preferably covers the antenna 412 and the IC chip 413 so that the external surface (open surface) of the magnetic layer 415 is flat.

Moreover, viewing the non-contact data reception/transmission unit 410 from one side of the base substrate 411, the plurality of magnetic particulates constituting the magnetic layer 415 form a connected single magnetic body in which at least a portion of the magnetic particulates mutually overlap.

Moreover, the composite body that makes up the magnetic layer 415 is disposed so as to be filled between the antenna 412 formed in the coiled form, and all or a portion of the magnetic particulates that make up this composite body are disposed between the antenna 412.

Figure 23:
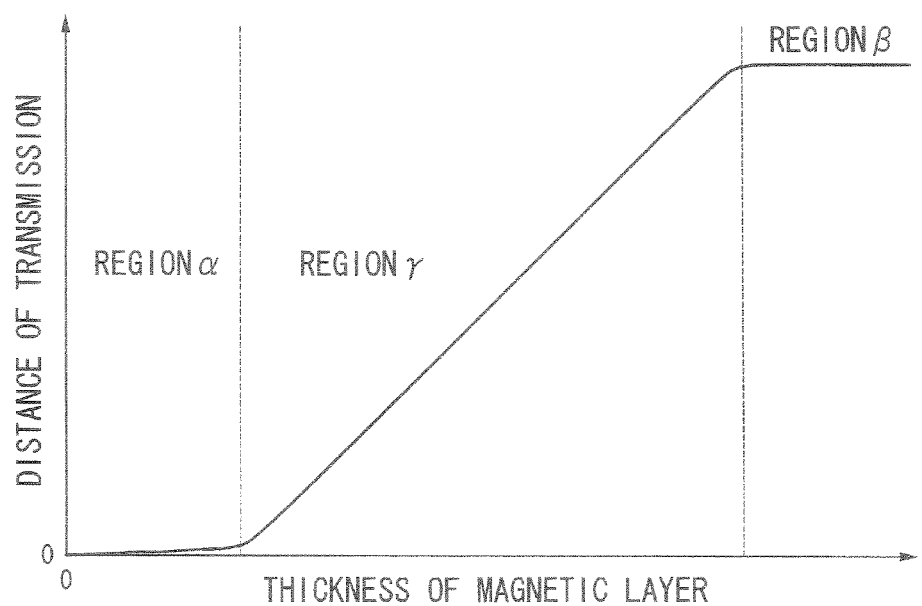
[FIG. 23] A graph showing the relationship between the thickness of the magnetic layer of the non-contact data reception/transmission unit according to the present invention and the communication distance.

In the non-contact data reception/transmission unit 410, as shown in FIG. 23 the magnetic layer 415 includes a region α and a region β whose thicknesses do not affect the communication distance and a region γ whose thickness affects the communication distance, with the region γ being positioned between the region α and the region β.

As shown in FIG. 23, in the thickness direction of the magnetic layer 415, the region α and the region β whose thicknesses do not affect the communication distance are regions in which the communication distance of the non-contact data reception/transmission unit 410 does not change (does not increase) even if the thickness of the magnetic layer 415 increases. By comparison, in the thickness direction of the magnetic layer 415 the region γ whose thickness affects the communication distance is a region in which the communication distance of the non-contact data reception/transmission unit 410 changes (increases) when the thickness of the magnetic layer 415 increases. The region α, the region γ and the region β are consecutive in this order.

In the non-contact data reception/transmission unit 410, the region γ is in a range with the thickness of the coil portion 412a constituting the antenna 412 being the lower limit and the thickness of the IC chip 413 being the upper limit. That is, the region γ shown in FIG. 23 is the region in the magnetic layer 415 shown in FIG. 22 extending from the surface of the coil portion 412a opposite the surface in contact with one surface of the base substrate 411 to the surface of the IC chip 413 opposite the surface in contact with the one surface of the base substrate 411. In addition, the region α shown in FIG. 23 is the region in the magnetic layer 415 shown in FIG. 22 extending from the surface in contact with the one surface of the base substrate 411 to the surface of the coil portion 412a opposite the surface in contact with the one surface of the base substrate 411. In addition, the region β shown in FIG. 23 is the region in the magnetic layer 415 shown in FIG. 22 exceeding the surface of the IC chip 413 opposite the surface in contact with the one surface of the base substrate 411.

Thus, when the magnetic layer 415 exists within the region extending from the surface in contact with the one surface of the base substrate 411 to the surface of the coil portion 412a opposite the surface in contact with the one surface of the base substrate 411, that is, when it exists in the region α shown in FIG. 23, the communication distance of the non-contact data reception/transmission unit 410 does not change (does not increase) in the thickness direction of the magnetic layer 415. Also, when the magnetic layer 415 exists up to a region exceeding the surface of the IC chip 413 opposite the surface in contact with the one surface of the base substrate 411 that is, when it exists up to the region β shown in FIG. 23, in this region β the communication distance of the non-contact data reception/transmission unit 410 does not change (does not increase) in the thickness direction of the magnetic layer 415.

Moreover, in the non-contact data reception/transmission unit 410, as shown in FIG. 23, the communication distance in the region γ increases monotonously with respect to the thickness of the magnetic layer 415. Accordingly, in the region γ the communication distance of the non-contact data reception/transmission unit 410 can be set to the desired range by varying the thickness of the magnetic layer 415.

The base substrate 411, at least for the surface layer portion, is selected from a publicly known material such as a woven fabric, non-woven fabric, mat, paper or combination thereof made from inorganic fiber such as glass fiber or alumina fiber and organic fiber such as polyester fiber or polyamide fiber; a composite base substrate formed by impregnating any thereof with a resin varnish; a plastic substrate such as a polyamide resin substrate, polyester resin substrate, polyolefine resin substrate, polyimide resin substrate, ethylene vinyl alcohol copolymer substrate, polyvinyl alcohol resin substrate, polyvinyl chloride resin substrate, polyvinylidence chloride resin substrate, polystyrene resin substrate, polycarbonate resin substrate, acrylonitrile styrene butadiene copolymerization resin substrate, polyether sulfone resin substrate or any thereof subjected to mat treatment, corona discharge treatment, plasma treatment, ultraviolet irradiation treatment, electron-beam-irradiation treatment, flame plasma treatment and ozone treatment, or surface treatment such as easy adhesion treatment. Among these, an electrically insulating film or sheet consisting of polyethylene terephthalate or polyimide is suitably used.

The antenna 412 can be formed by screen printing a predetermined pattern with a polymer conductive ink or etching a conductive foil on one surface of the base substrate 411.

As examples of the polymer conductive ink used in the present invention, those that have electrically conductive particulates such as silver dust, gold dust, platinum powder, aluminum powder, palladium powder, rhodium powder and carbon powder (carbon black, carbon nanotube, etc.) blended in a resin composition can be given.

If a thermosetting resin is used as the resin compound, it shall be a thermosetting type that can form the coating film that makes up the antenna 412 at less than 200° C., for example 100 to 150° C. The path through which electricity flows in the coating film that produces the antenna 412 is formed due to the mutual contact of the conductive particulates that form the coating film, and the resistance value of this coating film is on the order of $10^{-5}$ Ω/cm.

Also, in addition to a thermosetting type ink, publicly known types such as a photo-curing type, osmotic drying type, and solvent volatilization type are used as the polymer conductive ink in the present invention.

The photo-curing polymer conductive ink is one that includes a photo-curing resin in the resin compound, which shortens the hardening time and thereby raises manufacturing efficiency. The photo-curing polymer conductive ink can be one that contains at least 60 percent conductive particulates by mass and at least 10 percent polyester resin by mass blended in a thermoplastic resin only or a blended resin composition of a thermoplastic resin and a crosslinked resin (particularly a crosslinked resin of polyester and isocyanate and the like), that is, a solvent volatilization type or a crosslinked/thermoplastic combination type (with the thermoplastic type being at least 50 percent by mass), or one that contains at least 10 percent polyester resin by mass blended in a thermoplastic resin only or a blended resin composition of a thermoplastic resin and a crosslinked resin (particularly a crosslinked resin of polyester and isocyanate and the like), that is, a crosslinked type or a crosslinked/thermoplastic combination type.

In addition, a flexibilizer can be blended with the polymer conductive ink when resistance to bending is further required in the antenna 412.

Examples of the flexibilizer are a polyester flexibilizer, acrylic flexibilizer, urethane flexibilizer, polyvinyl acetate flexibilizer, thermoplastic-elastomer flexibilizer, natural-rubber flexibilizer, a synthetic-rubber flexibilizer, and a blend of two or more of the above.

The conductive foil that forms the antenna 412 includes copper foil, silver foil, gold foil, platinum foil, and aluminum foil etc.

The IC chip 413 is not particularly limited, and as long as writing and reading of information is possible in a non-contact state via the antenna 412, anything may be used that is applicable to RFID media such as non-contact IC tags and non-contact IC labels or non-contact IC cards.

The composite body forming the magnetic layer 415 is roughly constituted from a filler consisting of magnetic particulates and a resin.

This composite body is fabricated in a configuration in which the magnetic particulates are nearly uniformly dispersed by applying the magnetic coating including a filler consisting of magnetic particulates, resin, additives, and a solvent and then drying.

In this embodiment of a present invention, the mean particle diameter of magnetic particulates is 200 micrometers or less.

If the mean particle diameter of the magnetic particulates is within the above range, even if the particle diameter of the magnetic particulates that make up the magnetic layer 415 vary, the non-contact data reception/transmission unit of the present invention will exhibit a sufficient effect.

If the mean particle diameter of the magnetic particulates is within the above range, viewing the non-contact data reception/transmission unit 410 from one side of the base substrate 411, the plurality of magnetic particulates constituting the magnetic layer 415 form a connected single magnetic body in which at least a portion of the magnetic particulates mutually overlap. Thereby, even when the non-contact data reception/transmission unit 410 contacts an article containing at least metal, the antenna 412 can be made to generate sufficient induced electromotive force to operate the IC chip 413 since flux is picked up by the antenna 412 through the magnetic layer 415. Also, if the mean particle diameter of the magnetic particulates is within the above range, even when the antenna 412 is provided in a coil shape as in this embodiment, the magnetic particulates can be filled between the antenna 412. In this way, if the magnetic particulates are disposed between the antenna 412, flux can be more easily picked up by the antenna 412.

The magnetic particulates can be a powdered magnetic powder or magnetic flakes consisting of flat-shaped flakes obtained by refining this magnetic power into a powder with a ball mill or the like and then mechanically flattening the powder. Among these, as magnetic particulates, those of the flattened state are preferable. If the magnetic particulates are in the flattened state, viewing the non-contact data reception/transmission unit 410 from the side of one surface of the base substrate 411, the plurality of magnetic particulates constituting the magnetic layer 415 easily form a connected single magnetic body in which at least a portion of the magnetic particulates mutually overlap. Accordingly, flux can be more easily picked up by the antenna through the magnetic layer.

Moreover, as the magnetic powder, for example, Sendust (Fe—Si—Al alloy) powder, carbonile iron powder, atomized powder such as permalloy, and reduced iron powder etc. can be given. Flakes of a magnetic material can for example be flakes obtained by refining the magnetic material into a powder with a ball mill or the like and then mechanically flattening the powder, and flakes obtained by running molten metal of an iron-based or cobalt-based amorphous alloy into a water-cooled copper plate. Among these as the magnetic particulates, magnetic powder or magnetic material flakes consisting of Sendust are preferable, with magnetic flakes consisting of Sendust being more preferable. If the magnetic particulates are magnetic powder or magnetic material flakes consisting of Sendust, since the saturation magnetic flux density and permeability of the magnetic layer 415 which contains these as a component are higher, flux can be more easily picked up by the antenna through the magnetic layer.

The shape of the magnetic particulates forming the magnetic layer 415 need not entirely be powdered or flat shaped. Powdered magnetic particulates and flat shaped-magnetic particulates may be mixed together in the magnetic layer 415, and even if magnetic particulates of differing shapes are thus mixed together, the non-contact data reception/transmission unit of the present invention will exhibit a sufficient effect. As the resin constituting the composite body that makes up the magnetic layer 415, thermoplastic resin, thermosetting resin, reactive resin and the like can be used.

Examples of the thermoplastic resin include vinyl chloride, vinyl acetate, a vinyl chloride-vinyl acetate copolymer, a vinyl chloride-vinylidene chloride copolymer, a vinyl chloride-acrylonitrile copolymer, an acrylic acid ester-acrylonitrile copolymer, an acrylic ester-vinyl chloride-vinylidene chloride copolymer an acrylic ester-vinylidene chloride copolymer, a methacrylate ester-vinylidene chloride copolymer, a methacrylate ester-vinyl chloride copolymer, a methacrylic acid ester-ethylene copolymer, polyvinyl fluoride, a vinylidene chloride-acrylonitrile copolymer, an acrylonitrile-butadiene copolymer, polyamide resin, polyvinyl butyral, a cellulose derivative (cellulose acetate butyrate, a cellulose die acetate, cellulose triacetate cellulose propionate, cellulose nitrate), a styrene-butadiene copolymer, a polyurthane resin, a polyester resin, an amino resin, or a polymer synthetic rubber material such as styrene rubber, fluorine rubber, silicone rubber, and ethylene-propylene copolymer rubber.

Examples of a thermosetting resin or reactive resin include phenol resin, epoxy resin, polyurethane hardening resin, urea resin, melamine resin, alkyd resin, silicone resin, polyamine resin, and urea-formaldehyde resin.

Various adhesives may be contained in the composite body that makes up the magnetic layer 415 in order to impart adhesiveness to the magnetic layer 415.

Moreover, examples of the additives contained in the magnetic coating used in order to form the composite body that makes up the magnetic layer 415 include a viscosity modifier, an antifoaming agent, a leveling agent, etc.

Furthermore, examples of the solvent contained in this magnetic coating include organic solvents such as cyclohexanone, acetone, and benzene-based and ethyl-based solvents.

In this way, even when the non-contact data reception/transmission unit 410 of the present embodiment contacts an article containing at least metal, because the magnetic layer 415 is disposed so as to cover the antenna 412 and the IC chip 413, the antenna 412 can be made to generate sufficient induced electromotive force to operate the IC chip 413 since flux is picked up by the antenna 412 through the magnetic layer 415. Moreover, the magnetic layer 415, by being formed so as to cover the antenna 412 and the IC chip 413, also exhibits the function of a protective layer of the antenna and the IC chip.

This embodiment gave the example of the antenna 412 being provided in a coil shape on one surface of the base substrate 411, however, the non-contact data reception/transmission unit of the present invention is not limited thereto. In the non-contact data reception/transmission unit of the present invention, as long as electromotive force is obtained by adopting an electromagnetic induction method, the antenna may have any shape.

Also, this embodiment illustrated the non-contact data reception/transmission unit 410 having the coil-shaped antenna 412 and the IC chip 413 provided separately on one surface of the base substrate 411 and connected to each other, however, the non-contact data reception/transmission unit of the present invention is not limited thereto. In the non-contact data reception/transmission unit of the present invention, the IC chip may be mounted on the antenna, or the antenna may be formed on the IC chip.

In addition, the non-contact data reception/transmission unit of this embodiment is applicable to a confidential postcard format. Examples of a confidential postcard format include two-fold postcards, three-fold postcards, four-fold postcards and partially folding postcards.

Next, the method of manufacturing the non-contact data reception/transmission unit that is the 11th embodiment shall be explained referring to FIG. 22.

First the antenna 412 having a predetermined thickness and predetermined pattern is formed on one surface of the base substrate 411 (antenna formation step).

In this step, when forming the antenna 412 with polymer conductive ink, after printing the polymer conductive ink by a screen method so as to have the predetermined thickness and the predetermined pattern on one surface of the base substrate 411, drying and hardening of the polymer conductive ink forms the antenna 412 having the predetermined thickness and the predetermined pattern.

Forming the antenna 412 with a conductive foil is performed according to the following procedure.

A conductive foil is bonded to one entire surface of the base substrate 411, after which an etch-resistant coating is printed in a predetermined pattern by a silk screen method onto the conductive foil. After drying and hardening the etch-resistant coating, it is immersed in an etching solution, wherein the copper foil that is not coated with the etch-resistant coating dissolves away, leaving the copper foil portion coated with the etch-resistant coating on the one surface of the base substrate 411, thereby forming the antenna 412 having a predetermined pattern.

Next, the IC chip 413 is mounted on one surface of the base substrate 411 by electrically connecting contacts (not illustrated) provided on the antenna 412 and contacts (not illustrated) provided on the IC chip 413 via an electrically conductive material consisting of conductive paste or solder (IC chip mounting step).

Then, a magnetic coating including a filler consisting of magnetic particulates, resin, additives, and solvents is applied on the one surface of the base substrate 411 to a degree of the antenna 412 and the IC chip 414 being slightly concealed or amply concealed. After applying the magnetic coating, the magnetic layer 415 is formed by drying and hardening the coating by leaving it at room temperature or heating it at a prescribed temperature and prescribed time, whereby the non-contact data reception/transmission unit 410 is obtained (magnetic layer forming step).

This embodiment illustrated a method of forming the antenna 412 by screen printing and etching, but the present invention is not limited thereto. In the present invention, the antenna can also be formed with vacuum deposition or an ink jet printing method.

Figure 24:
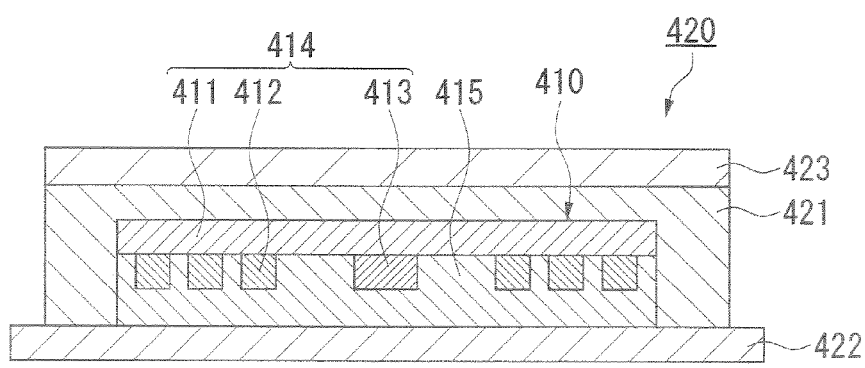
[FIG. 24] An outline sectional view showing the non-contact data reception/transmission unit according to the 12th embodiment of the present invention.

FIG. 24 is an outline sectional view showing the non-contact data reception/transmission unit of the 12th embodiment according to the present invention.

In FIG. 24, constituent elements identical to those of the non-contact data reception/transmission unit 410 shown in FIG. 2 are given the same reference numerals, with explanations therefor being omitted.

A non-contact data reception/transmission unit 420 of this embodiment is roughly constituted from the non-contact data reception/transmission unit 410, an adhesive layer 421, a release base substrate 422, and an overlay material 423.

In the non-contact data reception/transmission unit 420 the adhesive layer 421 is provided so as to cover the portions of the non-contact data reception/transmission unit 410 except the surface of the magnetic layer 415 opposite the surface that contacts the base substrate 411.

The release base substrate 422 is bonded to the surface of the magnetic layer 415 opposite the surface that contacts the base substrate 411 and the surfaces of the adhesive layer 421 on the side of the surface of the magnetic layer 415 opposite the surface that contacts the base substrate 411 (the surface to be bonded to the article).

Furthermore, the overlay material 423 is bonded to the surface of the adhesive layer 421 opposite the surface that contacts the base substrate 411 (the surface that is not bonded to an article).

Examples of the adhesive that forms the adhesive layer 421 include a phenol adhesive, epoxy adhesive, acrylic adhesive, and urethane adhesive. Other publicly known adhesives can also be suitably used.

Examples of the release base substrate 422 include a base substrate such as paper, synthetic paper, coated paper, polypropylene film, and PET film coated with a silicone or non-silicone releasing agent. In addition, other publicly known releasing agents and base substrates can also be suitably used.

Examples of the overlay material 423 include a base substrate such as paper, synthetic paper, coated paper, polypropylene film, and PET film. In addition, other publicly known releasing agents and base substrates can also be suitably used.

In the non-contact data reception/transmission unit 420 of this embodiment, the non-contact data reception/transmission unit 410 provided with the magnetic layer 415 is covered by the adhesive layer 421, and the non-contact data reception/transmission unit 410 covered by the adhesive layer 421 is enclosed by the release base substrate 422 and the overlay material 423. Therefore, dust and dirt do not adhere to the magnetic layer 415. By having the magnetic layer 415 make contact with an article including metal by means of the adhesive layer 421 which is newly exposed by removing the release base substrate 422, the non-contact data reception/transmission unit 420 can be attached to this article. Since the overlay material 423 is provided on the surface of the adhesive layer 421 opposite the surface in contact with the base substrate 411 (the surface not attached to an article), a pattern can be provided and various information can be printed on the overlay material 423.

This embodiment illustrated an example of the non-contact data reception/transmission unit 420 in which the adhesive layer 421 is provided so as to cover the portions of the non-contact data reception/transmission unit 410 except the surface opposite the surface of the magnetic layer 415 that contacts the base substrate 411, however, the non-contact data reception/transmission unit of the present invention is not limited thereto. In the non-contact data reception/transmission unit of the present invention, the adhesive layer may be provided on the surface opposite the surface of the magnetic layer that contacts the base substrate. Also, the adhesive layer need not be provided on the surface of the base substrate opposite the surface on which the antenna and the IC chip are provided.

In addition, this embodiment illustrated an example of the non-contact data reception/transmission unit 420 in which the release base substrate 422 is attached to the to the surface of the magnetic layer 415 opposite the surface that contacts the base substrate 411 and the surface of the adhesive layer 421 on the side of the surface of the magnetic layer 415 opposite the surface that contacts the base substrate 411 (the surface attached to an article), however, the non-contact data reception/transmission unit of the present invention is not limited thereto. In the non-contact data reception/transmission unit of the present invention, the release base substrate may be bonded to only the surface of the magnetic layer opposite the surface that contacts the base substrate.

Figure 25:
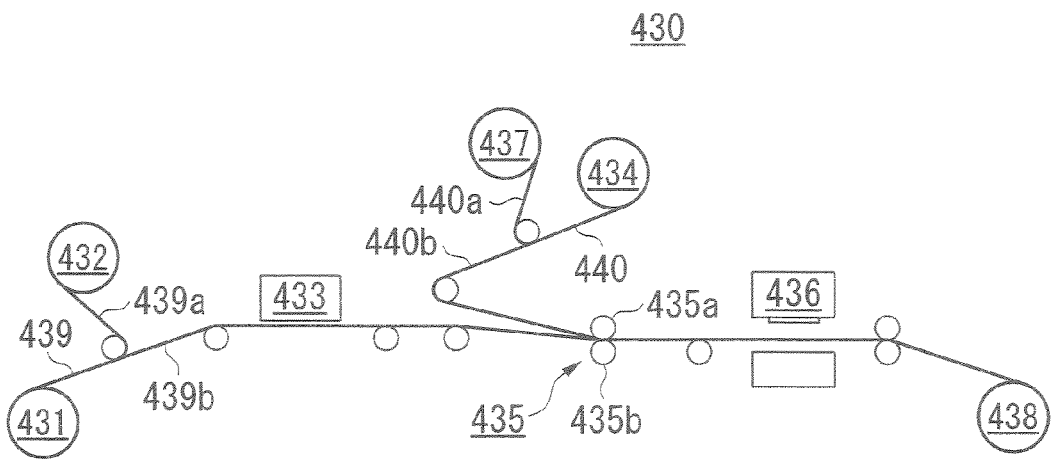
[FIG. 25] A mimetic diagram showing the constitution of the apparatus for manufacturing the non-contact data reception/transmission unit according to the present invention.
Figure 26:
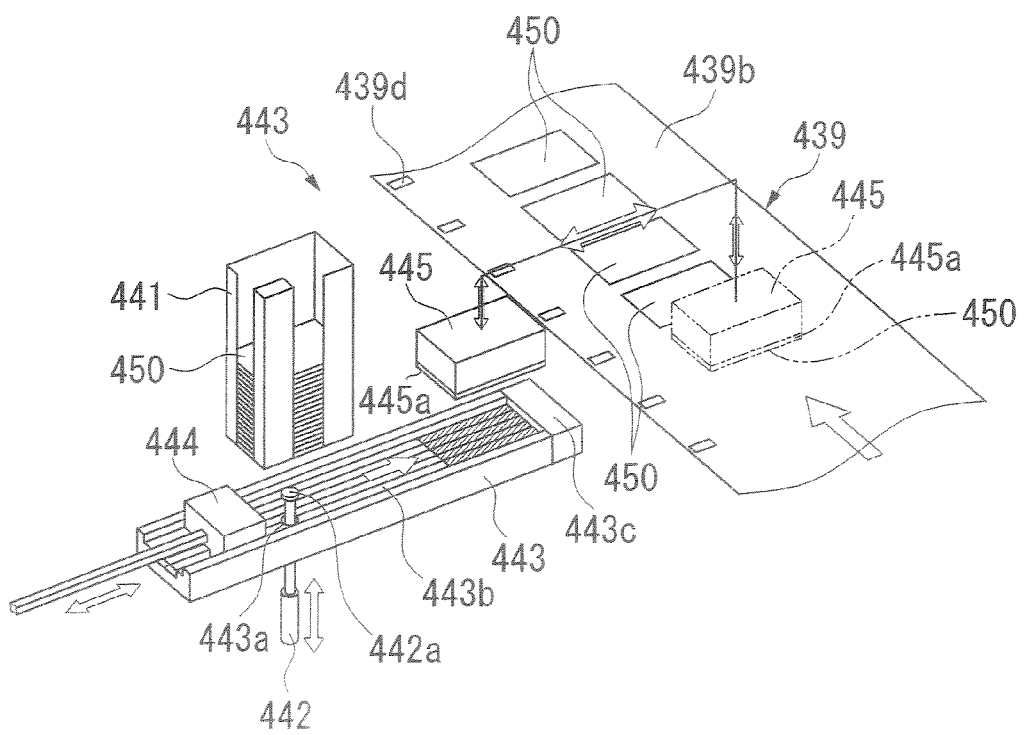
[FIG. 26] An outline perspective view showing the third means that constitutes the apparatus for manufacturing the non-contact data reception/transmission unit according to the present invention.

Next, the manufacturing method and manufacturing apparatus for the aforementioned non-contact data reception/transmission unit shall be explained referring to FIG. 25 and FIG. 26.

(Manufacturing Apparatus for the Aforementioned Non-contact Data Reception/Transmission Unit)

FIG. 25 is a mimetic diagram showing the constitution of the apparatus for manufacturing the non-contact data reception/transmission unit according to the aforementioned embodiment.

FIG. 26 is an outline perspective view showing the third means that constitutes the apparatus for manufacturing the non-contact data reception/transmission unit according to the aforementioned embodiment.

Hereinbelow, inlet means the inlet with a magnetic layer (the non-contact data reception/transmission unit shown in FIG. 24).

A manufacturing apparatus 430 shown in FIG. 25 is roughly constituted from a first means 431, a second means 432, a third means 433, a fourth means 434, a fifth means 435, a sixth means 436 and take-up means 437, 438, with these means disposed in this order. In addition, each means that constitutes the manufacturing apparatus 430 is connected by a conveying means such as a belt conveyor.

Moreover, the third means 433 shown in FIG. 26 is roughly constituted from a stacker (holding means) 441, an inlet pull-out mechanism (pull-out means) 442, a rail member 443, a push-out block 444, and a suction block 445.

The stacker 441 holds a plurality of inlets 450 in a vertically stacked state. Under the stacker 441 are provided the inlet pull-out mechanism 442 for pulling out one inlet 450 at a time and the rail member 443 for moving the inlet 450 pulled out from the stacker 441 to below the suction block 445.

The inlet pull-out mechanism 442 is constituted to be able to move reciprocally in the vertical direction through a through-hole 443a provided in the vertical direction in the rail member 443. The distal end head 442a thereof sequentially pulls out (takes out) by suction action the inlet 450 located at the bottom of the plurality of inlets 450 stacked in the stacker 441.

Here, the lower surface of the inlet 450, being the surface that is attached to a release base substrate 439b of a first continuous sheet 439, is formed flat. Therefore, the distal end head 442a of the inlet pull-out mechanism 442, suctioning the center portion of the lower surface of the inlet 450 with sufficient suction force, can reliably pull out one inlet 450 at a time from the stacker 441. Although the inlet 450 will bend momentarily at this time, since the IC chip and the antenna are disposed in a position away from the center portion of the inlet 450, they are not damaged by the suction from the distal end head 442a. Moreover, because the inlet pull-out mechanism 442 is constituted to pull out one by one from the bottom side of the plurality of inlets 450, the inlets 450 can be supplied anytime to the stacker 441 during operation.

A guide groove 443b on which inlets 450 pulled out from the stacker 441 by the inlet pull-out mechanism 442 are placed is provided in the rail member 443. The width dimension of the guide groove 443b is set to be slightly greater than the dimension corresponding to the inlet 450.

A push-out block 444 is provided in the guide groove 443b of the rail member 443, being positioned in the middle thereof and capable of reciprocal movement along the guide groove 443b.

By movement of the push-out block 444 to the right in the drawing along the guide groove 443a in FIG. 26, the inlet 450 pulled out from the stacker 441 and placed in the middle of the guide groove 443b is fed until its distal end mostly abuts the abutting portion 443c of the guide groove 443b.

Furthermore, the suction block 445, for suctioning the inlet 450 positioned so that its distal end mostly abuts the abutting portion 443c, is provided above the abutting portion 443c of the guide groove 443b.

The suction block 445 has a shape corresponding to the external shape of the inlet 450, with a shock absorbing material 445a such as a sponge attached to its bottom surface. Also, a suction port (not illustrated) for carrying out suction-holding of the inlet 450 is provided in the center of the bottom surface of the suction block 445.

The suction block 445 is constituted to be movable in the vertical direction and the horizontal direction along the guide groove 443b, being driven by an air cylinder, for example. With such a constitution, the suction block 445 descends toward the inlet 450 positioned so that its distal end mostly abuts the abutting portion 443c of the guide groove 443b, and the inlet 450 is suction-held by the bottom surface of the suction block 445. Although the suction force from the suction block 445 acts on the center portion of the inlet 450 at this time, due to the shock absorbing action of the sponge 445a, the inlet 450 does not sustain damage stemming from the suction force.

After the suction block 445 that suction-holds the inlet 450 ascends, it moves in the horizontal direction in the drawing until being above the release base substrate 439b of the first continuous sheet 439. At this time, the suction block 445 moves along a horizontal guide (not illustrated) and stops at a predetermined position above the release base substrate 439b by the operation of for example, a stopper (not illustrated). Then, the suction block 445 descends and presses the suctioned inlet 450 onto the surface of the release base substrate 439b. Accordingly, the inlet 450 is attached to the surface of the release base substrate 439b by the suction block 445 pressing the inlet 450 onto the surface of the release base substrate 439b while stopping the suction operation. In this way, the suction block 455 constitutes a moving and pressing means that moves inlets 450 disposed at a predetermined location, and sequentially presses them onto the surface of the release base substrate 439b of the first continuous sheet 439.

In the third means 433, inlets 450 are supplied in a cassette system, but the present invention is not limited thereto. In the present invention, a system of continuously supplying inlets with a magnetic layer and separating them with a cutter and the like may also be adopted. In addition, the magnetic layer may be formed by coating and drying in-line.

Also, this embodiment illustrated the example of the third means 433 attaching inlets 450 one at a time on the release base substrate 439b along the conveying direction of the first continuous sheet 439, however, the present invention is not limited thereto. In the present invention, the third means may have a mechanism that attaches a plurality of inlets simultaneously onto the release base substrate along the conveying direction of the first continuous sheet.

(Method of Manufacturing the Non-contact Data Reception/Transmission Unit)

For manufacturing the non-contact data reception/transmission unit, first a first continuous sheet 439 consisting of a backing paper attached to a long release base substrate is supplied from the first means 431.

The first continuous sheet 439 supplied from the first means 431 is sent to the third means 433 that attaches the inlets in the state of the backing paper 439a on the surface layer peeled off and the release base substrate 439b exposed. After the backing paper 439a is peeled off from the first continuous sheet 439, it is taken up by the second means 432.

The first continuous sheet 439 is intermittently conveyed along the lengthwise direction by a sensor (not illustrated) reading timing marks 439d provided on one side of the release base substrate 439b at a predetermined interval along the lengthwise direction. This enables adjustment of the interval of the inlets 450 to be attached to the surface of the release base substrate 439b.

Next, the intermittent conveyance operation of the first continuous sheet 439 is repeated and the inlets 450 are sequentially attached onto the surface of the release base substrate 439b at a predetermined interval.

Next, the first continuous sheet 439 on which inlets 450 are attached at regular intervals by the third means 433 is conveyed to a fifth means 435 provided with a pair of bonding rollers 435a and 435b.

Also, with the conveyance of the first continuous sheet 439 to the fifth means 435, a second continuous sheet 440 consisting of a backing paper 440a attached to an overlay material 440b via an adhesive layer (not illustrated) is supplied.

The second continuous sheet 440 supplied from the fourth means 434 is fed to the fifth means 435 in the state of the surface layer backing paper 440a peeled off and the adhesive layer exposed. After the backing paper 440a is peeled off from the second continuous sheet 440, it is taken up by a take-up means 437.

Next, by passing the first continuous sheet 439 and the second continuous sheet 440 between the pair of bonding rollers 435a and 435b provided at the fifth means 435, the surface of the first continuous sheet 439 on which the inlets 450 are attached to the release base substrate 439b and the surface of the second continuous sheet 440 on which the adhesive layer is attached are overlapped and bonded together.

Next, the composite sheet including the first continuous sheet 439 and the second continuous sheet 440 stacked by the fifth means 435 is conveyed to the sixth means 436. This composite sheet is die cut along the external dimensions of one non-contact data reception/transmission unit by the sixth means 436, with the die-cut non-contact data reception/transmission unit being collected. Also, the unwanted portion of the die-cut composite sheet (the first continuous release sheet 439 and the second continuous sheet 440 the region outside the non-contact data reception/transmission unit) is taken up by the take-up means 438.

Thus in the third means 433 of this embodiment, the stacked inlets 450 are sequentially pulled out and supplied one at a time to a predetermined position, with the inlets 450 supplied to the predetermined position moved and pressed onto the surface of the release base substrate 439b of the first continuous sheet 439, whereby the inlets 450 can be attached to the surface of the release base substrate 439b via an adhesive layer provided so as to cover the magnetic layer of the inlet 450 or a magnetic layer having adhesiveness. Accordingly, the activity of fitting the inlets 450 onto a sheet is performed automatically without relying on manual operation, and so large quantities of non-contact data reception/transmission units can be manufactured efficiently and with high quality.

In order to reduce the load on the inlets 450 when passing between the pair of bonding rollers 435a and 435b provided in the fifth means 435 that is, in order to reduce the nip pressure which acts on the inlets 450, a shock absorbing material such as a sponge may be wrapped around at least one of the bonding rollers 435a or 435b.

The non-contact data reception/transmission unit embodying the present invention is explained in detail hereinbelow.

Figure 27:
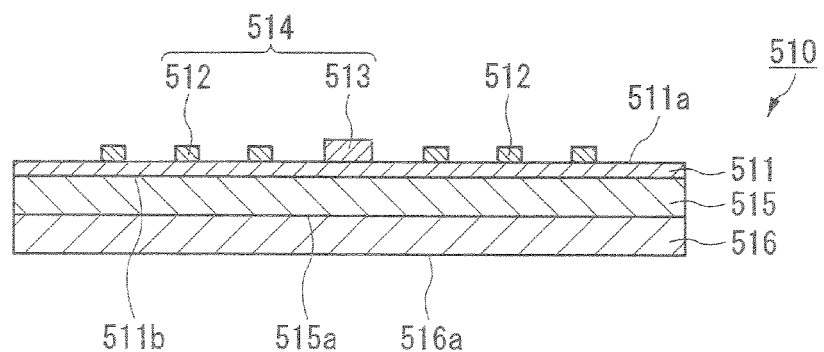
[FIG. 27] An outline sectional view showing the non-contact data reception/transmission unit according to the 13th embodiment of the present invention.

FIG. 27 is an outline sectional view showing the non-contact data reception/transmission unit of the 13th embodiment according to the present invention.

A non-contact data reception/transmission unit 510 of this embodiment is roughly constituted from a base substrate 511; an inlet 514 including a connected antenna 512 and IC chip 513 provided on one surface 511a thereof; a magnetic layer 515 disposed on the other surface 511b of the base substrate 511; a ferromagnetic layer 516 having spontaneous magnetization characteristics (hereafter, "ferromagnetic layer") disposed on a surface (hereafter, "the one surface") 515a of the magnetic layer 515 opposite the surface in contact with the base substrate 511. Moreover, the magnetic layer 515 is constituted from a composite body having a filler consisting of at least magnetic particulates contained in a resin.

In the non-contact data reception/transmission unit 510, the antenna 512 is provided in a coil shape at a predetermined interval on the one surface 511a of the base substrate 511.

In the non-contact data reception/transmission unit 510, the antenna 512 and the IC chip 513 are provided on the same surface (the one surface 511a) of the base substrate 511. However, in the non-contact data reception/transmission unit of the present invention, a connection bridge forming a portion of the antenna may be provided on the surface opposite the surface on which the body of the antenna is provided (the other surface 511b).

In the non-contact data reception/transmission unit 510, connection of the antenna 512 and the IC chip 513 which constitute the inlet 514, means the end portions of the antenna 512 being respectively connected to both terminals of the IC chip 513.

Moreover, viewing the non-contact data reception/transmission unit 510 from the other surface 511b side of the base substrate 511, the plurality of magnetic particulates constituting the magnetic layer 515 form a connected single magnetic body in which at least a portion of the magnetic particulates mutually overlap.

Furthermore, in the non-contact data reception/transmission unit 510, the one surface 516a of the ferromagnetic layer 516 serves as the affixing surface with respect to a metal article.

The base substrate 511, at least for the surface layer portion, is selected from a publicly known material such as a woven fabric, non-woven fabric, mat, paper or combination thereof made from inorganic fiber such as glass fiber or alumina fiber and organic fiber such as polyester fiber or polyamide fiber; a composite base substrate formed by impregnating any thereof with a resin varnish; a plastic substrate such as a polyamide resin substrate, polyester resin substrate, polyolefine resin substrate, polyimide resin substrate, ethylene vinyl alcohol copolymer substrate, polyvinyl alcohol resin substrate, polyvinyl chloride resin substrate, polyvinylidence chloride resin substrate, polystyrene resin substrate, polycarbonate resin substrate, acrylonitrile styrene butadiene copolymerization resin substrate, polyether sulfone resin substrate or any thereof subjected to mat treatment, corona discharge treatment, plasma treatment, ultraviolet irradiation treatment, electron-beam-irradiation treatment, flame plasma treatment and ozone treatment, or surface treatment such as easy adhesion treatment. Among these, an electrically insulating film or sheet consisting of polyethylene terephthalate or polyimide is suitably used.

The antenna 512 can be formed by screen printing a predetermined pattern with a polymer conductive ink or etching a conductive foil on the one surface 511a of the base substrate 511.

Examples of the polymer conductive ink used in the present invention include those that have electrically conductive particulates such as silver dust, gold dust, platinum powder, aluminum powder, palladium powder, rhodium powder and carbon powder (carbon black, carbon nanotube, etc.) blended in a resin composition.

If a thermosetting resin is used as the resin compound, it shall be a thermosetting type that can form the coating film that produces the antenna 512 at less than 200° C., for example 100 to 150° C. The path through which electricity flows in the coating film that produces the antenna 512 is formed due to the mutual contact of the conductive particulates that form the coating film, and the resistance value of this coating film is on the order of $10^{-5}$ Ω/cm.

Also, in addition to a thermosetting type ink, publicly known types such as a photo-curing type, osmotic drying type, and solvent volatilization type are used as the polymer conductive ink in the present invention.

The photo-curing polymer conductive ink is one that includes a photo-curing resin in the resin compound, which shortens the hardening time and thereby raises manufacturing efficiency. The photo-curing polymer conductive ink can be one in which at least 60 percent by mass of conductive particulates and at least 10 percent by mass of a polyester resin are blended in a thermoplastic resin only or a blended resin composition of a thermoplastic resin and a crosslinked resin (particularly a crosslinked resin of polyester and isocyanate and the like), that is, a solvent volatilization type or a crosslinked/thermoplastic combination type (with the thermoplastic type being at least 50 percent by mass).

In addition, a flexibilizer can be blended with the polymer conductive ink when resistance to bending is further required in the antenna 512.

Examples of the flexibilizer are a polyester flexibilizer, acrylic flexibilizer, urethane flexibilizer, polyvinyl acetate flexibilizer, thermoplastic-elastomer flexibilizer, natural-rubber flexibilizer, a synthetic-rubber flexibilizer, and a blend of two or more of the above.

The conductive foil that forms the antenna 512 includes copper foil, silver foil, gold foil, platinum foil, and aluminum foil etc.

The IC chip 513 is not particularly limited, and as long as writing and reading of information is possible in a non-contact state via the antenna 512, anything may be used that is applicable to RFID media such as non-contact IC tags and non-contact IC labels or non-contact IC cards.

The composite body that makes up the magnetic layer 515 is roughly constituted from a filler consisting of magnetic particulates, and an organic resin that consists of a thermosetting compound or a thermoplastic compound or an inorganic resin that consists of an inorganic compound.

This composite body, as needed, may be a coating configuration containing additives and solvents, being used in a coating/drying process with the magnetic particulates uniformly dispersed.

The magnetic particulates can be a powdered magnetic powder or magnetic flakes consisting of flat-shaped flakes obtained by refining this magnetic power into a powder with a ball mill or the like and then mechanically flattening the powder. Among these, as magnetic particulates, those of the flattened state are preferable. If the magnetic particulates are in the flattened state, viewing the non-contact data reception/transmission unit 510 from the other surface 511b of the base substrate 511 the plurality of magnetic particulates constituting the magnetic layer 515 easily form a connected single magnetic body in which at least a portion of the magnetic particulates mutually overlap. Accordingly, flux can be more easily picked up by the antenna through the magnetic layer.

Moreover, as the magnetic powder, for example, Sendust (Fe—Si—Al alloy) powder, carbonile iron powder, atomized powder such as permalloy, and reduced iron powder, etc. can be given. Flakes of a magnetic material can for example be flakes obtained by refining the magnetic material into a powder with a ball mill or the like and then mechanically flattening the powder, and flakes obtained by running molten metal of an iron-based or cobalt-based amorphous alloy into a water-cooled copper plate. As the magnetic particulates, magnetic powder or magnetic flakes consisting of Sendust are preferable, with magnetic flakes consisting of Sendust being more preferable. If the magnetic particulates are magnetic powder or magnetic flakes consisting of Sendust, since the saturation magnetic flux density and permeability of the magnetic layer 515 which contains these as a component are higher, flux can be more easily picked up by the antenna through the magnetic layer.

The shape of the magnetic particulates forming the magnetic layer 515 need not entirely be powdered or flat shaped. Powdered magnetic particulates and flat shaped-magnetic particulates may be mixed together in the magnetic layer 515, and even if magnetic particulates of differing shapes are thus mixed together, the non-contact data reception/transmission unit of the present invention will exhibit a sufficient effect.

As the resin constituting the composite body that makes up the magnetic layer 515, thermoplastic resin, thermosetting resin, reactive resin and the like can be used.

Examples of the thermoplastic resin include vinyl chloride, vinyl acetate, a vinyl chloride-vinyl acetate copolymer, a vinyl chloride-vinylidene chloride copolymer, a vinyl chloride-acrylonitrile copolymer, an acrylic acid ester-acrylonitrile copolymer, an acrylic ester-vinyl chloride-vinylidene chloride copolymer, an acrylic ester-vinylidene chloride copolymer, a methacrylate ester-vinylidene chloride copolymer, a methacrylate ester-vinyl chloride copolymer, a methacrylic acid ester-ethylene copolymer, polyvinyl fluoride, a vinylidene chloride-acrylonitrile copolymer, an acrylonitrile-butadiene copolymer, polyamide resin, polyvinyl butyral, a cellulose derivative (cellulose acetate butyrate, a cellulose die acetate, cellulose triacetate, cellulose propionate, cellulose nitrate), a styrene-butadiene copolymer, a polyurethane resin, a polyester resin, an amino resin, or a polymer synthetic rubber material such as styrene rubber, fluorine rubber, silicone rubber, and ethylene-propylene copolymer rubber.

Examples of a thermosetting resin or reactive resin include phenol resin, epoxy resin, polyurethane hardening resin, urea resin, melamine resin, alkyd resin, silicone resin, polyamine resin, and urea-formaldehyde resin.

Various adhesives may be contained in the composite body that makes up the magnetic layer 515 in order to impart adhesiveness to the magnetic layer 515.

Moreover, examples of the additives contained in the magnetic coating used in order to form the composite body that makes up the magnetic layer 515 include a viscosity modifier, an antifoaming agent, a leveling agent, etc.

Furthermore, examples of the solvent contained in this magnetic coating include organic solvents such as cyclohexanone, acetone, and benzene-based and ethyl-based solvents.

The ferromagnetic layer 516 is a ferromagnetic body having spontaneous magnetization characteristics, i.e., a permanent magnet, with such a permanent magnet including magnets such as a ferrite magnet, an alnico magnet, a samarium-based magnet, a cobalt-based magnet, a nickel-based magnet, and a magnet made by mixing powder of these magnets in various resins and fabricating into a sheet shape or plate shape. Moreover, the shape and size of the ferromagnetic body are appropriately set.

After the magnetic layer 515 is formed by a process of coating and drying, the ferromagnetic layer 516, as needed, is formed by a process of mixing the aforementioned magnet powder in various resins and coating and drying with a coating configuration containing additives and solvents while applying a magnetic field. The ferromagnetic layer 516 formed by this process has spontaneous magnetization characteristics.

According to the non-contact data reception/transmission unit 510 of this embodiment, by disposing the magnetic layer 515 on the other surface 511b of the base substrate 511, and disposing the ferromagnetic material layer 516 on the one surface 515a of the magnetic layer 515, it can be repeatedly attached to metal articles without using adhesive, and even when in contact with a metal article, the antenna 512 can be made to generate sufficient induced electromotive force to operate the IC chip 513 since flux is picked up by the antenna 512 through the magnetic layer 515.

Figure 28:
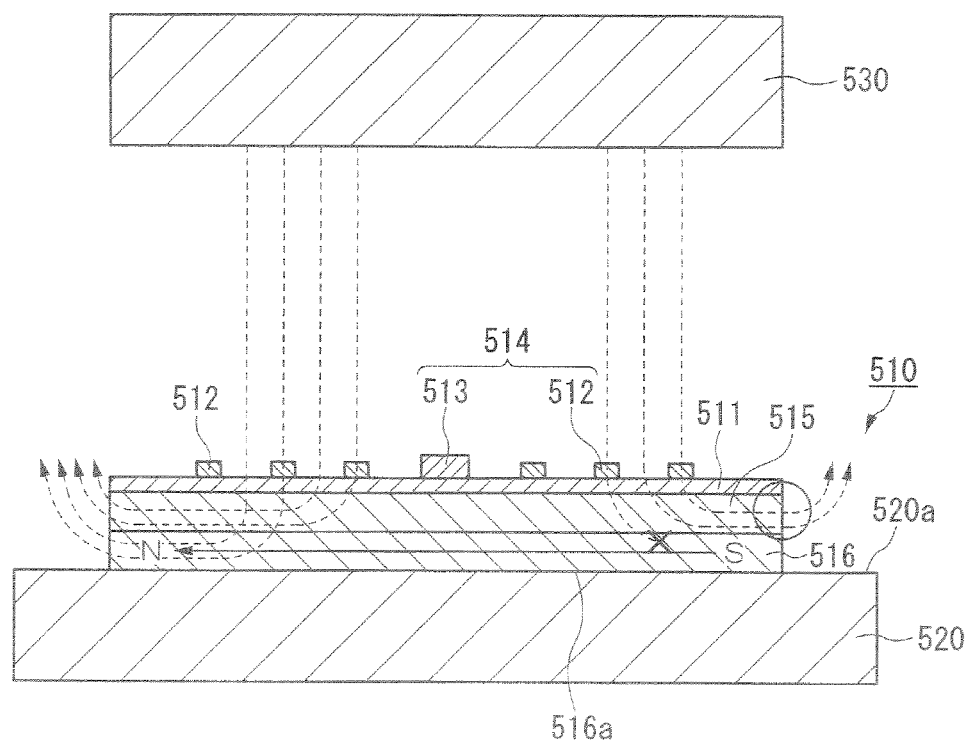
[FIG. 28] A drawing explaining the mechanism of a non-contact data reception/transmission unit picking up flux emitted from an information writing/reading device in the case of the non-contact data reception/transmission unit according to the present invention being attached to a metal article.

Referring to FIG. 28, the mechanism of a non-contact data reception/transmission unit 510 attached to a metal article 520 picking up flux emitted from an information writing/reading device 530 shall be explained.

In the ferromagnetic material layer 516 of the non-contact data reception/transmission unit 510, for example the direction of flux is always constant in the direction perpendicular to the direction in which the base substrate 511, the magnetic layer 515, and the ferromagnetic layer 516 are stacked (the direction of the solid line arrows in FIG. 28). Then, if the information writing/reading device 530 is brought close to the non-contact data reception/transmission unit 510 stuck on the one surface 520a of the metal article 520, the flux emitted from the information writing/reading device 530, tracing the direction of the broken line arrows shown in FIG. 28, will be picked up by the antenna 512. That is, at the N-pole side of the ferromagnetic layer 516, flux emitted from the information writing/reading device 530 is picked up by the antenna 512 through the magnetic layer 515 and the ferromagnetic layer 516. Meanwhile, at the S-pole side of the ferromagnetic layer 516, while flux emitted from the information writing/reading device 530 is picked up by the antenna 512 through the magnetic layer 515, it does not pass the ferromagnetic layer 516.

However, in the non-contact data reception/transmission unit 510 as a whole, since flux emitted from the information writing/reading device 530 is picked up by the antenna 512 through the magnetic layer 515, the antenna 512 can be made to generate sufficient induced electromotive force to operate the IC chip 513.

This embodiment gave the example of the antenna 512 being provided in a coil shape on the one surface 511a of the base substrate 511, however, the non-contact data reception/transmission unit of the present invention is not limited thereto. In the non-contact data reception/transmission unit of the present invention, as long as electromotive force is obtained by adopting an electromagnetic induction method, the antenna may have any shape.

Also, this embodiment illustrated the non-contact data reception/transmission unit 510 having the coil-shaped antenna 512 and the IC chip 513 provided separately on the one surface 511a of the base substrate 511 and connected to each other, however, the non-contact data reception/transmission unit of the present invention is not limited thereto. In the non-contact data reception/transmission unit of the present invention, the IC chip may be mounted on the antenna, or the antenna may be formed on the IC chip.

In addition, the non-contact data reception/transmission unit of this embodiment is applicable to a confidential postcard format. Examples of a confidential postcard format include two-fold postcards, three-fold postcards, four-fold postcards and partially folding postcards.

(Method of Manufacturing the Non-contact Data Reception/Transmission Unit)

Next, the method of manufacturing the non-contact data reception/transmission unit of this embodiment shall be explained referring to FIG. 27.

First, the antenna 512 having a predetermined thickness and predetermined pattern is formed on the one surface 511a of the base substrate 511.

In this step, when forming the antenna 512 with polymer conductive ink, after printing the polymer conductive ink by a screen method so as to have the predetermined thickness and the predetermined pattern on the one surface 511a of the base substrate 511, drying and hardening of the polymer conductive ink forms the antenna 512 having the predetermined thickness and the predetermined pattern.

Forming the antenna 512 with a conductive foil is performed according to the following procedure.

A conductive foil is bonded to the entire one surface 511a of the base substrate 511, after which an etch-resistant coating is printed in a predetermined pattern by a silk screen method onto the conductive foil. After drying and hardening the etch-resistant coating, it is immersed in an etching solution, wherein the copper foil that is not coated with the etch-resistant coating dissolves away, leaving the copper foil portion coated with the etch-resistant coating on the one surface 511a of the base substrate 511, thereby forming the antenna 512 having a predetermined pattern.

Next, the IC chip 513 is mounted on the one surface 511a of the base substrate 511 by electrically connecting contacts (not illustrated) provided on the antenna 512 and contacts (not illustrated) provided on the IC chip 513 via an electrically conductive material consisting of conductive paste or solder.

Then a magnetic coating including a filler consisting of magnetic particulates, resin, additives, and solvents is applied over the entire other surface 511b of the base substrate 511 by a screen printing method or the like. After applying the magnetic coating, the magnetic layer 515 is formed by drying and hardening the coating by leaving it at room temperature or heating it at a prescribed temperature and prescribed time.

Next, a sheet-shaped or plate-shaped ferromagnetic body having spontaneous magnetization characteristics is attached to the entire one surface 515a of the magnetic layer 515 by an adhesive, whereby the ferromagnetic layer 516 is formed and the non-contact data reception/transmission unit 510 is obtained.

This embodiment illustrated a method of forming the antenna 512 by screen printing and etching, but the present invention is not limited thereto. In the present invention, the antenna can also be formed with vacuum deposition or an ink jet printing method.

In addition, the magnetic layer 515 may be formed by a process of coating and drying while regulating by applying a magnetic field so that residual magnetization does not remain (to an extent of not being equipped with spontaneous magnetization characteristics). When doing so, permeability can be raised while mitigating flux variation.

Figure 29:
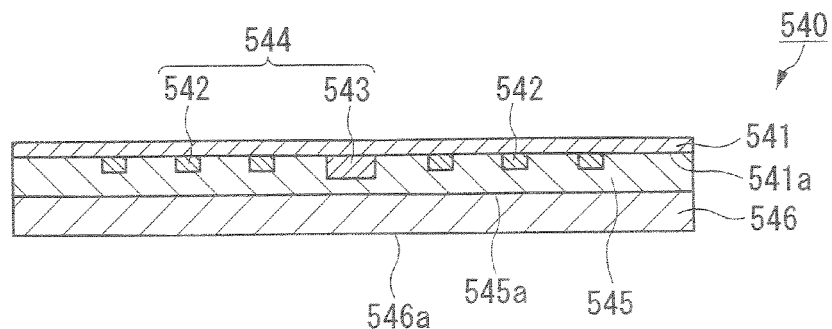
[FIG. 29] An outline sectional view showing the non-contact data reception/transmission unit according to the 14th embodiment of the present invention.

FIG. 29 is an outline sectional view showing the non-contact data reception/transmission unit of the 14th embodiment according to the present invention.

A non-contact data reception/transmission unit 540 of the present embodiment is roughly constituted from a base substrate 541; an inlet 544 including a connected antenna 542 and IC chip 543 provided on one surface 541a thereof; a magnetic layer 545 disposed so as to cover the antenna 542 and the IC chip 543; and a ferromagnetic layer 546 disposed on a surface (hereafter, "the one surface") 545a of the magnetic layer 545 opposite the surface in contact with the base substrate 541. Moreover, the magnetic layer 545 is constituted from a composite body having a filler consisting of at least magnetic particulates contained in a resin.

In the non-contact data reception/transmission unit 540, the antenna 542 is provided in a coil shape at a predetermined interval on the one surface 541a of the base substrate 541.

In the non-contact data reception/transmission unit 540, the antenna 542 and the IC chip 543 are provided on the same surface (the one surface 541a) of the base substrate 541. However, in the non-contact data reception/transmission unit of the present invention, a connection bridge forming a portion of the antenna may be provided on the surface opposite the surface on which the body of the antenna is provided (the one surface 541a).

In the non-contact data reception/transmission unit 540, connection of the antenna 542 and the IC chip 543, which constitute the inlet 544, means the end portions of the antenna 542 being respectively connected to both terminals of the IC chip 543.

A composite body, including a filler consisting of magnetic particulates and resin, that serves as a magnetic layer 545 covering the antenna 542 and the IC chip 543 constituting the inlet 544 means covering to a degree that the antenna 542 and the IC chip 543 are concealed. The magnetic layer 545 preferably covers the antenna 542 and the IC chip 543 so that the one surface 545a of the magnetic layer 545 is flat.

Moreover, viewing the non-contact data reception/transmission unit 540 from the side of the one surface 541a of the base substrate 541, the plurality of magnetic particulates constituting the magnetic layer 545 form a connected single magnetic body in which at least a portion of the magnetic particulates mutually overlap.

Also, the composite body that makes up the magnetic layer 545 is disposed so as to be filled between the antenna 542 formed in the coiled form, and all or a portion of the magnetic particulates that make up this composite body are disposed between the antenna 542.

Also, in the non-contact data reception/transmission unit 540, the one surface 546a of the ferromagnetic layer 546 serves as the affixing surface with respect to a metal article.

The base substrate 541 is the same as the aforementioned base substrate 511.

The material forming the antenna 542 is the polymer conductive ink or the conductive foil forming the aforementioned antenna 512. The IC chip 543 is the same as the aforementioned IC chip 513.

The composite body forming the magnetic layer 545 is the same as the composite body that forms the aforementioned magnetic layer 515.

The ferromagnetic body having spontaneous magnetization characteristics that forms the ferromagnetic layer 546 is the same as the ferromagnetic body having spontaneous magnetization characteristics that forms the ferromagnetic layer 516.

According to the non-contact data reception/transmission unit 540 of this embodiment, by disposing the magnetic layer 545 so as to cover the antenna 542 and the IC chip 543 provided on the one surface 541a of the base substrate 541, and disposing the ferromagnetic material layer 546 on the one surface 545a of the magnetic layer 54, it can be repeatedly attached to metal articles without using adhesive, and even when in contact with a metal article, the antenna 542 can be made to generate sufficient induced electromotive force to operate the IC chip 543 since flux is picked up by the antenna 542 through the magnetic layer 545.

Figure 30:
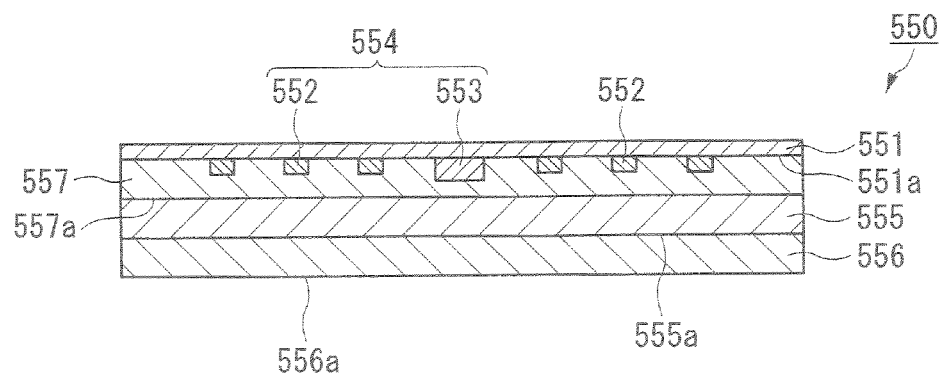
[FIG. 30] An outline sectional view showing the non-contact data reception/transmission unit according to the 15th embodiment of the present invention.

FIG. 30 is an outline sectional view showing the non-contact data reception/transmission unit according to the 15th embodiment of the present invention.

A non-contact data reception/transmission unit 550 of this embodiment is roughly constituted from a base substrate 551; an inlet 554 including a connected antenna 552 and IC chip 553 provided on one surface 551 a thereof; an intermediate layer 557 that is made of resin disposed so as to cover the antenna 552 and IC chip 553; a magnetic layer 555 disposed on a surface (hereafter "the one surface") 557a of the intermediate layer 557 opposite the surface in contact with the base substrate 551; and a ferromagnetic layer 556 disposed on a surface (hereafter "the one surface") 555a of the magnetic layer 555 opposite the surface in contact with the intermediate layer 557. Moreover, the magnetic layer 555 is constituted from a composite body having a filler consisting of at least magnetic particulates contained in a resin.

In the non-contact data reception/transmission unit 550, the antenna 552 is provided in a coil shape at a predetermined interval on the one surface 551a of the base substrate 551.

In the non-contact data reception/transmission unit 550, the antenna 552 and the IC chip 553 are provided on the same surface (the one surface 551a) of the base substrate 551. However, in the non-contact data reception/transmission unit of the present invention, a connection bridge forming a portion of the antenna may be provided on the surface opposite the surface on which the body of the antenna is provided (the surface opposite the aforementioned one surface 551a).

In the non-contact data reception/transmission unit 550, connection of the antenna 552 and the IC chip 553, which constitute the inlet 554, means the end portions of the antenna 552 being respectively connected to both terminals of the IC chip 553.

Moreover, viewing the non-contact data reception/transmission unit 550 from the one side 551a of the base substrate 551, the plurality of magnetic particulates constituting the magnetic layer 555 form a connected single magnetic body in which at least a portion of the magnetic particulates mutually overlap.

Also, in the non-contact data reception/transmission unit 550, the one surface 556a of the ferromagnetic layer 556 serves as the affixing surface with respect to a metal article.

The base substrate 551 is the same as the aforementioned base substrate 511. The material forming the antenna 552 is the polymer conductive ink or the conductive foil forming the aforementioned antenna 512. The IC chip 553 is the same as the aforementioned IC chip 513.

The composite body that makes up the magnetic layer 555 is the same as the composite body that forms the aforementioned magnetic layer 515.

The ferromagnetic body having spontaneous magnetization characteristics that makes up the ferromagnetic layer 556 is the same as the ferromagnetic body having spontaneous magnetization characteristics that forms the ferromagnetic layer 516.

The intermediate layer 557 is fabricated with resin, synthetic paper, paper, adhesive etc. As the resin forming the intermediate layer 557, a polyamide-based resin, polyimide-based resin, polyester-based resin, epoxy-based resin, polyurethane-based resin, etc. can be used, and even resins other than these can be suitably used.

According to the non-contact data reception/transmission unit 550 of this embodiment, by disposing the intermediate layer 557 consisting of resin and the like so as to cover the antenna 552 and the IC chip 553 provided on the one surface 551a of the base substrate 551, disposing the magnetic layer 555 on the one surface 557a of the intermediate layer 557, and disposing the ferromagnetic layer 556 on the one surface 555a of the magnetic layer 555, it can be repeatedly attached to metal articles without using adhesive, and even when in contact with a metal article, the antenna 552 can be made to generate sufficient induced electro motive force to operate the IC chip 553 since flux is picked up by the antenna 552 through the magnetic layer 555. In addition, providing the intermediate layer 557 can increase the overall strength of the non-contact data reception/transmission unit 550. Furthermore, if the intermediate layer 557 is provided, when providing the magnetic layer 555 by a method other than the process of coating and drying, the magnetic layer 555 can be provided so as to resist exfoliation.

This embodiment gave the example of the non-contact data reception/transmission unit 550 having the intermediate layer 557 as one layer thereof, however, the non-contact data reception/transmission unit of the present invention is not limited thereto. In the non-contact data reception/transmission unit of the present invention, a plurality of intermediate layers may be provided.

Figure 31:
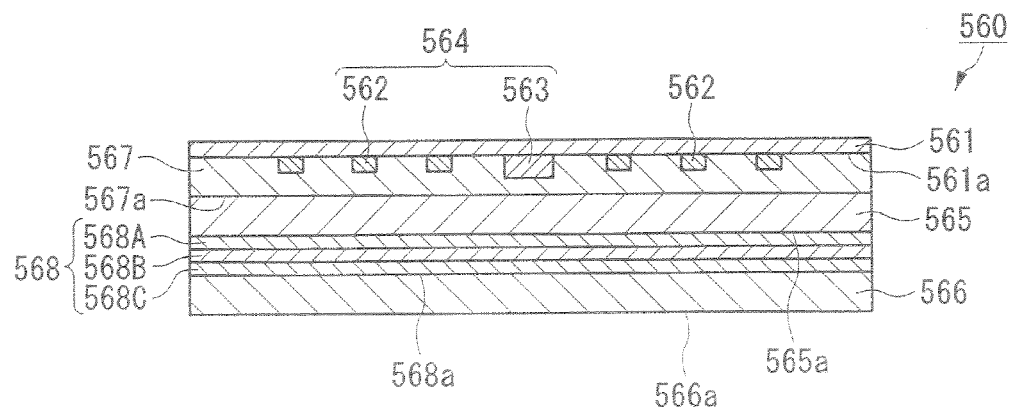
[FIG. 31] An outline sectional view showing the non-contact data reception/transmission unit according to the 16th embodiment of the present invention.

FIG. 31 is an outline sectional view showing the non-contact data reception/transmission unit according to the 16th embodiment of the present invention.

A non-contact data reception/transmission unit 560 of this embodiment is roughly constituted from a base substrate 561; an inlet 564 including a connected antenna 562 and IC chip 563 provided on one surface 561a thereof; a first intermediate layer 567 that is made of resin disposed so as to cover the antenna 562 and IC chip 563; a magnetic layer 565 disposed on a surface (hereafter "the one surface") 567a of the first intermediate layer 567 opposite the surface in contact with the base substrate 561; a second intermediate layer 568 including unit layers 568A, 568B, 568C and disposed on a surface (hereafter "the one surface") 565a of the magnetic layer 565 opposite the surface in contact with the first intermediate layer 567; and a ferromagnetic layer 566 disposed on a surface (hereafter "the one surface") 568a of the second intermediate layer 568 opposite the surface in contact with the magnetic layer 565. Moreover, the magnetic layer 565 is constituted from a composite body having a filler consisting of at least magnetic particulates contained in a resin.

In the non-contact data reception/transmission unit 560, the antenna 562 is provided in a coil shape at a predetermined interval on the one surface 561a of the base substrate 561.

In the non-contact data reception/transmission unit 560, the antenna 562 and the IC chip 563 are provided on the same surface (the one surface 561a) of the base substrate 561. However in the non-contact data reception/transmission unit of the present invention, a connection bridge forming a portion of the antenna may be provided on the surface opposite the surface on which the body of the antenna is provided (the surface opposite the aforementioned one surface 561a).

In the non-contact data reception/transmission unit 560, connection of the antenna 562 and the IC chip 563, which constitute the inlet 564, means the end portions of the antenna 562 being respectively connected to both terminals of the IC chip 563.

Moreover, viewing the non-contact data reception/transmission unit 560 from the one side 561a of the base substrate 561, the plurality of magnetic particulates constituting the magnetic layer 565 form a connected single magnetic body in which at least a portion of the magnetic particulates mutually overlap.

Also, in the non-contact data reception/transmission unit 560, the one surface 566a of the ferromagnetic layer 566 serves as the affixing surface with respect to a metal article.

The base substrate 561 is the same as the aforementioned base substrate 511. The material forming the antenna 562 is the polymer conductive ink or the conductive foil forming the aforementioned antenna 512. The IC chip 563 is the same as the aforementioned IC chip 513.

The composite body that makes up the magnetic layer 565 is the same as the composite body that forms the aforementioned magnetic layer 515.

The ferromagnetic body having spontaneous magnetization characteristics that makes up the ferromagnetic layer 566 is the same as the ferromagnetic body having spontaneous magnetization characteristics that forms the ferromagnetic layer 516.

The first intermediate layer 567 and the second intermediate layer 568 are fabricated with resin, synthetic paper, paper, adhesive etc. As the resin forming the first intermediate layer 567 and the second intermediate layer 568, a polyamide-based resin, polyimide-based resin, polyester-based resin, epoxy-based resin, polyurethane-based resin, etc. can be used, and even resins other than these can be suitably used.

According to the non-contact data reception/transmission unit 560 of this embodiment, by disposing the first intermediate layer 567 consisting of resin and the like so as to cover the antenna 562 and the IC chip 563 provided on the one surface 561a of the base substrate 561, disposing the magnetic layer 565 on the one surface 567a of the first intermediate layer 567, disposing the second intermediate layer 568 consisting of resin and the like on the one surface 565a of the magnetic layer 565, and disposing the ferromagnetic layer 566 on the one surface 568a of the second intermediate layer 568, it can be repeatedly attached to metal articles without using adhesive, and even when in contact with a metal article, the antenna 562 can be made to generate sufficient induced electromotive force to operate the IC chip 563 since flux is picked up by the antenna 562 through the magnetic layer 565. In addition, providing the first intermediate layer 567 and the second intermediate layer 568 can increase the overall strength of the non-contact data reception/transmission unit 560. Furthermore, if the first intermediate layer 567 is provided, when providing the magnetic layer 565 by a method other than the process of coating and drying, the magnetic layer 565 can be provided so as to resist exfoliation.

This embodiment gave the example of the non-contact data reception/transmission unit 560 having the first intermediate layer 567 as one layer thereof, however, the non-contact data reception/transmission unit of the present invention is not limited thereto. In the non-contact data reception/transmission unit of the present invention, the first intermediate layer may be provided in a plurality. In addition, the present embodiment gave the example of the second intermediate layer 568 of the non-contact data reception/transmission unit 560 having three layers including the unit layers 568A, 568B, 568C, however, the non-contact data reception/transmission unit of the present invention is not limited thereto. In the non-contact data reception/transmission unit of the present invention, the second intermediate layer may have one layer or two layers or four or more layers.

The non-contact data reception/transmission unit embodying the present invention is explained in detail hereinbelow.

Figure 32:
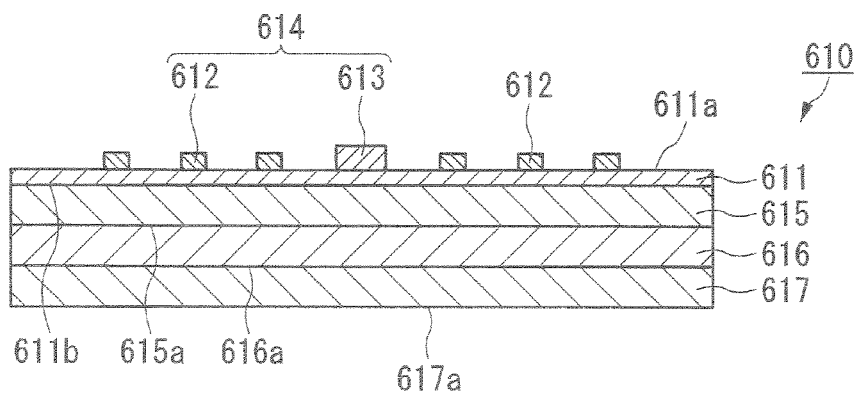
[FIG. 32] An outline sectional view showing the non-contact data reception/transmission unit according to the 17th embodiment of the present invention.

FIG. 32 is an outline sectional view showing the non-contact data reception/transmission unit of the 17th embodiment according to the present invention.

A non-contact data reception/transmission unit 610 of this embodiment is roughly constituted from a base substrate 611; an inlet 614 including a connected antenna 612 and IC chip 613 provided on one surface 611a thereof; a magnetic layer 615 disposed on the other surface 611b of the base substrate 611; a paramagnetic layer 616 that does not magnetize disposed on a surface (hereafter, "the one surface") 615a of the magnetic layer 615 opposite the surface in contact with the base substrate 611; and a ferromagnetic layer 617 having spontaneous magnetization characteristics (hereafter, "ferromagnetic layer") disposed on a surface (hereafter, "the one surface") 616a of the paramagnetic layer 616 opposite the surface in contact with the magnetic layer 615. Moreover, the magnetic layer 615 is constituted from a composite body having a filler consisting of at least magnetic particulates contained in a resin.

In the non-contact data reception/transmission unit 610, the antenna 612 is provided in a coil shape at a predetermined interval on the one surface 611a of the base substrate 611.

In the non-contact data reception/transmission unit 610, the antenna 612 and the IC chip 613 are provided on the same surface (the one surface 611a) of the base substrate 611. However, in the non-contact data reception/transmission unit of the present invention, a connection bridge forming a portion of the antenna may be provided on the surface opposite the surface on which the body of the antenna is provided (the aforementioned other surface 611b).

In the non-contact data reception/transmission unit 610, connection of the antenna 612 and the IC chip 613, which constitute the inlet 614, means the end portions of the antenna 612 being respectively connected to both terminals of the IC chip 613.

Moreover, viewing the non-contact data reception/transmission unit 610 from the other surface 611b side of the base substrate 611, the plurality of magnetic particulates constituting the magnetic layer 615 form a connected single magnetic body in which at least a portion of the magnetic particulates mutually overlap.

Furthermore, in the non-contact data reception/transmission unit 610, the one surface 617a of the ferromagnetic layer 617 serves as the affixing surface with respect to a metal article.

The base substrate 611, at least for the surface layer portion, is selected from a publicly known material such as a woven fabric, non-woven fabric, mat, paper or combination thereof made from inorganic fiber such as glass fiber or alumina fiber and organic fiber such as polyester fiber or polyamide fiber; a composite base substrate formed by impregnating any thereof with a resin varnish; a plastic substrate such as a polyamide resin substrate, polyester resin substrate, polyolefine resin substrate, polyimide resin substrate, ethylene vinyl alcohol copolymer substrate, polyvinyl alcohol resin substrate, polyvinyl chloride resin substrate, polyvinylidence chloride resin substrate polystyrene resin substrate, polycarbonate resin substrate, acrylonitrile styrene butadiene copolymerization resin substrate, polyether sulfone resin substrate or any thereof subjected to mat treatment, corona discharge treatment, plasma treatment, ultraviolet irradiation treatment, electron-beam-irradiation treatment, frame plasma treatment and ozone treatment, or surface treatment such as easy adhesion treatment. Among these, an electrically insulating film or sheet consisting of polyethylene terephthalate or polyimide is suitably used.

The antenna 612 is suitably formed by screen printing a predetermined pattern with a polymer conductive ink or etching a conductive foil on the one surface 611a of the base substrate 611.

Examples of the polymer conductive ink used in the present invention include those that have electrically conductive particulates such as silver dust, gold dust, platinum powder, aluminum powder, palladium powder, rhodium powder and carbon powder (carbon black, carbon nanotube, etc.) blended in a resin composition.

If a thermosetting resin is used as the resin compound, it shall be a thermosetting type that can form the coating film that makes up the antenna 612 at less than 200° C., for example 100 to 150° C. The path through which electricity flows in the coating film that produces the antenna 612 is formed due to the mutual contact of the conductive particulates that form the coating film, and the resistance value of this coating film is on the order of $10^{-5}$ Ω/cm.

Also, in addition to a thermosetting type ink, publicly known types such as a photo-curing type, osmotic drying type, and solvent volatilization type are used as the polymer conductive ink in the present invention.

The photo-curing polymer conductive ink is one that includes a photo-curing resin in the resin compound, which shortens the hardening time and thereby raises manufacturing efficiency. The photo-curing polymer conductive ink can be one that contains at least 60 percent conductive particulates by mass and at least 10 percent polyester resin by mass blended in a thermoplastic resin only or a blended resin composition of a thermoplastic resin and a crosslinked resin (particularly a crosslinked resin of polyester and isocyanate and the like), that is, a solvent volatilization type or a crosslinked/thermoplastic combination type (with the thermoplastic type being at least 50 percent by mass).

In addition, a flexibilizer can be blended with the polymer conductive ink when resistance to bending is further required in the antenna 612.

Examples of the flexibilizer are a polyester flexibilizer, acrylic flexibilizer, urethane flexibilizer, polyvinyl acetate flexibilizer, thermoplastic-elastomer flexibilizer, natural-rubber flexibilizer, a synthetic-rubber flexibilizer, and a blend of two or more of the above.

The conductive foil that forms the antenna 612 includes copper foil, silver foil, gold foil, platinum foil, and aluminum foil etc.

The IC chip 613 is not particularly limited, and as long as writing and reading of information is possible in a non-contact state via the antenna 612, anything may be used that is applicable to REID media such as non-contact IC tags and non-contact IC labels or non-contact IC cards.

The composite body that makes up the magnetic layer 615 is constituted from a filler consisting of magnetic particulates, and an organic resin that consists of a thermosetting compound or a thermoplastic compound or an inorganic resin that consists of an inorganic compound.

This composite body, as needed, may be a coating configuration containing additives and solvents, being used in a coating/drying process with the magnetic particulates uniformly dispersed.

The magnetic particulates can be a powdered magnetic powder or magnetic flakes consisting of flat-shaped flakes obtained by refining this magnetic power into a powder with a ball mill or the like and then mechanically flattening the powder. Among these, as magnetic particulates, those of the flattened state are preferable. If the magnetic particulates are in the flattened state, viewing the non-contact data reception/transmission unit 610 from the other surface 611b of the base substrate 611, the plurality of magnetic particulates constituting the magnetic layer 615 easily form a connected single magnetic body in which at least a portion of the magnetic particulates mutually overlap. Accordingly, flux can be more easily picked up by the antenna through the magnetic layer.

Moreover, as the magnetic powder, for example, Sendust (Fe—Si—Al alloy) powder, carbonile iron powder, atomized powder such as permalloy, and reduced iron powder, etc. can be given. Flakes of a magnetic material can for example be flakes obtained by refining the magnetic material into a powder with a ball mill or the like and then mechanically flattening the powder, and flakes obtained by running molten metal of an iron-based or cobalt-based amorphous alloy into a water-cooled copper plate. As the magnetic particulates, magnetic powder or magnetic flakes consisting of Sendust are preferable, with magnetic flakes consisting of Sendust being more preferable. If the magnetic particulates are magnetic powder or magnetic flakes consisting of Sendust, since the saturation magnetic flux density and permeability of the magnetic layer 615 which contains these as a component are higher, flux can be more easily picked up by the antenna through the magnetic layer.

The shape of the magnetic particulates forming the magnetic layer 615 need not entirely be powdered or flat shaped. Powdered magnetic particulates and flat shaped-magnetic particulates may be mixed together in the magnetic layer 615, and even if magnetic particulates of differing shapes are thus mixed together, the non-contact data reception/transmission unit of the present invention will exhibit a sufficient effect.

As the resin constituting the composite body that makes up the magnetic layer 615, thermoplastic resin, thermosetting resin, reactive resin and the like can be used.

Examples of the thermoplastic resin include vinyl chloride, vinyl acetate, a vinyl chloride-vinyl acetate copolymer, a vinyl chloride-vinylidene chloride copolymer, a vinyl chloride-acrylonitrile copolymer, an acrylic acid ester-acrylonitrile copolymer, an acrylic ester-vinyl chloride-vinylidene chloride copolymer, an acrylic ester-vinylidene chloride copolymer, a methacrylate ester-vinylidene chloride copolymer, a methacrylate ester-vinyl chloride copolymer, a methacrylic acid ester-ethylene copolymer, polyvinyl fluoride, a vinylidene chloride-acrylonitrile copolymer, an acrylonitrile-butadiene copolymer, polyamide resin, polyvinyl butyral, a cellulose derivative (cellulose acetate butyrate, a cellulose die acetate, cellulose triacetate, cellulose propionate, cellulose nitrate), a styrene-butadiene copolymer, a polyurethane resin, a polyester resin, an amino resin, or a polymer synthetic rubber material such as styrene rubber, fluorine rubber, silicone rubber, and ethylene-propylene copolymer rubber.

Examples of a thermosetting resin or reactive resin include phenol resin, epoxy resin, polyurethane hardening resin, urea resin, melamine resin, alkyd resin silicone resin, polyamine resin, and urea-formaldehyde resin.

Various adhesives may be contained in the composite body that makes up the magnetic layer 615 in order to impart adhesiveness to the magnetic layer 615.

Moreover, examples of the additives contained in the magnetic coating used in order to form the composite body that makes up the magnetic layer 615 include a viscosity modifier, an antifoaming agent, a leveling agent, etc.

Furthermore, examples of the solvent contained in this magnetic coating include organic solvents such as cyclohexanone, acetone, and benzene-based and ethyl-based solvents.

The paramagnetic layer 616 has dramatically low permeability and is made of a paramagnetic body that does not magnetize. A paramagnetic body that does not magnetize includes a metallic layer such as metallic foil that is made of aluminum, copper, silver, etc. In addition, iron cannot be used as a material that makes up the paramagnetic layer 616 since, when it contacts a ferromagnetic material having spontaneous magnetization characteristics, it comes to have spontaneous magnetization characteristics.

The ferromagnetic layer 617 is a ferromagnetic body having spontaneous magnetization characteristics, i.e., a permanent magnet, with such a permanent magnet including magnets such as a ferrite magnet, an alnico magnet, a samarium-based magnet, a cobalt-based magnet, a nickel-based magnet, and a magnet made by mixing powder of these magnets in various resins and fabricating into a sheet shape or plate shape. Moreover, the shape and size of the ferromagnetic body are appropriately set.

After the magnetic layer 615 is formed by a process of coating and drying, the ferromagnetic layer 617, as needed, is formed by a process of mixing the aforementioned magnet powder in various resins and coating and drying with a coating configuration containing additives and solvents while applying a magnetic field. The ferromagnetic layer 617 formed by this process has spontaneous magnetization characteristics.

According to the non-contact data reception/transmission unit 610 of this embodiment, by disposing the magnetic layer 615 on the other surface 611b of the base substrate 611, disposing the paramagnetic layer 616 on the one surface 615a of the magnetic layer 615, and disposing the ferromagnetic layer 617 on the one surface 616a of the paramagnetic layer 616, it can be repeatedly attached to metal articles without using adhesive, and even when in contact with a metal article, the antenna 612 can be made to generate sufficient induced electromotive force to operate the IC chip 613 since flux is picked up by the antenna 612 through the magnetic layer 615 without being drawn to the ferromagnetic layer 617. Also, since the paramagnetic layer 616 is disposed between the magnetic layer 615 and the ferromagnetic layer 617, it can prevent the phenomenon arising of the magnetic layer 615 taking on a spontaneous magnetization characteristic by the ferromagnetic layer 617 over the course of time. Accordingly, the non-contact data reception/transmission unit 610 has a stable RFID function in which the frequency of the inlet 614 does not vary regardless of the kind of metal article it is attached to.

Figure 33:
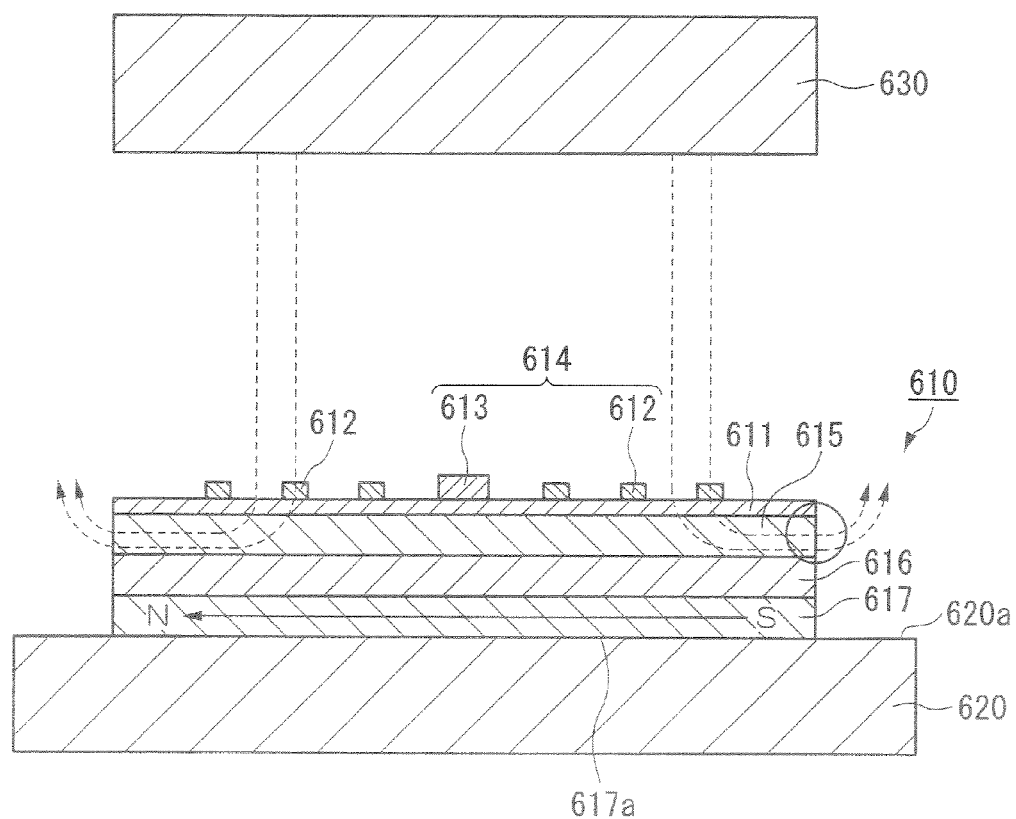
[FIG. 33] A drawing explaining the mechanism of a non-contact data reception/transmission unit picking up flux emitted from an information writing/reading device in the case of the non-contact data reception/transmission unit according to the present invention being attached to a metal article.

Here, the mechanism of the non-contact data reception/transmission unit 610 attached to the metal article 620 picking up flux emitted from the information writing/reading device 630 is explained referring to FIG. 33.

In the ferromagnetic layer 617 of the non-contact data reception/transmission unit 610, for example the direction of flux is always constant in the direction perpendicular to the direction in which the base substrate 611, the magnetic layer 615, the paramagnetic layer 616 and the ferromagnetic layer 617 are stacked (the direction of the solid line arrows in FIG. 33).

Then, if the information writing/reading device 630 is brought close to the non-contact data reception/transmission unit 610 stuck on the one surface 620a of the metal article 620, the flux emitted from the information writing/reading device 630, tracing the direction of the broken line arrows shown in FIG. 33, will be picked up by the antenna 612. That is, due to the existence of the paramagnetic layer 616, the flux emitted from the information writing/reading device 630 is picked up by the antenna 612 through the magnetic layer 615 without be drawn to the ferromagnetic layer 617. Accordingly, over the entire region of the non-contact data reception/transmission unit 610, the antenna 612 can be made to generate sufficient induced electromotive force to operate the IC chip 613 since flux emitted from the information writing/reading device 630 is picked up by the antenna 612 through the magnetic layer 615.

This embodiment gave the example of the antenna 612 being provided in a coil shape on the one surface 611a of the base substrate 611, however, the non-contact data reception/transmission unit of the present invention is not limited thereto. In the non-contact data reception/transmission unit of the present invention, as long as electromotive force is obtained by adopting an electromagnetic induction method, the antenna may have any shape.

Also, this embodiment illustrated the non-contact data reception/transmission unit 610 having the coil-shaped antenna 612 and the IC chip 613 provided separately on the one surface 611a of the base substrate 611 and connected to each other, however, the non-contact data reception/transmission unit of the present invention is not limited thereto. In the non-contact data reception/transmission unit of the present invention, the IC chip may be mounted on the antenna, or the antenna may be formed on the IC chip.

In addition, the non-contact data reception/transmission unit of this embodiment is applicable to a confidential postcard format. Examples of a confidential postcard format include two-fold postcards, three-fold postcards four-fold postcards and partially folding postcards.

(Method of Manufacturing the Non-contact Data Reception/Transmission Unit)

Next, the method of manufacturing the non-contact data reception/transmission unit of this embodiment shall be explained referring to FIG. 32.

First, the antenna 612 having a predetermined thickness and predetermined pattern is formed on the one surface 611a of the base substrate 611.

In this step, when forming the antenna 612 with polymer conductive ink, after printing the polymer conductive ink by a screen printing method so as to have the predetermined thickness and the predetermined pattern on the one surface 611a of the base substrate 611, drying and hardening of the polymer conductive ink forms the antenna 612 having the predetermined thickness and the predetermined pattern.

Forming the antenna 612 with a conductive foil is performed according to the following procedure.

A conductive foil is bonded to the entire one surface 611a of the base substrate 611, after which an etch-resistant coating is printed in a predetermined pattern by a silk screen method onto the conductive foil. After drying and hardening the etch-resistant coating, it is immersed in an etching solution, wherein the copper foil that is not coated with the etch-resistant coating dissolves away, leaving the copper foil portion coated with the etch-resistant coating on the one surface 611a of the base substrate 611, thereby forming the antenna 612 having a predetermined pattern.

Next, the IC chip 613 is mounted on the one surface 611a of the base substrate 611 by electrically connecting contacts (not illustrated) provided on the antenna 612 and contacts (not illustrated) provided on the IC chip 613 via an electrically conductive material consisting of conductive paste or solder.

Then a magnetic coating including a filler consisting of magnetic particulates, resin, additives, and solvents is applied over the entire other surface 611b of the base substrate 611 by a screen printing method or the like. After applying the magnetic coating, the magnetic layer 615 is formed by drying and hardening the coating by leaving it at room temperature or heating it at a prescribed temperature and prescribed time.

Subsequently, a metallic foil including a paramagnetic body that does not magnetize and has extremely low permeability is attached to the entire one surface 615a of the magnetic layer 615, thereby forming the paramagnetic layer 616.

Next, a sheet-shaped or plate-shaped ferromagnetic body having spontaneous magnetization characteristics is attached to the entire one surface 616a of the paramagnetic layer 616 by an adhesive, whereby the ferromagnetic layer 617 is formed and the non-contact data reception/transmission unit 610 is obtained.

This embodiment illustrated a method of forming the antenna 612 by screen printing and etching, but the present invention is not limited thereto. In the present invention, the antenna can also be formed with vacuum deposition or an ink jet printing method.

In addition, the magnetic layer 615 may be formed by a process of coating and drying while regulating by applying a magnetic field so that residual magnetization does not remain (to an extent of not being equipped with spontaneous magnetization characteristics). When doing so, permeability can be raised while mitigating flux variation.

Figure 34:
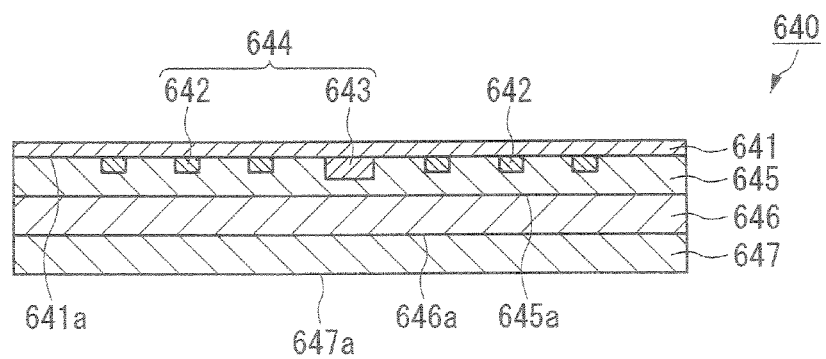
[FIG. 34] An outline sectional view showing the non-contact data reception/transmission unit according to the 18th embodiment of the present invention.

FIG. 34 is an outline sectional view showing the non-contact data reception/transmission unit of the 18th embodiment according to the present invention.

A non-contact data reception/transmission unit 640 of this embodiment is roughly constituted from a base substrate 641; an inlet 644 including a connected antenna 642 and IC chip 643 provided on one surface 641a thereof; a magnetic layer 645 disposed so as to cover the antenna 642 and the IC chip 643; a paramagnetic layer 646 disposed on the surface (hereafter "the one surface") 645a of the magnetic layer 645 opposite the surface in contact with the base substrate 641; and a ferromagnetic layer 647 disposed on a surface (hereafter "the one surface") 646a of the paramagnetic layer 646 opposite the surface in contact with the magnetic layer 645. Moreover, the magnetic layer 645 is constituted from a composite body having a filler consisting of at least magnetic particulates contained in a resin.

In the non-contact data reception/transmission unit 640, the antenna 642 is provided in a coil shape at a predetermined interval on the one surface 641a of the base substrate 641.

In the non-contact data reception/transmission unit 640, the antenna 642 and the IC chip 643 are provided on the same surface (the one surface 641a) of the base substrate 641. However, in the non-contact data reception/transmission unit of the present invention, a connection bridge forming a portion of the antenna may be provided on the surface opposite the surface on which the body of the antenna is provided (the surface opposite the aforementioned one surface 641a).

In the non-contact data reception/transmission unit 640, connection of the antenna 642 and the IC chip 643, which constitute the inlet 644, means the end portions of the antenna 642 being respectively connected to both terminals of the IC chip 643.

A composite body, including a filler consisting of magnetic particulates and resin, that forms a magnetic layer 645 covering the antenna 642 and the IC chip 643 constituting the inlet 644 means covering to a degree that the antenna 642 and the IC chip 643 are concealed. The magnetic layer 645 preferably covers the antenna 642 and the IC chip 643 so that the one surface 645a of the magnetic layer 645 is flat.

Moreover, viewing the non-contact data reception/transmission unit 640 from the side of the one surface 641a of the base substrate 641, the plurality of magnetic particulates constituting the magnetic layer 645 form a connected single magnetic body in which at least a portion of the magnetic particulates mutually overlap.

Also, the composite body that makes up the magnetic layer 645 is disposed so as to be filled between the antenna 642 formed in the coiled form, and all or a portion of the magnetic particulates that make up this composite body are disposed between the antenna 642.

Also, in the non-contact data reception/transmission unit 640, the one surface 647a of the ferromagnetic layer 647 serves as the affixing surface with respect to a metal article.

The base substrate 641 is the same as the aforementioned base substrate 611. The material forming the antenna 642 is the polymer conductive ink or the conductive foil forming the aforementioned antenna 612. The IC chip 643 is the same as the aforementioned IC chip 613.

The composite body forming the magnetic layer 645 is the same as the composite body forming the aforementioned magnetic layer 615.

The paramagnetic body that does not magnetize forming the paramagnetic layer 646 is the same as the paramagnetic body that does not magnetize forming the aforementioned paramagnetic layer 616.

The ferromagnetic body having spontaneous magnetization characteristics that forms the ferromagnetic layer 647 is the same as the ferromagnetic body having spontaneous magnetization characteristics that forms the ferromagnetic layer 617.

According to the non-contact data reception/transmission unit 640 of this embodiment, by disposing the magnetic layer 645 so as to cover the antenna 642 and the IC chip 643 provided on the one surface 641a of the base substrate 641, and providing the paramagnetic layer 646 on the one surface 645a of the magnetic layer 645, and disposing the ferromagnetic material layer 647 on the one surface 646a of the paramagnetic layer 646, it can be repeatedly attached to metal articles without using adhesive, and even when in contact with a metal article, the antenna 642 can be made to generate sufficient induced electromotive force to operate the IC chip 643 since flux is picked up by the antenna 642 through the magnetic layer 645 without being drawn to the ferromagnetic layer 647.

Figure 35:
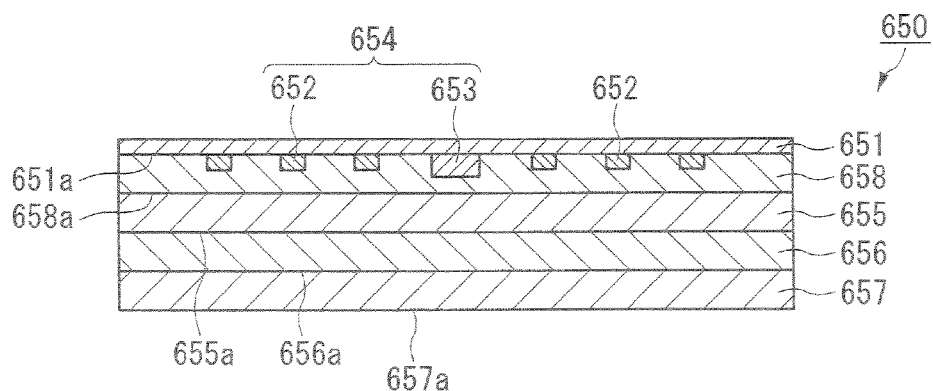
[FIG. 35] An outline sectional view showing the non-contact data reception/transmission unit according to the 19th embodiment of the present invention.

FIG. 35 is an outline sectional view showing the non-contact data reception/transmission unit of the 19th embodiment according to the present invention.

A non-contact data reception/transmission unit 650 of this embodiment is roughly constituted from a base substrate 651; an inlet 654 including a connected antenna 652 and IC chip 653 provided on one surface 651a thereof; an intermediate layer 658 that is made of resin disposed so as to cover the antenna 652 and IC chip 653; a magnetic layer 655 disposed on a surface (hereafter "the one surface") 658a of the intermediate layer 658 opposite the surface in contact with the base substrate 651; a paramagnetic layer 656 disposed on a surface (hereafter "the one surface") 655a of the magnetic layer 655 opposite the surface in contact with the intermediate layer 658; and a ferromagnetic layer 657 disposed on a surface (hereafter "the one surface") 656a of the paramagnetic layer 656 opposite the surface in contact with the magnetic layer 655. Moreover, the magnetic layer 655 is constituted from a composite body having a filler consisting of at least magnetic particulates contained in a resin.

In the non-contact data reception/transmission unit 650, the antenna 652 is provided in a coil shape at a predetermined interval on the one surface 651a of the base substrate 651.

In the non-contact data reception/transmission unit 650, the antenna 652 and the IC chip 653 are provided on the same surface (the one surface 651a) of the base substrate 651. However, in the non-contact data reception/transmission unit of the present invention, a connection bridge forming a portion of the antenna may be provided on the surface opposite the surface on which the body of the antenna is provided (the surface opposite the aforementioned one surface 651a).

In the non-contact data reception/transmission unit 650, connection of the antenna 652 and the IC chip 653, which constitute the inlet 654, means the end portions of the antenna 652 being respectively connected to both terminals of the IC chip 653.

Moreover, viewing the non-contact data reception/transmission unit 650 from the one side 651a of the base substrate 651, the plurality of magnetic particulates constituting the magnetic layer 655 form a connected single magnetic body in which at least a portion of the magnetic particulates mutually overlap.

Also, in the non-contact data reception/transmission unit 650, the one surface 657a of the ferromagnetic layer 657 serves as the affixing surface with respect to a metal article.

The base substrate 651 is the same as the aforementioned base substrate 611. The material forming the antenna 652 is the polymer conductive ink or the conductive foil forming the aforementioned antenna 612.

The IC chip 653 is the same as the aforementioned IC chip 613.

The composite body that makes up the magnetic layer 655 is the same as the composite body forming the aforementioned magnetic layer 615.

The paramagnetic body that does not magnetize forming the paramagnetic layer 656 is the same as the paramagnetic body that does not magnetize forming the aforementioned paramagnetic layer 616.

The ferromagnetic body having spontaneous magnetization characteristics that forms the ferromagnetic layer 657 is the same as the ferromagnetic body having spontaneous magnetization characteristics that forms the ferromagnetic layer 617.

The intermediate layer 658 is fabricated with resin, synthetic paper, paper, adhesive etc. As the resin forming the intermediate layer 658, a polyamide-based resin, polyimide-based resin, polyester-based resin, epoxy-based resin, polyurethane-based resin etc. can be used, and even resins other than these can be suitably used.

According to the non-contact data reception/transmission unit 650 of this embodiment, by disposing the intermediate layer 658 consisting of resin and the like so as to cover the antenna 652 and the IC chip 653 provided on the one surface 651a of the base substrate 651, disposing the magnetic layer 655 on the one surface 658a of the intermediate layer 658, disposing the paramagnetic layer 656 on the one surface 655a of the magnetic layer 655, and disposing the ferromagnetic layer 657 on the one surface 656a of the paramagnetic layer 656, it can be repeatedly attached to metal articles without using adhesive, and even when in contact with a metal article, the antenna 652 can be made to generate sufficient induced electromotive force to operate the IC chip 653 since flux is picked up by the antenna 652 through the magnetic layer 655 without being drawn to the ferromagnetic layer 65. Also, providing the intermediate layer 658 can raise the overall strength of the non-contact data reception/transmission unit 650. Furthermore, if the intermediate layer 658 is provided, when providing the magnetic layer 655 by a method other than the process of coating and drying, the magnetic layer 655 can be provided so as to resist exfoliation.

This embodiment gave the example of the non-contact data reception/transmission unit 650 having the intermediate layer 658 as one layer thereof, however, the non-contact data reception/transmission unit of the present invention is not limited thereto. In the non-contact data reception/transmission unit of the present invention, a plurality of intermediate layers may be provided.

Figure 36:
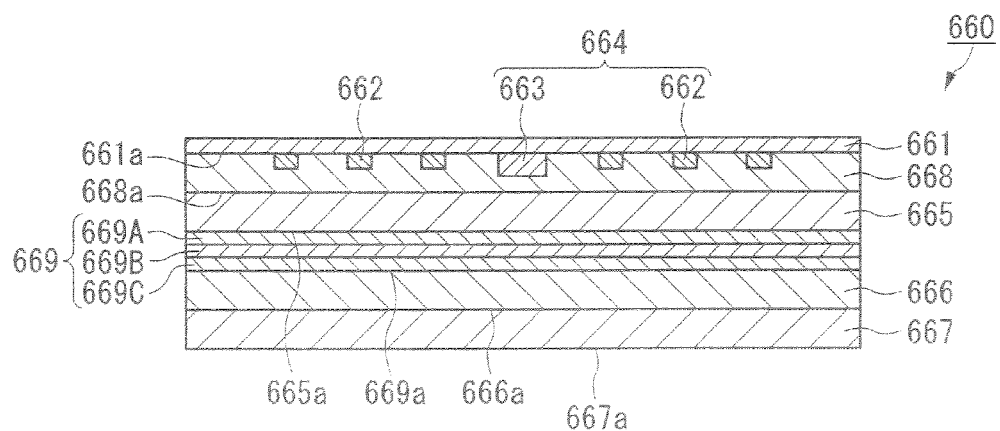
[FIG. 36] An outline sectional view showing the non-contact data reception/transmission unit according to the 20th embodiment of the present invention.

FIG. 36 is an outline sectional view showing the non-contact data reception/transmission unit according to the 20th embodiment of the present invention.

A non-contact data reception/transmission unit 660 of this embodiment is roughly constituted from a base substrate 661; an inlet 664 including a connected antenna 662 and IC chip 663 provided on one surface 661a thereof; a first intermediate layer 668 that is made of resin disposed so as to cover the antenna 662 and IC chip 663; a magnetic layer 665 disposed on a surface (hereafter "the one surface") 668a of the first intermediate layer 668 opposite the surface in contact with the base substrate 661; a second intermediate layer 669 including unit layers 669A, 669B, 669C and disposed on a surface (hereafter "the one surface") 665a of the magnetic layer 665 opposite the surface in contact with the first intermediate layer 668; a paramagnetic layer 666 disposed on a surface (hereafter "the one surface") 669a of the second intermediate layer 669 opposite the surface in contact with the magnetic layer 665, and a ferromagnetic layer 667 disposed on a surface (hereafter "the one surface") 666a of the paramagnetic layer 666 opposite the surface in contact with the second intermediate layer 669. Moreover, the magnetic layer 665 is constituted from a composite body having a filler consisting of at least magnetic particulates contained in a resin.

In the non-contact data reception/transmission unit 660, the antenna 662 is provided in a coil shape at a predetermined interval on the one surface 661a of the base substrate 661.

In the non-contact data reception/transmission unit 660, the antenna 662 and the IC chip 663 are provided on the same surface (the one surface 661a) of the base substrate 661. However, in the non-contact data reception/transmission unit of the present invention a connection bridge forming a portion of the antenna may be provided on the surface opposite the surface on which the body of the antenna is provided (the surface opposite the aforementioned one surface 661a).

In the non-contact data reception/transmission unit 660, connection of the antenna 662 and the IC chip 663, which constitute the inlet 664, means the end portions of the antenna 662 being respectively connected to both terminals of the IC chip 663.

Moreover, viewing the non-contact data reception/transmission unit 660 from the one side 661a of the base substrate 661, the plurality of magnetic particulates constituting the magnetic layer 665 form a connected single magnetic body in which at least a portion of the magnetic particulates mutually overlap.

Also, in the non-contact data reception/transmission unit 660, the one surface 667a of the ferromagnetic layer 667 serves as the affixing surface with respect to a metal article.

The base substrate 661 is the same as the aforementioned base substrate 611. The material forming the antenna 662 is the polymer conductive ink or the conductive foil forming the aforementioned antenna 612. The IC chip 663 is the same as the aforementioned IC chip 613.

The composite body that makes up the magnetic layer 665 is the same as the composite body that forms the aforementioned magnetic layer 615.

The paramagnetic body that does not magnetize forming the paramagnetic layer 666 is the same as the paramagnetic body that does not magnetize forming the aforementioned paramagnetic layer 616.

The ferromagnetic body having spontaneous magnetization characteristics that makes up the ferromagnetic layer 667 is the same as the ferromagnetic body having spontaneous magnetization characteristics that forms the ferromagnetic layer 617.

The first intermediate layer 668 and the second intermediate layer 669 are fabricated with resin, synthetic paper, paper, adhesive etc. As the resin forming the first intermediate layer 668 and the second intermediate layer 669, a polyamide-based resin, polyimide-based resin, polyester-based resin, epoxy-based resin, polyurethane-based resin, etc. can be used, and even resins other than these can be suitably used.

According to the non-contact data reception/transmission unit 660 of this embodiment, by disposing the first intermediate layer 668 consisting of resin and the like so as to cover the antenna 662 and the IC chip 663 provided on the one surface 661a of the base substrate 661, disposing the magnetic layer 665 on the one surface 668a of the first intermediate layer 668, disposing the second intermediate layer 669 consisting of resin and the like on the one surface 665a of the magnetic layer 665, disposing the paramagnetic layer 666 on the one surface 669a of the second intermediate layer 669, and disposing the ferromagnetic layer 667 on the one surface 666a of the paramagnetic layer 666, it can be repeatedly attached to metal articles without using adhesive, and even when in contact with a metal article, the antenna 662 can be made to generate sufficient induced electromotive force to operate the IC chip 663 since flux is picked up by the antenna 662 through the magnetic layer 665. In addition, providing the first intermediate layer 668 and the second intermediate layer 669 can increase the overall strength of the non-contact data reception/transmission unit 660. Furthermore, if the first intermediate layer 668 is provided, when providing the magnetic layer 665 by a method other than the process of coating and drying, the magnetic layer 665 can be provided so as to resist exfoliation.

This embodiment gave the example of the non-contact data reception/transmission unit 660 having the first intermediate layer 668 as one layer thereof, however, the non-contact data reception/transmission unit of the present invention is not limited thereto. In the non-contact data reception/transmission unit of the present invention, the first intermediate layer may be provided in a plurality. In addition, the present embodiment gave the example of the second intermediate layer 669 of the non-contact data reception/transmission unit 660 having three layers including the unit layers 669A, 669B, 669C, however, the non-contact data reception/transmission unit of the present invention is not limited thereto. In the non-contact data reception/transmission unit of the present invention, the second intermediate layer may have one layer or two layers or four or more layers.

The non-contact data reception/transmission unit embodying the present invention is explained in detail hereinbelow.

Figure 37A:
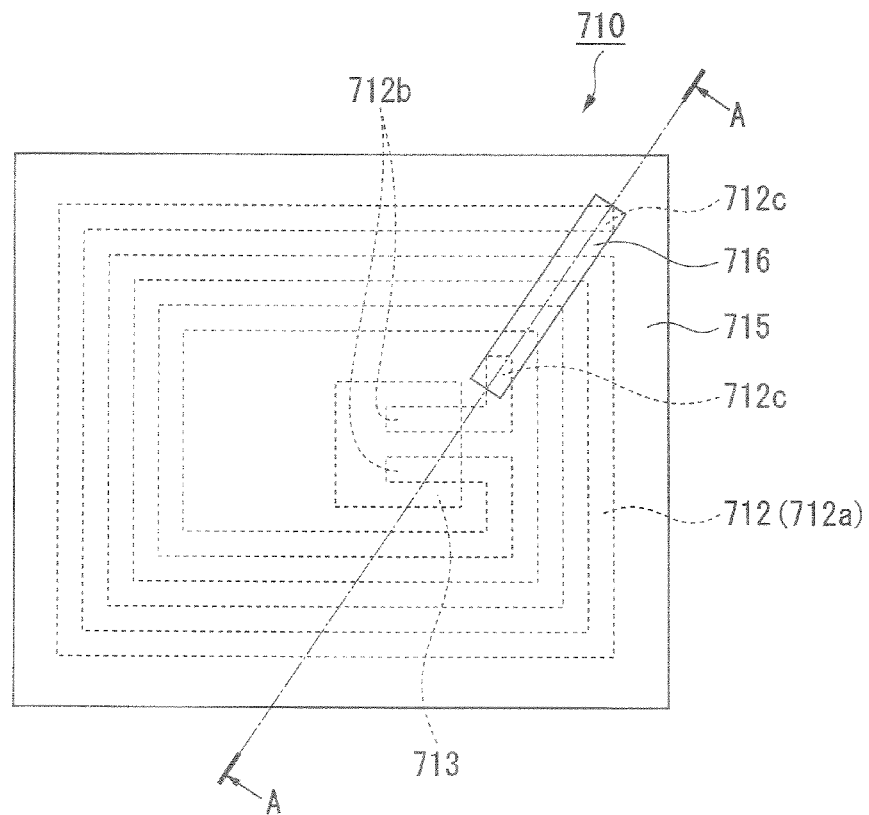
[FIG. 37A] A plan view of the non-contact data reception/transmission unit according to the 21st embodiment of the present invention.
Figure 37B:
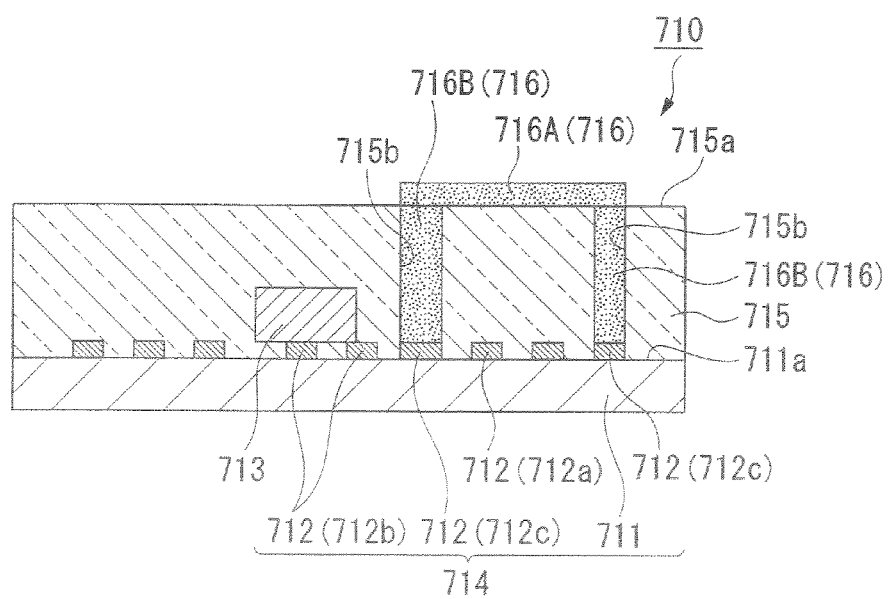
[FIG. 37B] A sectional view along line A-A of FIG. 37A.

FIG. 37A and FIG. 37B are schematic diagrams of the non-contact data reception/transmission unit according to the 21st embodiment of the present invention. FIG. 37A is a plan view, and FIG. 37B is a sectional view along line A-A of FIG. 37A.

A non-contact data reception/transmission unit 710 of this embodiment is roughly constituted from a base substrate 711; an inlet 714 including a connected antenna 712 and IC chip 713 provided on one surface 711a thereof; and a magnetic layer 715.

In the non-contact data reception/transmission unit 710, the antenna 712 is in a coiled shape via the IC chip, and, except for both ends thereof 712c, 712c and the vicinity thereof, the magnetic layer 715 is disposed on the base substrate 711 so as to cover the antenna 712 and the IC chip 713. Here, the vicinity of both ends 712c of the antenna 712 refers to the region contiguous with both ends 712c in the antenna 712.

Also, a first portion 716A that connects both ends 712c, 712c of the antenna 712 and forms a portion of a conductive portion 716 is provided on a surface (hereafter, "the one surface") 715a of the magnetic layer 715 opposite the surface in contact with the base substrate 711. The conductive portion 716 includes the first portion 716A and second portions 716B that are integrally provided. The second portions 716B are provided from the ends 712c, 712c of the antenna 712 to the first portion 716A provided on the one surface 715a of the magnetic layer 715.

In the non-contact data reception/transmission unit 710, the antenna 712 is provided in a coil shape at a predetermined interval around the IC chip 713 on the one surface 711a of the base substrate 711. Moreover, the thickness of the IC chip 713 is greater than the thickness of the antenna 712.

The antenna 712 and the IC chip 713, which constitute the inlet 714, being connected in the non-contact data reception/transmission unit 710 means the end portions of the antenna 712 being respectively connected to both terminals of the IC chip 713.

Moreover the magnetic layer 715 being disposed so as to cover the antenna 712 and the IC chip 713 constituting the inlet 714 except for both ends 712c, 712c of the antenna 712 and the vicinity thereof means covering to an extent that the antenna 712 and the IC chip 713 are concealed, except for both ends 712c, 712c of the antenna 712 and the vicinity thereof. The magnetic layer 715 preferably covers the antenna 712 and the IC chip 713 so that the external surface (open surface) of the magnetic layer 715 is fat.

Also, the magnetic layer 715 is constituted from a composite body having a filler consisting of at least magnetic particulates contained in a resin. In this kind of magnetic layer 715, viewing the non-contact data reception/transmission unit 710 from the side of the one surface 711a of the base substrate 711, the plurality of magnetic particulates constituting the magnetic layer 715 form a connected single magnetic body in which at least a portion of the magnetic particulates mutually overlap.

Also, the composite body that makes up the magnetic layer 715 is disposed so as to be filled between the antenna 712 formed in the coiled form, and all or a portion of the magnetic particulates that make up this composite body are disposed between the antenna 712.

The first portion 716A of the conductive portion 716 is directly provided on the one surface 715a of the magnetic layer 715. Directly providing the first portion 716A of the conductive portion 716 on the one surface 715a of the magnetic layer 715 makes for few elements (layers, films, etc) constituting the non-contact data reception/transmission unit 710. Therefore, in the case of flexing the non-contact data reception/transmission unit 710 when in contact with an article containing at least metal, the elements easily follow the change in shape, and as a result, such problems as exfoliation between the elements can be prevented. In addition, in the manufacture of the non-contact data reception/transmission unit 710, there is no need to provide an insulating film that covers the coil portion 712a of the antenna 712 in order to connect both ends 712c, 712c of the antenna 712 as is conventionally done, so that manufacturing steps can be omitted, thereby cutting manufacturing costs.

The base substrate 711, at least for the surface layer portion, is selected from a publicly known material such as a woven fabric, non-woven fabric, mat, paper or combination thereof made from inorganic fiber such as glass fiber or alumina fiber and organic fiber such as polyester fiber or polyamide fiber, a composite base substrate formed by impregnating any thereof with a resin varnish, a plastic substrate such as a polyamide resin substrate, polyester resin substrate, polyolefine resin substrate, polyimide resin substrate, ethylene vinyl alcohol copolymer substrate, polyvinyl alcohol resin substrate, polyvinyl chloride resin substrate, polyvinylidence chloride resin substrate, polystyrene resin substrate, polycarbonate resin substrate, acrylonitrile styrene butadiene copolymerization resin substrate, polyether sulfone resin substrate or any thereof subjected to mat treatment, corona discharge treatment, plasma treatment, ultraviolet irradiation treatment, electron-beam-irradiation treatment, flame plasma treatment and ozone treatment, or surface treatment such as easy adhesion treatment. Among these, an electrically insulating film or sheet consisting of polyethylene terephthalate or polyimide is suitably used.

The antenna 712 can be formed by screen printing a predetermined pattern with a polymer conductive ink or etching a conductive foil on the one surface 711a of the base substrate 711.

Examples of the polymer conductive ink used in the present invention include those that have electrically conductive particulates such as silver dust, gold dust, platinum powder, aluminum powder, palladium powder, rhodium powder and carbon powder (carbon black, carbon nanotube, etc.) blended in a resin composition.

If a thermosetting resin is used as the resin compound, it shall be a thermosetting type that can form the coating film that produces the antenna 712 at less than 200° C., for example 100 to 150° C. The path through which electricity flows in the coating film that produces the antenna 712 is formed due to the mutual contact of the conductive particulates that form the coating film, and the resistance value of this coating film is on the order of $10^{-}\Omega/cm$.

Also, in addition to a thermosetting type ink, publicly known types such as a photo-curing type, osmotic drying type, and solvent volatilization type are used as the polymer conductive ink in the present invention.

The photo-curing polymer conductive ink is one that includes a photo-curing resin in the resin compound, which shortens the hardening time and thereby raises manufacturing efficiency. The photo-curing polymer conductive ink can be one that contains at least 60 percent conductive particulates by mass and at least 10 percent polyester resin by mass blended in a thermoplastic resin only or a blended resin composition of a thermoplastic resin and a crosslinked resin (particularly a crosslinked resin of polyester and isocyanate and the like), that is, a solvent volatilization type or a crosslinked/thermoplastic combination type (with the thermoplastic type being at least 50 percent by mass), or one that contains at least 10 percent polyester resin by mass blended in a thermoplastic resin only or a blended resin composition of a thermoplastic resin and a crosslinked resin (particularly a crosslinked resin of polyester and isocyanate and the like), that is, a crosslinked type or a crosslinked, thermoplastic combination type.

In addition, a flexibilizer can be blended with the polymer conductive ink when flexibility is required of the non-contact data reception/transmission unit 710, and as a result, resistance to bending is further required in the antenna 712.

Examples of the flexibilizer are a polyester flexibilizer, acrylic flexibilizer urethane flexibilizer, polyvinyl acetate flexibilizer, thermoplastic-elastomer flexibilizer, natural-rubber flexibilizer, a synthetic-rubber flexibilizer, and a blend of two or more of the above.

The conductive foil that forms the antenna 712 includes copper foil, silver foil, gold foil, platinum foil, and aluminum foil etc.

The IC chip 713 is not particularly limited, and as long as writing and reading of information is possible in a non-contact state via the antenna 712, anything may be used that is applicable to RFID media such as non-contact IC tags and non-contact IC labels or non-contact IC cards.

The composite body forming the magnetic layer 715 is roughly constituted from a filler consisting of magnetic particulates and a resin.

This composite body is fabricated in a configuration in which the magnetic particulates are nearly uniformly dispersed by applying the magnetic coating including a filler consisting of magnetic particulates, resin, additives, and a solvent and then drying.

The magnetic particulates can be a powdered magnetic powder or magnetic flakes consisting of flat-shaped flakes obtained by refining this magnetic power into a powder with a ball mill or the like and then mechanically flattening the powder. Among these, as magnetic particulates, those of the flattened state are preferable. If the magnetic particulates are in the flattened state, viewing the non-contact data reception/transmission unit 710 from the side of the one surface 711a of the base substrate 711, the plurality of magnetic particulates constituting the magnetic layer 715 easily form a connected single magnetic body in which at least a portion of the magnetic particulates mutually overlap. Accordingly, flux can be more easily picked up by the antenna through the magnetic layer.

Moreover, as the magnetic powder, for example, Sendust (Fe—Si—Al alloy) powder, carbonile iron powder, atomized powder such as permalloy, and reduced iron powder, etc. can be given. Flakes of a magnetic material can for example be flakes obtained by refining the magnetic material into a powder with a ball mill or the like and then mechanically flattening the powder, and flakes obtained by running molten metal of an iron-based or cobalt-based amorphous alloy into a water-cooled copper plate. As the magnetic particulates, magnetic powder or magnetic flakes consisting of Sendust are preferable, with magnetic flakes consisting of Sendust being more preferable. If the magnetic particulates are magnetic powder or magnetic flakes consisting of Sendust, since the saturation magnetic flux density and permeability of the magnetic layer 715 which contains these as a component are higher, flux can be more easily picked up by the antenna through the magnetic layer.

The shape of the magnetic particulates forming the magnetic layer 715 need not entirely be powdered or flat shaped. Powdered magnetic particulates and flat shaped-magnetic particulates may be mixed together in the magnetic layer 715, and even if magnetic particulates of differing shapes are thus mixed together, the non-contact data reception/transmission unit of the present invention will exhibit a sufficient effect.

As the resin constituting the composite body that makes up the magnetic layer 715, thermoplastic resin, thermosetting resin, reactive resin and the like can be used.

Examples of the thermoplastic resin include vinyl chloride, vinyl acetate, a vinyl chloride-vinyl acetate copolymer, a vinyl chloride-vinylidene chloride copolymer, a vinyl chloride-acrylonitrile copolymer, an acrylic acid ester-acrylonitrile copolymer, an acrylic ester-vinyl chloride-vinylidene chloride copolymer, an acrylic ester-vinylidene chloride copolymer, a methacrylate ester-vinylidene chloride copolymer, a methacrylate ester-vinyl chloride copolymer, a methacrylic acid ester-ethylene copolymer, polyvinyl fluoride, a vinylidene chloride-acrylonitrile copolymer, an acrylonitrile-butadiene copolymer, polyamide resin, polyvinyl butyral, a cellulose derivative (cellulose acetate butyrate, a cellulose die acetate, cellulose triacetate, cellulose propionate, cellulose nitrate), a styrene-butadiene copolymer, a polyurthane resin, a polyester resin, an amino resin, or a polymer synthetic rubber material such as styrene rubber, fluorine rubber, silicone rubber, and ethylene-propylene copolymer rubber.

Examples of a thermosetting resin or reactive resin include phenol resin, epoxy resin, polyurethane hardening resin, urea resin, melamine resin, alkyd resin, silicone resin, polyamine resin, and urea-formaldehyde resin.

Various adhesives may be contained in the composite body that makes up the magnetic layer 715 in order to impart adhesiveness to the magnetic layer 715.

Moreover, examples of the additives contained in the magnetic coating used in order to form the composite body that makes up the magnetic layer 715 include a viscosity modifier, an antifoaming agent, a leveling agent, etc.

Furthermore, examples of the solvent contained in this magnetic coating include organic solvents such as cyclohexanone, acetone, and benzene-based and ethyl-based solvents.

The first portion 716A of the conductive portion 716 is formed on the one surface 715a of the magnetic layer 715 by screen printing in a predetermined pattern using the same polymer conductive ink as that used to form the aforementioned antenna 712.

Also, when further flexibility is required of the non-contact data reception'transmission unit 710, a flexibilizer is preferably blended with the polymer conductive ink that makes up the first portion 716A of the conductive portion 716. Since this enhances the resistance to bending of the first portion 716A of the conductive portion 716, even when the non-contact data reception/transmission unit 710 is flexed to make contact with an article containing at least metal, impairment of the communication function of the non-contact data reception/transmission unit 710 due to damage to the first portion 716A of the conductive portion 716 can be prevented.

Thus, according to the non-contact data reception/transmission unit 710 of this embodiment, by disposing the magnetic layer 715 on the base substrate 711 so as to cover the antenna 712 and the IC chip 713 except for both ends 712c, 712c of the antenna 712 and the vicinity thereof, the antenna 712 can be made to generate sufficient induced electromotive force to operate the IC chip 713 since flux is picked up by the antenna 712 through the magnetic layer 715 even when the non-contact data reception/transmission unit 710 is in contact with an article containing at least metal. Moreover, since the magnetic layer 715 is one having magnetic particulates impregnated in resin, by adjusting the mix ratio of the magnetic particulates and the resin, the permeability of the magnetic layer 715 can be raised and the insulation properties can be maintained. Therefore, the magnetic layer 715, by being formed so as to cover the antenna 712 and the IC chip 713, also exhibits the function of a protective layer of them. Moreover, since the magnetic layer 715 is one having magnetic particulates impregnated in resin, by adjusting the mix ratio of the magnetic particulates and the resin, the permeability of the magnetic layer 715 can be raised and the insulation properties can be maintained. Thereby, the magnetic layer 715 also serves as an element of an insulating film, and by providing the first portion 716A of the conductive portion 716 that connect both ends 712c, 712c of the antenna 712 on the one surface 715a of the magnetic layer 715, since the first portion 716A of the conductive portion 716 connects both ends 712c, 712c of the antenna 712, there is no need to form conduction portions on the coil portion 712a of the antenna 712 via the insulating film, resulting in fewer elements (layers, films, etc) constituting the non-contact data reception/transmission unit 710. Therefore, in the case of flexing the non-contact data reception/transmission unit 710 in order to make contact with an article containing at least metal, the elements easily follow the change in shape, and as a result, such problems as exfoliation between the elements can be prevented (Method of Manufacturing the Non-contact Data Reception/Transmission Unit)

Figure 38A:
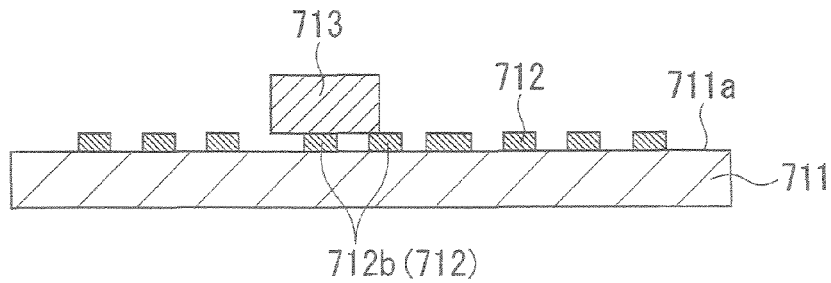
[FIG. 38A] An outline sectional view showing the method of manufacturing the non-contact data reception/transmission unit according to the present invention.
Figure 38B:
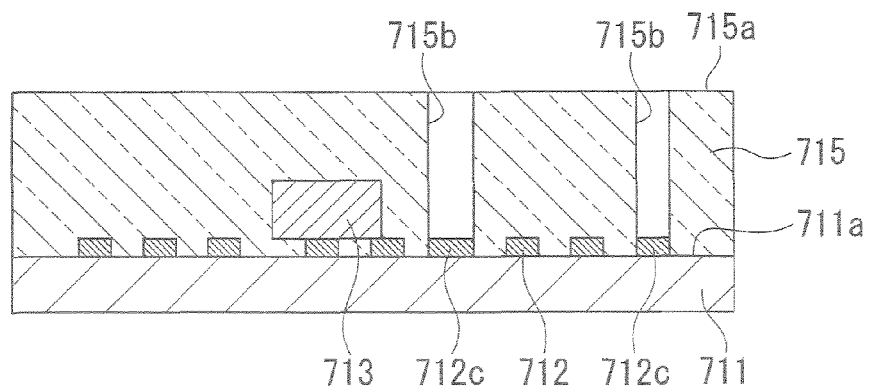
[FIG. 38B] An outline sectional view showing the method of manufacturing the non-contact data reception/transmission unit according to the present invention.
Figure 38C:
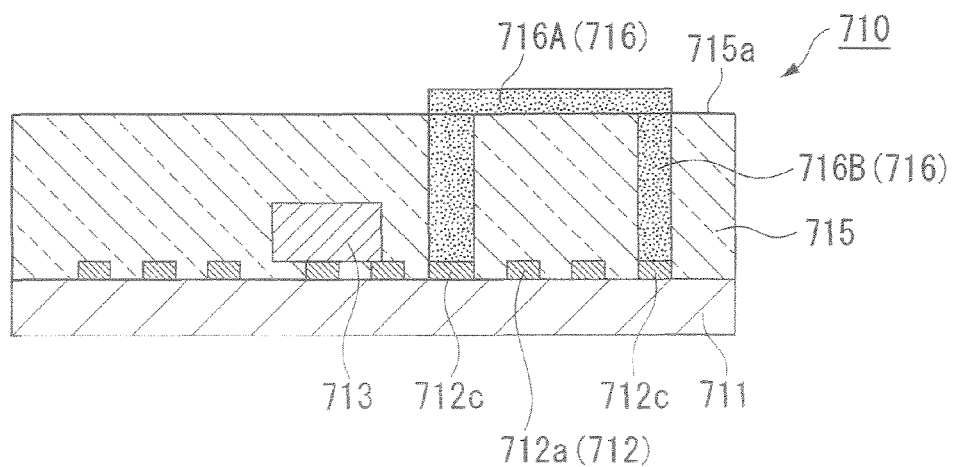
[FIG. 38C] An outline sectional view showing the method of manufacturing the non-contact data reception/transmission unit according to the present invention.
Figure 39:
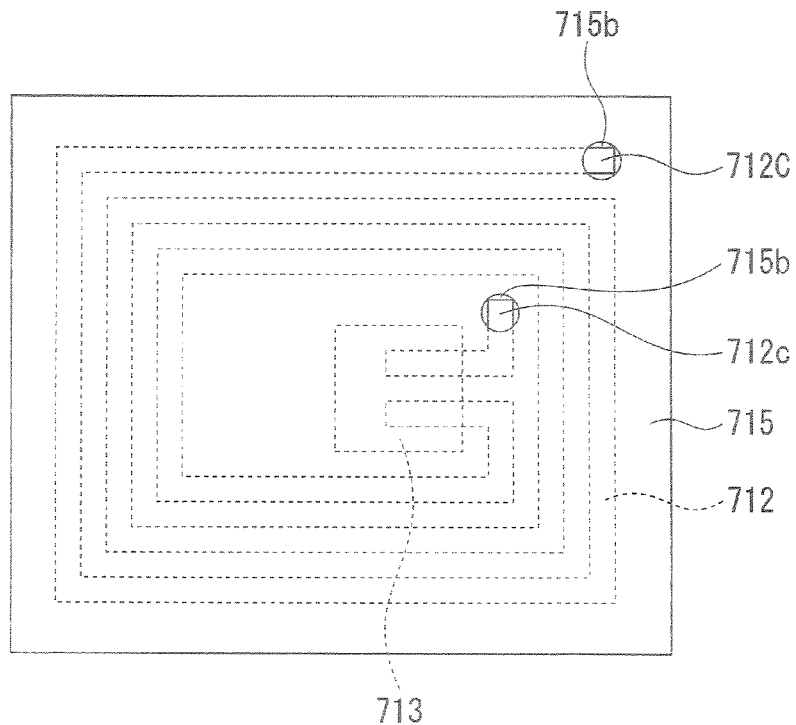
[FIG. 39] An outline sectional view showing the method of manufacturing the non-contact data reception/transmission unit according to the present invention.

Next, the method of manufacturing the non-contact data reception/transmission unit of the aforementioned embodiment shall be explained referring to FIGS. 38A through 39.

First, the antenna 712 having a predetermined thickness and predetermined pattern is formed on the one surface 711a of the base substrate 711 (antenna formation step).

In this step, when forming the antenna 712 with polymer conductive ink, after printing the polymer conductive ink so as to have the predetermined thickness and the predetermined pattern on the one surface 711a of the base substrate 711, drying and hardening of the polymer conductive ink forms the antenna 712 having the predetermined thickness and the predetermined pattern.

Forming the antenna 712 with a conductive foil is performed according to the following procedure.

A conductive foil is bonded to the entire one surface 711a of the base substrate 711, after which an etch-resistant coating is printed in a predetermined pattern by a silk screen method onto the conductive foil. Alter drying and hardening the etch-resistant coating, it is immersed in an etching solution, wherein the copper foil that is not coated with the etch-resistant coating dissolves away, leaving the copper foil portion coated with the etch-resistant coating on the one surface of the base substrate 711, thereby forming the antenna 712 having a predetermined pattern.

Next, as shown in FIG. 38A, the IC chip 713 is mounted on the one surface 711a of the base substrate 711 by electrically connecting contacts 712b, 712b provided on the antenna 712 and contacts (not illustrated) provided on the IC chip 713 via an electrically conductive material consisting of conductive paste or solder (IC chip mounting step).

Then, as shown in FIG. 38B, a magnetic coating including a filler consisting of magnetic particulates, resin, additives, and solvents is applied on the one surface 711a of the base substrate 711 to a degree of the antenna 712 and the IC chip 713 being slightly concealed or amply concealed. After applying the magnetic coating, the magnetic layer 715 is formed by drying and hardening the coating by leaving it at room temperature or heating it at a prescribed temperature and prescribed time (magnetic layer forming step). In this magnetic layer forming step, as shown in FIG. 38B and FIG. 39, the magnetic layer 715 is formed by applying a magnetic coating on the one surface 711a of the base substrate 711 so through holes 715b, 715b from the one surface 715a of the magnetic layer 715 to both ends 712c, 712c of the antenna 712 are opened.

Next, as shown in FIG. 38C, the polymer conductive ink is filled into the through holes 715b, 715b of the magnetic layer 715 and printed by a screen printing method so as to have the predetermined thickness and the predetermined pattern on the one surface 715a of the magnetic layer 715, after which by drying and hardening the polymer conductive ink, the conductive portion 716 including the first portion 716A and the second portion 716B is formed (conductive portion formation step).

In this way, after forming the magnetic layer 715 by applying the magnetic coating on the one surface 711a of the base substrate 711 so that the through holes 715b, 715b from the one surface 715a of the magnetic layer 715 to both ends 712c, 712c of the antenna 712 are opened, by providing the conduction portion 716 for electrically connecting both ends 712c, 712c of the antenna 712, it is not necessary to form a conduction portion on the coil portion 712a of the antenna 712 via an insulating film in order to connect the both ends 712c, 712c of the antenna 712 as is conventionally done, and so the manufacturing steps can be omitted, thereby cutting manufacturing costs.

This embodiment illustrated a method of forming the antenna 712 by screen printing and etching, but the present invention is not limited thereto. In the present invention, the antenna can also be formed with vacuum deposition or an ink jet printing method.

Figure 40:
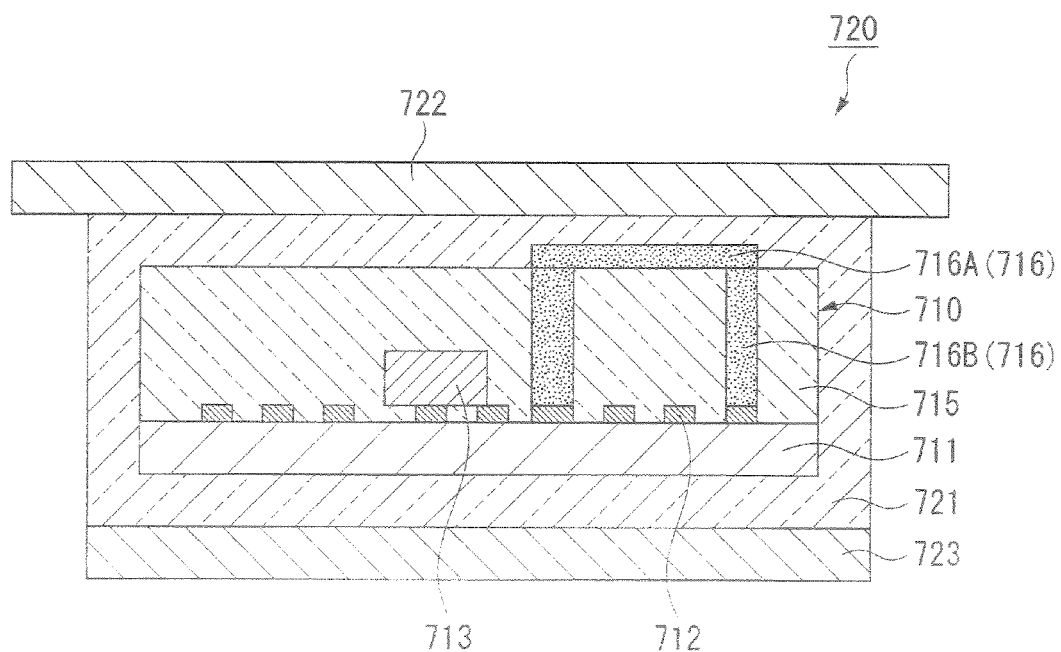
[FIG. 40] An outline sectional view showing the non-contact data reception/transmission unit according to the 22nd embodiment of the present invention.

FIG. 40 is an outline sectional view showing the non-contact data reception/transmission unit of the 22nd embodiment according to the present invention.

In FIG. 40, constituent elements identical to those of the non-contact data reception/transmission unit 710 shown in FIG. 37A are given the same reference numerals, with explanations therefor being omitted.

A non-contact data reception/transmission unit 720 of this embodiment is roughly constituted from the non-contact data reception/transmission unit 710, an adhesive layer 721, a release base substrate 722, and an overlay material 723.

In the non-contact data reception/transmission unit 720 the adhesive layer 721 is provided so as to cover the non-contact data reception/transmission unit 710.

The release base substrate 722 is bonded to the surface of the adhesive layer 721 opposite the surface in contact with the magnetic layer 715 (the surface to be bonded to the article).

Furthermore, the overlay material 723 is bonded to the surface of the adhesive layer 721 opposite the surface that contacts the base substrate 711 (the surface that is not bonded to an article).

Examples of the adhesive that forms the adhesive layer 721 include a phenol adhesive, epoxy adhesive, acrylic adhesive, and urethane adhesive. Other publicly known adhesives can also be suitably used.

Examples of the release base substrate 722 include a base substrate such as paper, synthetic paper, coated paper, polypropylene film, and PET film coated with a silicone or non-silicone releasing agent. In addition, other publicly known releasing agents and base substrates can also be suitably used.

Examples of the overlay material 723 include a base substrate such as paper, synthetic paper, coated paper, polypropylene film, and PET film. In addition, other publicly known releasing agents and base substrates can also be suitably used.

In the non-contact data reception/transmission unit 720 of this embodiment, the non-contact data reception/transmission unit 710 provided with the magnetic layer 715 is covered by the adhesive layer 721, and the non-contact data reception/transmission unit 710 covered by the adhesive layer 721 is enclosed by the release base substrate 722 and the overlay material 723. Therefore, dust and dirt do not adhere to the magnetic layer 715. By having the magnetic layer 715 make contact with an article including metal by means of the adhesive layer 721 which is newly exposed by removing the release base substrate 722, the non-contact data reception/transmission unit 720 can be attached to this article. Since the overlay material 723 is provided on the surface of the adhesive layer 721 opposite the surface in contact with the base substrate 711 (the surface not attached to an article), a pattern can be provided and various information can be printed on the overlay material 723.

This embodiment illustrated an example of the non-contact data reception/transmission unit 720 in which the adhesive layer 721 is provided so as to cover the portions of the non-contact data reception/transmission unit 710, however, the non-contact data reception/transmission unit of the present invention is not limited thereto. In the non-contact data reception/transmission unit of the present invention, the adhesive layer may be provided on the surface opposite the surface of the magnetic layer that contacts the base substrate. Also, the adhesive layer need not be provided on the surface of the base substrate opposite the surface on which the antenna and the IC chip are provided.

In addition, this embodiment illustrated an example of the non-contact data reception/transmission unit 720 in which the release base substrate 722 is bonded to the to the surface of the magnetic layer 715 opposite the surface that contacts the base substrate 711 and the surface of the adhesive layer 721 on the side of the surface of the magnetic layer 715 opposite the surface that contacts the base substrate 711 (the surface attached to an article), however, the non-contact data reception/transmission unit of the present invention is not limited thereto. In the non-contact data reception/transmission unit of the present invention, the release base substrate may be bonded to only the surface opposite the surface of the magnetic layer that contacts the base substrate.

Figure 41:
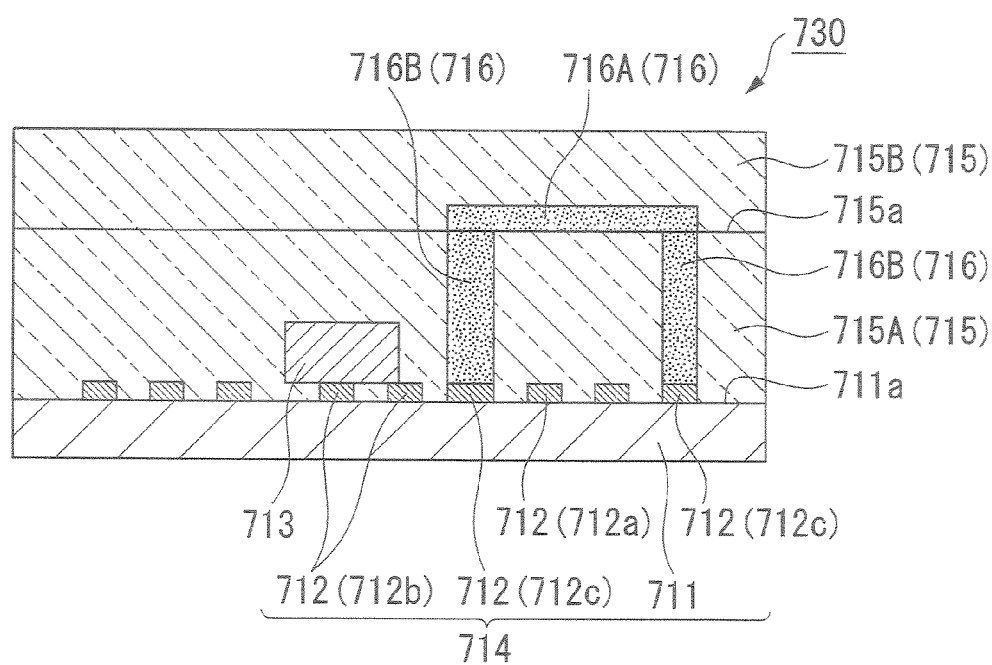
[FIG. 41] An outline sectional view showing the non-contact data reception/transmission unit according to the 23rd embodiment of the present invention.

FIG. 41 is an outline sectional view showing the non-contact data reception/transmission unit of the 23rd embodiment according to the present invention.

In FIG. 41, constituent elements identical to those of the non-contact data reception/transmission unit 710 shown in FIG. 37A are given the same reference numerals, with explanations therefor being omitted.

The non-contact data reception/transmission unit 730 of this embodiment differs from the aforementioned non-contact data reception/transmission unit 710 on the point of the first portion 716A of the conduction portion 716 being provided inside the magnetic layer 715.

In order to manufacture this kind of non-contact data reception/transmission unit 730, after manufacturing the non-contact data reception/transmission unit 710 shown in FIG. 37A, the magnetic layer 715B may be formed by applying a magnetic coating so as to cover the one surface 715a of the magnetic layer 715A and the first portion 716A of the conductive portion 716, and then drying and hardening the coating by leaving it at room temperature or heating it at a prescribed temperature and prescribed time.

Thereby, since the conductive portion 716 that for connecting both ends 712c, 712c of the antenna 712 are completely covered by the magnetic layer 715, disconnection of the antenna 712 by breakage of the conductive portion 716 can be prevented. Also, since the conductive portion 716 does not exist on the surface of the non-contact data reception/transmission unit 730, the external surface of the non-contact data reception/transmission unit 730 can be made flat, thereby simplifying printing on the external surface of the non-contact data reception/transmission unit 730.

Figure 42A:
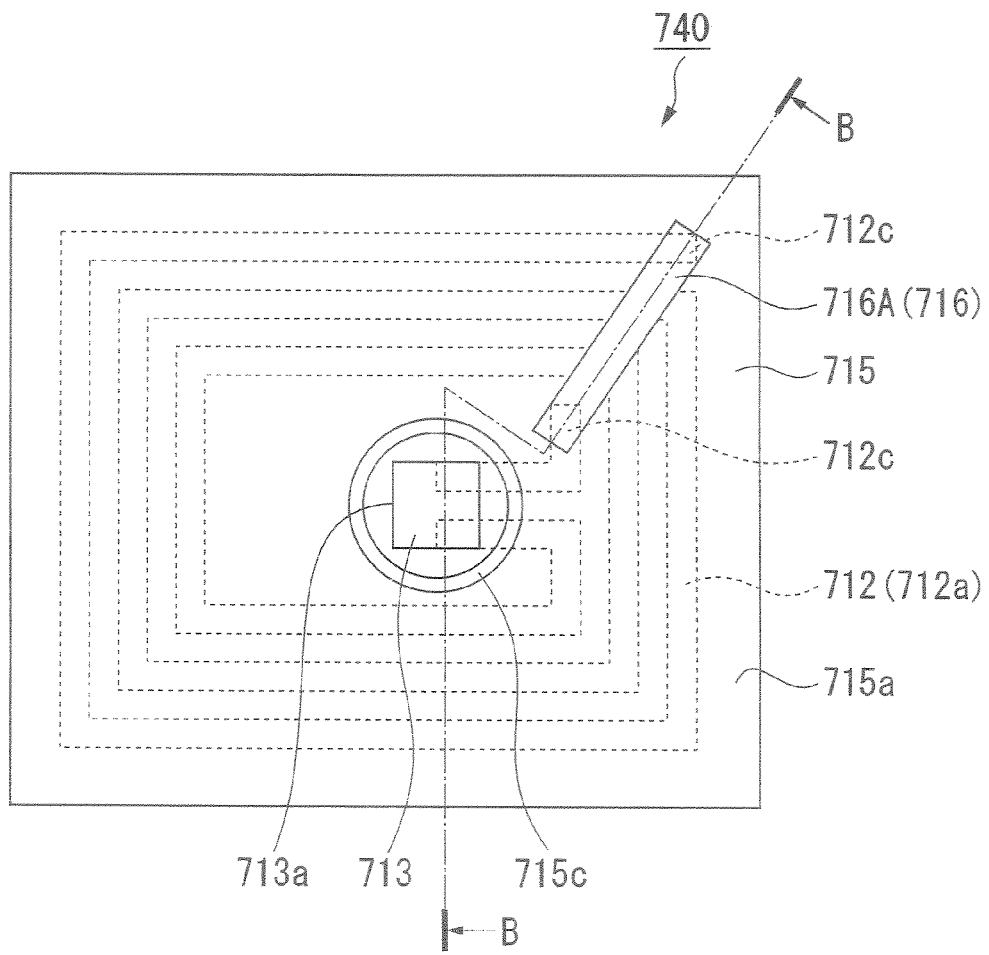
[FIG. 42A] A plan view of the non-contact data reception/transmission unit according to the 24th embodiment of the present invention.
Figure 42B:
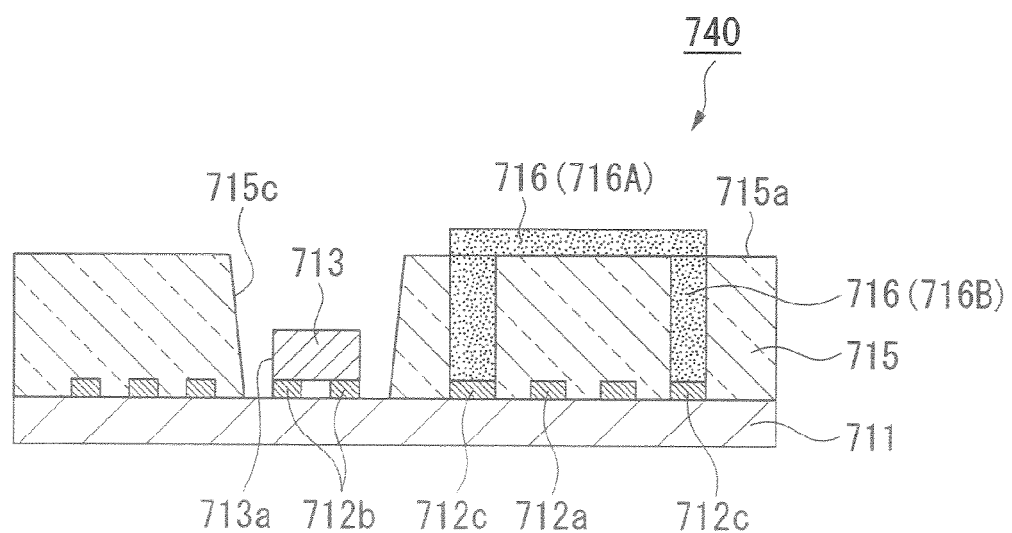
[FIG. 42B] A sectional view along line B-B of FIG. 42A.

FIG. 42A and FIG. 42B are schematic diagrams showing the non-contact data reception/transmission unit of the 24th embodiment according to the present invention. FIG. 42A is a plan view, and FIG. 42B is a sectional view along line B-B of FIG. 42A.

In FIG. 42A and FIG. 42B, constituent elements identical to those of the non-contact data reception/transmission unit 710 shown in FIG. 37A are given the same reference numerals, with explanations therefor being omitted.

The non-contact data reception/transmission unit 740 differs from the aforementioned non-contact data reception/transmission unit 710 on the points of the magnetic layer 715 being disposed on the base substrate 711 so as to cover the antenna 712 except for both ends 712c, 712c of the antenna 712 and the vicinity thereof, and the IC chip 713 and the vicinity thereof.

Also, in the non-contact data reception/transmission unit 740, gaps are provided between the side surfaces 713a of the IC chip 713 and the side surfaces 715c of the magnetic layer 715.

The size of the gaps provided between the side surfaces 713a of the IC chip 713 and the side surfaces 715c of the magnetic layer 715 are not particularly limited, being suitably provided in accordance with the curved surface shape of the metal article to which the non-contact data reception/transmission unit 740 is bonded, and the shape and size of the IC chip 713.

Moreover, the side surfaces 715c of the magnetic layer 715 positioned facing the side surfaces 713a of the IC chip 713 may be tapered with the opening diameter gradually increasing from the surface of the magnetic layer 715 in contact with the antenna 712 to the one surface 715a of the magnetic layer 715.

The side surfaces 715c of the magnetic layer 715 positioned facing the side surfaces 713a of the IC chip 713 are tapered, but the shape thereof is not particularly limited, being suitably provided in accordance with the curved surface shape of the metal article to which the non-contact data reception/transmission unit 740 is bonded, and the shape and size of the IC chip 713.

According to the non-contact data reception/transmission unit 740 of this embodiment, the magnetic layer 715 is disposed on the base substrate 711 so as to cover the antenna 712 except for both ends 712c, 712c of the antenna 712 and the vicinity thereof, and the IC chip 713 and the vicinity thereof. Thereby, in the case of flexing the non-contact data reception/ transmission unit 740 in order to make contact with an article containing at least metal, the magnetic layer 715 more easily follows the changes in shape, and as a result, such problems as exfoliation between the elements can be prevented.

Also, if gaps are provided between the side surfaces 713a of the IC chip 713 and the side surfaces 715c of the magnetic layer 715, and moreover, if the side surfaces 715c of the magnetic layer 715 positioned facing the side surfaces 713a of the IC chip 713 form a tapered shape with the opening diameter gradually increasing from the surface of the magnetic layer 715 in contact with the antenna 712 to the one surface 715a of the magnetic layer 715, even if either of the one surface 715a of the magnetic layer 715 or the surface of the base substrate 711 opposite the surface in contact with the magnetic layer 715 is made to serve as the surface that bonds to an article, in the case of flexing the non-contact data reception/transmission unit 740 in order to make contact with an article containing at least metal, the side surfaces 713a of the IC chip 713 and the side surfaces 715c of the magnetic layer 715 are hindered from making contact, and so damage to the IC chip 713 due to contact between the two is prevented.

The non-contact data reception/transmission unit embodying the present invention is explained in detail hereinbelow.

Figure 43A:
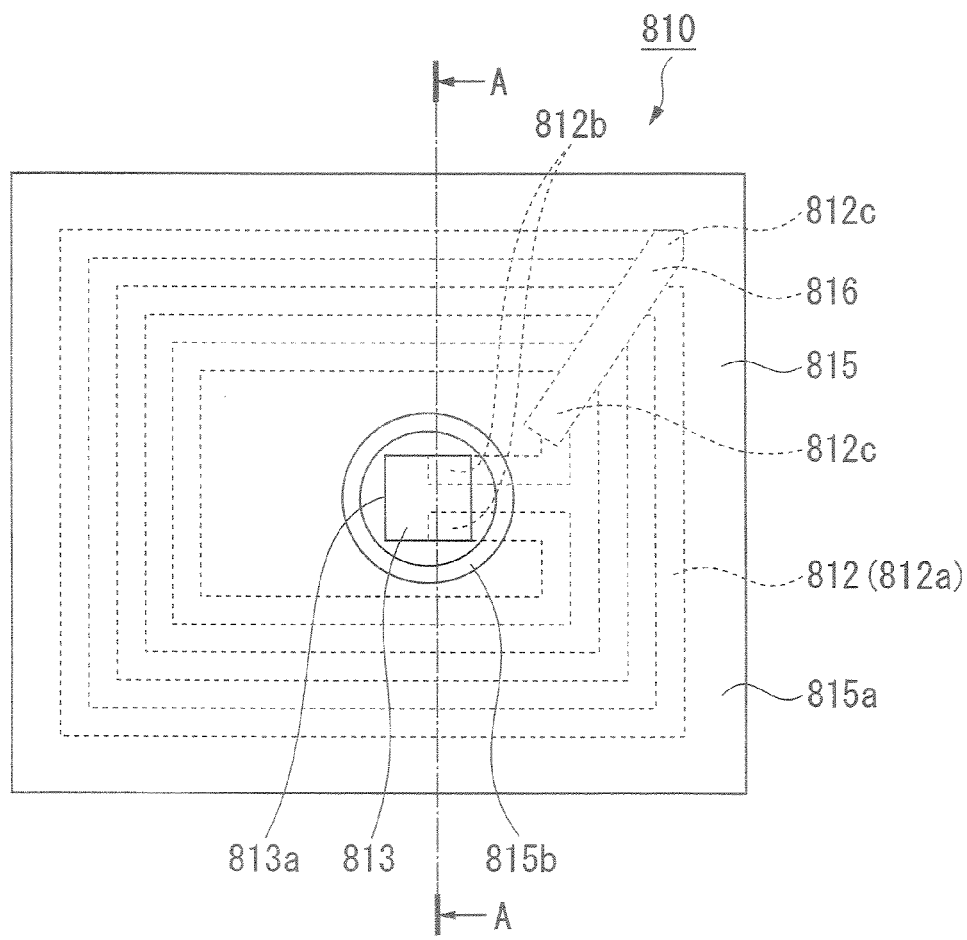
[FIG. 43A] A plan view of the non-contact data reception/transmission unit according to the 25th embodiment of the present invention.
Figure 43B:
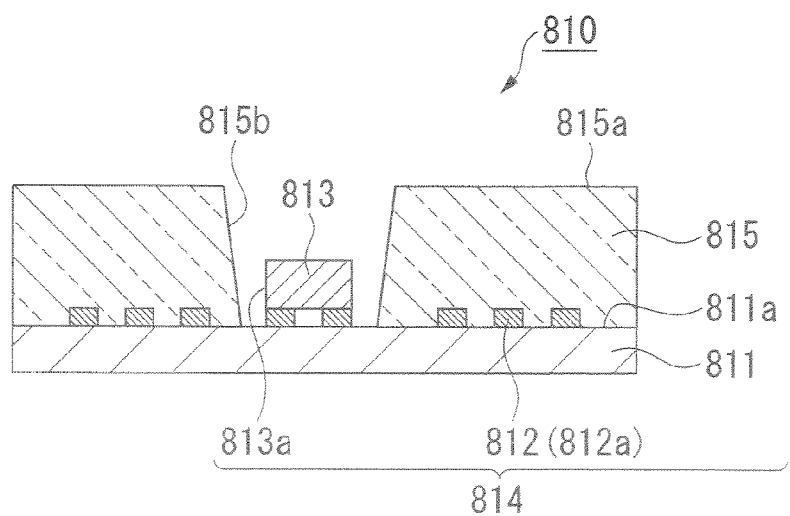
[FIG. 43B] A sectional view along line A-A of FIG. 43A.

FIG. 43A and FIG. 43B are schematic diagrams showing the non-contact data reception/transmission unit of the 25th embodiment according to the present invention FIG. 43A is a plan view, and FIG. 43B is a sectional view along line A-A of FIG. 43A.

A non-contact data reception/transmission unit 810 of this embodiment is roughly constituted from a base substrate 811; an inlet 814 including a connected antenna 812 and IC chip 813 provided on one surface 811a thereof; and a magnetic layer 815.

In this non-contact data reception/transmission unit 810, the magnetic layer 815 is disposed on the base substrate 811 so as to cover the antenna 812 except for the IC chip 813 and the vicinity thereof. Also, gaps are provided between the side surfaces 813a of the IC chip 813 and the side surfaces 815b of the magnetic layer 815.

The size of the gaps provided between the side surfaces 813a of the IC chip 813 and the side surfaces 815b of the magnetic layer 815 are not particularly limited, being suitably provided in accordance with the curved surface shape of the metal article to which the non-contact data reception/transmission unit 810 is bonded, and the shape and size of the IC chip 813.

Also, the side surfaces 815b of the magnetic layer 815 opposing the side surfaces 813a of the IC chip 813 form a tapered shape, with the opening diameter gradually increasing from the surface of the magnetic layer 815 in contact with the antenna 812 to the surface (hereafter, "the one surface 815a") of the magnetic layer 815 opposite the surface in contact with the antenna 812.

The side surfaces 815b of the magnetic layer 815 positioned facing the side surfaces 813c of the IC chip 813 form a tapered shape, but the shape thereof is not particularly limited, being suitably provided in accordance with the curved surface shape of the metal article to which the non-contact data reception/transmission unit 810 is bonded, and the shape and size of the IC chip 813.

In the non-contact data reception/transmission unit 810, the antenna 812 is provided in a coil shape at a predetermined interval around the IC chip 813 on the one surface 811a of the base substrate 811. Moreover, the thickness of the IC chip 813 is greater than the thickness of the antenna 812.

Also, in the non-contact data reception/transmission unit 810, connection of the antenna 812 and the IC chip 813, which constitute the inlet 814, means the end portions of the antenna 812 being respectively connected to both terminals of the IC chip 813.

Furthermore, the magnetic layer 815 being disposed on the base substrate 811 so as to cover the antenna 812 except for the IC chip 813 and the vicinity thereof means covering to an extent that the antenna 812 is concealed. The magnetic layer 815 preferably covers the antenna 812 so that the external surface (open surface) of the magnetic layer 815 is flat.

Also, the magnetic layer 815 is constituted from a composite body having a filler consisting of at least magnetic particulates contained in a resin. In this kind of magnetic layer 815, viewing the non-contact data reception/transmission unit 810 from the side of the one surface 811a of the base substrate 811, the plurality of magnetic particulates constituting the magnetic layer 815 form a connected single magnetic body in which at least a portion of the magnetic particulates mutually overlap.

Also, the composite body that makes up the magnetic layer 815 is disposed so as to be filled between the antenna 812 formed in the coiled form, and all or a portion of the magnetic particulates that make up this composite body are disposed between the antenna 812.

The base substrate 811, at least for the surface layer portion, is selected from a publicly known material such as a woven fabric, non-woven fabric, mat, paper or combination thereof made from inorganic fiber such as glass fiber or alumina fiber and organic fiber such as polyester fiber or polyamide fiber; a composite base substrate formed by impregnating any thereof with a resin varnish; a plastic substrate such as a polyamide resin substrate, polyester resin substrate, polyolefine resin substrate, polyimide resin substrate, ethylene vinyl alcohol copolymer substrate, polyvinyl alcohol resin substrate, polyvinyl chloride resin substrate, polyvinylidence chloride resin substrate, polystyrene resin substrate, polycarbonate resin substrate, acrylonitrile styrene butadiene copolymerization resin substrate, polyether sulfone resin substrate or any thereof subjected to mat treatment, corona discharge treatment, plasma treatment, ultraviolet irradiation treatment, electron-beam-irradiation treatment, flame plasma treatment and ozone treatment, or surface treatment such as easy adhesion treatment. Among these, an electrically insulating film or sheet consisting of polyethylene terephthalate or polyimide is suitably used.

The antenna 812 can be formed by screen printing a predetermined pattern with a polymer conductive ink or etching a conductive foil on the one surface 811a of the base substrate 811.

Examples of the polymer conductive ink used in the present invention include those that have electrically conductive particulates such as silver dust, gold dust, platinum powder, aluminum powder, palladium powder, rhodium powder and carbon powder (carbon black, carbon nanotube, etc.) blended in a resin composition.

If a thermosetting resin is used as the resin compound, it shall be a thermosetting type that can form the coating film that produces the antenna 812 at less than 200° C., for example 100 to 150° C. The path through which electricity flows in the coating film that produces the antenna 812 is formed due to the mutual contact of the conductive particulates that form the coating film, and the resistance value of this coating film is on the order of $10^{-5}$ Ω/cm.

Also, in addition to a thermosetting type ink, publicly known types such as a photo-curing type, osmotic drying type, and solvent volatilization type are used as the polymer conductive ink in the present invention.

The photo-curing polymer conductive ink is one that includes a photo-curing resin in the resin compound, which shortens the hardening time and thereby raises manufacturing efficiency. The photo-curing polymer conductive ink can be one that contains at least 60 percent conductive particulates by mass and at least 10 percent polyester resin by mass blended in a thermoplastic resin only or a blended resin composition of a thermoplastic resin and a crosslinked resin (particularly a crosslinked resin of polyester and isocyanate and the like), that is, a solvent volatilization type or a crosslinked/thermoplastic combination type with the thermoplastic type being at least 50 percent by mass), or one that contains at least 10 percent polyester resin by mass blended in a thermoplastic resin only or a blended resin composition of a thermoplastic resin and a crosslinked resin (particularly a crosslinked resin of polyester and isocyanate and the like), that is, a crosslinked type or a crosslinked/thermoplastic combination type.

In addition, a flexibilizer can be blended with the polymer conductive ink when flexibility is required of the non-contact data reception/transmission unit 810, and as a result, resistance to bending is further required in the antenna 812.

Examples of the flexibilizer are a polyester flexibilizer, acrylic flexibilizer, urethane flexibilizer, polyvinyl acetate flexibilizer, thermoplastic-elastomer flexibilizer, natural-rubber flexibilizer, a synthetic-rubber flexibilizer, and a blend of two or more of the above.

The conductive oil that forms the antenna 812 includes copper foil, silver foil, gold foil, platinum foil, and aluminum foil etc.

The IC chip 813 is not particularly limited, and as long as writing and reading of information is possible in a non-contact state via the antenna 812, anything may be used that is applicable to RFID media such as non-contact IC tags and non-contact IC labels or non-contact IC cards.

The composite body forming the magnetic layer 815 is roughly constituted from a filler consisting of magnetic particulates and a resin.

This composite body is fabricated in a configuration in which the magnetic particulates are nearly uniformly dispersed by applying the magnetic coating including a filler consisting of magnetic particulates, resin, additives, and a solvent and then drying.

The magnetic particulates can be a powdered magnetic powder or magnetic flakes consisting of flat-shaped flakes obtained by refining this magnetic power into a powder with a ball mill or the like and then mechanically flattening the powder. Among these, as magnetic particulates, those of the flattened state are preferable. If the magnetic particulates are in the flattened state, viewing the non-contact data reception/transmission unit 810 from the side of the one surface of the base substrate 811, the plurality of magnetic particulates constituting the magnetic layer 815 easily form a connected single magnetic body in which at least a portion of the magnetic particulates mutually overlap. Accordingly, flux can be more easily picked up by the antenna through the magnetic layer.

Moreover, as the magnetic powder, for example, Sendust (Fe—Si—Al alloy) powder, carbonile iron powder, atomized powder such as permalloy, and reduced iron powder, etc. can be given. Flakes of a magnetic material can for example be flakes obtained by refining the magnetic material into a powder with a ball mill or the like and then mechanically flattening the powder, and flakes obtained by running molten metal of an iron-based or cobalt-based amorphous alloy into a water-cooled copper plate. As the magnetic particulates, magnetic powder or magnetic flakes consisting of Sendust are preferable, with magnetic flakes consisting of Sendust being more preferable. If the magnetic particulates are magnetic powder or magnetic flakes consisting of Sendust, since the saturation magnetic flux density and permeability of the magnetic layer 815 which contains these as a component are higher, flux can be more easily picked up by the antenna through the magnetic layer.

The shape of the magnetic particulates forming the magnetic layer 815 need not entirely be powdered or flat shaped. Powdered magnetic particulates and flat shaped-magnetic particulates may be mixed together in the magnetic layer 815, and even if magnetic particulates of differing shapes are thus mixed together, the non-contact data reception/transmission unit of the present invention will exhibit a sufficient effect.

As the resin constituting the composite body that makes up the magnetic layer 815, thermoplastic resin, thermosetting resin, reactive resin and the like can be used.

Examples of the thermoplastic resin include vinyl chloride, vinyl acetate, a vinyl chloride-vinyl acetate copolymer, a vinyl chloride-vinylidene chloride copolymer, a vinyl chloride-acrylonitrile copolymer, an acrylic acid ester-acrylonitrile copolymer, an acrylic ester-vinyl chloride-vinylidene chloride copolymer, an acrylic ester-vinylidene chloride copolymer, a methacrylate ester-vinylidene chloride copolymer, a methacrylate ester-vinyl chloride copolymer, a methacrylic acid ester-ethylene copolymer, polyvinyl fluoride, a vinylidene chloride-acrylonitrile copolymer, an acrylonitrile-butadiene copolymer, polyamide resin, polyvinyl butyral, a cellulose derivative (cellulose acetate butyrate, a cellulose die acetate, cellulose triacetate, cellulose propionate, cellulose nitrate), a styrene-butadiene copolymer, a polyurthane resin, a polyester resin, an amino resin, or a polymer synthetic rubber material such as styrene rubber, fluorine rubber, silicone rubber, and ethylene-propylene copolymer rubber.

Examples of a thermosetting resin or reactive resin include phenol resin, epoxy resin, polyurethane hardening resin, urea resin, melamine resin, alkyd resin, silicone resin, polyamine resin, and urea-formaldehyde resin.

Various adhesives may be contained in the composite body that makes up the magnetic layer 815 in order to impart adhesiveness to the magnetic layer 815.

Moreover, examples of the additives contained in the magnetic coating used in order to form the composite body that makes up the magnetic layer 815 include a viscosity modifier, an antifoaming agent, a leveling agent, etc.

Furthermore, examples of the solvent contained in this magnetic coating include organic solvents such as cyclohexanone, acetone, and benzene-based and ethyl-based solvents.

The conductive portion 816 is formed by screen printing in a predetermined pattern using the same polymer conductive ink as that used to form the aforementioned antenna 812.

Also, when further flexibility is required of the non-contact data reception/transmission unit 810, a flexibilizer is preferably blended with the polymer conductive ink that forms the conductive portion 816. Since this enhances the resistance to bending of the conductive portion 816, even when the non-contact data reception/transmission unit 810 is bonded to the curved surface of an article, impairment of the communication unction of the non-contact data reception/transmission unit 810 due to damage to the conductive portion 816 can be prevented.

Thus, according to the non-contact data reception/transmission unit 810 of this embodiment, by disposing the magnetic layer 815 on the base substrate 811 so as to cover the antenna 812 except for the IC chip 813 and the vicinity thereof, the antenna 812 can be made to generate sufficient induced electromotive force to operate the IC chip 813 since flux is picked up by the antenna 812 through the magnetic layer 815 even when the non-contact data reception/transmission unit 810 is in contact with an article containing at least metal. Moreover, since the magnetic layer 815 is one having magnetic particulates impregnated in resin, by adjusting the mix ratio of the magnetic particulates and the resin, the permeability of the magnetic layer 815 can be raised and the insulation properties can be maintained. Therefore, the magnetic layer 815, by being formed so as to cover the antenna 812, also exhibits the function of a protective layer of them. Moreover, since the magnetic layer 815 is disposed on the base substrate 811 so as to cover the antenna 812 except for the IC chip 813 and the vicinity thereof in the case of flexing the non-contact data reception/transmission unit 810 in order to make contact with an article containing at least metal, the magnetic layer 815 easily follows the change in shape, and as a result, such problems as exfoliation between the constituent elements can be prevented.

Also, if gaps are provided between the side surfaces 813a of the IC chip 813 and the side surfaces 815b of the magnetic layer 815, and moreover, if the side surfaces 815b of the magnetic layer 815 positioned facing the side surfaces 813a of the IC chip 813 form a tapered shape with the opening diameter gradually increasing from the surface of the magnetic layer 815 in contact with the antenna 812 to the one surface 815a of the magnetic layer 815, even if either of the one surface 815a of the magnetic layer 815 or the surface of the base substrate 811 opposite the surface in contact with the magnetic layer 815 is made to serve as the surface that bonds to an article, in the case of flexing the non-contact data reception/transmission unit 810 in order to make contact with an article containing at least metal, the side surfaces 813a of the IC chip 813 and the side surfaces 815b of the magnetic layer 815 are hindered from making contact, and so damage to the IC chip 813 due to contact between the two is prevented.

Also, this embodiment illustrated the non-contact data reception/transmission unit 810 having the coil-shaped antenna 812 and the IC chip 813 provided separately on the one surface 811a of the base substrate 811 and connected to each other, however, the non-contact data reception/transmission unit of the present invention is not limited thereto. In the non-contact data reception/transmission unit of the present invention, the IC chip may be mounted on the antenna, or the antenna may be formed on the IC chip.

Also, this embodiment illustrated a coil antenna as the antenna 812, however, the non-contact data reception/transmission unit of the present invention is not limited thereto. In the non-contact data reception/transmission unit of the present invention, if an electromagnetic induction or a microwave method is adopted, even if a pole antenna, a bent pole antenna loop antenna, or a loop antenna is adopted, as long as electromotive force is obtained, there may be differences in the shape of an antenna etc.

(Method of Manufacturing the Non-contact Data Reception/Transmission Unit)

Figure 44A:
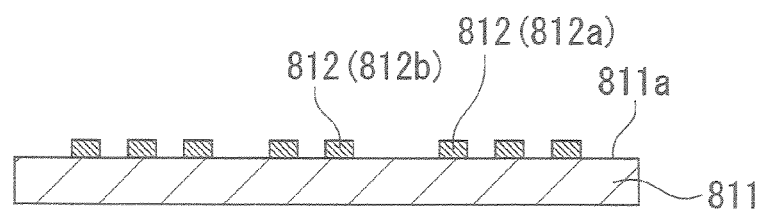
[FIG. 44A] An outline sectional view showing the method of manufacturing the non-contact data reception/transmission unit according to the present invention.
Figure 44B:
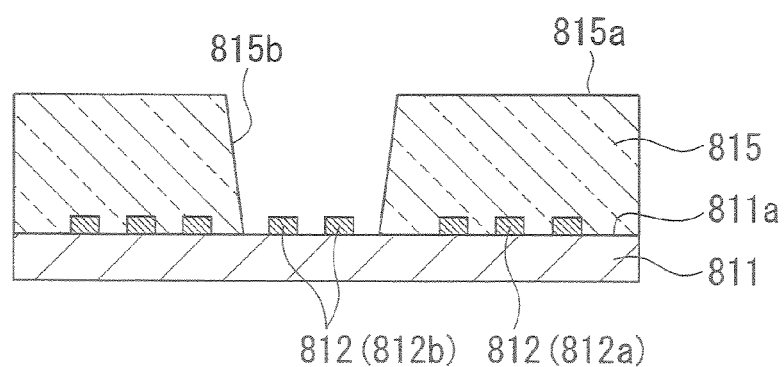
[FIG. 44B] An outline sectional view showing the method of manufacturing the non-contact data reception/transmission unit according to the present invention.
Figure 44C:
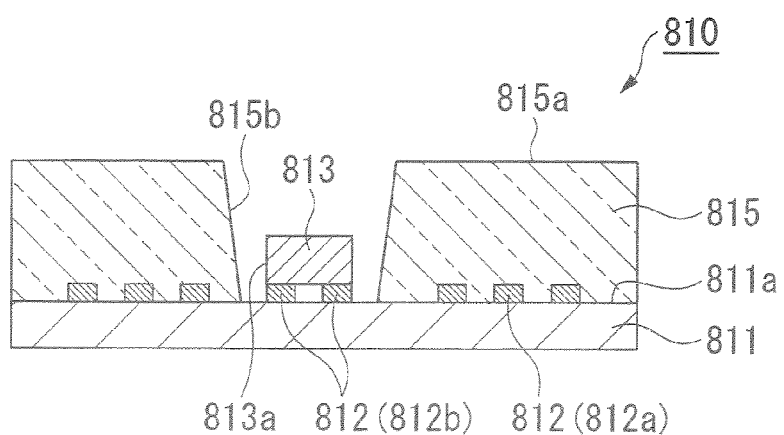
[FIG. 44C] An outline sectional view showing the method of manufacturing the non-contact data reception/transmission unit according to the present invention.

Next, the method of manufacturing the non-contact data reception/transmission unit of the aforementioned embodiment shall be explained referring to FIG. 44A to FIG. 44C.

First, as shown in FIG. 44A, the antenna 812 having a predetermined thickness and predetermined pattern is formed on the one surface 811a of the base substrate 811 (antenna formation step).

In this step, when forming the antenna 812 with polymer conductive ink, after printing the polymer conductive ink by a screen printing method so as to have the predetermined thickness and the predetermined pattern on the one surface 811a of the base substrate 811, drying and hardening of the polymer conductive ink forms the antenna 812 having the predetermined thickness and the predetermined pattern.

Forming the antenna 812 with a conductive foil is performed according to the following procedure.

A conductive foil is bonded to the entire one surface 811a of the base substrate 811, after which an etch-resistant coating is printed in a predetermined pattern by a silk screen method onto the conductive foil. After drying and hardening the etch-resistant coating, it is immersed in an etching solution, wherein the copper foil that is not coated with the etch-resistant coating dissolves away, leaving the copper foil portion coated with the etch-resistant coating on the one surface of the base substrate 811, thereby forming the antenna 812.

Then, as shown in FIG. 44B, a magnetic coating including a filler consisting of magnetic particulates, resin, additives, and solvents is applied on the one surface 811a of the base substrate 811 to a degree of the antenna 812 being slightly concealed or amply concealed. After applying the magnetic coating, the magnetic layer 815 is formed by drying and hardening the coating by leaving it at room temperature or heating it at a prescribed temperature and prescribed time (magnetic layer forming step). In this magnetic layer forming step, the magnetic layer 815 is formed by applying a magnetic coating on the one surface 811a of the base substrate 811 so that the magnetic layer 815 has an opening in which the side surfaces 815b of the magnetic layer 815 facing the side surfaces 813a of the IC chip 813 form a tapered shape with the opening diameter gradually increasing from the surface of the magnetic layer 815 in contact with the antenna 812 to the one surface 815a of the magnetic layer 815.

Next, as shown in FIG. 44C, the IC chip 813 is mounted on the one surface 811a of the base substrate 811 by electrically connecting contacts 812b, 812b provided on the antenna 812 and contacts (not illustrated) provided on the IC chip 813 via an electrically conductive material consisting of conductive paste or solder, and thereby the non-contact data reception/transmission unit 810 is obtained (IC chip mounting step).

In this way, the magnetic layer 815 is formed by applying a magnetic coating on the one surface 811a of the base substrate 811 so that the magnetic layer 815 has an opening in which the side surfaces 815b of the magnetic layer 815 facing the side surfaces 813a of the IC chip 813 form a tapered shape with the opening diameter gradually increasing from the surface of the magnetic layer 815 in contact with the antenna 812 to the one surface 815a of the magnetic layer 815. Thereafter, if the IC chip 813 is to be mounted, the IC chip 813 can be mounted after the printing steps from the antenna 812 format on to the magnetic layer 815 formation. Therefore, since there is no need to provide additional steps midway through the printing step, manufacturing time can be shortened, thereby cutting manufacturing costs.

This embodiment illustrated a method of forming the antenna 812 by screen printing and etching, but the present invention is not limited thereto. In the present invention, the antenna can also be formed with vacuum deposition or an ink jet printing method.

Figure 45:
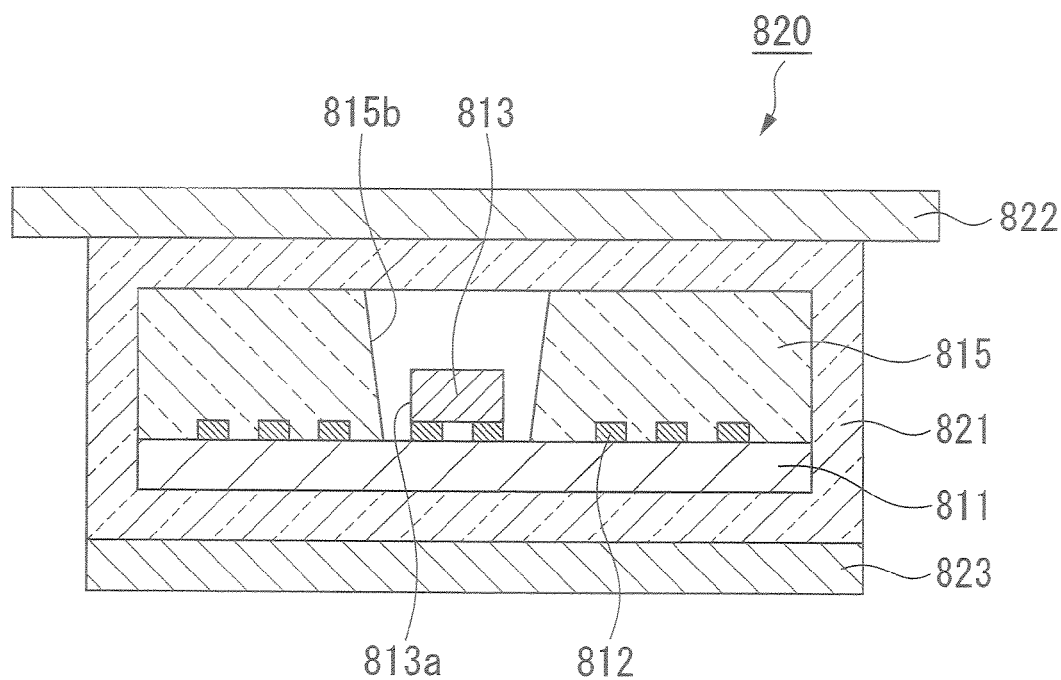
[FIG. 45] An outline sectional view showing the non-contact data reception/transmission unit according to the 26th embodiment of the present invention.

FIG. 45 is an outline sectional view showing the non-contact data reception/transmission unit of the 26th embodiment according to the present invention.

In FIG. 45 constituent elements identical to those of the non-contact data reception/transmission unit 810 shown in FIG. 43A are given the same reference numerals, with explanations therefor being omitted.

A non-contact data reception/transmission unit 820 of this embodiment is roughly constituted from the non-contact data reception/transmission unit 810, an adhesive layer 821, a release base substrate 822, and an overlay material 823.

In the non-contact data reception/transmission unit 820 the adhesive layer 821 is provided so as to cover the non-contact data reception/transmission unit 810.

The release base substrate 822 is bonded to the surface of the adhesive layer 821 opposite the surface that contacts the magnetic layer 815 (the surface to be bonded to the article).

Furthermore, the overlay material 823 is bonded to the surface of the adhesive layer 821 opposite the surface that contacts the base substrate 811 (the surface that is not bonded to an article).

Examples of the adhesive that forms the adhesive layer 821 include a phenol adhesive, epoxy adhesive, acrylic adhesive, and urethane adhesive. Other publicly known adhesives can also be suitably used.

Examples of the release base substrate 822 include a base substrate such as paper, synthetic paper, coated paper, polypropylene film, and PET film coated with a silicone or non-silicone releasing agent. In addition, other publicly known releasing agents and base substrates can also be suitably used. Examples of the overlay material 823 include a base substrate such as paper, synthetic paper, coated paper, polypropylene film, and PET film. In addition, other publicly known releasing agents and base substrates can also be suitably used.

In the non-contact data reception/transmission unit 820 of this embodiment, the non-contact data reception/transmission unit 810 provided with the magnetic layer 815 is covered by the adhesive layer 821, and the non-contact data reception/transmission unit 810 covered by the adhesive layer 821 is enclosed by the release base substrate 822 and the overlay material 823. Therefore, dust and dirt do not adhere to the magnetic layer 815. By having the magnetic layer 815 make contact with an article including metal by means of the adhesive layer 821 which is newly exposed by removing the release base substrate 822, the non-contact data reception/transmission unit 820 can be attached to this article. Since the overlay material 823 is provided on the surface of the adhesive layer 821 opposite the surface in contact with the base substrate 811 (the surface not attached to an article), a pattern can be provided and various information can be printed on the overlay material 823.

This embodiment illustrated an example of the non-contact data reception/transmission unit 820 in which the adhesive layer 821 is provided so as to cover the portions of the non-contact data reception/transmission unit 810, however, the non-contact data reception/transmission unit of the present invention is not limited thereto. In the non-contact data reception/transmission unit of the present invention, the adhesive layer may be provided on the surface opposite the surface of the magnetic layer that contacts the base substrate. Also, the adhesive layer need not be provided on the surface of the base substrate opposite the surface on which the antenna and the IC chip are provided.

In addition, this embodiment illustrated an example of the non-contact data reception/transmission unit 820 in which the release base substrate 822 is attached to the to the surface of the magnetic layer 815 opposite the surface that contacts the base substrate 811 and the surface of the adhesive layer 821 on the side of the surface of the magnetic layer 815 opposite the surface that contacts the base substrate 811 (the surface attached to an article), however, the non-contact data reception/transmission unit of the present invention is not limited thereto. In the non-contact data reception/transmission unit of the present invention, the release base substrate may be bonded to only the surface of the magnetic layer opposite the surface that contacts the base substrate.

Figure 46A:
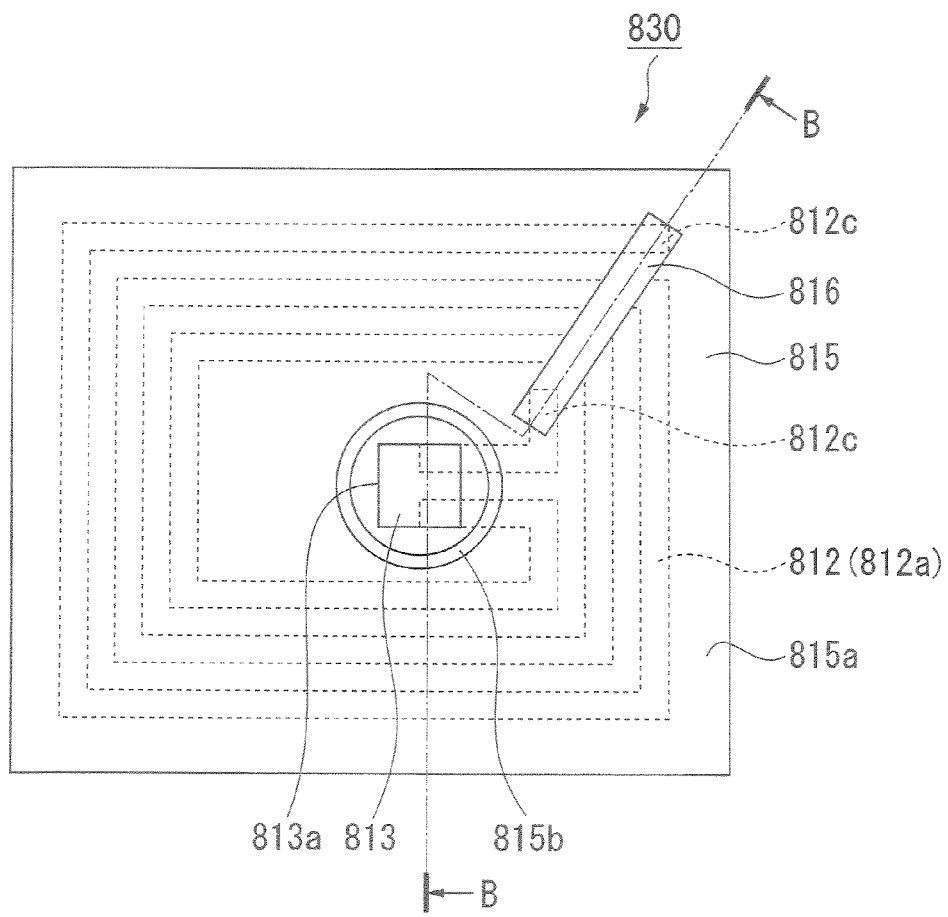
[FIG. 46A] A plan view of the non-contact data reception/transmission unit according to the 27th embodiment of the present invention.
Figure 46B:
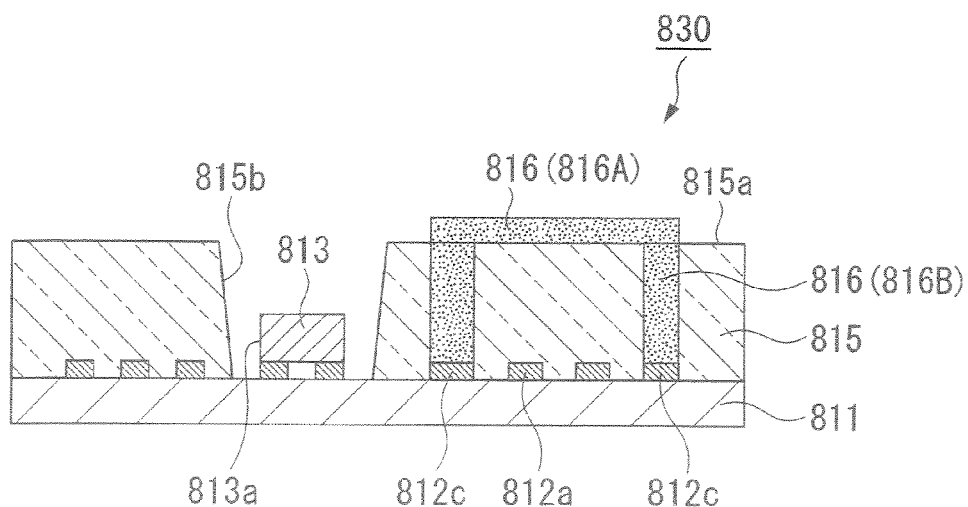
[FIG. 46B] A sectional view along B-B line of FIG. 46A.

FIG. 46A and FIG. 46B are schematic diagrams of the non-contact data reception/transmission unit according to the 27th embodiment of the present invention. FIG. 46A is a plan view, and FIG. 46B is a sectional view along line B-B of FIG. 46A.

In FIG. 46A, constituent elements identical to those of the non-contact data reception/transmission unit 810 shown in FIG. 43A are given the same reference numerals, with explanations therefor being omitted.

The non-contact data reception/transmission unit 830 differs from the aforementioned non-contact data reception/transmission unit 810 on the point of the magnetic layer 815 being disposed on the base substrate 811 so as to cover the antenna 812 except for both ends 812c, 812c of the antenna 812 and the vicinity thereof, and the IC chip 813 and the vicinity thereof and the point of a first portion 816A forming a portion of the conductive portion 816 being provided on the one surface 815a of the magnetic layer 815.

The conductive portion 816 includes the first portion 816A and second portions 816B that are integrally provided. The second portions 816B are provided from the ends 812c, 812c of the antenna 812 to the first portion 816A provided on the one surface 815a of the magnetic layer 815.

Thus, the magnetic layer 815 is one having magnetic particulates impregnated in resin. By adjusting the mix ratio of the magnetic particulates and the resin, the permeability of the magnetic layer 815 can be raised and the insulation properties can be maintained. Thereby, the magnetic layer 815 also serves as an element of an insulating film, and by providing the first portion 816A of the conductive portion 816 that connect both ends 812c, 812c of the antenna 812 on the one surface 815a of the magnetic layer 815; since the first portion 816A of the conductive portion 816 connects both ends 812c, 812c of the antenna 812, there is no need to form conduction portions on the coil portion 812a of the antenna 812 via the insulating film, resulting in fewer elements (layers, films, etc.) constituting the non-contact data reception/transmission unit 830. Therefore, in the case of flexing the non-contact data reception/transmission unit 830, in order to make contact with an article containing at least metal, the elements easily follow the change in shape, and as a result, such problems as exfoliation between the elements can be prevented. In addition in the manufacture of the non-contact data reception/transmission unit 830 there is no need to form the conductive portion 816 on the coil portion 812a of the antenna 812 via the insulating film in order to connect both ends 812, 812c of the antenna 812, so that manufacturing steps can be omitted, thereby cutting manufacturing costs.

The non-contact data reception/transmission unit embodying the present invention is explained in detail hereinbelow.

Figure 47:
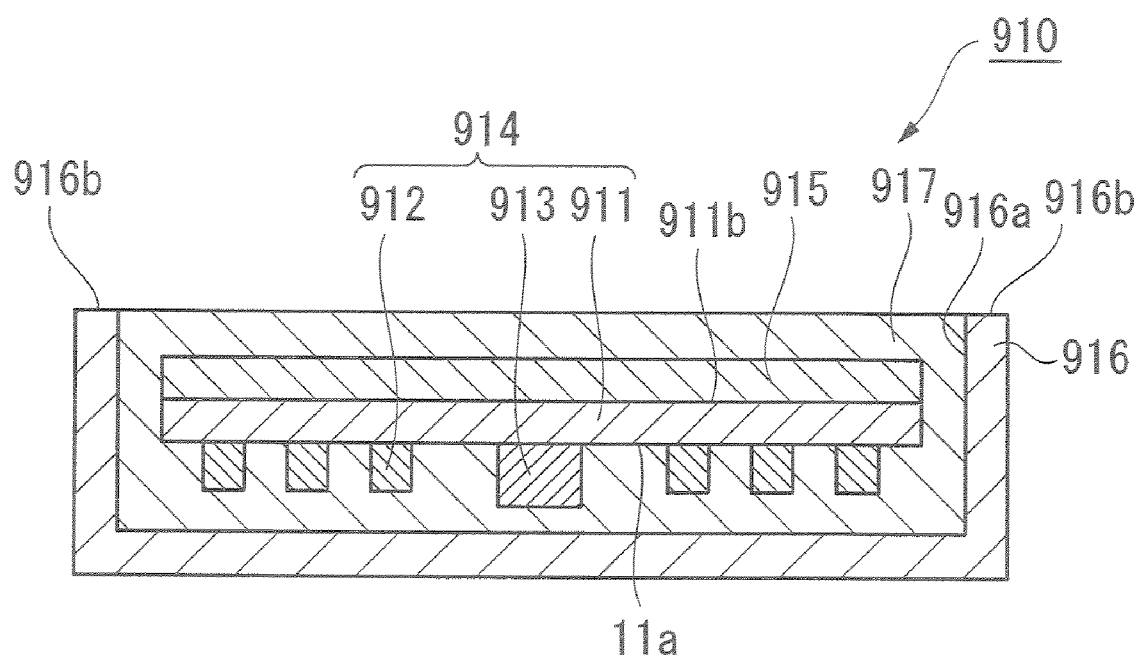
[FIG. 47] An outline sectional view showing the non-contact data reception/transmission unit according to the 28th embodiment of the present invention.

FIG. 47 is an outline sectional view showing the non-contact data reception/transmission unit of the 28th embodiment according to the present invention.

In FIG. 47, reference number 910 denotes the non-contact data reception/transmission unit, 911 a base substrate, 912 an antenna, 913 an IC chip, 914 an inlet, 915 a magnetic layer, 916 a case and 917 a covering.

The non-contact data reception/transmission unit 910 of this embodiment is roughly constituted from the case 916 having a rectangular cross-sectional shape and provided with a recessed portion 916a; an inlet 914 housed in the recessed portion 916a; and the covering 917 provided so as to cover the inlet 914 in the recessed portion 916a, with the inlet 914 being disposed inside the recessed portion 916a from a plane formed by the peripheral edge 916b of the case 916.

Also, the inlet 914 includes the base substrate 911 and the connected antenna 912 and IC chip 913 provided on one surface 911a thereof. Moreover, the magnetic layer 915 is provided on the other surface 911b of the base substrate 911 in the inlet 914.

In the non-contact data reception/transmission unit 910, the antenna 912 is provided in a coil shape at a predetermined interval on the one surface 911a of the base substrate 911 around the IC chip 913. Moreover, the thickness of the IC chip 913 is greater than the thickness of the antenna 912.

The antenna 912 and the IC chip 913, which constitute the inlet 914, being connected in the non-contact data reception/transmission unit 910 means the end portions of the antenna 912 being respectively connected to both terminals of the IC chip 913.

The base substrate 911, at least for the surface layer portion, is selected from a publicly known material such as a woven fabric, non-woven fabric, mat, paper or combination thereof made from inorganic fiber such as glass fiber or alumina fiber and organic fiber such as polyester fiber or polyamide fiber; a composite base substrate formed by impregnating any thereof with a resin varnish; a plastic substrate such as a polyamide resin substrate, polyester resin substrate, polyolefine resin substrate, polyimide resin substrate, ethylene vinyl alcohol copolymer substrate, polyvinyl alcohol resin substrate, polyvinyl chloride resin substrate, polyvinylidence chloride resin substrate, polystyrene resin substrate, polycarbonate resin substrate, acrylonitrile styrene butadiene copolymerization resin substrate, polyether sulfone resin substrate or any thereof subjected to mat treatment, corona discharge treatment, plasma treatment, ultraviolet irradiation treatment, electron-beam-irradiation treatment, flame plasma treatment and ozone treatment, or surface treatment such as easy adhesion treatment. Among these, an electrically insulating film or sheet consisting of polyethylene terephthalate or polyimide is suitably used.

The antenna 912 can be formed by screen printing a predetermined pattern with a polymer conductive ink or etching a conductive foil on the one surface 911a of the base substrate 911.

Examples of the polymer conductive ink used in the present invention include those that have electrically conductive particulates such as silver dust, gold dust, platinum powder, aluminum powder, palladium powder, rhodium powder and carbon powder (carbon black, carbon nanotube, etc.) blended in a resin composition.

If a thermosetting resin is used as the resin compound, it shall be a thermosetting type that can form the coating film that produces the antenna 912 at less than 200° C., for example 100 to 150° C. The path through which electricity flows in the coating film that produces the antenna 912 is formed due to the mutual contact of the conductive particulates that form the coating film, and the resistance value of this coating film is on the order of $10^{-5}$ Ω/cm.

Also, in addition to a thermosetting type ink, publicly known types such as a photo-curing type, osmotic drying type, and solvent volatilization type are used as the polymer conductive ink in the present invention.

The photo-curing polymer conductive ink is one that includes a photo-curing resin in the resin compound, which shortens the hardening time and thereby raises manufacturing efficiency. The photo-curing polymer conductive ink can be one that contains at least 60 percent conductive particulates by mass and at least 10 percent polyester resin by mass blended in a thermoplastic resin only or a blended resin composition of a thermoplastic resin and a crosslinked resin (particularly a crosslinked resin of polyester and isocyanate and the like), that is, a solvent volatilization type or a crosslinked, thermoplastic combination type (with the thermoplastic type being at least 50 percent by mass), or one that contains at least 10 percent polyester resin by mass blended in a thermoplastic resin only or a blended resin composition of a thermoplastic resin and a crosslinked resin (particularly a crosslinked resin of polyester and isocyanate and the like), that is, a crosslinked type or a crosslinked/thermoplastic combination type.

The conductive foil that forms the antenna 912 includes copper foil, silver foil, gold foil, platinum foil, and aluminum foil etc.

The IC chip 913 is not particularly limited, and as long as writing and reading of information is possible in a non-contact state via the antenna 912, anything may be used that is applicable to RFID media such as non-contact IC tags and non-contact IC labels or non-contact IC cards.

Moreover, the magnetic layer 915 is constituted from a composite body having a filler consisting of at least magnetic particulates contained in a resin. In this kind of magnetic layer 915, viewing the non-contact data reception/transmission unit 910 from the side of the one surface 911a of the base substrate 911, the plurality of magnetic particulates constituting the magnetic layer 915 form a connected single magnetic body in which at least a portion of the magnetic particulates mutually overlap.

The composite body forming the magnetic layer 915 is roughly constituted from a filler consisting of magnetic particulates and a resin.

This composite body is fabricated in a configuration in which the magnetic particulates are nearly uniformly dispersed by applying the magnetic coating including a filler consisting of magnetic particulates, resin, additives, and a solvent and then drying.

The magnetic particulates can be a powdered magnetic powder or magnetic flakes consisting of flat-shaped flakes obtained by refining this magnetic power into a powder with a ball mill or the like and then mechanically flattening the powder. Among these, as magnetic particulates, those of the flattened state are preferable, if the magnetic particulates are in the flattened state, viewing the non-contact data reception/transmission unit 910 from the side of the one surface 911a of the base substrate 911, the plurality of magnetic particulates constituting the magnetic layer 915 easily form a connected single magnetic body in which at least a portion of the magnetic particulates mutually overlap. Accordingly, flux can be more easily picked up by the antenna through the magnetic layer.

Moreover, as the magnetic powder, for example, Sendust (Fe—Si—Al alloy) powder, carbonile iron powder, atomized powder such as permalloy, and reduced iron powder, etc. can be given. Flakes of a magnetic material can for example be flakes obtained by refining the magnetic material into a powder with a ball mill or the like and then mechanically flattening the powder, and flakes obtained by running molten metal of an iron-based or cobalt-based amorphous alloy into a water-cooled copper plate. As the magnetic particulates, magnetic powder or magnetic flakes consisting of Sendust are preferable, with magnetic flakes consisting of Sendust being more preferable. If the magnetic particulates are magnetic powder or magnetic flakes consisting of Sendust, since the saturation magnetic flux density and permeability of the magnetic layer 915 which contains these as a component are higher, flux can be more easily picked up by the antenna through the magnetic layer.

The shape of the magnetic particulates forming the magnetic layer 915 need not entirely be powdered or flat shaped. Powdered magnetic particulates and flat shaped-magnetic particulates may be mixed together in the magnetic layer 915, and even if magnetic particulates of differing shapes are thus mixed together, the non-contact data reception/transmission unit of the present invention will exhibit a sufficient effect.

As the resin constituting the composite body that makes up the magnetic layer 915 thermoplastic resin, thermosetting resin, reactive resin and the like can be used.

Examples of the thermoplastic resin include vinyl chloride, vinyl acetate, a vinyl chloride-vinyl acetate copolymer, a vinyl chloride-vinylidene chloride copolymer, a vinyl chloride-acrylonitrile copolymer, an acrylic acid ester-acrylonitrile copolymer, an acrylic ester-vinyl chloride-vinylidene chloride copolymer, an acrylic ester-vinylidene chloride copolymer, a methacrylate ester-vinylidene chloride copolymer, a methacrylate ester-vinyl chloride copolymer, a methacrylic acid ester-ethylene copolymer, polyvinyl fluoride, a vinylidene chloride-acrylonitrile copolymer, an acrylonitrile-butadiene copolymer, polyamide resin, polyvinyl butyral, a cellulose derivative (cellulose acetate butyrate, a cellulose die acetate, cellulose triacetate, cellulose propionate, cellulose nitrate), a styrene-butadiene copolymer, a polyurethane resin, a polyester resin, an amino resin, or a polymer synthetic rubber material such as styrene rubber fluorine rubber, silicone rubber, and ethylene-propylene copolymer rubber.

Examples of a thermosetting resin or reactive resin include phenol resin, epoxy resin, polyurethane hardening resin, urea resin, melamine resin, alkyd resin, silicone resin, polyamine resin, and urea-formaldehyde resin.

Various adhesives may be contained in the composite body that makes up the magnetic layer 915 in order to impart adhesiveness to the magnetic layer 915.

Moreover, examples of the additives contained in the magnetic coating used in order to form the composite body that makes up the magnetic layer 915 include a viscosity modifier, an antifoaming agent, a leveling agent, etc.

Furthermore, examples of the solvent contained in this magnetic coating include organic solvents such as cyclohexanone, acetone and benzene-based and ethyl-based solvents.

The material constituting the case 916 is not particularly limited, with examples including resins such as thermoplastic resin, thermosetting resin, and reactive resin ceramics, glass and metal. The thickness of the case 916 may be made thick enough to be able to house the inlet 914 and the covering 917 in the recessed portion 916a, and is preferably as thin as possible.

Examples of the thermoplastic resin constituting the case 916 include vinyl chloride, vinyl acetate, a vinyl chloride-vinyl acetate copolymer, a vinyl chloride-vinylidene chloride copolymer, a vinyl chloride-acrylonitrile copolymer, an acrylic acid ester-acrylonitrile copolymer, an acrylic ester-vinyl chloride-vinylidene chloride copolymer, an acrylic ester-vinylidene chloride copolymer, a methacrylate ester-vinylidene chloride copolymer, a methacrylate ester-vinyl chloride copolymer, a methacrylic acid ester-ethylene copolymer, polyvinyl fluoride, a vinylidene chloride-acrylonitrile copolymer, an acrylonitrile-butadiene copolymer, polyamide resin, polyvinyl butyral, a cellulose derivative (cellulose acetate butyrate, a cellulose die acetate, cellulose triacetate, cellulose propionate, cellulose nitrate), a styrene-butadiene copolymer, a polyurthane resin, a polyester resin, an amino resin, or a polymer synthetic rubber material such as styrene rubber, fluorine rubber, silicone rubber, and ethylene-propylene copolymer rubber.

Examples of a thermosetting resin or reactive resin include phenol resin, epoxy resin, polyurethane hardening resin, urea resin, melamine resin, alkyd resin, silicone resin, polyamine resin, and urea-formaldehyde resin.

Ceramics, glass or metal constituting the case 916 are not particularly limited, and any may be used that allows formation of the recessed portion 916a that can house the inlet 914 and the covering 917.

Among the materials constituting the case 916, resin is preferable from the standpoint of ease of fabrication to a predetermined shape, and among resins, thermoplastic resin is preferred for hindering cracks in the recessed portion 916a even when the case 916 is formed using a thin sheet-shaped base substrate.

Examples of the material forming the covering 917 include resins such as thermoplastic resin, reactive resin and thermosetting resin.

The same thermoplastic resin or reactive resin as used for the case 916 is used.

The thermosetting resin is not particularly limited as long as it is able to cover so as to sheathe the inlet 914 in the state of the inlet 914 being housed in the recessed portion 916a of the case 916, and may be epoxy resin or urethane resin or the like. Among these, when the case 916 is made of a thermoplastic resin, the thermosetting resin forming the covering 917 shall have a hardening temperature lower than the melting point of the thermoplastic resin.

In order to enhance the durability against external forces and chemical resistance of the non-contact data reception/transmission unit 910, and in order to raise the adhesion of the case 916 and the covering 917, both are preferably of the same material. However, when the materials of the case 916 and the covering 917 are made to be identical, when resin constituting the covering 917 is filled in the recessed portion 916a in order to cover the inlet 914, the case 916 may deform or fluidify from the heat of the resin forming the covering 917 (the hardening temperature in the case of thermosetting resin, and the melting temperature in order to be melted in the case of thermoplastic resin), which is not preferable. In addition, when the covering 917 is a thermoplastic resin, the time until hardening is short, hindering filling within the recessed portion 916a, and so a reactive resin or a thermoplastic resin is preferred as the material constituting the covering 917. Moreover, when a reactive resin has set, since its molecular structure can easily become dense, a thermoplastic resin is more preferable as the material constituting the covering 917.

In this way, according to the non-contact data reception/transmission unit 910, since the inlet 914 is disposed inside the recessed portion 916a from a plane formed by the peripheral edge 916b of the case 916, the entire periphery of the inlet 914 is covered by the covering 917 within the recessed portion 916a of the case 916. Therefore, even if the case 916 and the covering 917 are formed with different materials, separation of the case 916 and the covering 917 at their contact surface (surface boundary), and resulting exposure and damage of the inlet 914 does not occur from the application of an external force (especially from the side) to the non-contact data reception/transmission unit 910. Also, since the non-contact data reception/transmission unit 910 is attached to an object article (adherend) via an adhesive or a bonding agent on the peripheral edge 916b side of the case 916, so that the surface boundary of the case 916 and the covering 917 is not exposed outward in the state of being attached to the article, more adequate chemical resistance can be ensured during used. In addition, since there is no separation of the case 916 and the covering 917 at their contact surface (surface boundary), seepage of water or chemicals into the interior of the non-contact data reception/transmission unit 910 does not occur, thereby imparting excellent water resistance and chemical resistance. Moreover, if the case 916 is formed with thermoplastic resin, it can be made into a thin structure while sufficiently ensuring its durability against external forces and chemical resistance. Furthermore, if the case 916 is formed with thermoplastic resin, not only can it be made into a thin structure while sufficiently ensuring its durability against external forces and chemical resistance, but also it can be formed into a shape with a curved surface.

The present embodiment exemplified a non-contact data reception/transmission unit using a case 916 having a rectangular cross section but the non-contact data reception/transmission unit of the present invention is not limited thereto. In the non-contact data reception/transmission unit of the present invention, the shape of the case that houses the inlet is suitably decided in accordance with the shape of the object article and the place where the non-contact data reception/transmission unit is to be attached.

In addition, the present embodiment illustrated the non-contact data reception/transmission unit in which the magnetic layer 915 is provided on the other surface 911b of the base substrate 911, but the non-contact data reception/transmission unit of the present invention is not limited thereto. In the non-contact data reception/transmission unit of the present invention, the magnetic layer may be provided on the one surface of the base substrate so as to cover the antenna and the IC chip constituting the inlet. In this case, the composite body constituting the magnetic layer is disposed so as to be filled between the antenna formed in the coil shape, and all or a portion of the magnetic particulates that make up this composite body are disposed between the antenna.

Also, in the present embodiment, the surface of the inlet 914 on which the antenna 912 and the IC chip 913 are provided is disposed on the bottom surface side in the recessed portion 916a of the case 916, but the non-contact data reception/transmission unit of the present invention is not limited thereto. In the non-contact data reception/transmission unit of the present invention, the surface of the inlet on which the antenna and the IC chip are provided may be disposed on the peripheral edge side of the case.

(Method of Manufacturing the Non-contact Data Reception/Transmission Unit)

Next, one embodiment of a method of manufacturing the non-contact data reception/transmission unit shall be explained referring to FIGS. 48A through 50.

Figure 48A:
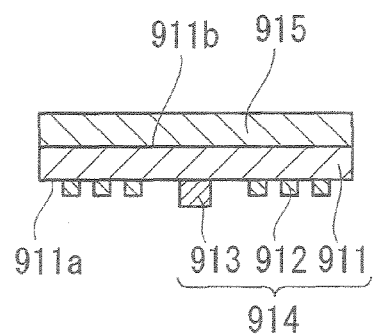
[FIG. 48A] An outline sectional view showing one embodiment of the method of manufacturing the non-contact data reception/transmission unit according to the present invention.

The inlet 914 as shown in FIG. 48A provided with the magnetic layer 915 is manufactured as described hereinbelow.

First the antenna 912 having a predetermined thickness and predetermined pattern is provided on the one surface 911a of the base substrate 911.

In this step, when forming the antenna 912 with polymer conductive ink, after printing the polymer conductive ink so as to have the predetermined thickness and the predetermined pattern on the one surface 911a of the base substrate 911, drying and hardening of the polymer conductive ink forms the antenna 912 having the predetermined thickness and the predetermined pattern.

Forming the antenna 912 with a conductive foil is performed according to the following procedure.

A conductive foil is bonded to the entire one surface 911a of the base substrate 911, after which an etch-resistant coating is printed in a predetermined pattern by a silk screen method onto the conductive foil. After drying and hardening the etch-resistant coating, it is immersed in an etching solution, wherein the copper foil that is not coated with the etch-resistant coating dissolves away, leaving the copper foil portion coated with the etch-resistant coating on the one surface of the base substrate 911, thereby forming the antenna 912.

Next, the IC chip 913 is mounted on the one surface 911a of the base substrate 911 by electrically connecting contacts 912b, 912b provided on the antenna 912 and the contacts (not illustrated) provided on the IC chip 913 via an electrically conductive material consisting of conductive paste or solder.

Then, a magnetic coating including a filler consisting of magnetic particulates, resin, additives, and solvents is applied on the other surface 911b of the base substrate 911. After applying the magnetic coating, the magnetic layer 915 is formed by drying and hardening the magnetic coating by leaving it at room temperature or heating it at a prescribed temperature and prescribed time, whereby the inlet 914 having the magnetic layer 915 is obtained.

Figure 48B:
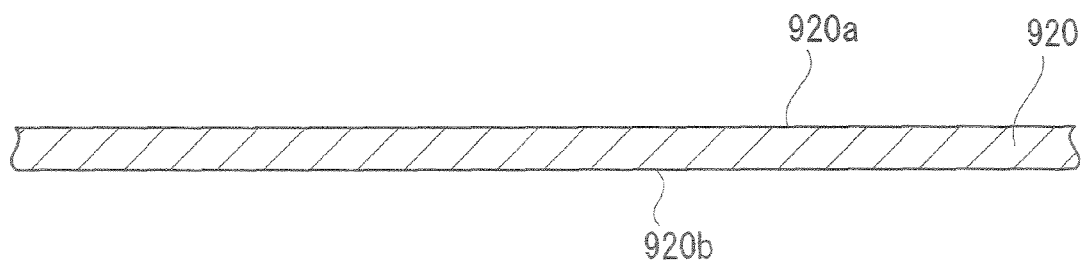
[FIG. 48B] An outline sectional view showing one embodiment of the method of manufacturing the non-contact data reception/transmission unit according to the present invention.

In addition, as shown in FIG. 48B, a sheet-shaped substrate 920 made of a thermoplastic resin is prepared separately from the inlet manufacturing step.

Figure 48C:
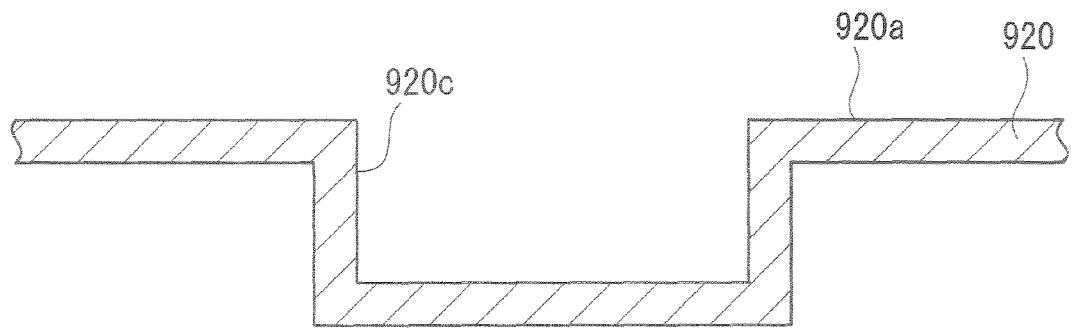
[FIG. 48C] An outline sectional view showing one embodiment of the method of manufacturing the non-contact data reception/transmission unit according to the present invention.

Next, as shown in FIG. 48C, at least a portion of the substrate 920 is deformed to form a recessed portion 920c.

As methods of deforming the substrate 920 to form the recessed portion 920c, a method of pressing a metal mold of a prescribed shape onto the substrate 920 from the one surface 920a and performing thermal deformation of the substrate 920, or a method of suctioning the substrate 920 from the other surface 920b into a decompression or vacuum to be appressed into a mold of a predetermined shape is used.

Figure 49A:
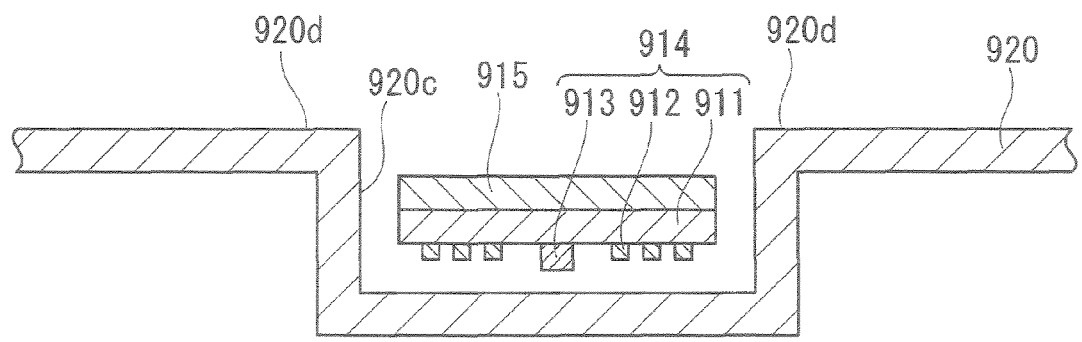
[FIG. 49A] An outline sectional view showing one embodiment of the method of manufacturing the non-contact data reception/transmission unit according to the present invention.

Subsequently, as shown in FIG. 49A, the inlet 914 is housed in the recessed portion 920c of the substrate 920.

In this step, the inlet 914 is disposed so as to be inside the recessed portion 920c from a plane formed by an opening edge 920d of the recessed portion 920c.

Figure 49B:
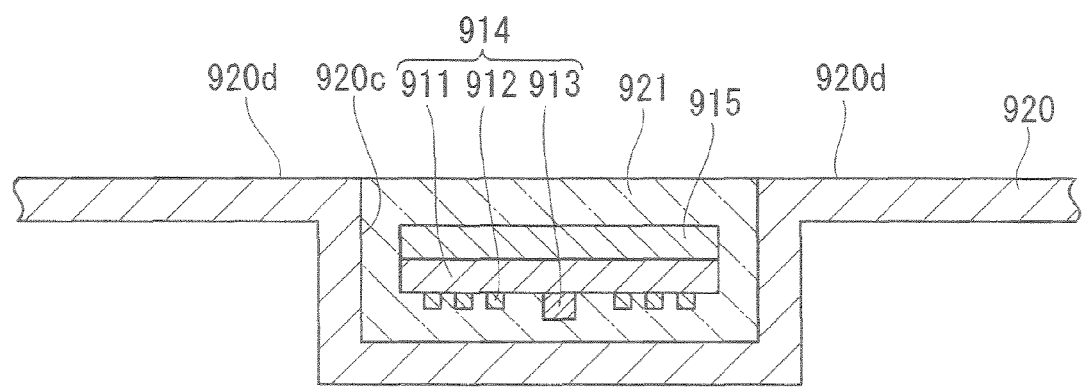
[FIG. 49B] An outline sectional view showing one embodiment of the method of manufacturing the non-contact data reception/transmission unit according to the present invention.

Next, as shown in FIG. 49B, thermosetting resin 921 is filled into in the recessed portion 920c of the substrate 920 so as to cover the inlet 914.

The same resin forming the aforementioned covering 917 shall be used as the thermosetting resin 921.

Figure 49C:
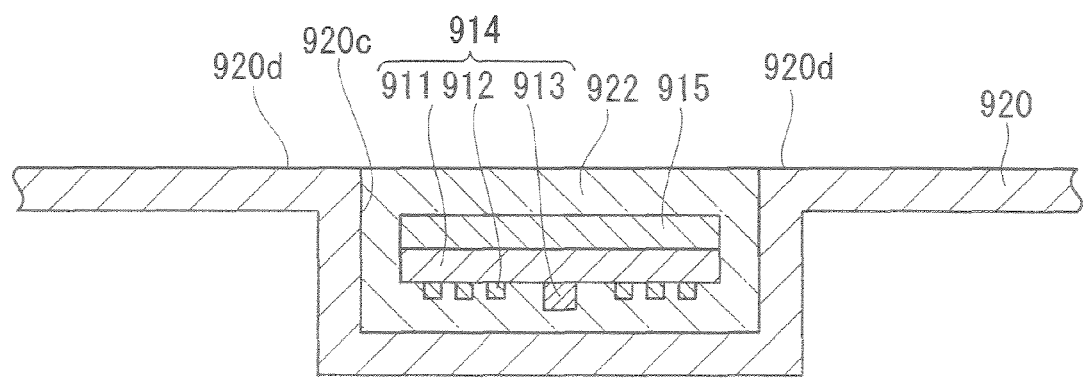
[FIG. 49C] An outline sectional view showing one embodiment of the method of manufacturing the non-contact data reception/transmission unit according to the present invention.

Then, as shown in FIG. 49C, the thermosetting resin 921 is heat-treated at a temperature lower than the melting point of the thermoplastic resin which forms the substrate 920, the thermosetting resin 921 is hardened, and the covering 922 is formed.

Figure 50:
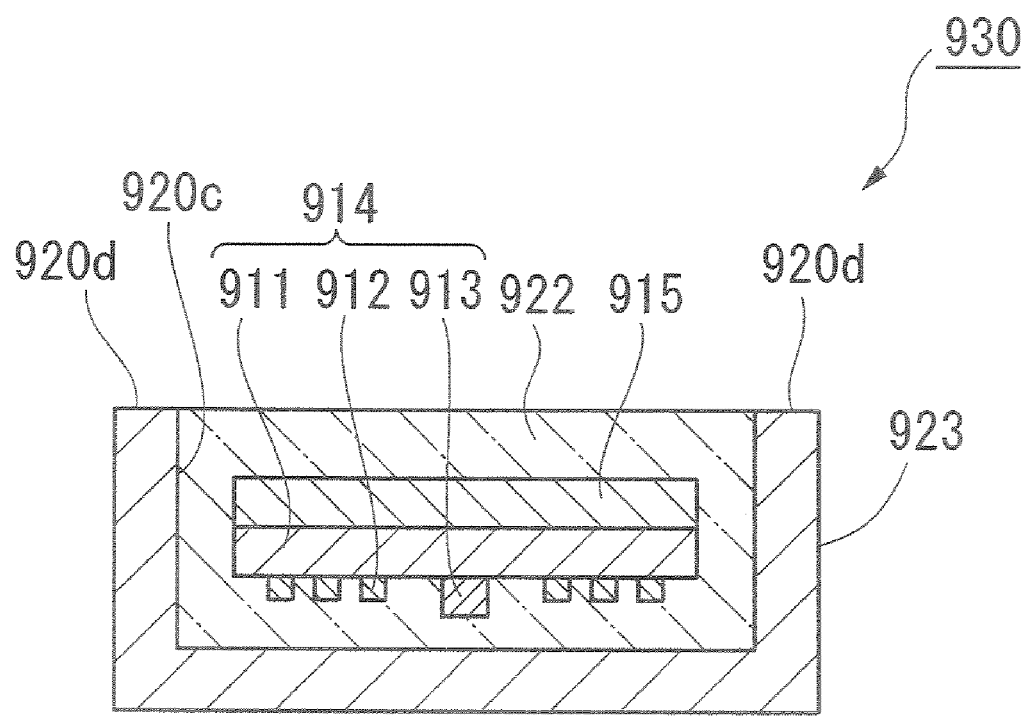
[FIG. 50] An outline sectional view showing one embodiment of the method of manufacturing the non-contact data reception/transmission unit according to the present invention.

Subsequently, as shown in FIG. 50, the substrate 920 is divided at every region where the substrate 920, the inlet 914, and the covering 922 are integrated, whereby a case 923 that is made of the substrate 920 is formed to obtain the non-contact data reception/transmission unit 930.

In this embodiment, after the inlet 914 is housed in the recessed portion 920c of the substrate 920, the step is shown of filling the thermosetting resin 921 into this recessed portion 920c. However, in the present invention, after a suitable quantity of the thermosetting resin 921 is injected into the recessed portion 920c in advance, the inlet 914 is housed in the recessed portion 920c so as to make contact with the thermosetting resin 921, after which thermosetting resin 921 may be filled into the recessed portion 920c so as to cover the thermosetting resin 921.

Figure 51:
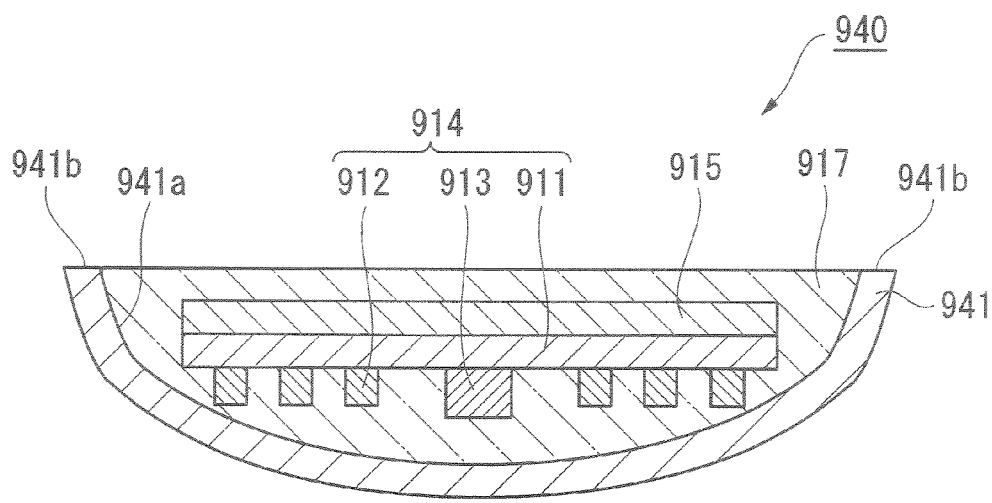
[FIG. 51] An outline sectional view showing the non-contact data reception/transmission unit according to the 29th embodiment of the present invention.

FIG. 51 is an outline sectional view showing the non-contact data reception/transmission unit of the 29th embodiment according to the present invention.

In FIG. 51, constituent elements identical to those of the non-contact data reception/transmission unit 910 shown in FIG. 47 are given the same reference numerals, with explanations therefor being omitted.

The non-contact data reception/transmission unit 940 of this embodiment differs from the aforementioned non-contact data reception/transmission unit 910 on the point of the cross-sectional shape of the case 941 being circular.

Even in the non-contact data reception/transmission unit 940, the inlet 914 is disposed inside the recessed portion 941a from a plane formed by the peripheral edge 941b of the case 941.

Figure 52:
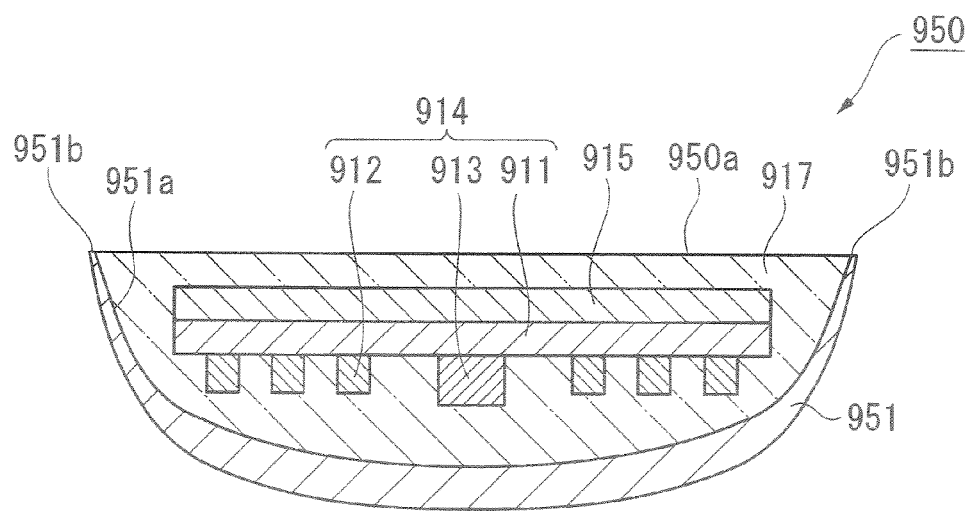
[FIG. 52] An outline sectional view showing the non-contact data reception/transmission unit according to the 30th embodiment of the present invention.

FIG. 52 is an outline sectional view showing the non-contact data reception/transmission unit of the 30th embodiment according to the present invention.

In FIG. 52, constituent elements identical to those of the non-contact data reception/transmission unit 910 shown in FIG. 47 are given the same reference numerals, with explanations therefor being omitted.

The non-contact data reception/transmission unit 950 of this embodiment differs from the aforementioned non-contact data reception/transmission unit 940 on the point of the peripheral edge 951b of the case 951 having a linear form, so that when viewing the non-contact data reception/transmission unit 950 from the peripheral edge 951b side, the plane 950a is formed almost only by the covering 917.

The method of manufacturing the non-contact data reception/transmission unit that is the 31st embodiment according to the present invention shall be described in detail hereinbelow.

Figure 53:
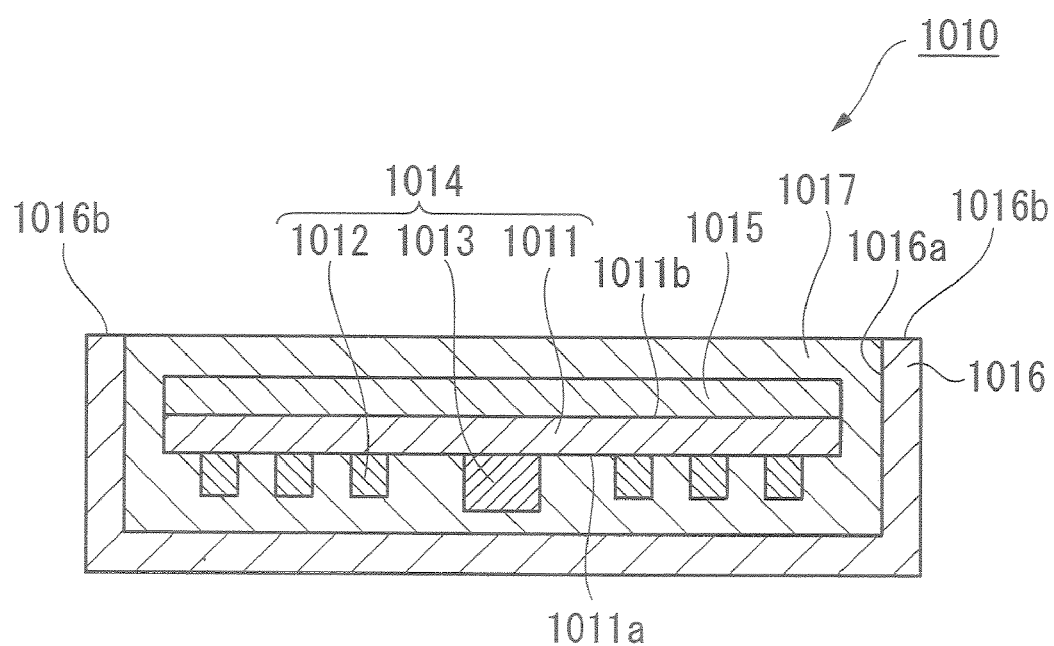
[FIG. 53] An outline sectional view showing an example of the non-contact data reception/transmission unit obtained by the method of manufacturing the non-contact data reception/transmission unit according to the present invention.
Figure 54A:
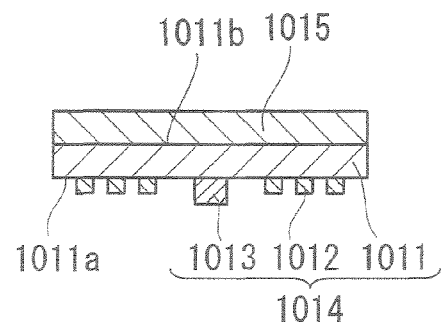
[FIG. 54A] An outline sectional view showing the method of manufacturing the non-contact data reception/transmission unit according to the 31st embodiment of a present invention.

FIG. 53 is an outline sectional view showing an example of the non-contact data reception/transmission unit obtained by the method of manufacturing the non-contact data reception/transmission unit according to the present invention. FIGS. 54A through 55 are outline sectional views showing one embodiment of the method of manufacturing the non-contact data reception/transmission unit according to the present invention.

By the method explained below with reference to FIG. 54A through FIG. 55, the non-contact data reception/transmission unit shown in FIG. 53 is obtained.

In FIG. 53, reference number 1010 denotes the non-contact data reception/transmission unit, 1011 a base substrate, 1012 an antenna, 1013 an IC chip, 1014 an inlet, 1015 a magnetic layer, 1016 a case and 1017 a covering.

The non-contact data reception/transmission unit 1010 of this embodiment is roughly constituted from the case 1016 having a rectangular cross-sectional shape and provided with a recessed portion 1016a; an inlet 1014 housed in the recessed portion 1016a; and the covering 1017 provided so as to cover the inlet 1014 in the recessed portion 1016a.

Also, the inlet 1014 includes the base substrate 1011 and the connected antenna 1012 and IC chip 1013 provided on one surface 1011a thereof. Moreover, the magnetic layer 1015 is provided on the other surface 1011b of the base substrate 1011 in the inlet 1014.

In the non-contact data reception/transmission unit 1010, the antenna 1012 is provided in a coil shape at a predetermined interval on the one surface 1011a of the base substrate 1011 around the IC chip 1013. Moreover, the thickness of the IC chip 1013 is greater than the thickness of the antenna 1012.

The antenna 1012 and the IC chip 1013, which constitute the inlet 1014, being connected in the non-contact data reception/transmission unit 1010 means the end portions of the antenna 1012 being respectively connected to both terminals of the IC chip 1013.

In addition, the inlet 1014 is disposed inside the recessed portion 1016a from a plane formed by a peripheral edge 1016b of the case 1016.

The following steps are performed in order to form the non-contact data reception/transmission unit 1010 of this constitution.

As described hereinbelow, the inlet 1014 provided with the magnetic layer 1015 as shown in FIG. 54A is manufactured.

First the antenna 1012 having a predetermined thickness and predetermined pattern is provided on the one surface 1011a of the base substrate 1011.

In this step, when forming the antenna 1012 with polymer conductive ink, after printing the polymer conductive ink by a screen method so as to have the predetermined thickness and the predetermined pattern on the one surface 1011a of the base substrate 1011, drying and hardening of the polymer conductive ink forms the antenna 1012 having the predetermined thickness and the predetermined pattern.

Forming the antenna 1012 with a conductive foil is performed according to the following procedure.

A conductive foil is bonded to the entire one surface 1011a of the base substrate 1011, after which an etch-resistant coating is printed in a predetermined pattern by a silk screen method onto the conductive foil. After drying and hardening the etch-resistant coating, it is immersed in an etching solution, wherein the copper foil that is not coated with the etch-resistant coating dissolves away, leaving the copper foil portion coated with the etch-resistant coating on the one surface of the base substrate 1011, thereby forming the antenna 1012.

Next, the IC chip 1013 is mounted on the one surface 1011a of the base substrate 1011 by electrically connecting contacts 1012b, 1012b provided on the antenna 1012 and the contacts (not illustrated) provided on the IC chip 1013 via an electrically conductive material consisting of conductive paste or solder.

Then, a magnetic coating including a filler consisting of magnetic particulates, resin, additives, and solvents is applied on the other surface 1011b of the base substrate 1011 by a screen method or the like. After applying the magnetic coating, the magnetic layer 1015 is formed by drying and hardening the magnetic coating by leaving it at room temperature or heating it at a prescribed temperature and prescribed time, whereby the inlet 1014 having the magnetic layer 1015 is obtained.

The magnetic layer may be provided on the one surface of the base substrate so as to cover the antenna and the IC chip constituting the inlet. In this case, the composite body constituting the magnetic layer is disposed so as to be filled between the antenna formed in the coil shape, and all or a portion of the magnetic particulates that make up this composite body are disposed between the antenna.

Figure 54B:
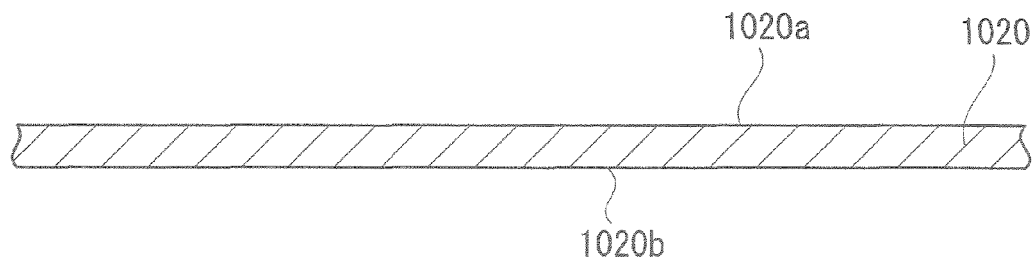
[FIG. 54B] An outline sectional view showing the method of manufacturing the non-contact data reception/transmission unit according to the 31 st embodiment of a present invention.
Figure 55:
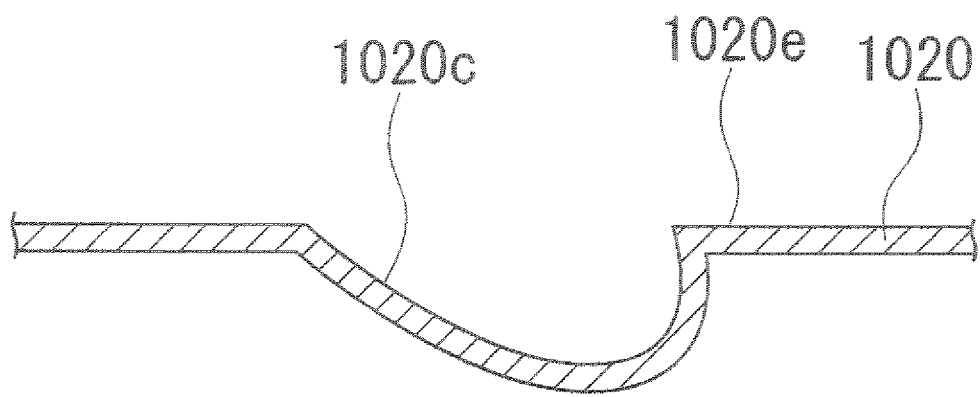
[FIG. 55] An outline sectional view showing one embodiment of the method of manufacturing the non-contact data reception/transmission unit according to the present invention.

In addition, as shown in FIG. 54B, a sheet-shaped substrate 1020 made of a thermoplastic resin is prepared separately from the inlet manufacturing step.

Figure 54C:
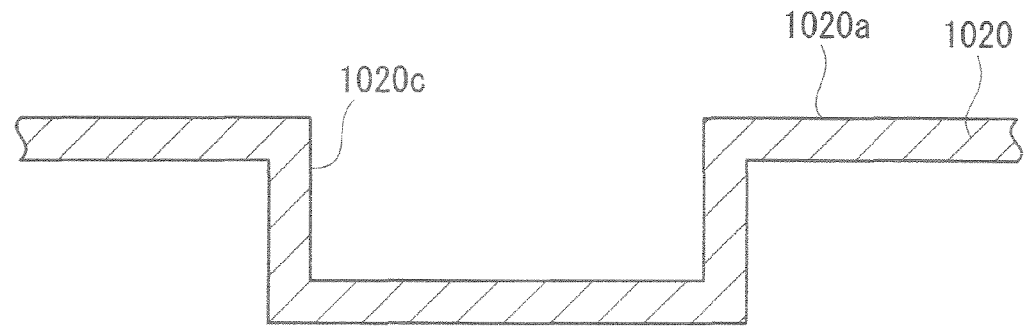
[FIG. 54C] An outline sectional view showing the method of manufacturing the non-contact data reception/transmission unit according to the 31st embodiment of a present invention.

Next, as shown in FIG. 54C, the substrate 1020 is deformed so that at least a portion of the substrate 1020 forms a recessed portion 1020c whose cross-sectional shape is rectangular.

As methods of deforming the substrate 1020 to form the recessed portion 1020c, a method of pressing a metal mold of a prescribed shape onto the substrate 1020 from the one surface 1020a and performing thermal deformation of the substrate 1020, or a method of suctioning the substrate 1020 from the other surface 1020b into a decompression or vacuum to be appressed into a mold of a predetermined shape is used.

In the method of pressing a metal mold of a prescribed shape onto the substrate 1020 and performing thermal deformation of the substrate 1020, by pressing the metal mold obliquely toward the substrate 1020 to deform the substrate 1020, or making the shape of the recessed portion 1020c hemispherical if a metal die is used in which the shape of the portion in contact with the substrate 1020 is rounded, as shown in FIG. 55, the portion that serves as the mating surface with the adherend (the portion shown by 1020e in FIG. 55) can be skewed. According to this method, in addition to sealing the IC chip, a plastic molding configuration can be produced that cannot be accomplished by conventional methods. In addition, similarly, even the recessed portion 1020c can be fabricated in any shape by a method of suctioning the substrate 1020 into a decompression or vacuum to be appressed into a mold of a predetermined shape.

Figure 56A:
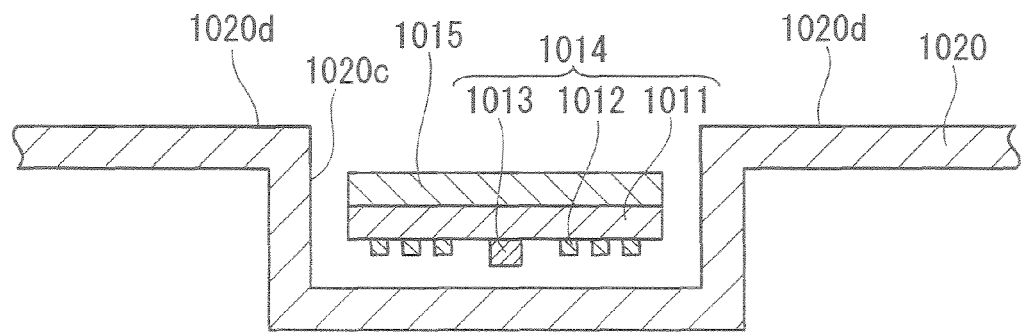
[FIG. 56A] An outline sectional view showing one embodiment of the method of manufacturing the non-contact data reception/transmission unit according to the present invention.

Subsequently, as shown in FIG. 56A, the inlet 1014 is housed in the recessed portion 1020c of the substrate 1020.

In this step, the inlet 1014 is disposed so as to be inside the recessed portion 1020c from a plane formed by an opening edge 1020d of the recessed portion 1020c.

Figure 56B:
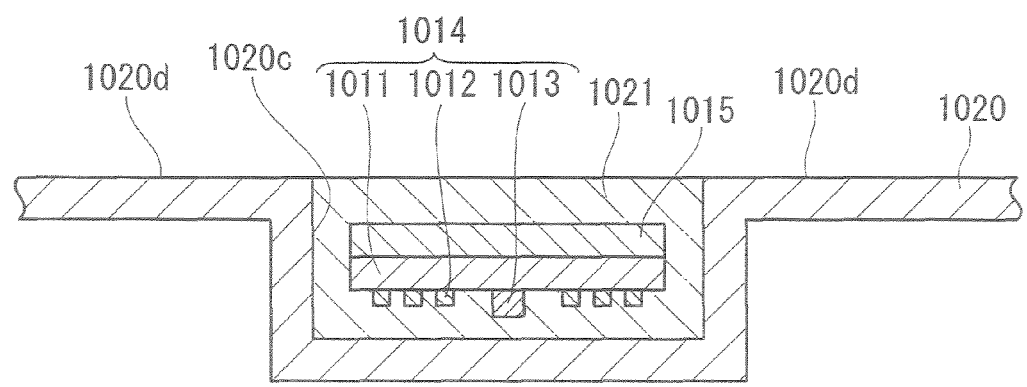
[FIG. 56B] An outline sectional view showing one embodiment of the method of manufacturing the non-contact data reception/transmission unit according to the present invention.

Next, as shown in FIG. 56B, thermosetting resin 1021 is filled into the recessed portion 1020c of the substrate 1020 so as to cover the inlet 1014.

The same resin forming the aforementioned covering 1017 shall be used as the thermosetting resin 1021.

Figure 56C:
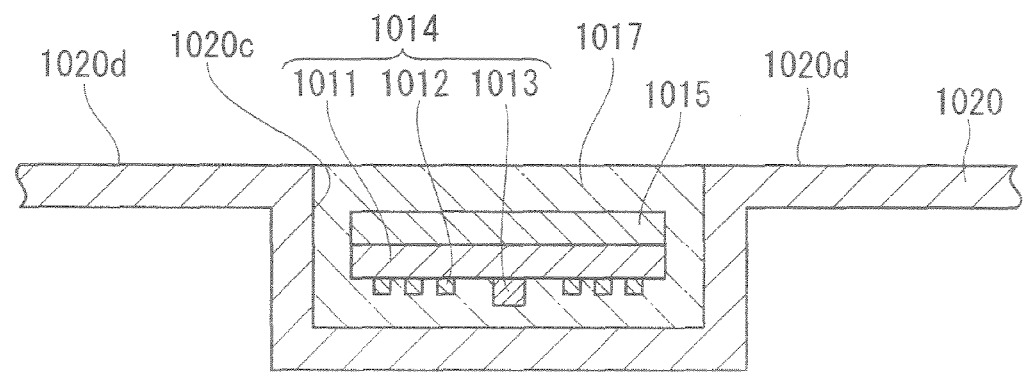
[FIG. 56C] An outline sectional view showing one embodiment of the method of manufacturing the non-contact data reception/transmission unit according to the present invention.

Then, as shown in FIG. 56C, the thermosetting resin 1021 is heat-treated at a temperature lower than the melting point of the thermoplastic resin which forms the substrate 1020, the thermosetting resin 1021 is hardened, and the covering 1017 is formed.

Subsequently, the substrate 1020 is divided at every region where the substrate 1020, the inlet 1014, and the covering 1017 are integrated, whereby a case 1016 that is made of the substrate 1020 is formed to obtain the non-contact data reception/transmission unit 1010.

The base substrate 1011, at least for the surface layer portion, is selected from a publicly known material such as a woven fabric, non-woven fabric, mat, paper or combination thereof made from inorganic fiber such as glass fiber or alumina fiber and organic fiber such as polyester fiber or polyamide fiber; a composite base substrate formed by impregnating any thereof with a resin varnish; a plastic substrate such as a polyamide resin substrate, polyester resin substrate, polyolefine resin substrate, polyimide resin substrate, ethylene vinyl alcohol copolymer substrate, polyvinyl alcohol resin substrate, polyvinyl chloride resin substrate, polyvinylidene chloride resin substrate, polystyrene resin substrate, polycarbonate resin substrate, acrylonitrile styrene butadiene copolymerization resin substrate, polyether sulfone resin substrate or any thereof subjected to mat treatment, corona discharge treatment, plasma treatment, ultraviolet irradiation treatment, electron-beam-irradiation treatment, flame plasma treatment and ozone treatment, or surface treatment such as easy adhesion treatment. Among these, an electrically insulating film or sheet consisting of polyethylene terephthalate or polyimide is suitably used.

Examples of the polymer conductive ink include those that have electrically conductive particulates such as silver dust, gold dust, platinum powder, aluminum powder, palladium powder rhodium powder and carbon powder (carbon black, carbon nanotube, etc.) blended in a resin composition.

If a thermosetting resin is used as the resin compound, it shall be a thermosetting type that can form the coating film that produces the antenna 1012 at less than 200° C., for example 100 to 150° C. The path through which electricity flows in the coating film that produces the antenna 1012 is formed due to the mutual contact of the conductive particulates that form the coating film, and the resistance value of this coating film is on the order of $10^{-5}$/cm.

Also, in addition to a thermosetting type ink, publicly known types such as a photo-curing type, osmotic drying type, and solvent volatilization type are used as the polymer conductive ink in the present invention.

The photo-curing polymer conductive ink is one that includes a photo-curing resin in the resin compound, which shortens the hardening time and thereby raises manufacturing efficiency. The photo-curing polymer conductive ink can be one that contains at least 60 percent conductive particulates by mass and at least 10 percent polyester resin by mass blended in a thermoplastic resin only or a blended resin composition of a thermoplastic resin and a crosslinked resin (particularly a crosslinked resin of polyester and isocyanate and the like), that is, a solvent volatilization type or a crosslinked/thermoplastic combination type (with the thermoplastic type being at least 50 percent by mass), or one that contains at least 10 percent polyester resin by mass blended in a thermoplastic resin only or a blended resin composition of a thermoplastic resin and a crosslinked resin particularly a crosslinked resin of polyester and isocyanate and the like), that is, a crosslinked type or a crosslinked/thermoplastic combination type.

The conductive foil that forms the antenna 1012 includes copper foil, silver foil, gold foil, platinum foil, and aluminum foil etc.

The IC chip 1013 is not particularly limited, and as long as writing and reading of information is possible in a non-contact state via the antenna 1012, anything may be used that is applicable to RFID media such as non-contact IC tags and non-contact IC labels or non-contact IC cards.

The magnetic layer 1015 is constituted from a composite body having a filler consisting of at least magnetic particulates contained in a resin. In this kind of magnetic layer 1015, viewing the non-contact data reception/transmission unit 1010 from the side of the one surface 1011a of the base substrate 1011, the plurality of magnetic particulates constituting the magnetic layer 1015 form a connected single magnetic body in which at least a portion of the magnetic particulates mutually overlap.

The composite body forming the magnetic layer 1015 is roughly constituted from a filler consisting of magnetic particulates and a resin.

This composite body is fabricated in a configuration in which the magnetic particulates are nearly uniformly dispersed by applying the magnetic coating including a filler consisting of magnetic particulates, resin, additives, and a solvent and then drying.

The magnetic particulates can be a powdered magnetic powder or magnetic flakes consisting of flat-shaped flakes obtained by refining this magnetic power into a powder with a ball mill or the like and then mechanically flattening the powder. Among these, as magnetic particulates, those of the flattened state are preferable. If the magnetic particulates are in the flattened state, viewing the non-contact data reception/transmission unit 1010 from the side of the one surface 1011a of the base substrate 1011, the plurality of magnetic particulates constituting the magnetic layer 1015 easily form a connected single magnetic body in which at least a portion of the magnetic particulates mutually overlap. Accordingly, flux can be more easily picked up by the antenna through the magnetic layer.

Moreover as the magnetic powder, for example, Sendust (Fe—Si—Al alloy) powder, carbonile iron powder, atomized powder such as permalloy, and reduced iron powder, etc. can be given. Flakes of a magnetic material can for example be flakes obtained by refining the magnetic material into a powder with a ball mill or the like and then mechanically flattening the powder, and flakes obtained by running molten metal of an iron-based or cobalt-based amorphous alloy into a water-cooled copper plate. As the magnetic particulates, magnetic powder or magnetic flakes consisting of Sendust are preferable, with magnetic flakes consisting of Sendust being more preferable. If the magnetic particulates are magnetic powder or magnetic flakes consisting of Sendust, since the saturation magnetic flux density and permeability of the magnetic layer 1015 which contains these as a component are higher, flux can be more easily picked up by the antenna through the magnetic layer.

The shape of the magnetic particulates forming the magnetic layer 1015 need not entirely be powdered or flat shaped. Powdered magnetic particulates and flat shaped-magnetic particulates may be mixed together in the magnetic layer 1015, and even if magnetic particulates of differing shapes are thus mixed together, the non-contact data reception/transmission unit of the present invention will exhibit a sufficient effect.

As the resin constituting the composite body that makes up the magnetic layer 1015, thermoplastic resin, thermosetting resin, reactive resin and the like can be used.

Examples of the thermoplastic resin include vinyl chloride, vinyl acetate, a vinyl chloride-vinyl acetate copolymer, a vinyl chloride-vinylidene chloride copolymer, a vinyl chloride-acrylonitrile copolymer an acrylic acid ester-acrylonitrile copolymer, an acrylic ester-vinyl chloride-vinylidene chloride copolymer, an acrylic ester-vinylidene chloride copolymer, a methacrylate ester-vinylidene chloride copolymer, a methacrylate ester-vinyl chloride copolymer, a methacrylic acid ester-ethylene copolymer, polyvinyl fluoride, a vinylidene chloride-acrylonitrile copolymer, an acrylonitrile-butadiene copolymer, polyamide resin, polyvinyl butyral, a cellulose derivative (cellulose acetate butyrate, a cellulose die acetate, cellulose triacetate, cellulose propionate, cellulose nitrate), a styrene-butadiene copolymer, a polyurthane resin, a polyester resin, an amino resin, or a polymer synthetic rubber material such as styrene rubber, fluorine rubber, silicone rubber, and ethylene-propylene copolymer rubber.

Examples of a thermosetting resin or reactive resin include phenol resin, epoxy resin, polyurethane hardening resin, urea resin, melamine resin, alkyd resin, silicone resin, polyamine resin, and urea-formaldehyde resin.

Various adhesives may be contained in the composite body that makes up the magnetic layer 1015 in order to impart adhesiveness to the magnetic layer 1015.

Moreover, examples of the additives contained in the magnetic coating used in order to form the composite body that makes up the magnetic layer 1015 include a viscosity modifier, an antifoaming agent, a leveling agent, etc.

Furthermore, examples of the solvent contained in this magnetic coating include organic solvents such as cyclohexanone, acetone, and benzene-based and ethyl-based solvents.

Examples of the thermoplastic resin that constitutes the substrate 1020 include vinyl chloride, vinyl acetate, a vinyl chloride-vinyl acetate copolymer, a vinyl chloride-vinylidene chloride copolymer, a vinyl chloride-acrylonitrile copolymer, an acrylic acid ester-acrylonitrile copolymer, an acrylic ester-vinyl chloride-vinylidene chloride copolymer, an acrylic ester-vinylidene chloride copolymer, a methacrylate ester-vinylidene chloride copolymer, a methacrylate ester-vinyl chloride copolymer, a methacrylic acid ester-ethylene copolymer, polyvinyl fluoride, a vinylidene chloride-acrylonitrile copolymer, an acrylonitrile-butadiene copolymer, polyamide resin, polyvinyl butyral, a cellulose derivative (cellulose acetate butyrate, a cellulose die acetate, cellulose triacetate, cellulose propionate, cellulose nitrate), a styrene-butadiene copolymer, a polyurthane resin, a polyester resin, an amino resin, or a polymer synthetic rubber material such as styrene rubber, fluorine rubber, silicone rubber, and ethylene-propylene copolymer rubber.

The thermosetting resin 1021 is not particularly limited as long as it is able to cover so as to sheathe the inlet 1014 in the state of the inlet 1014 being housed in the recessed portion 1020c of the substrate 1020, and may be epoxy resin or urethane resin or the like. Among these, as the thermo setting resin 1021, it is preferable to use one having a hardening temperature lower than the melting point of the thermoplastic resin constituting the substrate 1020.

This embodiment illustrated a manufacturing method including a step to deform the substrate 1020 employing the sheet-shaped substrate 1020 made of a thermoplastic resin so that at least a portion of the substrate 1020 forms a recessed portion 1020c. However, the manufacturing method of the non-contact data reception/transmission unit of the present invention is not limited thereto. In the manufacturing method of the non-contact data reception/transmission unit of the present invention, a base substrate may be used having in advance a cross-sectional shape forming a predetermined shape such as a rectangular shape or circular shape, and being provided with a recessed portion having a cross-sectional shape that forms a predetermined shape such as a rectangular shape or circular shape.

Moreover, although this embodiment showed a manufacturing method using a sheet-shaped material consisting of a thermoplastic resin as the substrate 1020 the manufacturing method of the non-contact data reception/transmission unit of the present invention is not limited thereto. In the manufacturing method of the non-contact data reception/transmission unit of the present invention, a material consisting of ceramics, glass or metal may be used as the base substrate. In the case of using a metal base substrate, similarly to the case of using a thermoplastic resin, the base substrate is deformed so as at least a portion of the base substrate forms a recessed portion, or a base substrate is used having a recessed portion provided in advance, or a case-shaped one having a recessed portion may be used. In the case of using a glass or ceramics base substrate, a base substrate is used having a recessed portion provided in advance or a case-shaped one having a recessed portion may be used. Furthermore, the shape of the recessed portion that houses the inlet or the case is appropriately decided in accordance with the shape of the object article and the place where the non-contact data reception/transmission unit is to be attached.

This embodiment showed the step of filling the thermosetting resin 1021 into the recessed portion 1020c after housing the inlet 1014 in the recessed portion 1020c of the substrate 1020. However, in the present invention, after injecting an appropriate amount of the thermosetting resin 1021 into the recessed portion 1020c in advance and then housing the inlet 1014 inside the recessed portion 1020c so as to make contact with the thermosetting resin 1021, thermosetting resin 1021 may be filled into the recessed portion 1020c so as to cover the thermosetting resin 1021.

This embodiment showed the manufacturing method including the step of dividing the substrate 1020 at every region where the substrate 1020, the inlet 1014, and the covering 1017 are integrated, to form the case 1016 that is made of the substrate 1020, however, the manufacturing method of the non-contact data reception/transmission unit of the present invention is not limited thereto. In the manufacturing method of the non-contact data reception/transmission unit of the present invention, a non-contact data reception/transmission unit may be formed having a plurality of regions in which the base substrate, inlet and covering are integrated.

Furthermore, in this embodiment the surface of the inlet 1014 on which the antenna 1012 and the IC chip 1013 are provided was disposed on the bottom surface side in the recessed portion 1020c of the substrate 1020, however, the non-contact data reception/transmission unit of the present invention is not limited thereto. In the non-contact data reception/transmission unit of the present invention, the surface of the inlet on which the antenna and the IC chip are provided may be disposed on the peripheral edge side of the case recessed portion of the base substrate.

In addition, the present embodiment showed the example of a thermoplastic resin as the resin that constitutes the case 1016, but the non-contact data reception/transmission unit of the present invention is not limited thereto. In the non-contact data reception/transmission unit of the present invention, a thermosetting resin or reactive resin such as phenol resin, epoxy resin, polyurethane hardening resin, urea resin, melamine resin, alkyd resin, silicone resin, polyamine resin, and urea-formaldehyde resin may be used as the resin constituting the case.

Also, this embodiment illustrated thermosetting resin as the resin that constitutes the covering 1017, but the manufacturing method of the non-contact data reception/transmission unit of the present invention is not limited thereto. In the non-contact data reception/transmission unit of the present invention, a thermoplastic resin or reactive resin may be used as the resin that constitutes the covering 1017.

In this way, according to the manufacturing method of the non-contact data reception/transmission unit of the embodiment, a non-contact data reception/transmission unit 1010 is obtained in which since the entire periphery of the inlet 1014 can be covered by the covering 1017 within the recessed portion 1016a of the case 1016, even if the ease 1016 and the covering 1017 are formed with different materials, separation of the case 1016 and the covering 1017 at their surface boundary, and resulting exposure and damage of the inlet 1014, does not occur from the application of an external force. Also, if the case 1016 is formed with thermoplastic resin, it can be made into a thin structure while sufficiently ensuring its durability against external forces and chemical resistance. Moreover, if the case 1016 is formed with thermoplastic resin, not only can it be made into a thin structure while sufficiently ensuring its durability against external forces and chemical resistance, but also it can be formed into a shape with a curved surface. In addition, if thermosetting resin is used as the resin constituting the covering 1017 and this thermosetting resin is heat-treated at a temperature lower than the melting point of the thermoplastic resin which forms the substrate 1020, the case 1016 consisting of the separated substrate 1020 retains the shape formed according to the shape of the article serving as the applied object, and the inlet 1014 is covered by the covering 1017 without sustaining thermal damage. Therefore, the obtained non-contact data reception'transmission unit 1010 has excellent dimensional accuracy, maintains the initial function of the inlet 1014 and has an excellent communication facility.

The non-contact data reception/transmission unit embodying the present invention is explained in detail hereinbelow.

Figure 57:
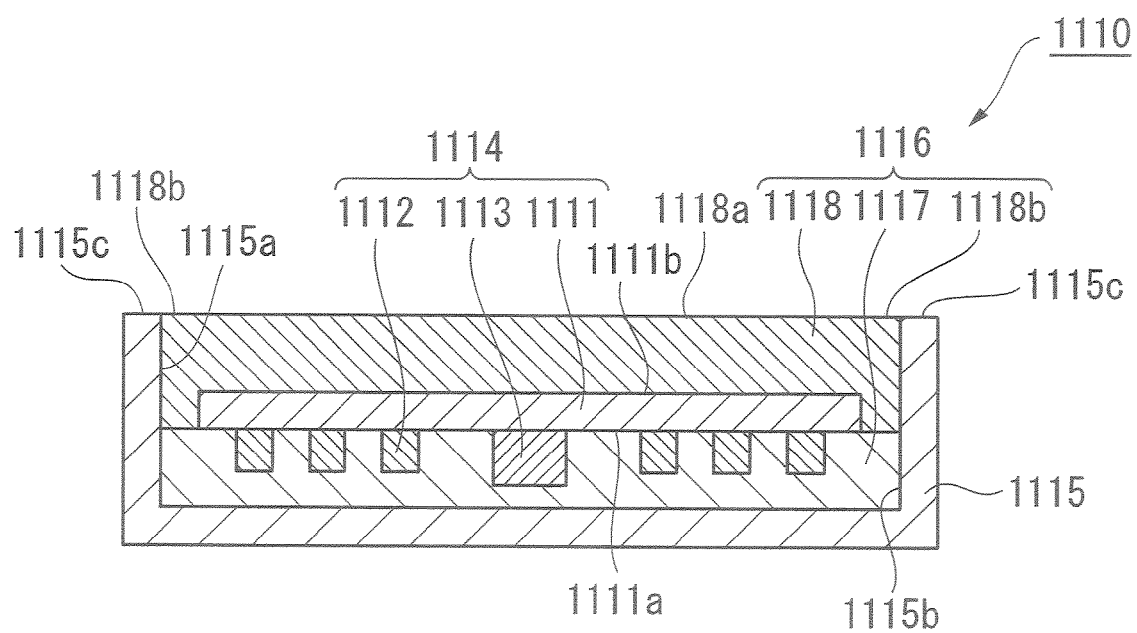
[FIG. 57] An outline sectional view showing the non-contact data reception/transmission unit according to the 32nd embodiment of the present invention.

FIG. 57 is an outline sectional view showing the non-contact data reception/transmission unit of the 32nd embodiment according to the present invention.

In FIG. 57, reference number 1110 denotes the non-contact data reception/transmission unit, 1111a base substrate, 1111 an antenna, 1113 an IC chip, 1114 an inlet, 1115 a case, 1116 a magnetic layer, 1117 a first covering and 1118 a second covering.

The non-contact data reception/transmission unit 1110 of this embodiment is roughly constituted from the case 1115 having a rectangular cross-sectional shape and provided with a recessed portion 1115a; an inlet 1114 housed in the recessed portion 1115a; and the covering 1116 provided so as to cover the inlet 1114 in the recessed portion 1115a. In addition, this covering 1116 is roughly constituted from the first covering 1117 disposed in the space 1115b located between the case 1115 and the inlet 1114; and the second covering 1118 including a magnetic material, provided so as to cover the inlet 1114 in the recessed portion 1115a except for the space 1115b located between the case 1115 and the inlet 1114, that is, to cover the surface 1111b (hereafter, "the other surface") of the base substrate 1111 opposite the surface 1111a (hereafter, "the one surface") on which the antenna 1112 and the IC chip 1113 are provided, so as to fill the space on the peripheral edge 1115c side of the case 1115 from the other surface 1111b in the recessed portion 1115a.

Also, the inlet 1114 includes the base substrate 1111 and the connected antenna 1112 and IC chip 1113 provided on one surface 1111a thereof. The antenna 1112 and the IC chip 1113, which constitute the inlet 1114, being connected in the non-contact data reception/transmission unit 1110 means the end portions of the antenna 1112 being respectively connected to both terminals of the IC chip 1113. In the non-contact data reception/transmission unit 1110, the antenna 1112 is provided in a coil shape at a predetermined interval on the one surface 1111a of the base substrate 1111 around the IC chip 1113. Moreover, the thickness of the IC chip 1113 is greater than the thickness of the antenna 1112.

In the non-contact data reception/transmission unit 1110, the peripheral edge portion 1118b of the external surface 1118a of the second covering 1118 is preferably disposed so as to be flush with the peripheral edge portion 1115c of the case 1115.

In this way, since the inlet 1114 is covered by the first covering 1117 and the second covering 1118 or either one of the first covering 1117 and the second covering 1118 in the recessed portion 1115a of the case 1115, there is no exfoliation at the contact surface (surface boundary) between the case 1115 and the covering 1116, and resulting exposure and damage of the inlet 1114, due to the application of an external force (particularly from the sides) to the non-contact data reception/transmission unit 1110.

The base substrate 1111, at least for the surface layer portion, is selected from a publicly known material such as a woven fabric, non-woven fabric, mat, paper or combination thereof made from inorganic fiber such as glass fiber or alumina fiber and organic fiber such as polyester fiber or polyamide fiber, a composite base substrate formed by impregnating any thereof with a resin varnish; a plastic substrate such as a polyamide resin substrate, polyester resin substrate, polyolefine resin substrate, polyimide resin substrate, ethylene vinyl alcohol copolymer substrate, polyvinyl alcohol resin substrate, polyvinyl chloride resin substrate, polyvinylidence chloride resin substrate, polystyrene resin substrate, polycarbonate resin substrate, acrylonitrile styrene butadiene copolymerization resin substrate, polyether sulfone resin substrate or any thereof subjected to mat treatment, corona discharge treatment, plasma treatment, ultraviolet irradiation treatment, electron-beam-irradiation treatment, flame plasma treatment and ozone treatment, or surface treatment such as easy adhesion treatment. Among these, an electrically insulating film or sheet consisting of polyethylene terephthalate or polyimide is suitably used.

The antenna 1112 can be formed by screen printing a predetermined pattern with a polymer conductive ink or etching a conductive foil on the one surface 1111a of the base substrate 1111.

Examples of the polymer conductive ink used in the present invention include those that have electrically conductive particulates such as silver dust, gold dust, platinum powder, aluminum powder, palladium powder, rhodium powder and carbon powder (carbon black, carbon nanotube, etc.) blended in a resin composition.

If a thermosetting resin is used as the resin compound, it shall be a thermosetting type that can form the coating film that produces the antenna 1112 at less than 200° C. for example 100 to 150° C. The path through which electricity flows in the coating film that produces the antenna 1112 is formed due to the mutual contact of the conductive particulates that form the coating film, and the resistance value of this coating film is on the order of $10^{-5}$ Ω/cm.

Also, in addition to a thermosetting type ink, publicly known types such as a photo-curing type, osmotic drying type, and solvent volatilization type are used as the polymer conductive ink in the present invention.

The photo-curing polymer conductive ink is one that includes a photo-curing resin in the resin compound, which shortens the hardening time and thereby raises manufacturing efficiency. The photo-curing polymer conductive ink can be one that contains at least 60 percent conductive particulates by mass and at least 10 percent polyester resin by mass blended in a thermoplastic resin only or a blended resin composition of a thermoplastic resin and a crosslinked resin (particularly a crosslinked resin of polyester and isocyanate and the like), that is, a solvent volatilization type or a crosslinked/thermoplastic combination type (with the thermoplastic type being at least 50 percent by mass), or one that contains at least 10 percent polyester resin by mass blended in a thermoplastic resin only or a blended resin composition of a thermoplastic resin and a crosslinked resin (particularly a crosslinked resin of polyester and isocyanate and the like), that is, a crosslinked type or a crosslinked/thermoplastic combination type.

The conductive foil that forms the antenna 1112 includes copper foil, silver foil, gold foil, platinum foil, and aluminum foil etc.

The IC chip 1113 is not particularly limited, and as long as writing and reading of information is possible in a non-contact state via the antenna 1112, anything may be used that is applicable to RFID media such as non-contact IC tags and non-contact IC labels or non-contact IC cards.

The material constituting the case 1115 is not particularly limited, with examples including resins such as thermoplastic resin, thermosetting resin, and reactive resin, ceramics and glass.

The thickness of the case 1115 may be made thick enough to be able to house the inlet 1114 and the covering 1116 in the recessed portion 1115a, and is preferably as thin as possible.

Examples of the thermoplastic resin constituting the case 1115 include vinyl chloride, vinyl acetate, a vinyl chloride-vinyl acetate copolymer, a vinyl chloride-vinylidene chloride copolymer, a vinyl chloride-acrylonitrile copolymer, an acrylic acid ester-acrylonitrile copolymer, an acrylic ester-vinyl chloride-vinylidene chloride copolymer, an acrylic ester-vinylidene chloride copolymer, a methacrylate ester-vinylidene chloride copolymer, a methacrylate ester-vinyl chloride copolymer, a methacrylic acid ester-ethylene copolymer, polyvinyl fluoride, a vinylidene chloride-acrylonitrile copolymer, an acrylonitrile-butadiene copolymer, polyamide resin, polyvinyl butyral, a cellulose derivative (cellulose acetate butyrate, a cellulose die acetate, cellulose triacetate, cellulose propionate, cellulose nitrate), a styrene-butadiene copolymer, a polyurethane resin, a polyester resin, an amino resin, or a polymer synthetic rubber material such as styrene rubber, fluorine rubber, silicone rubber, and ethylene-propylene copolymer rubber.

Examples of a thermo setting resin or reactive resin constituting the case 1115 include phenol resin, epoxy resin, polyurethane hardening resin, urea resin, melamine resin, alkyd resin, silicone resin, polyamine resin, and urea-formaldehyde resin.

Ceramics or glass constituting the case 1115 are not particularly limited, and any may be used that allows formation of the recessed portion 1115a that can house the inlet 1114 and the covering 1116.

Among the materials constituting the case 1115, resin is preferable from the standpoint of ease of fabrication to a predetermined shape, and among resins, thermoplastic resin is preferred for hindering cracks in the recessed portion 1115a even when the case 1115 is formed using a thin sheet-shaped base substrate.

Examples of the material forming the first covering 1117 include resins such as thermoplastic resin, reactive resin and thermosetting resin.

The same thermoplastic resin or reactive resin as used for the case 1115 is used.

The thermosetting resin is not particularly limited as long as it is able to cover so as to sheathe the inlet 1114 in the state of the inlet 1114 being housed in the recessed portion 1115a of the case 1115, and may be epoxy resin or urethane resin or the like. Among these, when the case 1115 is made of a thermoplastic resin, the thermosetting resin forming the first covering 1117 shall have a hardening temperature lower than the melting point of the thermoplastic resin.

In order to enhance the durability against external forces and chemical resistance of the non-contact data reception/transmission unit 1110, and in order to raise the adhesion of the case 1115 and the first covering 1117, both are preferably of the same material. However, when the materials of the case 1115 and the first covering 1117 are made to be identical, when resin constituting the first covering 1117 is filled in the recessed portion 1115a in order to cover the inlet 1114, the case 1115 may deform or fluidify from the heat of the resin forming the first covering 1117 (the hardening temperature in the case of thermosetting resin, and the melting temperature in order to be melted in the case of thermoplastic resin), which is not preferable. In addition, when the first covering 1117 is a thermoplastic resin, the time until hardening is short, hindering filling within the recessed portion 1115a, and so a reactive resin or a thermoplastic resin is preferred as the material constituting the first covering 1117. Moreover, when a reactive resin has set, since its molecular structure can easily become dense, a thermoplastic resin is more preferable as the material constituting the first covering 1117.

The second covering 1118 is constituted from a composite body having a filler consisting of at least magnetic particulates contained in a resin. In this kind of second covering 1118, viewing the non-contact data reception/transmission unit 1110 from the side of the other surface 1111b of the base substrate 1111, the plurality of magnetic particulates constituting the second covering 1118 form a connected single magnetic body in which at least a portion of the magnetic particulates mutually overlap.

The magnetic particulates can be a powdered magnetic powder or magnetic flakes consisting of flat-shaped flakes obtained by refining this magnetic power into a powder with a ball mill or the like and then mechanically flattening the powder. Among these, as magnetic particulates, those of the flattened state are preferable. If the magnetic particulates are in the flattened state, viewing the non-contact data reception/transmission unit 1110 from the side of the one surface 1111a of the base substrate 1111, the plurality of magnetic particulates constituting the second covering 1118 easily form a connected single magnetic body in which at least a portion of the magnetic particulates mutually overlap. Accordingly, flux can be more easily picked up by the antenna through the magnetic layer.

Moreover, as the magnetic powder, for example, Sendust (Fe—Si—Al alloy) powder, carbonile iron powder, atomized powder such as permalloy, and reduced iron powder, etc can be given. Flakes of a magnetic material can for example be flakes obtained by refining the magnetic material into a powder with a ball mill or the like and then mechanically flattening the powder, and flakes obtained by running molten metal of an iron-based or cobalt-based amorphous alloy into a water-cooled copper plate. As the magnetic particulates, magnetic powder or magnetic flakes consisting of Sendust are preferable, with magnetic flakes consisting of Sendust being more preferable. If the magnetic particulates are magnetic powder or magnetic flakes consisting of Sendust, since the saturation magnetic flux density and permeability of the second covering 1118 which contains these as a component are higher, flux can be more easily picked up by the antenna through the magnetic layer.

The shape of the magnetic particulates forming the second covering 1118 need not entirely be powdered or flat shaped. Powdered magnetic particulates and flat shaped-magnetic particulates may be mixed together in the second covering 1118, and even if magnetic particulates of differing shapes are thus mixed together, the non-contact data reception/transmission unit of the present invention will exhibit a sufficient effect.

As the resin constituting the composite body that makes up the second covering 1118, thermoplastic resin, thermosetting resin, reactive resin and the like can be used.

Examples of the thermoplastic resin include vinyl chloride, vinyl acetate, a vinyl chloride-vinyl acetate copolymer, a vinyl chloride-vinylidene chloride copolymer, a vinyl chloride-acrylonitrile copolymer, an acrylic acid ester-acrylonitrile copolymer, an acrylic ester-vinyl chloride-vinylidene chloride copolymer, an acrylic ester-vinylidene chloride copolymer, a methacrylate ester-vinylidene chloride copolymer, a methacrylate ester-vinyl chloride copolymer, a methacrylic acid ester-ethylene copolymer, polyvinyl fluoride, a vinylidene chloride-acrylonitrile copolymer, an acrylonitrile-butadiene copolymer, polyamide resin, polyvinyl butyral, a cellulose derivative (cellulose acetate butyrate, a cellulose die acetate, cellulose triacetate, cellulose propionate, cellulose nitrate), a styrene-butadiene copolymer, a polyurethane resin, a polyester resin, an amino resin, or a polymer synthetic rubber material such as styrene rubber, fluorine rubber, silicone rubber, and ethylene-propylene copolymer rubber.

Examples of a thermosetting resin or reactive resin include phenol resin, epoxy resin, polyurethane hardening resin, urea resin, melamine resin, alkyd resin, silicone resin, polyamine resin, and urea-formaldehyde resin.

Various adhesives may be contained in the composite body that makes up the second covering 1118 in order to impart adhesiveness to the adherend.

Moreover, examples of the additives contained in the magnetic coating used in order to form the composite body that makes up the second covering 1118 include a viscosity modifier, an antifoaming agent, a leveling agent, etc.

Furthermore, examples of the solvent contained in this magnetic coating include organic solvents such as cyclohexanone, acetone, and benzene-based and ethyl-based solvents.

The composite body that constitutes the second covering 1118 is fabricated in a configuration in which the magnetic particulates are nearly uniformly dispersed by applying the magnetic coating including a filler consisting of magnetic particulates, resin, additives, and a solvent and then drying.

In order to enhance the durability against external forces and chemical resistance of the non-contact data reception/transmission unit 1110, and in order to raise the adhesion of the case 1151 and the second covering 1118, it is preferable to have the resin constituting the second covering 1118 be identical to the material constituting the case 1115.

In this way, according to the non-contact data reception/transmission unit 1110 of this embodiment, since there is provided the second covering 1118 that includes a magnetic material so as to cover the inlet 1114 in the recessed portion 1115$a$ except for the space 1115$b$ located between the case 1115 and the inlet 1114, even in the case of being in contact with an article that includes at least metal, the antenna 1112 can be made to generate sufficient induced electromotive force to operate the IC chip 1113 since flux is picked up by the antenna 1112 through the second covering 1118. Moreover, the first covering 1117 functions as a protective layer of the antenna 1112 and the IC chip 1113.

Furthermore, if the peripheral edge portion 1118$b$ of the external surface 1118$a$ of the second covering 1118 is disposed to be flush with the peripheral edge portion 1115$c$ of the case 1115, the inlet 1114 is covered by the first covering 1117 and the second covering 1118 or either one of the first covering 1117 and the second covering 1118 in the recessed portion 1115$a$ of the case 1115. Therefore, there is no exfoliation at the contact surface (surface boundary) between the case 1115 and the covering 1116, and resulting exposure and damage of the inlet 1114, due to the application of an external force (particularly from the sides) to the non-contact data reception/transmission unit 1110.

Also, since the non-contact data reception/transmission unit 1110 is attached to an object article (adherend) via an adhesive or a bonding agent on the peripheral edge 1115$c$ side of the case 1115, so that the surface boundary of the case 1115 and the covering 1116 is not exposed outward in the state of being attached to the article, more adequate chemical resistance can be ensured during used. In addition since there is no separation of the case 1115 and the covering 1116 at their contact surface (surface boundary), seepage of water or chemicals into the interior of the non-contact data reception/transmission unit 1110 does not occur, thereby imparting excellent water resistance and chemical resistance. Moreover, if the case 1115 is formed with thermoplastic resin it can be made into a thin structure while sufficiently ensuring its durability against external forces and chemical resistance. Furthermore, if the case 1115 is formed with thermoplastic resin, not only can it be made into a thin structure while sufficiently ensuring its durability against external forces and chemical resistance, but also it can be formed into a shape with a curved surface.

The present embodiment exemplified a non-contact data reception/transmission unit using a case 1115 having a rectangular cross section, but the non-contact data reception/transmission unit of the present invention is not limited thereto. In the non-contact data reception/transmission unit of the present invention, the shape of the case that houses the inlet is suitably decided in accordance with the shape of the object article (adherend) and the place where the non-contact data reception/transmission unit is to be attached.

In addition, the present embodiment illustrated the non-contact data reception/transmission unit 1110 in which a space is not provided between the internal surface of the recessed portion 1115$a$ of the case 1115 and the inlet 1114, but the non-contact data reception/transmission unit of the present invention is not limited thereto. In the non-contact data reception/transmission unit of the present invention, a space may be provided between the internal surface of the recessed portion of the case and the inlet. In this case, the first covering 1117 may be provided so as to fill at least the space between the inlet 1114 housed in the recessed portion 1115*a* and the bottom surface in the recessed portion 1115*a*.

In addition, the present embodiment illustrated the non-contact data reception/transmission unit 1110 in which the inlet 1114 is disposed with the surface on which the antenna 1112 and the IC chip 1113 are provided facing the internal side of the recessed portion 1115*a* of the case 1115, however, the non-contact data reception/transmission unit of the present invention is not limited thereto. In the non-contact data reception/transmission unit of the present invention, the inlet may be disposed with the surface on which the antenna and the IC chip are provided facing the outside of the recessed portion of the case. Disposing the inlet in this way can lower the resin pressure acting on the antenna and the IC chip, thereby inhibiting damage to the antenna and the IC chip due to the resin pressure.

Also, in the present embodiment the surface of the inlet 1114 on which the antenna 1112 and the IC chip 1113 are provided was disposed on the bottom surface side in the recessed portion 1115*a* of the case 1115, however, the non-contact data reception/transmission unit of the present invention is not limited thereto. In the non-contact data reception/transmission unit of the present invention, the surface of the inlet on which the antenna and the IC chip are provided may be disposed on the peripheral edge side of the case.

(Method of Manufacturing the Non-contact Data Reception/Transmission Unit)

Next, one embodiment of a method of manufacturing the non-contact data reception/transmission unit shall be explained referring to FIGS. 58A through 60.

Figure 58A:
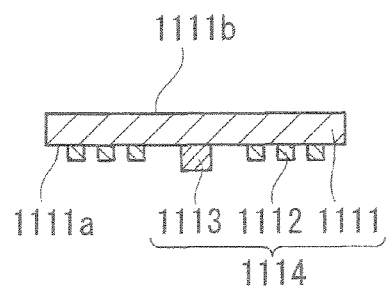
[FIG. 58A] An outline sectional view showing one embodiment of the method of manufacturing the non-contact data reception/transmission unit according to the present invention.

The inlet 1114 as shown in FIG. 58*a* is manufactured as described hereinbelow.

First the antenna 1112 having a predetermined thickness and predetermined pattern is provided on the one surface 1111*a* of the base substrate 1111.

In this step, when forming the antenna 1112 with polymer conductive ink, after printing the polymer conductive ink by a screen method so as to have the predetermined thickness and the predetermined pattern on the one surface 1111*a* of the base substrate 1111, drying and hardening of the polymer conductive ink forms the antenna 1112 having the predetermined thickness and the predetermined pattern.

Forming the antenna 1112 with a conductive foil is performed according to the following procedure.

A conductive foil is bonded to the entire one surface 1111*a* of the base substrate 1111, after which an etch-resistant coating is printed in a predetermined pattern by a silk screen method onto the conductive foil. After drying and hardening the etch-resistant coating, it is immersed in an etching solution, wherein the copper foil that is not coated with the etch-resistant coating dissolves away, leaving the copper foil portion coated with the etch-resistant coating on the one surface of the base substrate 1111, thereby forming the antenna 1112.

Next, the IC chip 1113 is mounted on the one surface 1111*a* of the base substrate 1111 by electrically connecting contacts 1112*b*, 1112*b* provided on the antenna 1112 and the contacts (not illustrated) provided on the IC chip 1113 via an electrically conductive material consisting of conductive paste or solder.

Figure 58B:
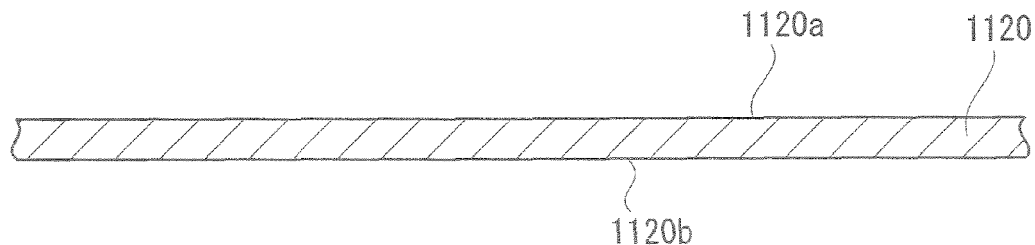
[FIG. 58B] An outline sectional view showing one embodiment of the method of manufacturing the non-contact data reception/transmission unit according to the present invention.

In addition, as shown in FIG. 58B, a sheet-shaped substrate 1120 is prepared separately from the inlet manufacturing step.

Figure 58C:
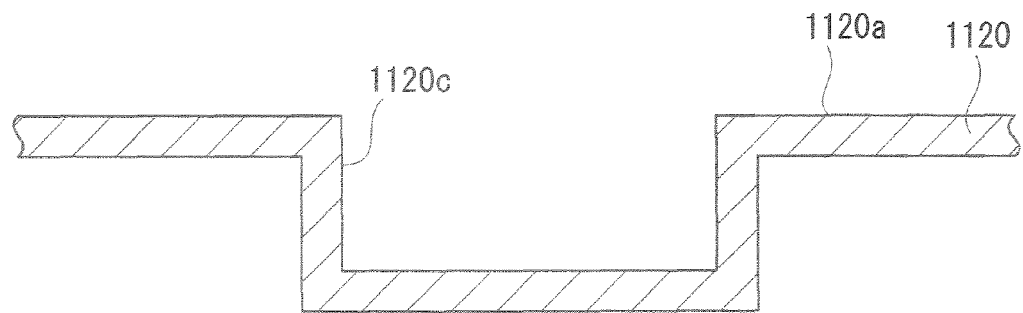
[FIG. 58C] An outline sectional view showing one embodiment of the method of manufacturing the non-contact data reception/transmission unit according to the present invention.

Next, as shown in FIG. 58C, the substrate 1120 is deformed so that at least a portion of the substrate 1120 forms a recessed portion 1120*c*.

As methods of deforming the substrate 1120 to form the recessed portion 1120*c*, a method of pressing a metal mold of a prescribed shape onto the substrate 1120 from the one surface 1120*a* and performing thermal deformation of the substrate 1120, or a method of suctioning the substrate 1120 from the other surface 1120*b* into a decompression or vacuum to be appressed into a mold of a predetermined shape is used.

In the method of pressing a metal mold of a prescribed shape onto the substrate 1120 and performing thermal deformation of the substrate 1120, by pressing the metal mold obliquely toward the substrate 1120 to deform the substrate 1120, or making the shape of the recessed portion 1120*c* hemispherical if a metal die is used in which the shape of the portion in contact with the substrate 1120 is rounded, the portion that series as the mating surface with the adherend can be skewed. In addition, similarly, the recessed portion 1120*c* can be fabricated in any shape by a method of suctioning the substrate 1120 into a decompression or vacuum to be appressed into a mold of a predetermined shape.

Figure 59A:
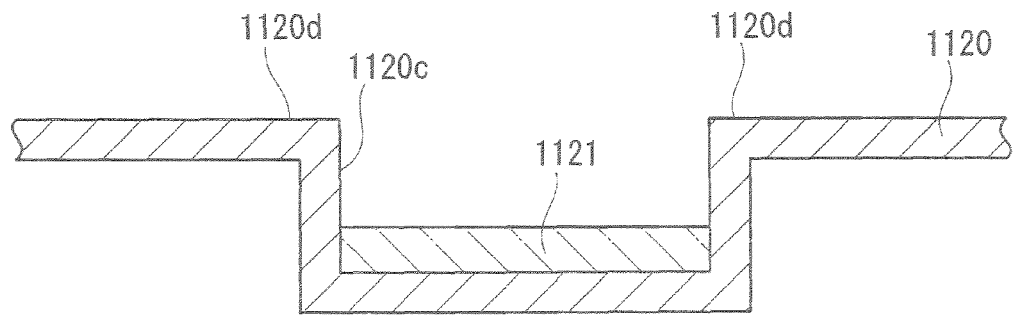
[FIG. 59A] An outline sectional view showing one embodiment of the method of manufacturing the non-contact data reception/transmission unit according to the present invention.

Next, as shown in FIG. 59A, an appropriate amount of the resin 1121 constituting the first covering is filled into the recessed portion 1120*c* of the substrate 1120.

The filling amount of the resin constituting the first covering is not particularly limited, and may be an amount such that, when the inlet 1114 is housed in the recessed portion 1120*c* so as to be brought into contact with the resin 1121, the space between the recessed portion 1120*c* and the inlet 1114 is filled by the resin 1121. Also, the filling amount of the resin 1121 is suitably adjusted in accordance with the size of the antenna 1112 and the IC chip 1113 forming the inlet 1114.

Figure 59B:
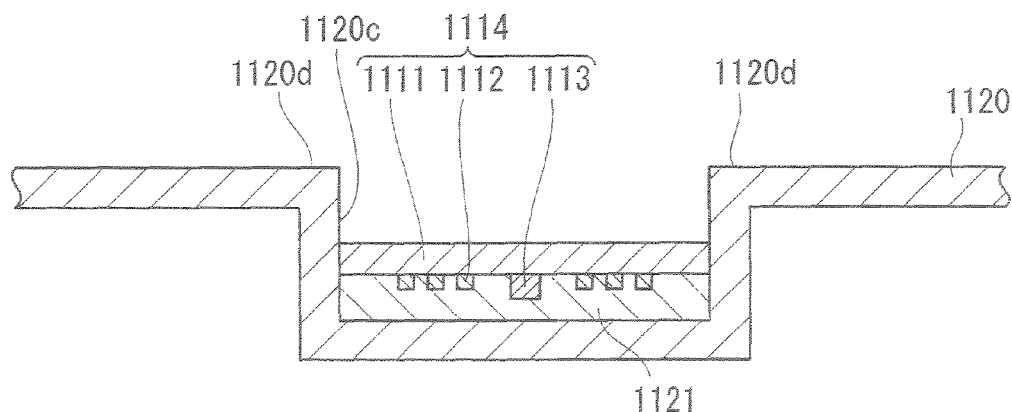
[FIG. 59B] An outline sectional view showing one embodiment of the method of manufacturing the non-contact data reception/transmission unit according to the present invention.

Next, as shown in FIG. 59B, with its surface on which the antenna 1112 and the IC chip 1113 are provided facing inward, the inlet 1114 is housed in the recessed portion 1120*c* of the substrate 1120 so as to be in contact with the resin 1121.

In this step, the inlet 1114 is disposed inside the recessed portion 1120*c* from a plane formed by the opening edge 1120*d* of the recessed portion 1120*c*.

Figure 59C:
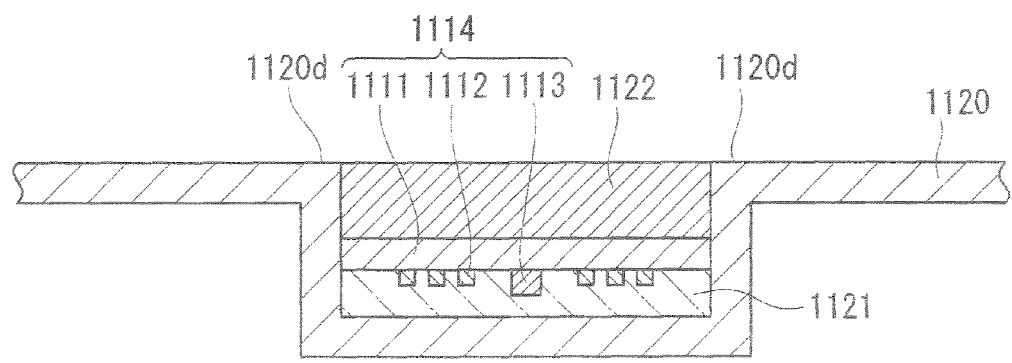
[FIG. 59C] An outline sectional view showing one embodiment of the method of manufacturing the non-contact data reception/transmission unit according to the present invention.

Next, as shown in FIG. 59C, a magnetic coating 1122 that is the second covering covers the surface of the inlet 1114 opposite the surface on which the antenna 1112 and the IC chip 1113 are provided so as to fill the space on the opening edge 1120*d* side from this surface in the recessed portion 1120*c*.

A printing method such as a screen printing method is used to fill the magnetic coating in the recessed portion 1120*c*.

Next, the covering consisting of the first covering and the second covering is formed by drying and hardening by leaving at room temperature or heating the resin and magnetic coating constituting the first covering and the second covering at a prescribed temperature and prescribed time.

Figure 60:
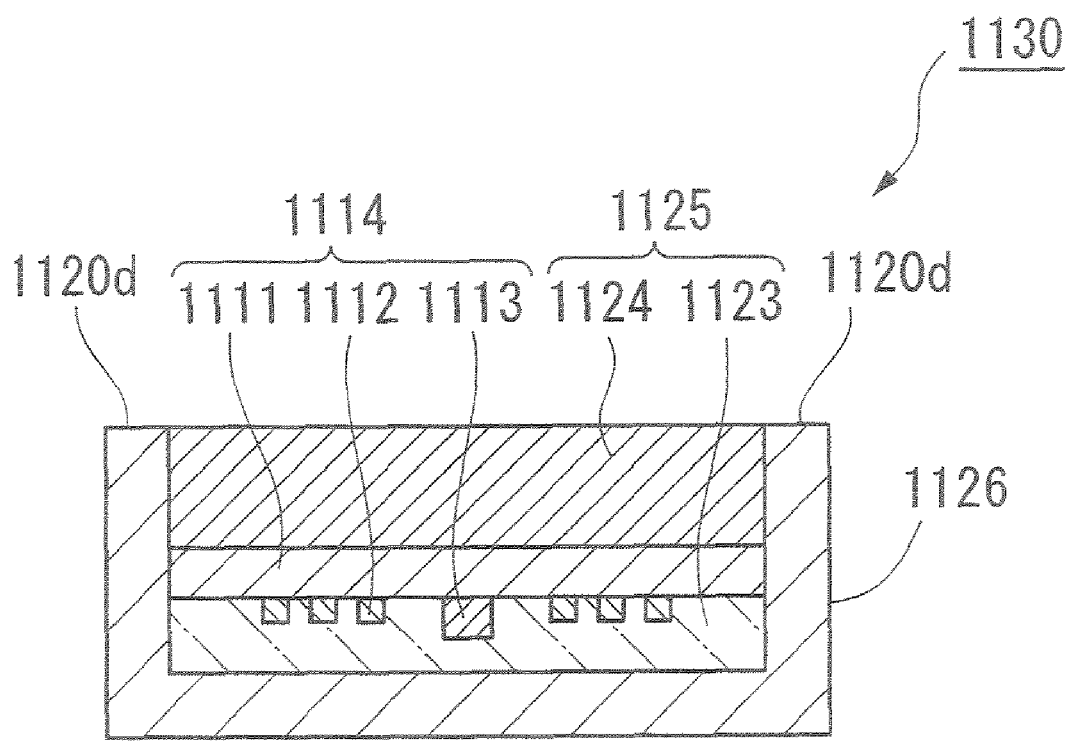
[FIG. 60] An outline sectional view showing one embodiment of the method of manufacturing the non-contact data reception/transmission unit according to the present invention.

Subsequently, as shown in FIG. 60, the substrate 1120 is divided at every region where the substrate 1120, the inlet 1114, and a covering 1125 including a first covering 1123 and a second covering 1124 are integrated, whereby a case 1126 that is made of the substrate 1120 is formed to obtain a non-contact data reception/transmission unit 1130.

Figure 61:
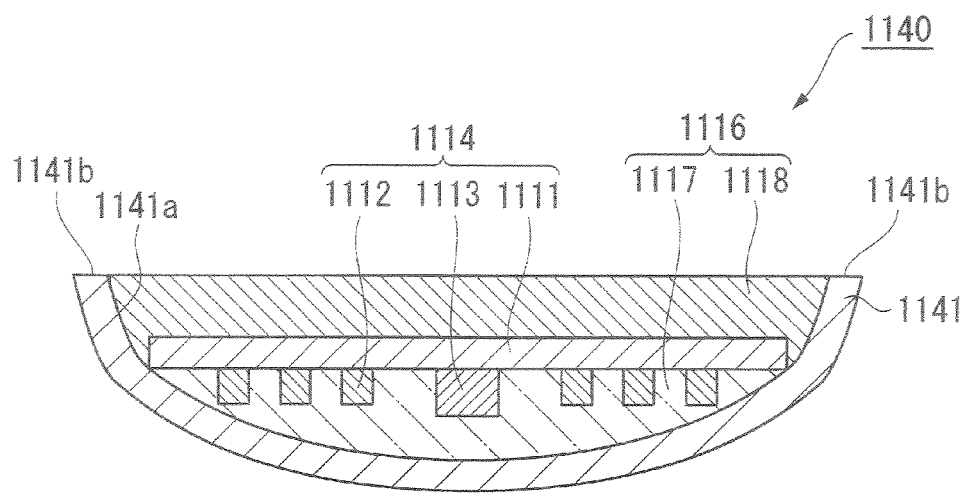
[FIG. 61] An outline sectional view showing the non-contact data reception/transmission unit according to the 33rd embodiment of the present invention.

FIG. 61 is an outline sectional view showing the non-contact data reception/transmission unit of the 33rd embodiment according to the present invention.

In FIG. 61, constituent elements identical to those of the non-contact data reception/transmission unit 1110 shown in FIG. 57 are given the same reference numerals, with explanations therefor being omitted.

The non-contact data reception/transmission unit 1140 of this embodiment differs from the aforementioned non-contact data reception/transmission unit 1111 on the point of the cross-sectional shape of the case 1141 being circular.

Even in the non-contact data reception/transmission unit 1140, the inlet 1114 is disposed inside the recessed portion 1141*a* from a plane formed by the peripheral edge 1141*b* of the case 1141.

Figure 62:
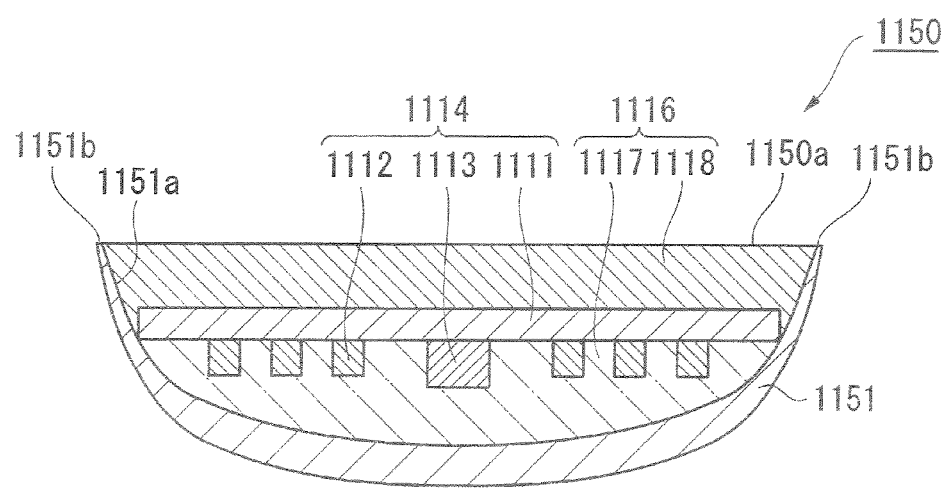
[FIG. 62] An outline sectional view showing the non-contact data reception/transmission unit according to the 34th embodiment of the present invention.

FIG. 62 is an outline sectional view showing the non-contact data reception/transmission unit of the 34th embodiment according to the present invention.

In FIG. 62, constituent elements identical to those of the non-contact data reception/transmission unit 1110 shown in FIG. 57 are given the same reference numerals, with explanations therefor being omitted.

The non-contact data reception/transmission unit 1150 of this embodiment differs from the aforementioned non-contact data reception/transmission unit 1140 on the point of the peripheral edge 1151*b* of the case 1151 having a linear form, so that when viewing the non-contact data reception/transmission unit 1150 from the peripheral edge 1151*b* side, the plane 1150*a* is formed almost only by the second covering 1118.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly the invention is not to be considered as being limited by the foregoing description and is only limited by the scope of the appended claims.

INDUSTRIAL APPLICABILITY

The aforementioned apparatus for manufacturing a non-contact IC label can be similarly applied to so-called IC tags. Accordingly "IC label" in the present invention is not limited to conventional IC labels that are peeled from a mount and used, and can be applied to IC tags having a form incorporated between two sheets.

The invention claimed is:

1. A semiconductor device comprising:
   an inlet including
      a base substrate, and
      an antenna and an IC chip both disposed on a surface of said base substrate, the antenna and the IC chip being electrically connected to each other;
   a magnetic layer disposed so as to cover said antenna, said IC chip, and an entirety of the surface of the base substrate; and
   a case including resin that envelops said inlet with said magnetic layer.

2. The semiconductor device according to claim 1, wherein said magnetic layer is a composite body including a bonding agent and a magnetic powder or magnetic flakes.

3. The semiconductor device according to claim 1, wherein a thickness of the magnetic layer is greater than a thickness of the antenna and a thickness of the IC chip.

* * * * *